US011696499B2

(12) United States Patent
Cho et al.

(10) Patent No.: US 11,696,499 B2
(45) Date of Patent: *Jul. 4, 2023

(54) ORGANIC LIGHT-EMITTING DEVICE

(71) Applicant: SAMSUNG DISPLAY CO., LTD., Yongin-si (KR)

(72) Inventors: Hwan-Hee Cho, Yongin-si (KR); Myeong-Suk Kim, Yongin-si (KR); Sung-Wook Kim, Yongin-si (KR); Se-Hun Kim, Yongin-si (KR); Jin-Soo Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/866,460

(22) Filed: May 4, 2020

(65) Prior Publication Data

US 2020/0266362 A1 Aug. 20, 2020

Related U.S. Application Data

(63) Continuation of application No. 15/293,174, filed on Oct. 13, 2016.

(30) Foreign Application Priority Data

May 10, 2016 (KR) ........................ 10-2016-0057130

(51) Int. Cl.

| | |
|---|---|
| ***H01L 51/54*** | (2006.01) |
| ***H01L 51/00*** | (2006.01) |
| ***C09K 11/02*** | (2006.01) |
| ***C09K 11/06*** | (2006.01) |
| ***H01L 51/50*** | (2006.01) |

(52) U.S. Cl.

CPC ........ *H01L 51/0072* (2013.01); *C09K 11/025* (2013.01); *C09K 11/06* (2013.01); *H01L 51/0054* (2013.01); *H01L 51/0067* (2013.01); *H01L 51/0071* (2013.01); *H01L 51/0085* (2013.01); *H01L 51/5004* (2013.01); *C09K 2211/1007* (2013.01); *C09K 2211/1029* (2013.01); *C09K 2211/185* (2013.01); *H01L 51/006* (2013.01); *H01L 51/0061* (2013.01); *H01L 51/0073* (2013.01); *H01L 51/0074* (2013.01); *H01L 51/5016* (2013.01); *H01L 51/5024* (2013.01); *H01L 51/5056* (2013.01); *H01L 2251/5384* (2013.01); *H01L 2251/552* (2013.01)

(58) Field of Classification Search

None

See application file for complete search history.

(56) References Cited

U.S. PATENT DOCUMENTS

| | | | |
|---|---|---|---|
| 5,840,217 | A | 11/1998 | Lupo et al. |
| 6,911,551 | B2 | 6/2005 | Stössel et al. |
| 7,663,304 | B2 | 2/2010 | Fukuoka et al. |
| 7,956,531 | B2 | 6/2011 | Smith |
| 8,394,510 | B2 | 3/2013 | Mizuki et al. |
| 8,679,647 | B2 | 3/2014 | Pflumm et al. |
| 8,890,126 | B2 | 11/2014 | Ryu et al. |
| 8,932,732 | B2 | 1/2015 | Buesing et al. |
| 9,040,172 | B2 | 5/2015 | Parham et al. |
| 9,070,885 | B2 | 6/2015 | Ono |
| 9,203,043 | B2 | 12/2015 | Nishimura et al. |
| 9,831,439 | B2 | 11/2017 | Kim et al. |
| 9,871,208 | B2 | 1/2018 | Lee et al. |
| 9,972,789 | B2 | 5/2018 | Cho et al. |
| 10,622,565 | B2 | 4/2020 | Parham et al. |
| 10,818,846 | B2 | 10/2020 | Kim et al. |
| 10,930,853 | B2 | 2/2021 | Kim et al. |
| 2002/0098379 | A1 | 7/2002 | Arakane et al. |
| 2003/0160564 | A1 | 8/2003 | Park et al. |
| 2005/0106419 | A1 | 5/2005 | Endoh et al. |
| 2006/0055305 | A1 | 3/2006 | Funahashi et al. |
| 2006/0088728 | A1 | 4/2006 | Kwong et al. |
| 2006/0220535 | A1 | 10/2006 | Nakayama |
| 2007/0252516 | A1 | 11/2007 | Kondakova et al. |
| 2008/0124572 | A1 | 5/2008 | Mizuki et al. |
| 2009/0309487 | A1 | 12/2009 | Royster, Jr. et al. |

(Continued)

FOREIGN PATENT DOCUMENTS

| | | |
|---|---|---|
| CN | 101535256 A | 9/2009 |
| CN | 102668157 A | 9/2012 |

(Continued)

OTHER PUBLICATIONS

Machine translation of KR 10-2011-0066766 A (Year: 2011).

(Continued)

*Primary Examiner* — Andrew K Bohaty

(74) *Attorney, Agent, or Firm* — Lewis Roca Rothgerber Christie LLP

(57) ABSTRACT

An organic light emitting device includes: a first electrode; a second electrode facing the first electrode; and an organic layer between the first electrode and the second electrode, the organic layer including an emission layer, wherein the organic layer includes a first compound, a second compound, a third compound, and a fourth compound, and the first compound to the fourth compound satisfy Equations 1 to 8:

$$E_{1,LUMO} \geq E_{2,LUMO} + 0.15 \text{ electron volts (eV)} \quad \text{Equation 1}$$

$$E_{1,HOMO} \geq E_{2,HOMO} + 0.15 \text{ eV} \quad \text{Equation 2}$$

$$E_{1,T1} \geq E_{4,T1} \quad \text{Equation 3}$$

$$E_{2,T1} \geq E_{4,T1} \quad \text{Equation 4}$$

$$E_{3,T1} \geq E_{4,T1} \quad \text{Equation 5}$$

$$E_{3,LUMO} \geq E_{2,LUMO} + 0.1 \text{ eV} \quad \text{Equation 6}$$

$$-5.6 \text{ eV} \geq E_{3,HOMO} \quad \text{Equation 7}$$

$$E_{gap1} \geq E_{gap3}. \quad \text{Equation 8}$$

16 Claims, 5 Drawing Sheets

(56) References Cited

U.S. PATENT DOCUMENTS

| | | | |
|---|---|---|---|
| 2010/0001636 | A1 | 1/2010 | Yabunouchi |
| 2010/0012931 | A1 | 1/2010 | Kato et al. |
| 2010/0046336 | A1 | 2/2010 | Takahashi et al. |
| 2010/0187977 | A1 | 7/2010 | Kai et al. |
| 2011/0037062 | A1 | 2/2011 | Fukumatsu et al. |
| 2011/0248246 | A1 | 10/2011 | Ogita et al. |
| 2011/0278555 | A1 | 11/2011 | Inoue et al. |
| 2011/0279020 | A1 | 11/2011 | Inoue et al. |
| 2012/0001165 | A1 | 1/2012 | Komori et al. |
| 2012/0068170 | A1 | 3/2012 | Pflumm et al. |
| 2012/0091885 | A1 | 4/2012 | Kim et al. |
| 2012/0112169 | A1 | 5/2012 | Mizuki et al. |
| 2012/0112174 | A1 | 5/2012 | Lee et al. |
| 2012/0138915 | A1 | 6/2012 | Nishimura et al. |
| 2012/0153272 | A1 | 6/2012 | Fukuzaki |
| 2012/0181518 | A1 | 7/2012 | Ogiwara et al. |
| 2012/0203010 | A1 | 8/2012 | Matsumoto et al. |
| 2012/0235123 | A1 | 9/2012 | Lee et al. |
| 2012/0256123 | A1 | 10/2012 | Cho et al. |
| 2012/0273764 | A1 | 11/2012 | Yu et al. |
| 2012/0305898 | A1 | 12/2012 | Okamoto |
| 2013/0075716 | A1 | 3/2013 | Nishimura et al. |
| 2013/0105771 | A1 | 5/2013 | Ryu et al. |
| 2013/0119354 | A1 | 5/2013 | Ma et al. |
| 2013/0256634 | A1 | 10/2013 | Cho et al. |
| 2013/0292665 | A1 | 11/2013 | Ono |
| 2013/0313536 | A1 | 11/2013 | Nishimura et al. |
| 2014/0001446 | A1 | 2/2014 | Mizuki et al. |
| 2014/0034943 | A1 | 2/2014 | Mizuki et al. |
| 2014/0048784 | A1 | 2/2014 | Inoue et al. |
| 2014/0054564 | A1 | 2/2014 | Kim et al. |
| 2014/0061609 | A1 | 3/2014 | Kim et al. |
| 2014/0070204 | A1 | 3/2014 | Nagao et al. |
| 2014/0084270 | A1 | 3/2014 | Kato et al. |
| 2014/0131665 | A1 | 5/2014 | Xia et al. |
| 2014/0197386 | A1 | 7/2014 | Kim et al. |
| 2014/0217393 | A1 | 8/2014 | Kato et al. |
| 2014/0225046 | A1 | 8/2014 | Jatsch et al. |
| 2014/0275530 | A1 | 9/2014 | Jatsch et al. |
| 2014/0299865 | A1 | 10/2014 | Nishimura et al. |
| 2014/0306207 | A1 | 10/2014 | Nishimura et al. |
| 2014/0312331 | A1 | 10/2014 | Inoue et al. |
| 2014/0312338 | A1 | 10/2014 | Mizutani et al. |
| 2014/0326985 | A1 | 11/2014 | Mizuki et al. |
| 2014/0367649 | A1 | 12/2014 | Cho et al. |
| 2014/0374711 | A1 | 12/2014 | Cho et al. |
| 2015/0001488 | A1 | 1/2015 | Min et al. |
| 2015/0060796 | A1 | 3/2015 | Kim et al. |
| 2015/0065730 | A1 | 3/2015 | Montenegro et al. |
| 2015/0069352 | A1 | 3/2015 | Kim et al. |
| 2015/0102301 | A1 | 4/2015 | Cho et al. |
| 2015/0115239 | A1 | 4/2015 | Pflumm et al. |
| 2015/0155498 | A1 | 6/2015 | Ahn et al. |
| 2015/0179953 | A1 | 6/2015 | Mujica-Fernaud et al. |
| 2015/0194622 | A1 | 7/2015 | Yamamoto et al. |
| 2015/0207079 | A1 | 7/2015 | Cho et al. |
| 2015/0236262 | A1 | 8/2015 | Cho et al. |
| 2015/0243897 | A1 | 8/2015 | Montenegro et al. |
| 2015/0280136 | A1 | 10/2015 | Ryu et al. |
| 2015/0303379 | A1 | 10/2015 | Lee et al. |
| 2015/0325795 | A1 | 11/2015 | Lee et al. |
| 2015/0325800 | A1 | 11/2015 | Ito et al. |
| 2015/0349270 | A1 | 12/2015 | Lee et al. |
| 2016/0149139 | A1 | 5/2016 | Xia et al. |
| 2016/0197289 | A1 | 7/2016 | Sado et al. |
| 2017/0047527 | A1 | 2/2017 | Lee et al. |
| 2017/0084844 | A1 | 3/2017 | Parham et al. |
| 2017/0117488 | A1 | 4/2017 | Ahn et al. |
| 2017/0207396 | A1 | 7/2017 | Park et al. |

FOREIGN PATENT DOCUMENTS

| | | | |
|---|---|---|---|
| CN | 102858912 | A | 1/2013 |
| CN | 103328420 | A | 9/2013 |
| CN | 104795503 | A | 7/2015 |
| CN | 104860883 | A | 8/2015 |
| CN | 104903421 | A | 9/2015 |
| CN | 105051011 | A | 11/2015 |
| JP | 2010-34548 | A | 2/2010 |
| JP | 2012-156449 | A | 8/2012 |
| JP | 2012-156499 | A | 8/2012 |
| JP | 2014-216576 | A | 11/2014 |
| JP | 2015-167150 | A | 9/2015 |
| KR | 10-2003-0071617 | A | 9/2003 |
| KR | 10-2005-0085046 | A | 8/2005 |
| KR | 10-2005-0086729 | A | 8/2005 |
| KR | 10-2009-0073260 | A | 7/2009 |
| KR | 10-2009-0086057 | A | 8/2009 |
| KR | 10-2010-0105099 | A | 9/2010 |
| KR | 10-2011-0007124 | A | 1/2011 |
| KR | 10-2011-0011647 | A | 2/2011 |
| KR | 10-2011-0015836 | A | 2/2011 |
| KR | 10-2011-0066766 | A | 6/2011 |
| KR | 10-2011-0071127 | A | 6/2011 |
| KR | 10-2011-0118542 | A | 10/2011 |
| KR | 10-2012-0032572 | A | 4/2012 |
| KR | 10-2012-0038374 | A | 4/2012 |
| KR | 10-2012-0042633 | A | 5/2012 |
| KR | 10-2012-0047706 | A | 5/2012 |
| KR | 10-2012-0057611 | A | 6/2012 |
| KR | 10-2012-0088752 | A | 8/2012 |
| KR | 10-2012-0092550 | A | 8/2012 |
| KR | 10-2012-0127746 | A | 11/2012 |
| KR | 10-2013-0039671 | A | 4/2013 |
| KR | 10-2013-0054205 | A | 5/2013 |
| KR | 10-2013-0109471 | A | 10/2013 |
| KR | 10-2013-0115027 | A | 10/2013 |
| KR | 10-2013-0118059 | A | 10/2013 |
| KR | 10-2014-0000259 | A | 1/2014 |
| KR | 10-2014-0006000 | A | 1/2014 |
| KR | 10-2014-0031213 | A | 3/2014 |
| KR | 10-2014-0069199 | A | 6/2014 |
| KR | 10-2014-0073406 | | 6/2014 |
| KR | 10-2014-0073412 | | 6/2014 |
| KR | 10-2014-0074286 | A | 6/2014 |
| KR | 10-2014-0081879 | A | 7/2014 |
| KR | 10-2014-0087883 | A | 7/2014 |
| KR | 10-2014-0092332 | A | 7/2014 |
| KR | 10-2014-0094520 | A | 7/2014 |
| KR | 10-2014-0095072 | A | 7/2014 |
| KR | 10-2014-0095491 | A | 8/2014 |
| KR | 10-2014-0096203 | A | 8/2014 |
| KR | 10-2014-0104895 | A | 8/2014 |
| KR | 10-1427605 | B1 | 8/2014 |
| KR | 10-2014-0108637 | | 9/2014 |
| KR | 10-2014-0124654 | A | 10/2014 |
| KR | 10-2014-0133572 | A | 11/2014 |
| KR | 10-2014-0145456 | A | 12/2014 |
| KR | 10-2014-0145888 | A | 12/2014 |
| KR | 10-2014-0146103 | A | 12/2014 |
| KR | 10-1476231 | B1 | 12/2014 |
| KR | 10-2015-0001101 | A | 1/2015 |
| KR | 10-2015-0006199 | A | 1/2015 |
| KR | 10-2015-0007476 | A | 1/2015 |
| KR | 10-2015-0024735 | A | 3/2015 |
| KR | 10-2015-0034333 | A | 4/2015 |
| KR | 10-2015-0036721 | A | 4/2015 |
| KR | 10-2015-0041652 | A | 4/2015 |
| KR | 10-2015-0042603 | A | 4/2015 |
| KR | 10-2015-0068776 | A | 6/2015 |
| KR | 10-2015-0086721 | | 7/2015 |
| KR | 10-2015-0096593 | | 8/2015 |
| KR | 10-2003-0071617 | A | 9/2015 |
| KR | 10-2015-0124886 | A | 11/2015 |
| WO | WO 2010/107244 | A2 | 9/2010 |
| WO | WO 2010/131855 | A2 | 11/2010 |
| WO | WO 2011/081423 | A2 | 7/2011 |
| WO | 2012/013271 | A1 | 2/2012 |
| WO | WO 2012/026780 | A1 | 3/2012 |
| WO | WO 2012/070233 | A1 | 5/2012 |
| WO | WO 2013/013271 | A1 | 1/2013 |
| WO | WO 2013/088973 | A1 | 6/2013 |
| WO | 2013105747 | A1 | 7/2013 |
| WO | WO 2013/120577 | A1 | 8/2013 |

(56) References Cited

FOREIGN PATENT DOCUMENTS

| | | | | |
|---|---|---|---|---|
| WO | WO 2013/157886 A1 | 10/2013 | | |
| WO | 2013/187894 A1 | 12/2013 | | |
| WO | WO 2014/097711 A1 | 6/2014 | | |
| WO | WO 2014/141725 A1 | 9/2014 | | |
| WO | WO 2014/088284 A1 | 12/2014 | | |
| WO | WO 2015/046916 A1 | 4/2015 | | |
| WO | WO 2015/050391 A1 | 4/2015 | | |
| WO | WO 2015/082056 A1 | 6/2015 | | |
| WO | WO-2015084114 A1 * | 6/2015 | ......... | H01L 51/0072 |
| WO | WO 2015/135625 A1 | 9/2015 | | |
| WO | WO 2015/156587 A1 | 10/2015 | | |
| WO | WO 2015/167199 A1 | 11/2015 | | |
| WO | WO 2015/167259 A1 | 11/2015 | | |
| WO | WO 2015/169412 A1 | 11/2015 | | |
| WO | 2016/013875 A1 | 1/2016 | | |

OTHER PUBLICATIONS

Office Action issued in U.S. Appl. No. 15/273,515 by the USPTO, dated Jan. 22, 2020, 10 pages.
U.S. Office Action dated Apr. 3, 2020, issued in U.S. Appl. No. 14/856,487 (43 pages).
Hu, Jian-Yong, et al.; Synthesis and Photophysical Properties of Pyrene-Based Multiply Conjugated Shaped Light-Emitting Architectures: Toward Efficient Organic-Light Emitting Diodes, InTech Chapter 2, pp. 21-60, dated Jul. 27, 2011.
U.S. Final Office Action dated Aug. 1, 2019, issued in U.S. Appl. No. 15/390,210 by the USPTO, 14 pages.
U.S. Office Action dated Nov. 14, 2019, issued in U.S. Appl. No. 15/390,210 by the USPTO, 12 pages.
U.S. Office Action dated Dec. 13, 2019, issued in U.S. Appl. No. 15/183,627 by the USPTO, 15 pages.
Cosimbescu, Lelia, et al.; Electron Transport Materials: Synthesis, Properties and Device Performance, International Journal of Organic Chemistry, 2012, 2, 101-110. (Year: 2012) 10 pages.
Office action issued in U.S. Appl. No. 15/183,627 by the USPTO, dated Jul. 18, 2019, 14 pages.
U.S. Office Action dated Apr. 3, 2019, issued in U.S. Appl. No. 15/273,515 (12 pages).
U.S. Final Office Action dated Apr. 5, 2019, issued in U.S. Appl. No. 14/856,487 (29 pages).
Concise Description of Relevance of the Third-Party Submission, submitted in U.S. Appl. No. 14/856,487, 9 pages.
Machine Translation of JP 2010-034548 A. Feb. 12, 2010. (Year: 2010).
Yersin, H., "Highly Efficient OLEDs with Phosphorescent Materials," WILEY-VCH Verlag GmbH & Co. 2008. pp. 311-328.
U.S. Office Action dated Aug. 17, 2017, issued in U.S. Appl. No. 15/183,627 (22 pages).
U.S. Office Action dated Nov. 3, 2017, issued in U.S. Appl. No. 14/856,487 (28 pages).
U.S. Final Office Action dated Dec. 15, 2017, issued in U.S. Appl. No. 15/183,627 (12 pages).
U.S. Office Action dated Apr. 6, 2018, issued in U.S. Appl. No. 15/390,294 (13 pages).
U.S. Office Action dated Apr. 6, 2018, issued in U.S. Appl. No. 15/390,210 (14 pages).
U.S. Office Action dated May 24, 2018, issued in U.S. Appl. No. 15/273,515 (11 pages).
U.S. Advisory Action dated Jun. 14, 2018, issued in U.S. Appl. No. 14/856,487 (4 pages).
U.S. Office Action dated Jul. 17, 2018, issued in U.S. Appl. No. 15/183,627 (14 pages).
U.S. Office Action dated Oct. 4, 2018, issued in U.S. Appl. No. 15/182,298 (12 pages).
U.S. Office Action dated Oct. 4, 2018, issued in U.S. Appl. No. 15/372,042 (22 pages).
EPO Extended Search Report dated Jul. 26, 2017, for corresponding European Patent Application No. 17150355.0 (7 pages).
Machine translation of WO 2011/081423 A2 (Year: 2011).
U.S. Final Office Action dated Jun. 8, 2020, issued in U.S. Appl. No. 15/273,515 (12 pages).
U.S. Final Office Action dated Oct. 16, 2020, issued in U.S. Appl. No. 14/856,487 (35 pages).
EPO Office Action dated Mar. 11, 2021, issued in corresponding European Patent Application No. 17150355.0 (4 pages).
Machine translation of WO 2013105747. (Year: 2013).
U.S. Office Action dated Dec. 18, 2020, issued in U.S. Appl. No. 15/273,515 (11 pages).
U.S. Office Action dated Nov. 18, 2020, issued in U.S. Appl. No. 15/372,042 (34 pages).
U.S. Final Office Action dated May 13, 2021, issued in U.S. Appl. No. 15/273,515 (13 pages).
U.S. Office Action dated Aug. 4, 2021, issued in U.S. Appl. No. 15/273,515 (10 pages).
U.S. Office Action dated Oct. 5, 2021, issued in U.S. Appl. No. 14/856,487 (28 pages).
U.S. Final Office Action dated Jan. 5, 2022, issued in U.S. Appl. No. 15/273,515 (10 pages).
U.S. Office Action from U.S. Appl. No. 14/856,487, dated Mar. 15, 2018, 20 pages.
U.S. Office Action from U.S. Appl. No. 14/856,487, dated Sep. 11, 2018, 18 pages.
U.S. Advisory Action from U.S. Appl. No. 14/856,487, dated Dec. 30, 2020, 6 pages.
U.S. Office Action from U.S. Appl. No. 14/856,487, dated Apr. 14, 2022, 46 pages.
U.S. Restriction Requirement from U.S. Appl. No. 15/182,298, dated May 14, 2018, 5 pages.
U.S. Office Action from U.S. Appl. No. 15/182,298, dated Feb. 15, 2019, 11 pages.
U.S. Advisory Action from U.S. Appl. No. 15/182,298, dated Apr. 26, 2019, 2 pages.
U.S. Office Action from U.S. Appl. No. 15/182,298, dated Jun. 17, 2019, 11 pages.
U.S. Notice of Allowance from U.S. Appl. No. 15/182,298, dated Nov. 26, 2019, 8 pages.
U.S. Notice of Allowance from U.S. Appl. No. 15/182,298, dated Mar. 17, 2020, 5 pages.
U.S. Notice of Allowance from U.S. Appl. No. 15/182,298, dated Jun. 24, 2020, 5 pages.
U.S. Notice of Allowance from U.S. Appl. No. 15/182,298, dated Oct. 15, 2020, 5 pages.
U.S. Advisory Action from U.S. Appl. No. 15/183,627, dated Feb. 28, 2018, 4 pages.
U.S. Office Action from U.S. Appl. No. 15/183,627, dated Jan. 14, 2019, 12 pages.
U.S. Advisory Action from U.S. Appl. No. 15/183,627, dated Mar. 25, 2019, 6 pages.
U.S. Advisory Action from U.S. Appl. No. 15/183,627, dated Feb. 26, 2020, 5 pages.
U.S. Office Action from U.S. Appl. No. 15/183,627, dated Jun. 23, 2020, 13 pages.
U.S. Office Action from U.S. Appl. No. 15/183,627, dated Nov. 23, 2020, 10 pages.
U.S. Office Action from U.S. Appl. No. 15/273,515, dated Nov. 21, 2018, 13 pages.
U.S. Advisory Action from U.S. Appl. No. 15/273,515, dated Feb. 14, 2019, 3 pages.
U.S. Office Action from U.S. Appl. No. 15/273,515, dated Sep. 12, 2019, 12 pages.
U.S. Advisory Action from U.S. Appl. No. 15/273,515, dated Nov. 1, 2019, 3 pages.
U.S. Advisory Action from U.S. Appl. No. 15/273,515, dated Aug. 18, 2020, 3 pages.
U.S. Advisory Action from U.S. Appl. No. 15/273,515, dated Mar. 8, 2022, 3 pages.
U.S. Notice of Allowance from U.S. Appl. No. 15/273,515, dated Apr. 27, 2022, 10 pages.
U.S. Notice of Allowance from U.S. Appl. No. 15/293,174, dated Aug. 6, 2019, 8 pages.

(56) References Cited

OTHER PUBLICATIONS

U.S. Notice of Allowance from U.S. Appl. No. 15/293,174, dated Oct. 17, 2019, 8 pages.
U.S. Notice of Allowance from U.S. Appl. No. 15/293,174, dated Jan. 23, 2020, 8 pages.
U.S. Notice of Allowance from U.S. Appl. No. 15/293,174, dated May 5, 2020, 8 pages.
U.S. Notice of Allowance from U.S. Appl. No. 15/293,174, dated Jul. 21, 2020, 8 pages.
U.S. Notice of Allowance from U.S. Appl. No. 15/293,174, dated Jan. 25, 2021, 8 pages.
U.S. Notice of Allowance from U.S. Appl. No. 15/293,174, dated Jun. 10, 2021, 8 pages.
U.S. Notice of Allowance from U.S. Appl. No. 15/293,174, dated Oct. 5, 2021, 8 pages.
U.S. Notice of Allowance from U.S. Appl. No. 15/293,174, dated Feb. 7, 2022, 8 pages.
U.S. Notice of Allowance from U.S. Appl. No. 15/293,174, dated May 18, 2022, 8 pages.
U.S. Office Action from U.S. Appl. No. 15/372,042, dated Mar. 7, 2019, 27 pages.
U.S. Advisory Action from U.S. Appl. No. 15/372,042, dated May 14, 2019, 3 pages.
U.S. Office Action from U.S. Appl. No. 15/372,042, dated Nov. 15, 2019, 20 pages.
U.S. Office Action from U.S. Appl. No. 15/372,042, dated May 12, 2020, 19 pages.
U.S. Advisory Action from U.S. Appl. No. 15/372,042, dated Jul. 31, 2020, 3 pages.
U.S. Office Action from U.S. Appl. No. 15/372,042, dated Jun. 9, 2021, 17 pages.
U.S. Office Action from U.S. Appl. No. 15/390,210, dated Oct. 11, 2018, 18 pages.
U.S. Advisory Action from U.S. Appl. No. 15/390,210, dated Dec. 26, 2018, 3 pages.
U.S. Office Action from U.S. Appl. No. 15/390,210, dated Mar. 5, 2019, 19 pages.
U.S. Advisory Action from U.S. Appl. No. 15/390,210, dated Oct. 4, 2019, 3 pages.
U.S. Office Action from U.S. Appl. No. 15/390,210, dated Apr. 7, 2020, 13 pages.
U.S. Advisory Action from U.S. Appl. No. 15/390,210, dated Jun. 16, 2020, 3 pages.
U.S. Office Action from U.S. Appl. No. 15/390,210, dated Oct. 6, 2020, 12 pages.
U.S. Office Action from U.S. Appl. No. 15/390,210, dated Mar. 23, 2021, 13 pages.
U.S. Notice of Allowance from U.S. Appl. No. 15/390,210, dated Jun. 21, 2021, 8 pages.
U.S. Notice of Allowance from U.S. Appl. No. 15/390,210, dated Oct. 1, 2021, 8 pages.
U.S. Notice of Allowance from U.S. Appl. No. 15/390,210, dated Jan. 31, 2022, 8 pages.
U.S. Notice of Allowance from U.S. Appl. No. 15/390,210, dated May 13, 2022, 8 pages.
U.S. Office Action from U.S. Appl. No. 17/155,893, dated May 9, 2022, 12 pages.
Advisory Action for U.S. Appl. No. 14/856,487 dated Jul. 11, 2022, 4 pages.
Final Office Action for U.S. Appl. No. 17/155,893 dated Aug. 25, 2022, 11 pages.
Notice of Allowance for U.S. Appl. No. 15/293,174 dated Sep. 7, 2022, 5 pages.
Notice of Allowance for U.S. Appl. No. 15/390,210 dated Sep. 6, 2022, 5 pages.
Shin et al. "A New N-flourenyl Carbazole Host Material: Synthesis, Physical Properties and Applications for Highly Efficient Phosphorescent Organic Light Emitting Diodes," Organic Electronics 2011, 12(5), 785-793.
Advisory Action for U.S. Appl. No. 15/273,515 dated Dec. 14, 2022, 3 pages.
Advisory Action for U.S. Appl. No. 17/155,893 dated Nov. 1, 2022, 3 pages.
Final Office Action for U.S. Appl. No. 15/2/3,515 dated Oct. 6, 2022, 11 pages.
Notice of Allowance for U.S. Appl. No. 15/293,174 dated Jan. 12, 2023, 5 pages.
Office Action for U.S. Appl. No. 14/856,487 dated Dec. 1, 2022, 29 pages.
Office Action for U.S. Appl. No. 17/155,893 dated Dec. 20, 2022, 12 pages.
Office Action for U.S. Appl. No. 17/177,049 dated Dec. 27, 2022, 18 pages.
Notice of Allowance for U.S. Appl. No. 15/390,210 dated Jan. 17, 2023, 7 pages.
U.S. Office Action dated Mar. 2, 2023, issued in U.S. Appl. No. 15/273,515 (10 pages).

* cited by examiner

ORGANIC LIGHT-EMITTING DEVICE

CROSS-REFERENCE TO RELATED APPLICATION

This continuation application claims priority to and the benefit of U.S. application Ser. No. 15/293,174, filed on Oct. 13, 2016, entitled ORGANIC LIGHT-EMITTING DEVICE, which claims priority to and the benefit of Korean Patent Application No. 10-2016-0057130, filed on May 10, 2016, in the Korean Intellectual Property Office (KIPO), the entire content of both which is incorporated herein by reference.

BACKGROUND

1. Field

One or more aspects of embodiments of the present disclosure relate to an organic light-emitting device.

2. Description of the Related Art

Organic light-emitting devices are self-emission devices and have wide viewing angles, high contrast ratios, short response times, and excellent luminance, driving voltage, and response speed characteristics, and can produce full-color images.

An example organic light-emitting device may include a first electrode disposed (e.g., positioned) on a substrate, and a hole transport region, an emission layer, an electron transport region, and a second electrode, which are sequentially disposed on the first electrode in this stated order. Holes provided from the first electrode may move toward the emission layer through the hole transport region, and electrons provided from the second electrode may move toward the emission layer through the electron transport region. Carriers, such as holes and electrons, may then recombine in the emission layer to produce excitons. These excitons may transition from an excited state to a ground state, thereby generating light.

SUMMARY

One or more aspects of embodiments of the present disclosure are directed toward an organic light-emitting device.

Additional aspects will be set forth in part in the description which follows and, in part, will be apparent from the description, or may be learned by practice of the presented embodiments.

According to one or more embodiments, an organic light-emitting device includes:

a first electrode;

a second electrode facing the first electrode; and an organic layer between the first electrode and the second electrode, the organic layer including an emission layer, wherein the organic layer includes a first compound, a second compound, a third compound, and a fourth compound, and the first compound to the fourth compound satisfy Equations 1 to 8:

$$E_{1,LUMO} \geq E_{2,LUMO} + 0.15 \text{ electron volts (eV)} \quad \text{Equation 1}$$

$$E_{1,HOMO} \geq E_{2,HOMO} + 0.15 \text{ eV} \quad \text{Equation 2}$$

$$E_{1,T1} \geq E_{4,T1} \quad \text{Equation 3}$$

$$E_{2,T1} \geq E_{4,T1} \quad \text{Equation 4}$$

$$E_{3,T1} \geq E_{4,T1} \quad \text{Equation 5}$$

$$E_{3,LUMO} \geq E_{2,LUMO} + 0.1 \text{ eV} \quad \text{Equation 6}$$

$$-5.6 \text{ eV} \geq E_{3,HOMO} \quad \text{Equation 7}$$

$$E_{gap1} \geq E_{gap3}, \quad \text{Equation 8}$$

wherein, in Equations 1 to 8, $E_{1,LUMO}$ indicates a lowest unoccupied molecular orbital (LUMO) energy level of the first compound, $E_{2,LUMO}$ indicates a LUMO energy level of the second compound, $E_{3,LUMO}$ indicates a LUMO energy level of the third compound, $E_{1,HOMO}$ indicates a highest occupied molecular orbital (HOMO) energy level of the first compound, $E_{2,HOMO}$ indicates a HOMO energy level of the second compound, $E_{3,HOMO}$ indicates a HOMO energy level of the third compound, $E_{1,T1}$ indicates a lowest excited triplet energy level of the first compound, $E_{2,T1}$ indicates a lowest excited triplet energy level of the second compound, $E_{3,T1}$ indicates a lowest excited triplet energy level of the third compound, $E_{4,T1}$ indicates a lowest excited triplet energy level of the fourth compound, $E_{gap1}$ indicates a gap between the LUMO energy level of the first compound and the HOMO energy level of the first compound, and $E_{gap3}$ indicates a gap between the LUMO energy level of the third compound and the HOMO energy level of the third compound.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
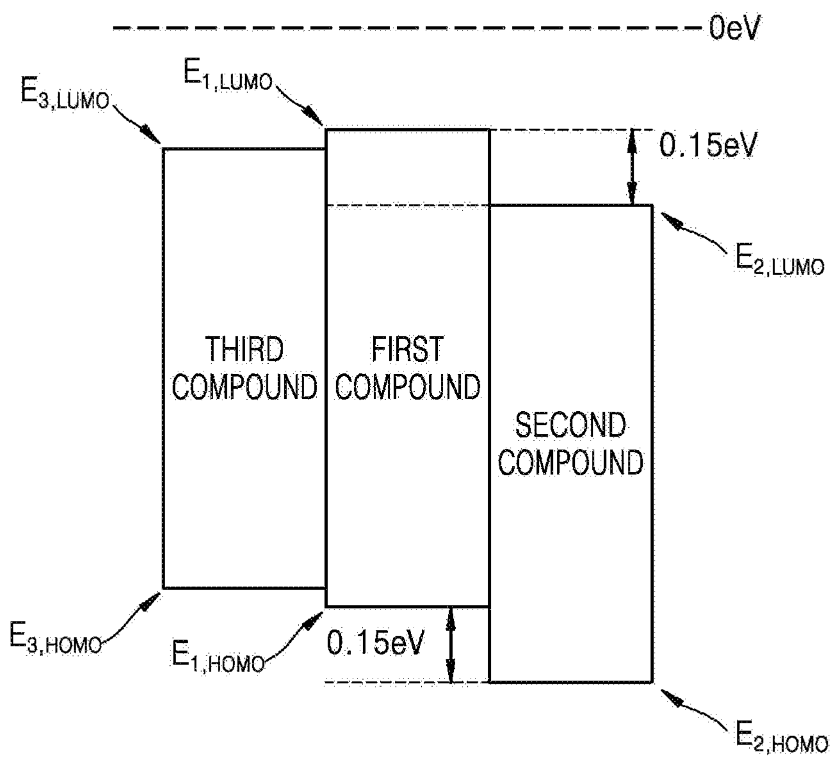
FIG. 1 is a schematic diagram illustrating the relative relationship between highest occupied molecular orbital (HOMO) energy levels and lowest unoccupied molecular orbital (LUMO) energy levels of a first compound, a second compound, and a third compound that are included in an organic light-emitting device according to one or more embodiments.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

According to one or more embodiments, an organic light-emitting device may include a first electrode; a second electrode facing the first electrode; and an organic layer disposed (e.g., positioned) between the first electrode and the second electrode, the organic layer including an emission layer, wherein the organic layer may include a first compound, a second compound, a third compound, and a fourth compound, and the first compound to the fourth compound satisfy Equations 1 to 8:

$$E_{1,LUMO} \geq E_{2,LUMO} + 0.15 \text{ electron volts (eV)} \quad \text{Equation 1}$$

$$E_{1,HOMO} \geq E_{2,HOMO} + 0.15 \text{ eV} \quad \text{Equation 2}$$

$$E_{1,T1} \geq E_{4,T1} \quad \text{Equation 3}$$

$$E_{2,T1} \geq E_{4,T1} \quad \text{Equation 4}$$

$$E_{3,T1} \geq E_{4,T1} \quad \text{Equation 5}$$

$$E_{3,LUMO} \geq E_{2,LUMO} + 0.1 \text{ eV} \quad \text{Equation 6}$$

$$-5.6 \text{ eV} \geq E_{3,HOMO} \quad \text{Equation 7}$$

$$E_{gap1} \geq E_{gap3}, \quad \text{Equation 8}$$

wherein, in Equations 1 to 8, $E_{1,LUMO}$ indicates a lowest unoccupied molecular orbital (LUMO) energy level of the first compound, $E_{2,LUMO}$ indicates a LUMO energy level of the second compound, $E_{3,LUMO}$ indicates a LUMO energy level of the third compound, $E_{1,HOMO}$ indicates a highest occupied molecular orbital (HOMO) energy level of the first compound, $E_{2,HOMO}$ indicates a HOMO energy level of the second compound, $E_{3,HOMO}$ indicates a HOMO energy level of the third compound, $E_{1,T1}$ indicates a lowest excited triplet energy level of the first compound, $E_{2,T1}$ indicates a lowest excited triplet energy level of the second compound, $E_{3,T1}$ indicates a lowest excited triplet energy level of the third compound, $E_{4,T1}$ indicates a lowest excited triplet energy level of the fourth compound, $E_{gap1}$ indicates a gap (e.g., energy gap) between the LUMO energy level of the first compound and the HOMO energy level of the first compound, and $E_{gap3}$ indicates a gap between the LUMO energy level of the third compound and the HOMO energy level of the third compound.

In an embodiment, $E_{1,HOMO}$ may satisfy Equation a, but embodiments are not limited thereto:

$$-5.9 \text{ eV} \leq E_{1,HOMO} \leq -5.3 \text{ eV}. \quad \text{Equation a}$$

In an embodiment, $E_{1,LUMO}$ may satisfy Equation b, but embodiments are not limited thereto:

$$-2.6 \text{ eV} \leq E_{1,LUMO} \leq -2.0 \text{ eV}. \quad \text{Equation b}$$

In an embodiment, $E_{2,HOMO}$ may satisfy Equation c, but embodiments are not limited thereto:

$$-6.4 \text{ eV} \leq E_{2,HOMO} \leq -5.6 \text{ eV}. \quad \text{Equation c}$$

In an embodiment, $E_{2,LUMO}$ may satisfy Equation d, but embodiments are not limited thereto:

$$-3.2 \text{ eV} \leq E_{2,LUMO} \leq -2.4 \text{ eV}. \quad \text{Equation d}$$

In an embodiment, $E_{3,HOMO}$ may satisfy Equation e, but embodiments are not limited thereto:

$$-5.9 \text{ eV} \leq E_{3,HOMO} \leq -5.3 \text{ eV}. \quad \text{Equation e}$$

In an embodiment, $E_{3,LUMO}$ may satisfy Equation f, but embodiments are not limited thereto:

$$-2.7 \text{ eV} \leq E_{3,LUMO} \leq -2.1 \text{ eV}. \quad \text{Equation f}$$

In an embodiment, $E_{4,HOMO}$ may satisfy Equation g, but embodiments are not limited thereto:

$$-5.5 \text{ eV} \leq E_{4,HOMO} \leq -4.5 \text{ eV}, \quad \text{Equation g}$$

wherein, in Equation g, $E_{4,HOMO}$ indicates a HOMO energy level of the fourth compound.

In an embodiment, $E_{1,T1}$ may satisfy Equation h, but embodiments are not limited thereto:

$$2.2 \text{ eV} \leq E_{1,T1} \leq 3.0 \text{ eV}. \quad \text{Equation h}$$

In an embodiment, $E_{2,T1}$ may satisfy Equation i, but embodiments are not limited thereto:

$$2.2 \text{ eV} \leq E_{2,T1} \leq 3.0 \text{ eV}. \quad \text{Equation i}$$

In an embodiment, $E_{3,T1}$ may satisfy Equation j, but embodiments are not limited thereto:

$$2.2 \text{ eV} \leq E_{3,T1} \leq 3.0 \text{ eV}. \quad \text{Equation j}$$

In an embodiment, $E_{4,T1}$ may satisfy Equation k, but embodiments are not limited thereto:

$$1.6 \text{ eV} \leq E_{4,T1} \leq 2.9 \text{ eV}. \quad \text{Equation k}$$

In an embodiment, $E_{gap1}$ may satisfy Equation l, but embodiments are not limited thereto:

$$3.0 \text{ eV} \leq E_{gap1} \leq 3.8 \text{ eV}. \quad \text{Equation l}$$

In an embodiment, $E_{gap3}$ may satisfy Equation m, but embodiments are not limited thereto:

$$3.0 \text{ eV} \leq E_{gap3} \leq 3.8 \text{ eV}. \quad \text{Equation m}$$

In another embodiment, the first compound to the fourth compound may each satisfy Equations 1a to 6a, but embodiments are not limited thereto:

$$E_{1,LUMO} \geq E_{2,LUMO} + 0.2 \text{ eV} \quad \text{Equation 1a}$$

$$E_{1,HOMO} \geq E_{2,HOMO} + 0.2 \text{ eV} \quad \text{Equation 2a}$$

$$E_{1,T1} \geq E_{4,T1} + 0.1 \text{ eV} \quad \text{Equation 3a}$$

$$E_{2,T1} \geq E_{4,T1} + 0.1 \text{ eV} \quad \text{Equation 4a}$$

$$E_{3,T1} \geq E_{4,T1} + 0.1 \text{ eV} \quad \text{Equation 5a}$$

$$E_{3,LUMO} \geq E_{2,LUMO} + 0.2 \text{ eV}. \quad \text{Equation 6a}$$

In some embodiments, the emission layer may include the first compound, the second compound, and the fourth compound, and a hole transport region disposed between the first electrode and the emission layer may include the third compound.

In some embodiments, the hole transport region may include a first layer, the first layer may comprise the third compound, and the first layer may directly contact the emission layer.

According to an embodiment, the first compound may be represented by one of Formulae 1-1, 2-1, 2-2, and 3-1, the second compound may be represented by one of Formulae 1-2, 2-3, 2-4, and 3-2, and the third compound may be represented by Formula 4:

Formula 1-1

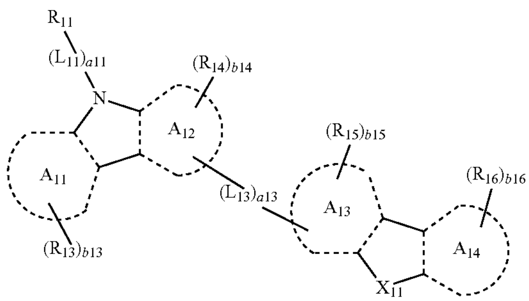

Formula 1-2

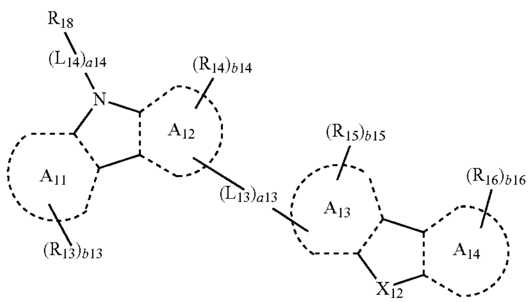

Formula 2-1

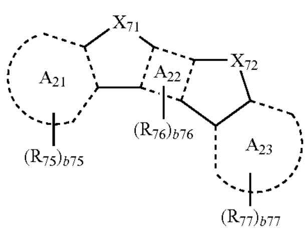

Formula 2-2

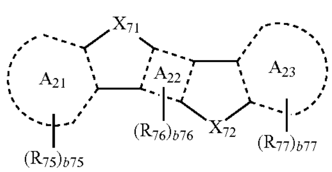

Formula 2-3

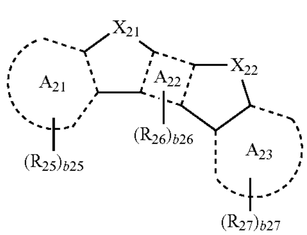

-continued

Formula 2-4

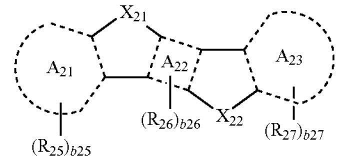

Formula 3-1

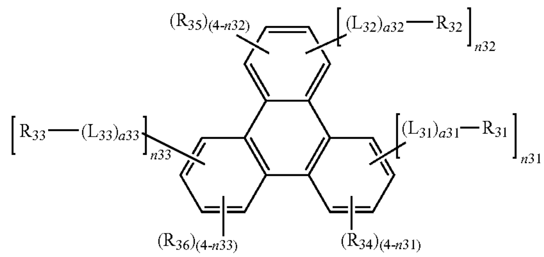

Formula 3-2

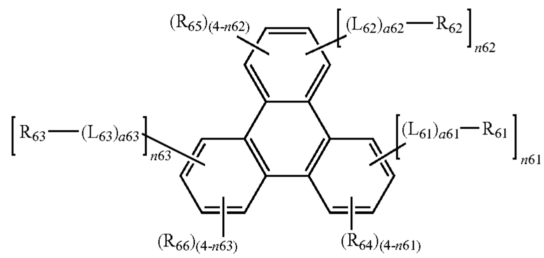

Formula 4

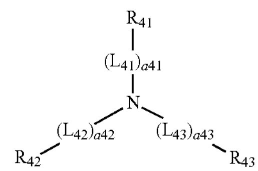

Formula 5

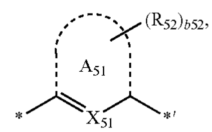

wherein, in Formulae 1-1, 1-2, 2-1 to 2-4, 3-1, 3-2, 4, and 5, $A_{11}$ to $A_{14}$, $A_{21}$ to $A_{23}$, and $A_{51}$ may each independently be selected from a $C_5$-$C_{20}$ carbocyclic group and a $C_1$-$C_{20}$ heterocyclic group, $X_{11}$ may be selected from O, S, $N[(L_{12})_{a12}$-$R_{12}]$, $C[(L_{12})_{a12}$-$R_{12}](R_{17})$, $Si[(L_{12})_{a12}$-$R_{12}](R_{17})$, $P[(L_{12})_{a12}$-$R_{12}]$, $B[(L_{12})_{a12}$-$R_{12}]$, and $P({=}O)[(L_{12})_{a12}$-$R_{12}]$, $X_{12}$ may be selected from O, S, $N[(L_{15})_{a15}$-$R_{19}]$, $C[(L_{15})_{a15}$-$R_{19}](R_{20})$, $Si[(L_{15})_{a15}$-$R_{19}](R_{20})$, $P[(L_{15})_{a15}$-$R_{19}]$, $B[(L_{15})_{a15}$-$R_{19}]$, and $P({=}O)[(L_{15})_{a15}$-$R_{19}]$, $X_{21}$ may be selected from $N[(L_{21})_{a21}$-$R_{21}]$, $C[(L_{21})_{a21}$-$R_{21}](R_{23})$, O, and S, $X_{22}$ may be selected from $N[(L_{22})_{a22}$-$R_{22}]$, $C[(L_{22})_{a22}$-$R_{22}](R_{24})$, O, and S, $X_{51}$ may be selected from N and $CR_{51}$, $X_{71}$ may be selected from $N[(L_{71})_{a71}$-$R_{71}]$, $C[(L_{71})_{a71}$-$R_{71}](R_{73})$, O, and S, $X_{72}$ may be selected from $N[(L_{72})_{a72}$-$R_{72}]$, $C[(L_{72})_{a72}$-$R_{72}](R_{74})$, O, and S, $R_{12}$ and $R_{17}$ may optionally be bound to form a saturated or unsaturated ring, $R_{19}$ and $R_{20}$ may optionally be bound to form a saturated or unsaturated ring, $L_{11}$ to $L_{15}$, $L_{21}$, $L_{22}$, $L_{31}$ to $L_{33}$, $L_{41}$ to $L_{43}$, $L_{61}$ to $L_{63}$, $L_{71}$, and $L_{72}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a11 to a15, a21, a22, a31 to a33, a41 to a43, a61 to a63, a71, and a72 may each independently be selected from 0, 1, 2, 3, 4, and 5, at least one selected from $L_{41}$ to $L_{43}$ may be a group represented by Formula 5, when $L_{41}$ is a group represented by Formula 5, a41 may be selected from 1, 2, 3, 4, and 5; when $L_{42}$ is a group represented by Formula 5, a42 may be selected from 1, 2, 3, 4, and 5; when $L_{43}$ is a group represented by Formula 5, a43 may be selected from 1, 2, 3, 4, and 5, $R_{11}$ to $R_{27}$, $R_{31}$ to $R_{36}$, $R_{41}$ to $R_{43}$, $R_{51}$, $R_{52}$, $R_{61}$ to $R_{66}$, and $R_{71}$ to $R_{77}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)($Q_1$), —S(=O)$_2$($Q_1$), and —P(=O)($Q_1$)($Q_2$), at least one selected from $R_{41}$ to $R_{43}$ may be selected from a substituted or unsubstituted monovalent non-aromatic condensed polycyclic group and a substituted or unsubstituted monovalent non-aromatic condensed heteropolycyclic group, b13 to b16, b25 to b27, b43 to b48, b52, and b75 to b77 may each independently be selected from 1, 2, 3, and 4, n31 to n33 and n61 to n63 may each independently be selected from 0, 1, 2, 3, and 4,

* indicates a binding site to an adjacent atom, and at least one selected from substituent(s) of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from the group consisting of:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($C_{212}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

In some embodiments, in Formulae 1-1, 1-2, 2-1 to 2-4, and 5, $A_{11}$ to A14, $A_{21}$ to $A_{23}$, and $A_{51}$ may each independently be selected from a benzene group, a naphthalene group, a fluorene group, a phenanthrene group, an anthracene group, a triphenylene group, a pyrene group, a chrysene group, a furan group, a thiophene group, a pyrrole group, a pyridine group, a pyrazine group, a pyrimidine group, a pyridazine group, a triazine group, a quinoline group, an isoquinoline group, a 2,6-naphthyridine group, a 1,8-naphthyridine group, a 1,5-naphthyridine group, a 1,6-naphthyridine group, a 1,7-naphthyridine group, a 2,7-naphthyridine group, a quinoxaline group, a quinazoline group, a benzofuran group, a benzothiophene group, a dibenzofuran group, a dibenzothiophene group, and a carbazole group.

In some embodiments, in Formulae 2-1 to 2-4, $X_{21}$ may be $N[(L_{21})_{a21}\text{-}R_{21}]$, $X_{22}$ may be selected from $N[(L_{22})_{a22}\text{-}R_{22}]$, $C[(L_{22})_{a22}\text{-}R_{22}](R_{24})$, O, and S, $X_{71}$ may be $N[(L_{71})_{a71}\text{-}R_{71}]$, and $X_{72}$ may be selected from $N[(L_{72})_{a72}\text{-}R_{72}]$, $C[(L_{72})_{a72}\text{-}R_{72}](R_{74})$, O, and S.

In one or more embodiments, at least one selected from $R_{41}$ to $R_{43}$ may be a group represented by Formula 4a or 4b:

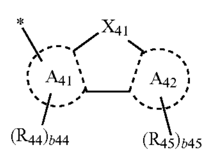

4a

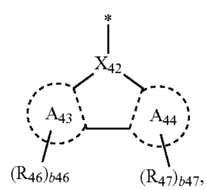

4b wherein, in Formulae 4a and 4b, $X_{41}$ may be selected from $N(R_{401})$, $B(R_{401})$, $C(R_{401})(R_{402})$, $Si(R_{401})(R_{402})$, O, and S, $X_{42}$ may be selected from N, B, $C(R_{403})$, and $Si(R_{403})$, $A_{41}$ to $A_{44}$ may each independently be selected from a benzene group, a naphthalene group, a fluorene group, a phenanthrene group, an anthracene group, a triphenylene group, a pyrene group, a chrysene group, a furan group, a thiophene group, a pyrrole group, a pyridine group, a pyrazine group, a pyrimidine group, a pyridazine group, a triazine group, a quinoline group, an isoquinoline group, a 2,6-naphthyridine group, a 1,8-naphthyridine group, a 1,5-naphthyridine group, a 1,6-naphthyridine group, a 1,7-naphthyridine group, a 2,7-naphthyridine group, a quinoxaline group, a quinazoline group, a benzofuran group, a benzothiophene group, a dibenzofuran group, a dibenzothiophene group, and a carbazole group, descriptions of $R_{44}$ to $R_{47}$ and $R_{401}$ to $R_{403}$ may each independently be the same as the description provided above in connection with $R_{41}$ to $R_{43}$ in Formula 4, b44 to b47 may each independently be selected from 1, 2, 3, and 4, and $R_{401}$ and $R_{402}$ may optionally be bound to form a saturated or unsaturated ring.

In some embodiments, $L_{11}$ to $L_{13}$, $L_{31}$ to $L_{33}$, $L_{71}$, and $L_{72}$ may each independently be selected from the group consisting of:

a phenylene group, a naphthylene group, a fluorenylene group, a spiro-bifluorenylene group, a benzofluorenylene group, a dibenzofluorenylene group, a phenanthrenylene group, an anthracenylene group, a triphenylenylene group, a thiophenylene group, a furanylene group, a carbazolylene group, a benzofuranylene group, a benzothiophenylene group, a dibenzofuranylene group, a dibenzothiophenylene group, a dibenzosilolylene group, a benzocarbazolylene group, and a dibenzocarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a triphenylenylene group, a thiophenylene group, a furanylene group, a carbazolylene group, a benzofuranylene group, a benzothiophenylene group, a dibenzofuranylene group, a dibenzothiophenylene group, a dibenzosilolylene group, a benzocarbazolylene group, and a dibenzocarbazolylene group, each substituted with at least one selected from deuterium, a methyl group, an ethyl group, an n-propyl group, an iso-propyl group, an n-butyl group, a sec-butyl group, an iso-butyl group, a tert-butyl group, a methoxy group, an ethoxy group, an n-propoxy group, an iso-propoxy group, an n-butoxy group, a sec-butoxy group, an iso-butoxy group, a tert-butoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a thiophenyl group, a furanyl group, a carbazolyl group, a benzofuranyl group, a benzothiophenyl group, a dibenzofuranyl group, a dibenzothiophenyl group, a dibenzosilolyl group, a benzocarbazolyl group, a dibenzocarbazolyl group, —$N(Q_{31})(Q_{32})$, —$Si(Q_{31})(Q_{32})(Q_{33})$, and —$B(Q_{31})(Q_{32})$, and $L_{14}$, $L_{15}$, $L_{21}$, $L_{22}$, and $L_{61}$ to $L_{63}$ may each independently be selected from the group consisting of:

a phenylene group, a naphthylene group, a fluorenylene group, a spiro-bifluorenylene group, a benzofluorenylene group, a dibenzofluorenylene group, a phenanthrenylene group, an anthracenylene group, a triphenylenylene group, a thiophenylene group, a furanylene group, a pyridinylene group, a pyrazinylene group, a pyrimidinylene group, a pyridazinylene group, a triazinylene group, a carbazolylene group, a benzofuranylene group, a benzothiophenylene group, a dibenzofuranylene group, a dibenzothiophenylene group, a dibenzosilolylene group, a benzocarbazolylene group, and a dibenzocarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a triphenylenylene group, a thiophenylene group, a furanylene group, a pyridinylene group, a pyrazinylene group, a pyrimidinylene group, a pyridazinylene group, a triazinylene group, a carbazolylene group, a benzofuranylene group, a benzothiophenylene group, a dibenzofuranylene group, a dibenzothiophenylene group, a dibenzosilolylene group, a benzocarbazolylene group, and a dibenzocarbazolylene group, each substituted with at least one selected from deuterium, —F, a cyano group, a methyl group, an ethyl group, an n-propyl group, an iso-propyl group, an n-butyl group, a sec-butyl group, an iso-butyl group, a tert-butyl group, a methoxy group, an ethoxy group, an n-propoxy group, an iso-propoxy group, an n-butoxy group, a sec-butoxy group, an iso-butoxy group, a tert-butoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a thiophenyl group, a furanyl group, a pyridinyl group, a pyrazinyl group, a pyrimidinyl group, a pyridazinyl group, a triazinyl group, a carbazolyl group, a benzofuranyl group, a benzothiophenyl group, a dibenzofuranyl group, a dibenzothiophenyl group, a dibenzosilolyl group, a benzocarbazolyl group, a dibenzocarbazolyl group, —N($Q_{31}$)($Q_{32}$), —Si($Q_{31}$)($Q_{32}$)($Q_{33}$), and —B($Q_{31}$)($Q_{32}$), wherein $Q_{31}$ to $Q_{33}$ may each independently be selected from a methyl group, an ethyl group, an n-propyl group, an iso-propyl group, an n-butyl group, a sec-butyl group, an iso-butyl group, a tert-butyl group, a phenyl group, a biphenyl group, a terphenyl group, and a naphthyl group.

In some embodiments, $L_{41}$ to $L_{43}$ may each independently be selected from selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a benzocarbazolylene group, and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, dibenzosilolylene group, a benzocarbazolylene group, and a dibenzocarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be selected from hydrogen, a methyl group, an ethyl group, an n-propyl group, an iso-propyl group, a tert-butyl group, a phenyl group, a biphenyl group, and a terphenyl group, but embodiments are not limited thereto.

According to an embodiment, $L_{41}$ to $L_{43}$ in Formula 4 may each independently be selected from groups represented by Formulae 4-1 to 4-31, but embodiments are not limited thereto:

4-1

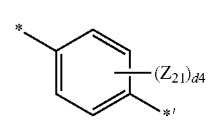

-continued
4-2
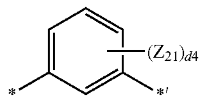
4-3
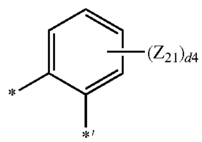
4-4
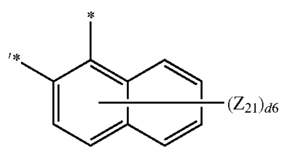
4-5
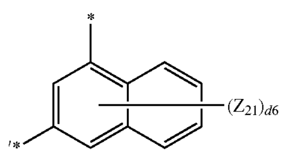
4-6
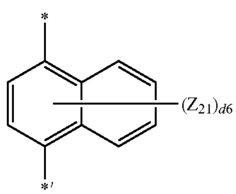
4-7
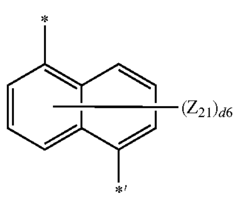
4-8
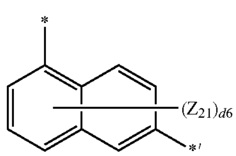
4-9
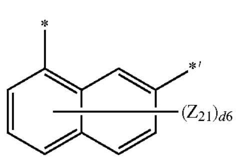
4-10
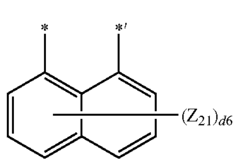
4-11
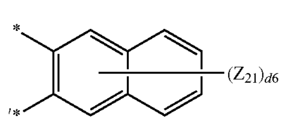
-continued
4-12
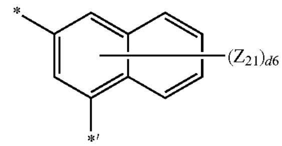
4-13
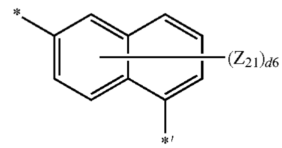
4-14
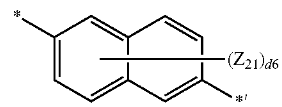
4-15
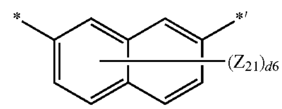
4-16
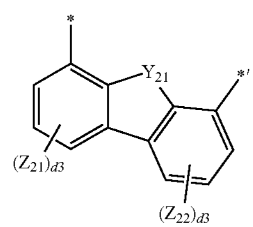
4-17
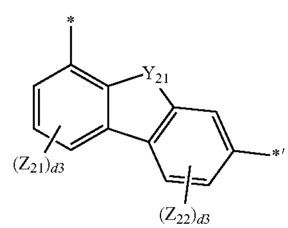
4-18
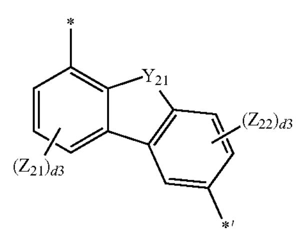
4-19
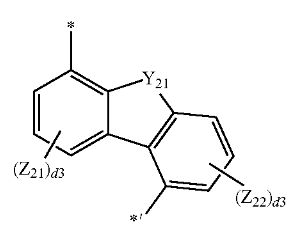
4-20
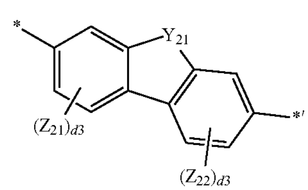

-continued 4-21
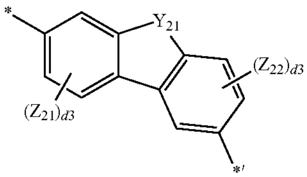

4-22
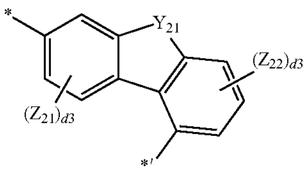

4-23
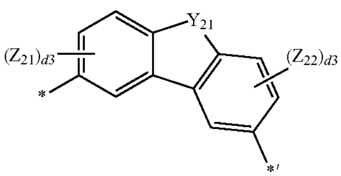

4-24
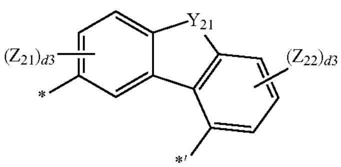

4-25
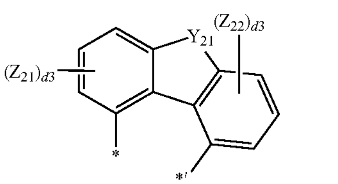

4-26
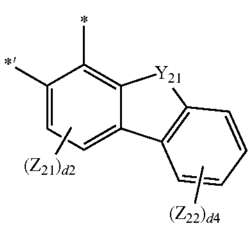

4-27
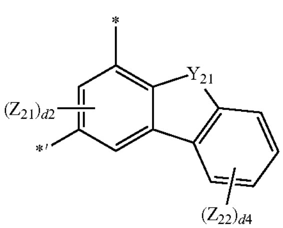

4-28
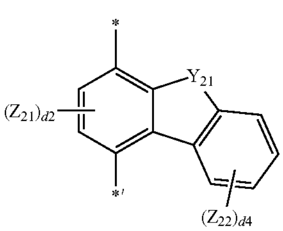

-continued 4-29
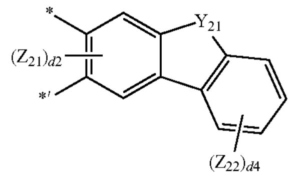

4-30
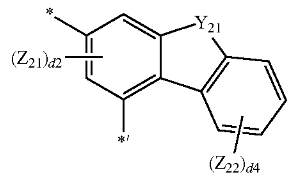

4-31
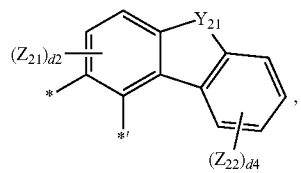

wherein, in Formulae 4-1 to 4-31, $Y_{21}$ may be selected from O, S, $N(R_{43})$, $C(R_{43})(R_{44})$, and $Si(R_{43})(R_{44})$, wherein $R_{43}$ and $R_{44}$ are as defined herein, $Z_{21}$ and $Z_{22}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$, wherein $Q_{31}$ to $Q_{33}$ may each independently be selected from hydrogen, a methyl group, an ethyl group, an n-propyl group, an iso-propyl group, a tert-butyl group, a phenyl group, a biphenyl group, and a terphenyl group, d2 may be an integer selected from 1 and 2, d3 may be an integer selected from 1 to 3, d4 may be an integer selected from 1 to 4, d6 may be an integer selected from 1 to 6, and

* and *' each independently indicate a binding site to an adjacent atom.

In one or more embodiments, compound represented by Formula 5 may be represented by one selected from Formulae 4-2, 4-5, 4-27, and 4-30, but embodiments are not limited thereto.

In some embodiments, a11 to a15, a21, a22, a31 to a33, a41 to a43, a61 to a63, a71, and a72 may each independently be selected from 0, 1, 2, and 3.

In an embodiment, $R_{11}$ to $R_{17}$, $R_{31}$ to $R_{36}$, $R_{51}$, $R_{52}$, and $R_{71}$ to $R_{77}$ may each independently be a hole transporting group, and $R_{18}$ to $R_{27}$, $R_{41}$ to $R_{47}$, and $R_{61}$ to $R_{66}$ may each independently be selected from a hole transporting group and an electron transporting group, but embodiments are not limited thereto.

In some embodiments, the hole transporting group may be selected from a $C_1$-$C_{20}$ alkyl group, $—Si(Q_1)(Q_2)(Q_3)$, $—N(Q_1)(Q_2)$, and a group represented by any of Formulae 5-1 to 5-19:

5-1
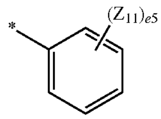
5-2
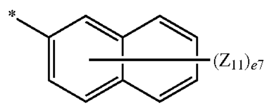
5-3
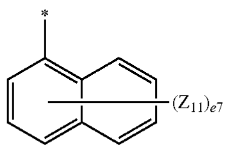
5-4
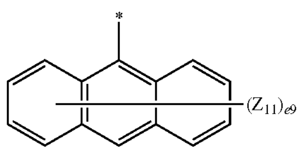
5-5
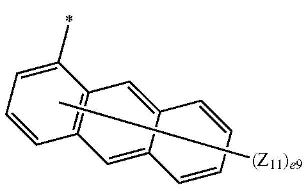
5-6
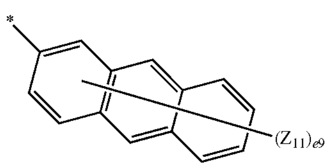
5-7
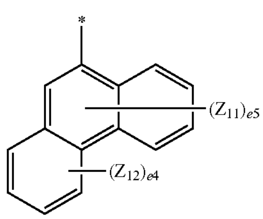
5-8
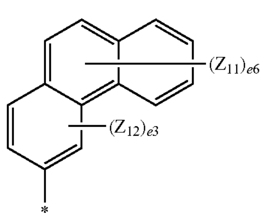
5-9
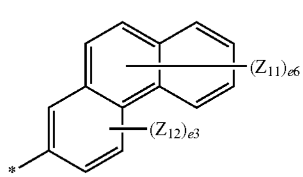
-continued
5-10
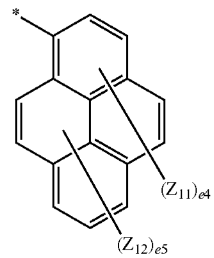
5-11
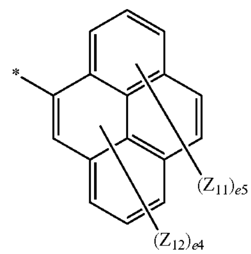
5-12
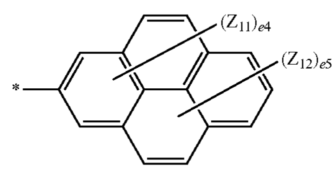
5-13
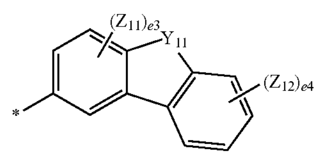
5-14
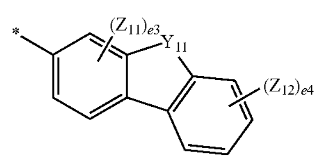
5-15
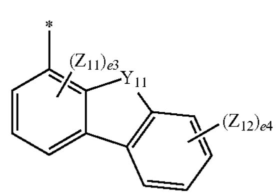
5-16
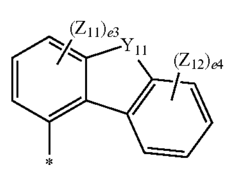
5-17
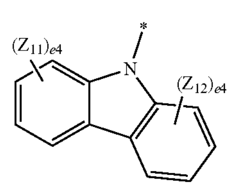

-continued 5-18

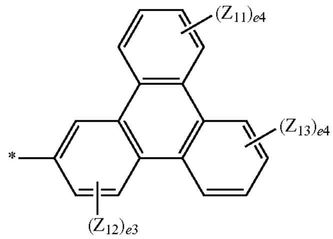

5-19

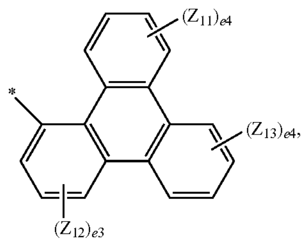

wherein, in Formulae 5-1 to 5-19, $Y_{11}$ may be selected from O, S, $C(Z_{13})(Z_{14})$, $N(Z_{13})$, and $Si(Z_{13})(Z_{14})$, $Z_{11}$ to $Z_{14}$ may each independently be selected from the group consisting of:

hydrogen, deuterium, a hydroxyl group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a benzofuranyl group, a benzothiophenyl group, a benzosilolyl group, an isobenzothiazolyl group, a dibenzofuranyl group, a dibenzothiophenyl group, a dibenzosilolyl group, a carbazolyl group, a benzocarbazolyl group, a dibenzocarbazolyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$; and a phenyl group, a biphenyl group, a terphenyl group, a naphthyl group, a dibenzofuranyl group, a dibenzothiophenyl group, a dibenzosilolyl group, a carbazolyl group, a benzocarbazolyl group, and a dibenzocarbazolyl group, each substituted with at least one selected from a $C_1$-$C_{20}$ alkyl group, a $C_1$-$C_{20}$ alkoxy group, a phenyl group, a biphenyl group, a terphenyl group, a naphthyl group, a carbazolyl group, a fluorenyl group, $—Si(Q_{21})(Q_{22})(Q_{23})$, and $—N(Q_{21})(Q_{22})$, wherein $Q_1$ to $Q_3$, $Q_{21}$ to $Q_{23}$, and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, e2 may be an integer selected from 1 and 2, e3 may be an integer selected from 1 to 3, e4 may be an integer selected from 1 to 4, e5 may be an integer selected from 1 to 5, e6 may be an integer selected from 1 to 6, e7 may be an integer selected from 1 to 7, e9 may be an integer selected from 1 to 9, and

* indicates a binding site to an adjacent atom.

In some embodiments, the electron transporting group may be selected from the group consisting of:

a cyano group, —F, and $—CF_3$;

a $C_6$-$C_{60}$ aryl group substituted with at least one selected from a cyano group, —F, and $—CF_3$; and a $C_1$-$C_{60}$ heterocyclic group having at least one *=N—*' moiety as a ring-forming moiety, but embodiments are not limited thereto.

In some embodiments, the electron transporting group may be selected from —CN, $—CF_3$, and a group represented by any of Formulae 6-1 to 6-128, but embodiments are not limited thereto:

6-1

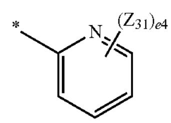

6-2

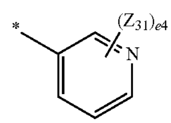

6-3

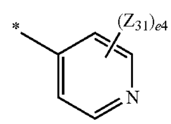

6-4

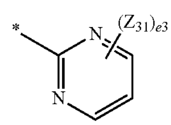

6-5

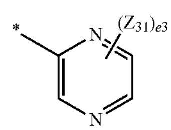

6-6

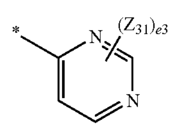

6-7

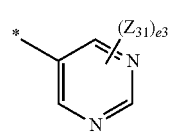

6-8

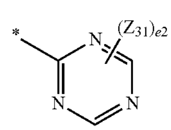

6-9

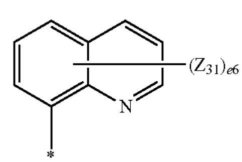

-continued
6-10
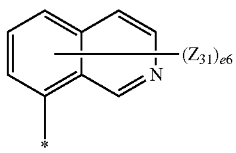
6-11
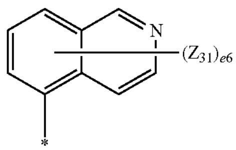
6-12
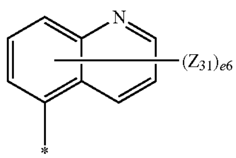
6-13
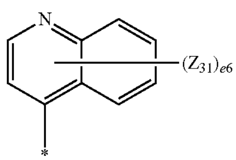
6-14
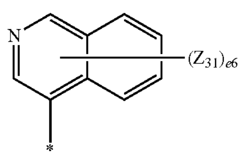
6-15
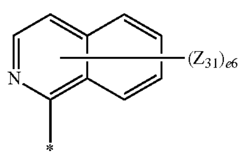
6-16
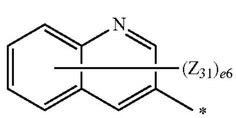
6-17
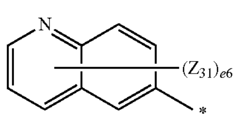
6-18
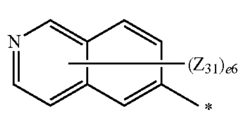
6-19
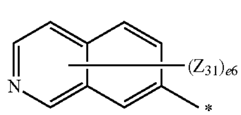
-continued
6-20
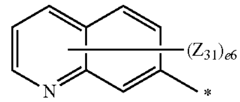
6-21
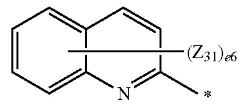
6-22
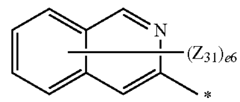
6-23
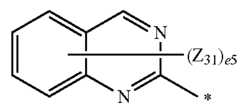
6-24
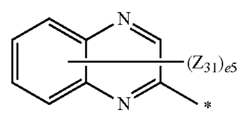
6-25
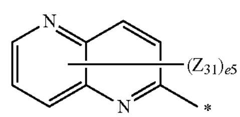
6-26
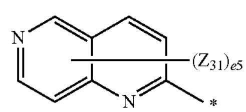
6-27
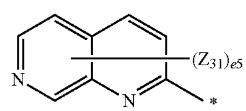
6-28
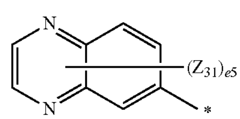
6-29
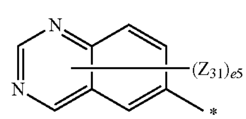
6-30
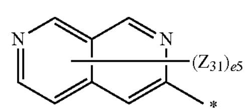
6-31
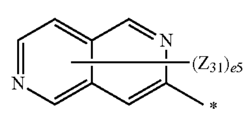
6-32
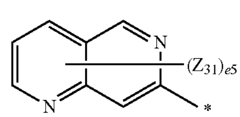

-continued
6-33
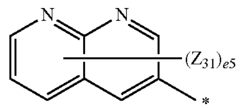
6-34
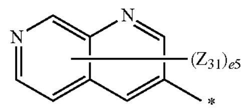
6-35
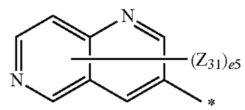
6-36
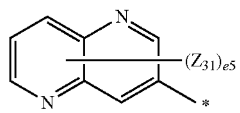
6-37
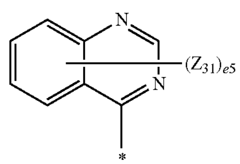
6-38
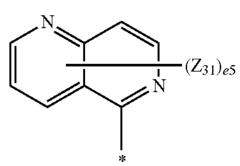
6-39
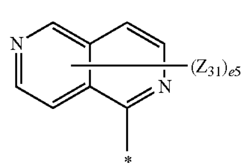
6-40
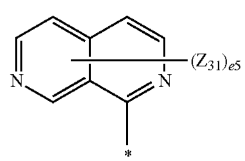
6-41
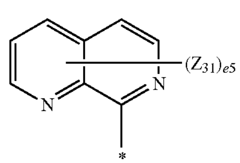
6-42
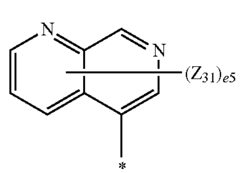
-continued
6-43
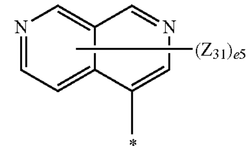
6-44
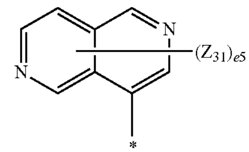
6-45
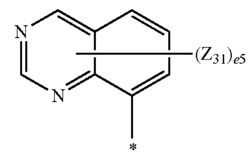
6-46
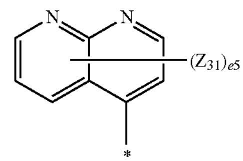
6-47
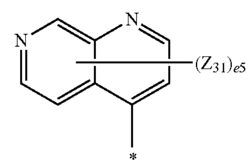
6-48
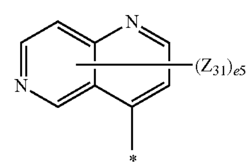
6-49
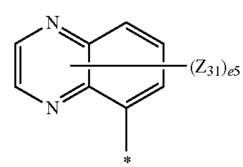
6-50
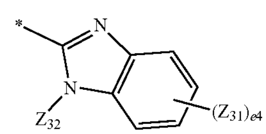
6-51
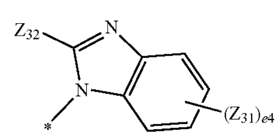
6-52
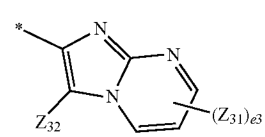

-continued
6-53
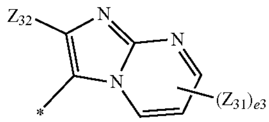
6-54
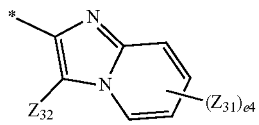
6-55
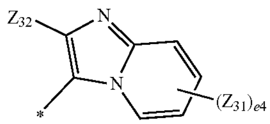
6-56
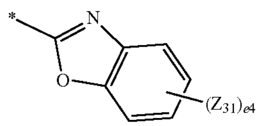
6-57
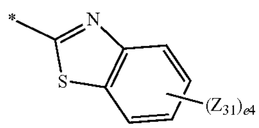
6-58
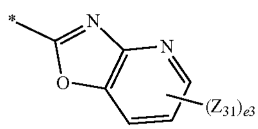
6-59
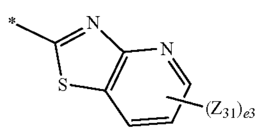
6-60
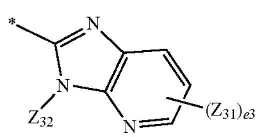
6-61
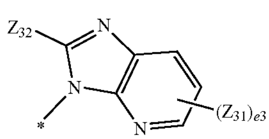
6-62
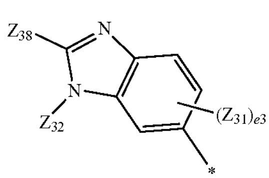
6-63
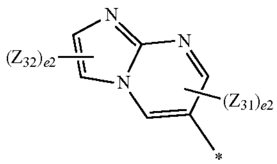
-continued
6-64
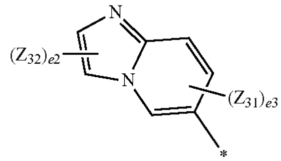
6-65
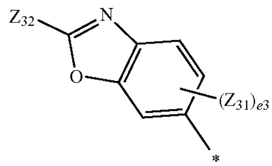
6-66
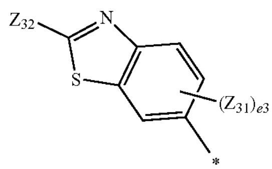
6-67
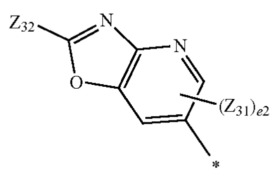
6-68
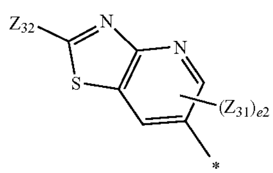
6-69
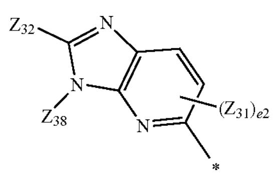
6-70
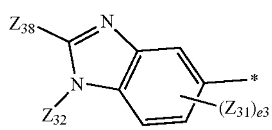
6-71
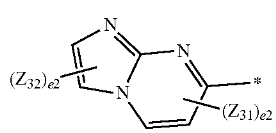
6-72
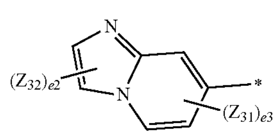
6-73
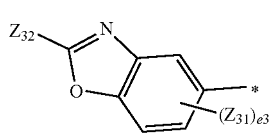

-continued
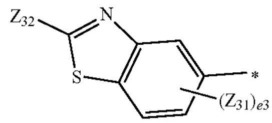
6-74
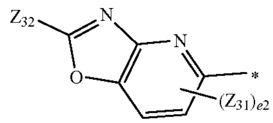
6-75
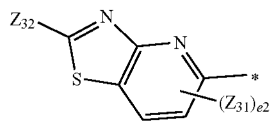
6-76
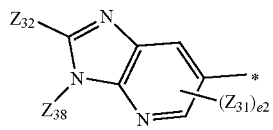
6-77
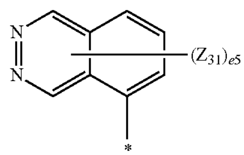
6-78
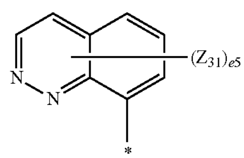
6-79
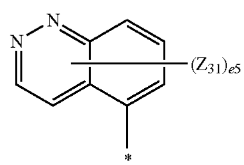
6-80
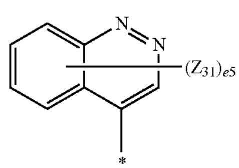
6-81
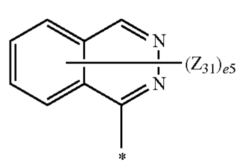
6-82
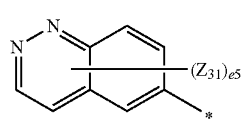
6-83
-continued
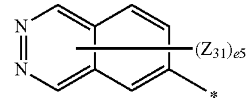
6-84
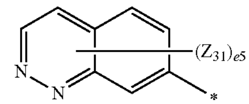
6-85
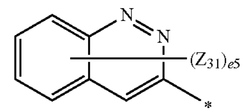
6-86
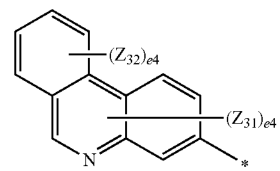
6-87
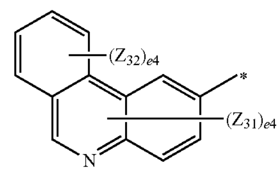
6-88
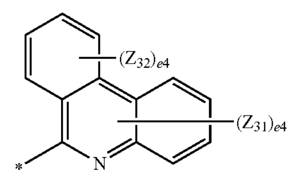
6-89
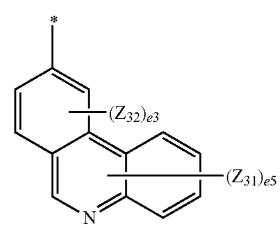
6-90
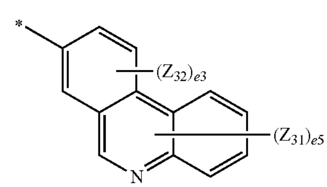
6-91
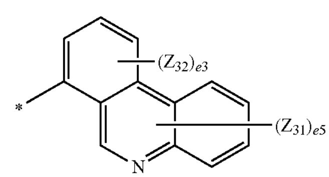
6-92

-continued
6-93
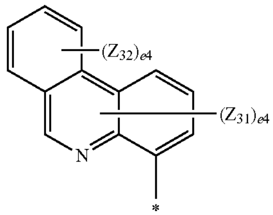
6-94
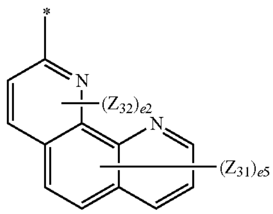
6-95
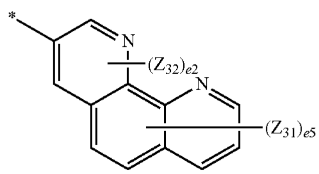
6-96
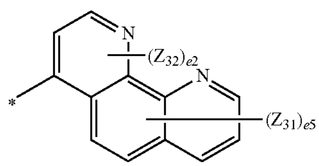
6-97
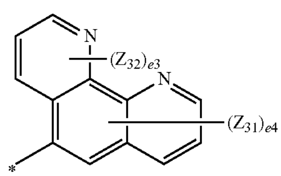
6-98
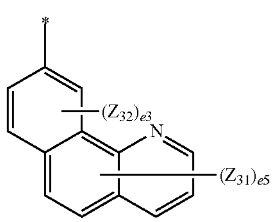
6-99
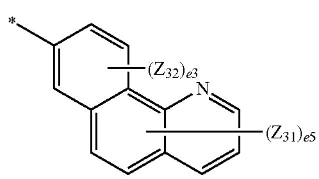
6-100
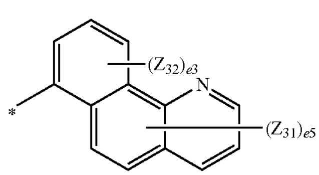
-continued
6-101
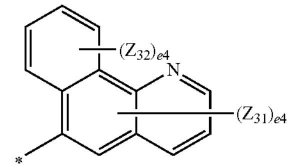
6-102
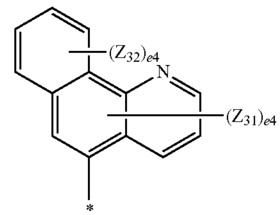
6-103
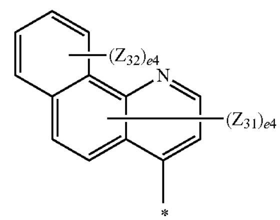
6-104
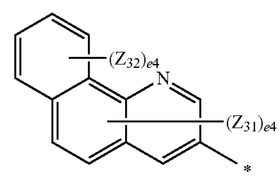
6-105
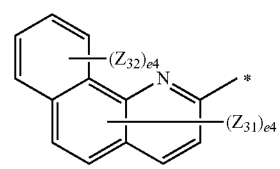
6-106
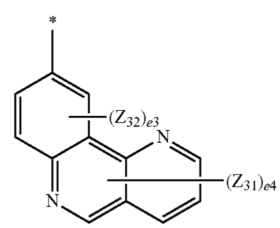
6-107
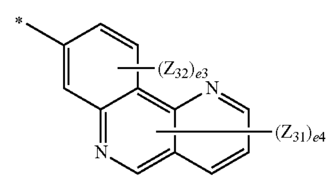
6-108
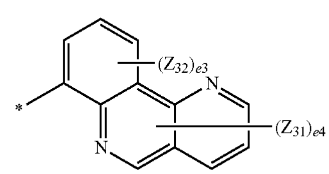

-continued
6-109
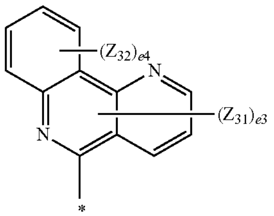
6-110
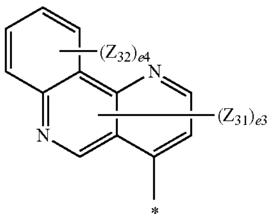
6-111
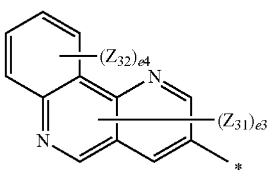
6-112
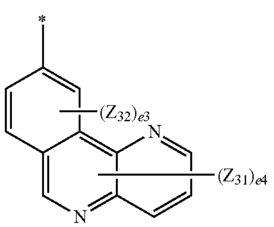
6-113
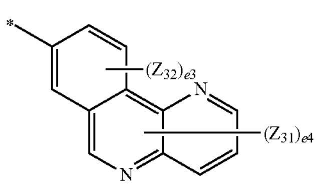
6-114
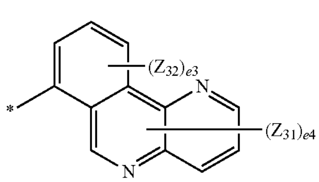
6-115
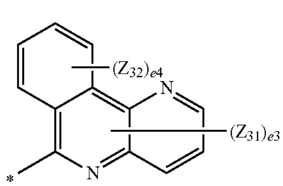
-continued
6-116
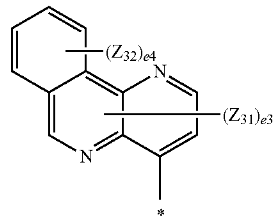
6-117
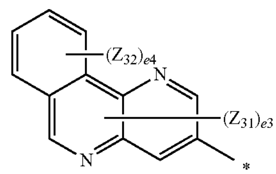
6-118
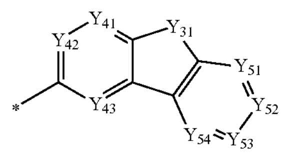
6-119
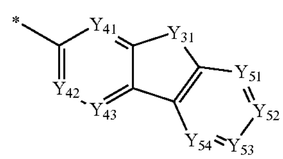
6-120
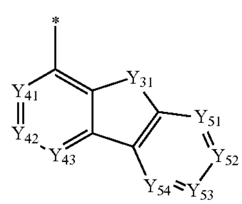
6-121
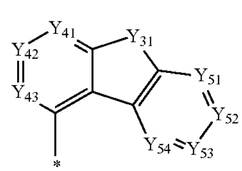
6-122
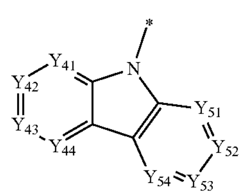
6-123
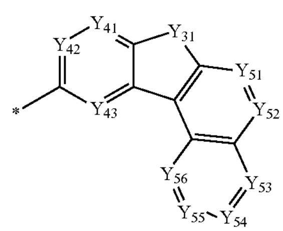

-continued 6-124

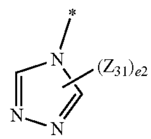

6-125

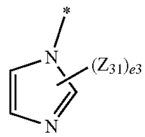

6-126

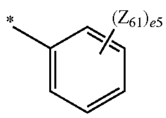

6-127

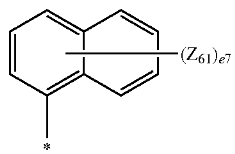

6-128

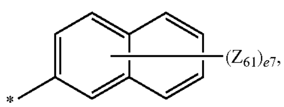

wherein, in Formulae 6-1 to 6-128, $Y_{31}$ may be selected from O, S, $C(Z_{33})(Z_{34})$, $N(Z_{33})$, and $Si(Z_{33})(Z_{34})$, $Y_{41}$ may be N or $C(Z_{41})$, $Y_{42}$ may be N or $C(Z_{42})$, $Y_{43}$ may be N or $C(Z_{43})$, $Y_{44}$ may be N or $C(Z_{44})$, $Y_{51}$ may be N or $C(Z_{51})$, $Y_{52}$ may be N or $C(Z_{52})$, $Y_{53}$ may be N or $C(Z_{53})$, $Y_{54}$ may be N or $C(Z_{54})$, $Y_{55}$ may be N or $C(Z_{55})$, $Y_{56}$ may be N or $C(Z_{56})$, at least one selected from $Y_{41}$ to $Y_{43}$ and $Y_{51}$ to $Y_{54}$ in Formulae 6-118 to 6-121 may be N, at least one selected from $Y_{41}$ to $Y_{44}$ and $Y_{51}$ to $Y_{54}$ in Formula 6-122 may be N, at least one selected from $Y_{41}$ to $Y_{43}$ and $Y_{51}$ to $Y_{56}$ in Formula 6-123 may be N, $Z_{31}$ to $Z_{34}$, $Z_{41}$ to $Z_{44}$, and $Z_{51}$ to $Z_{56}$ may each independently be selected from the group consisting of:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$; and a phenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{20}$ alkyl group, a $C_1$-$C_{20}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, a quinazolinyl group, a carbazolyl group, a fluorenyl group, $—Si(Q_{21})(Q_{22})(Q_{23})$, and $—N(Q_{21})(Q_{22})$, $Z_{61}$ may be selected from hydrogen, a cyano group, —F, and $—CF_3$, provided that at least one $Z_{61}$ may be selected from a cyano group, —F, and $—CF_3$, wherein $Q_{21}$ to $Q_{23}$ and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, e2 may be an integer selected from 1 and 2, e3 may be an integer selected from 1 to 3, e4 may be an integer selected from 1 to 4, e5 may be an integer selected from 1 to 5, e6 may be an integer selected from 1 to 6, e7 may be an integer selected from 1 to 7, and

* indicates a binding site to an adjacent atom.

In some embodiments, the first compound represented by Formula 1-1 may be represented by Formula 1-11, and the second compound represented by Formula 1-2 may be represented by Formula 1-21:

1-11

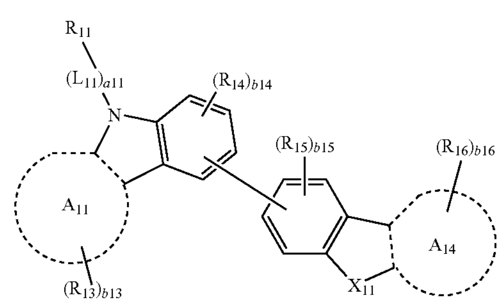

-continued 1-21

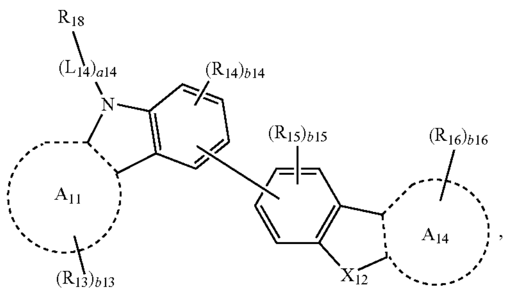

wherein, in Formulae 1-11 and 1-21, definitions of $A_{11}$, $A_{14}$, $X_{11}$, $X_{12}$, $L_{11}$, $L_{13}$, $L_{14}$, a11, a13, a14, $R_{11}$, $R_{13}$ to $R_{16}$, $R_{18}$, and b13 to b16 may be respectively the same as those provided above in connection with Formulae 1-1 and 1-2.

In some embodiments, the first compound represented by Formula 2-1 or 2-2 may be represented by one of Formulae 2-11 to 2-15 and 2-21 to 2-23, and the second compound represented by Formula 2-3 or 2-4 may be represented by one of Formulae 2-31 to 2-35 and 2-41 to 2-43, but embodiments are not limited thereto:

2-11

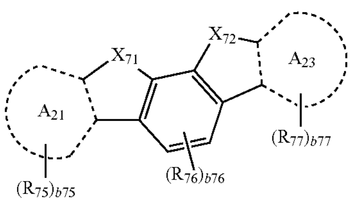

2-12

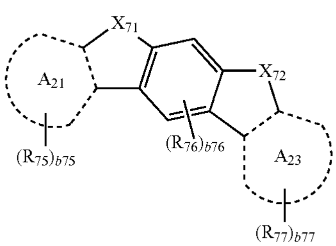

2-13

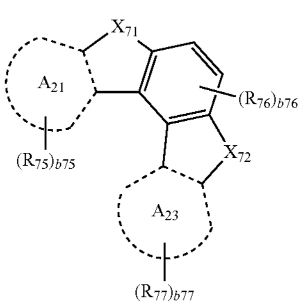

2-14

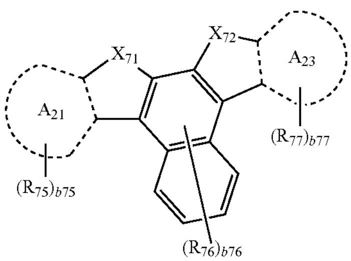

-continued 2-15

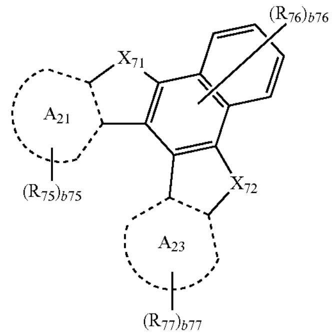

2-21

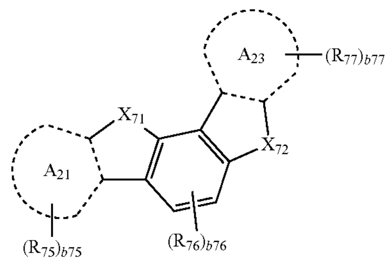

2-22

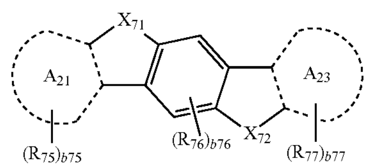

2-23

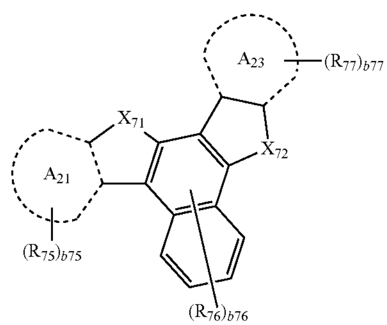

2-31

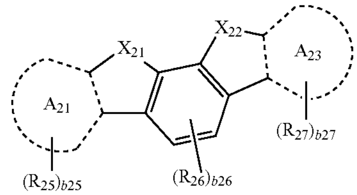

2-32

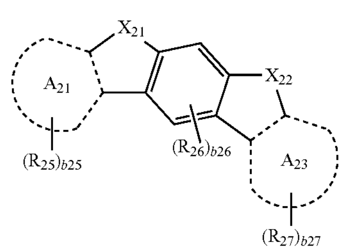

-continued 2-33

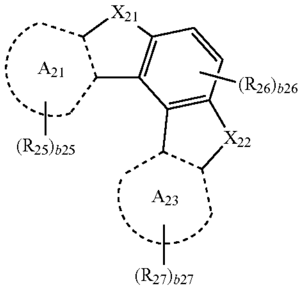

2-34

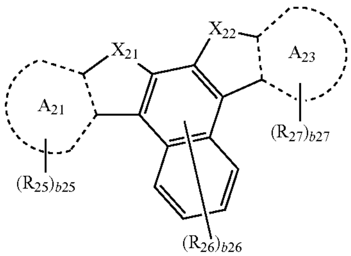

2-35

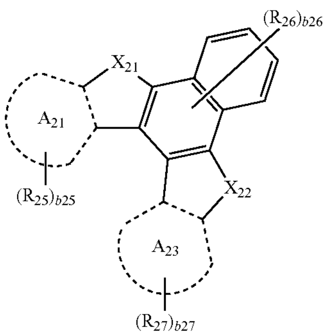

2-41

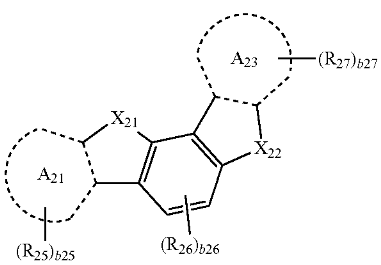

2-42

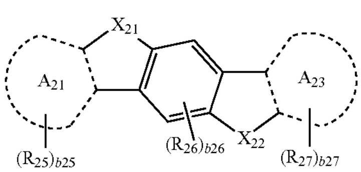

2-43

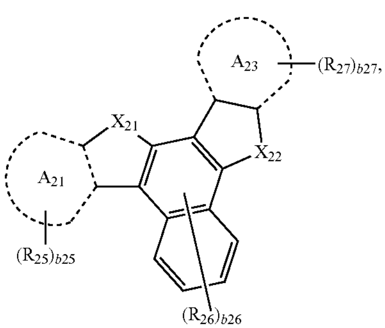

wherein, in Formulae 2-11 to 2-15, 2-21 to 2-23, 2-31 to 2-35, and 2-41 to 2-43, descriptions of $A_{21}$, $A_{23}$, $X_{21}$, $X_{22}$, $X_{71}$, $X_{72}$, $R_{25}$ to $R_{27}$, $R_{75}$ to $R_{77}$, b25 to b27, and b75 to b77 are respectively the same as those provided above in connection with Formulae 2-1 to 2-4.

In some embodiments, the first compound represented by Formula 1-1 may be selected from Compounds B-101 to B-230, the second compound represented by Formula 1-2 may be selected from Compounds A-101 to A-206, the first compound represented by Formula 2-1 or 2-2 may be selected from Compounds G-101 to G-173, the second compound represented by Formula 2-3 or 2-4 may be selected from Compounds C-101 to C-270, the first compound represented by Formula 3-1 may be selected from Compounds E-101 to E-182, the second compound represented by Formula 3-2 may be selected from Compounds D-101 to D-159, and the third compound represented by Formula 4 may be selected from Compounds F-101 to F-313:

B-101

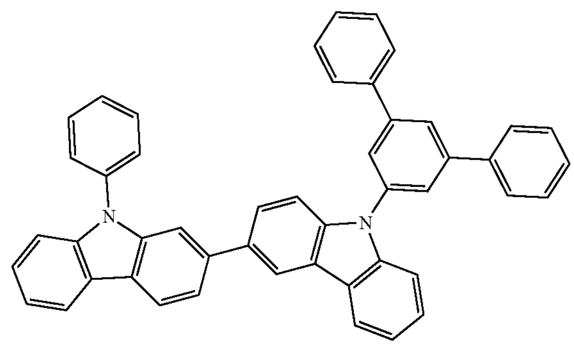

B-102

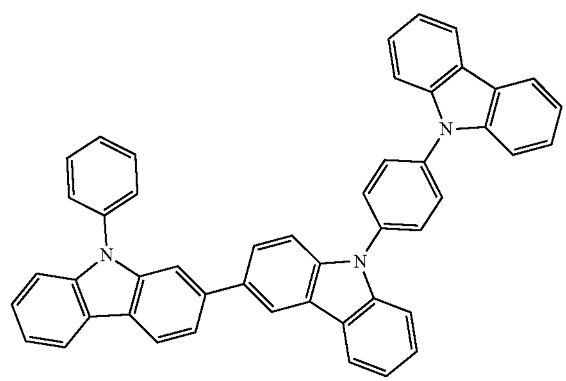

B-103

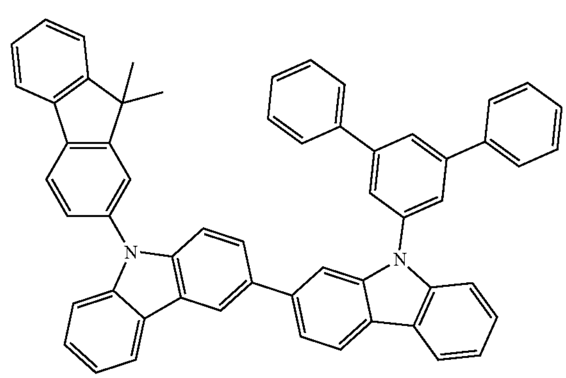

B-104
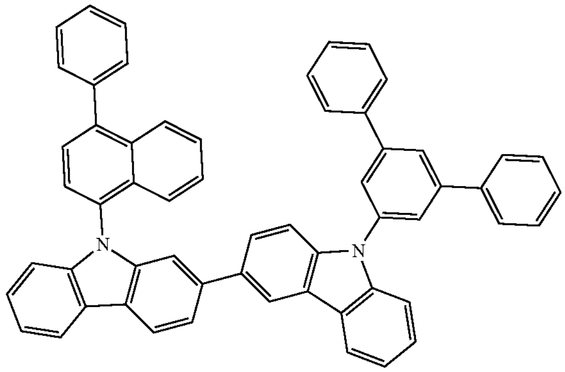
B-105
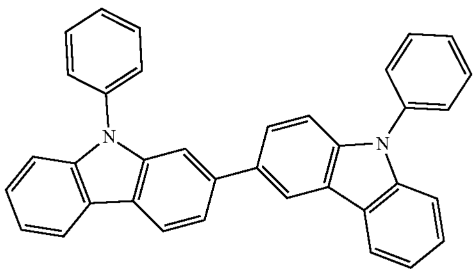
B-106
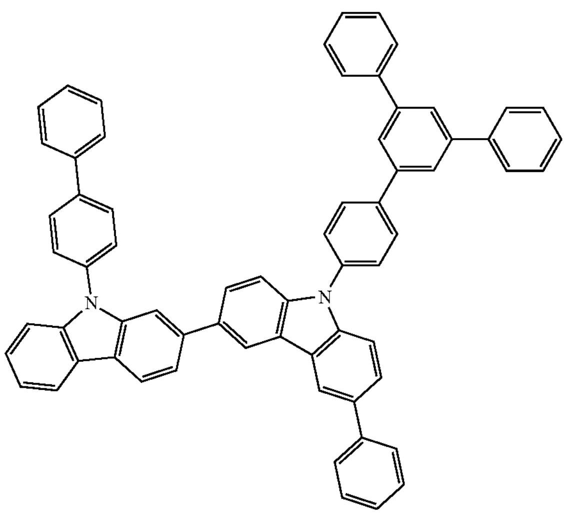
B-107
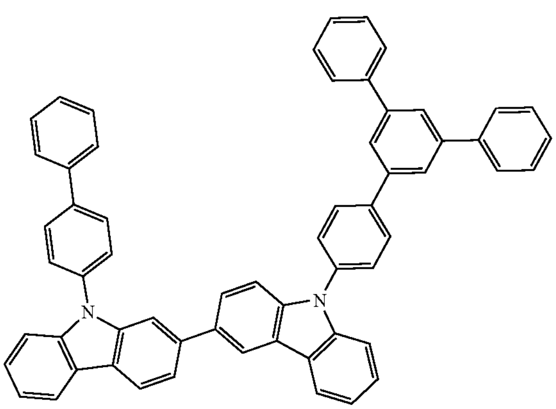
B-108
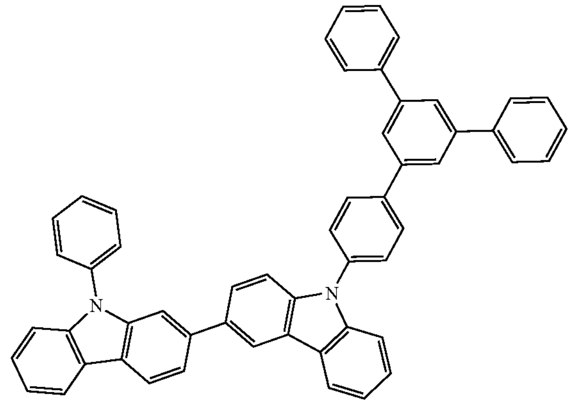
B-109
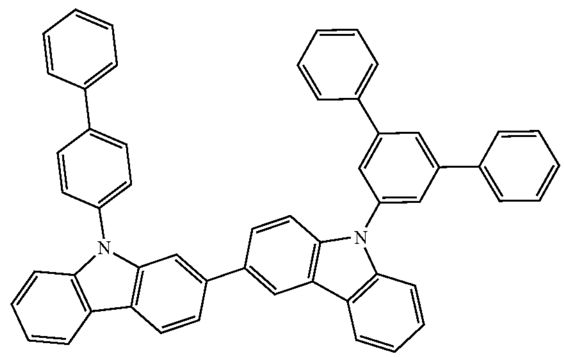
B-110
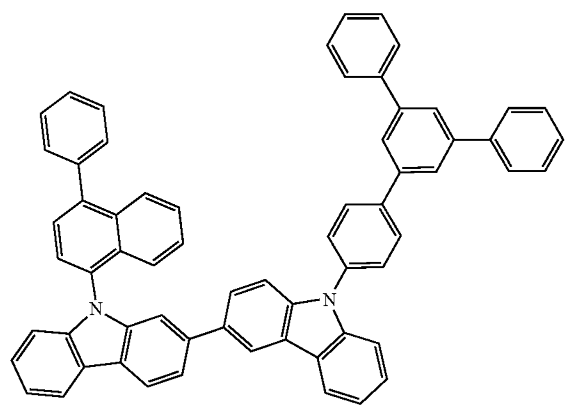
B-111
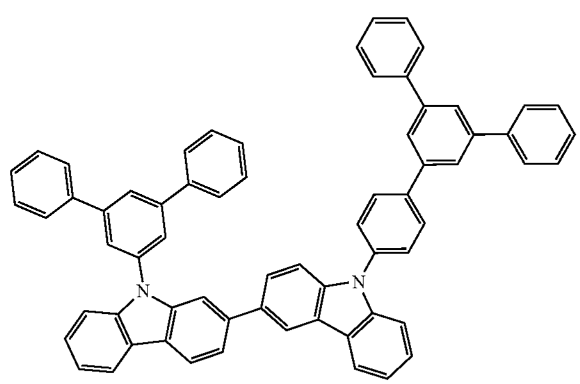

-continued
B-112
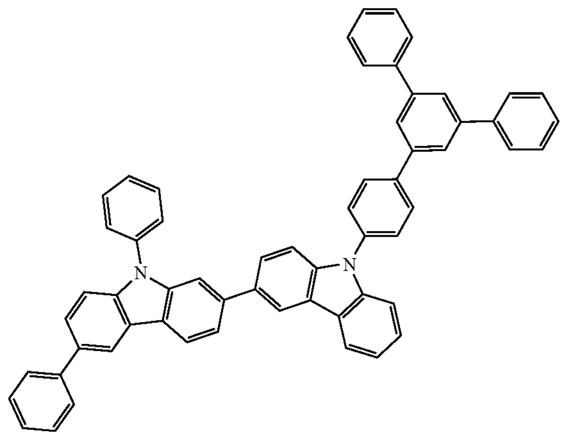
B-113
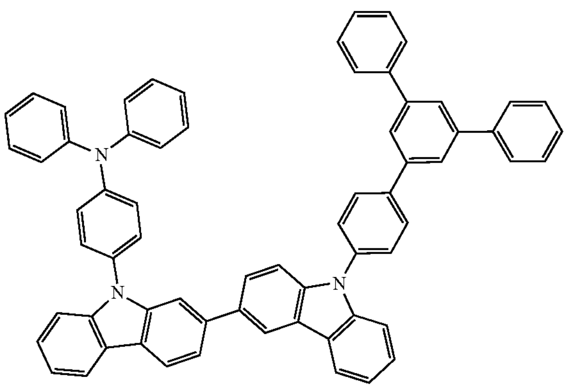
B-114
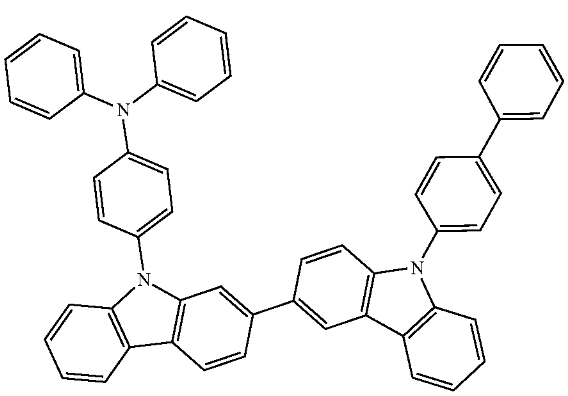
B-115
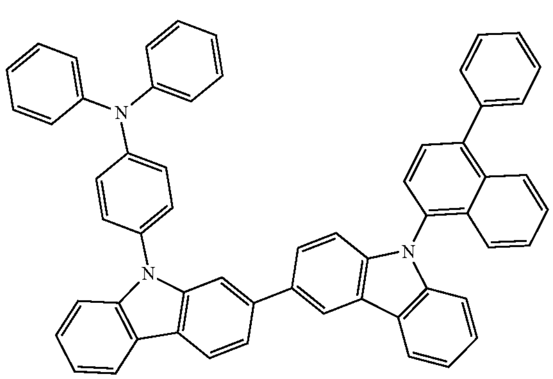
-continued
B-116
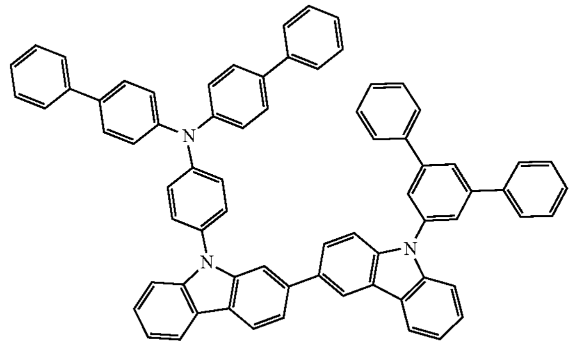
B-117
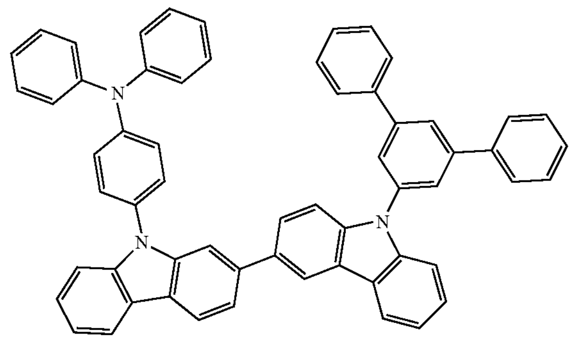
B-118
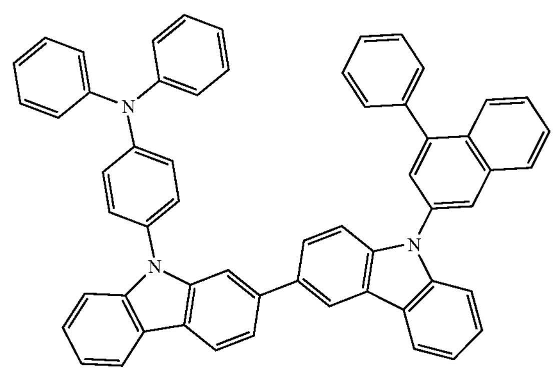
B-119
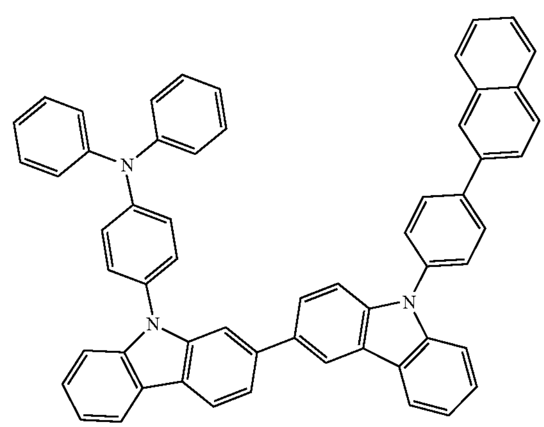

-continued
B-120
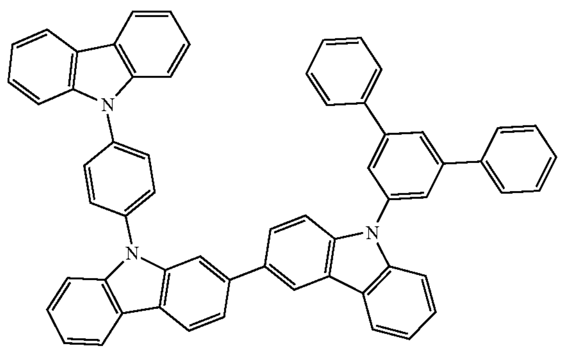
B-121
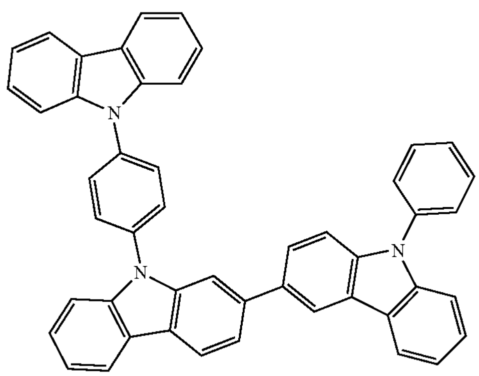
B-122
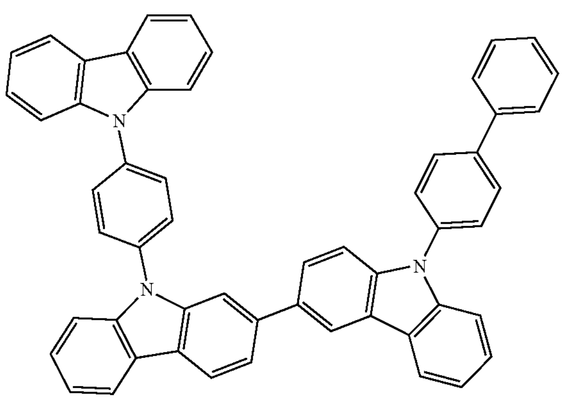
B-123
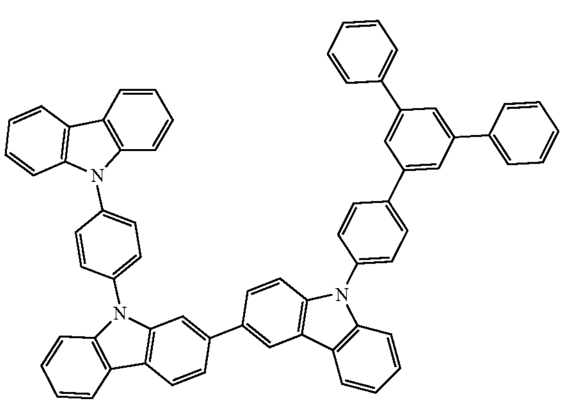
-continued
B-124
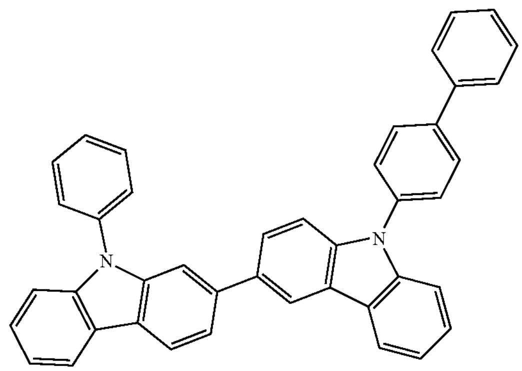
B-125
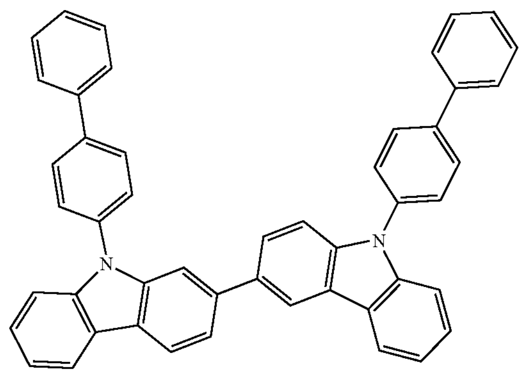
B-126
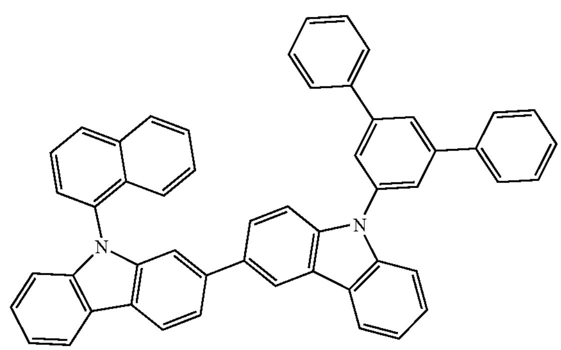
B-127
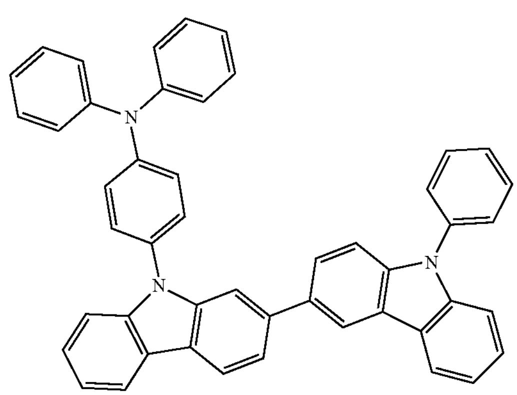

B-128
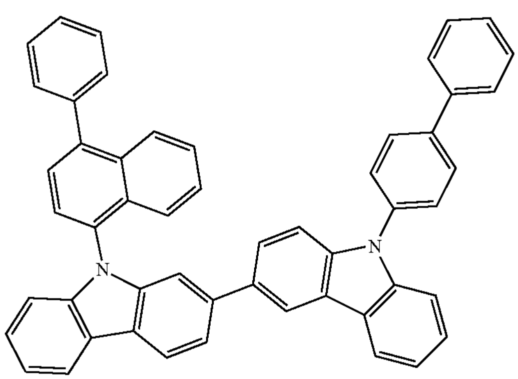
B-129
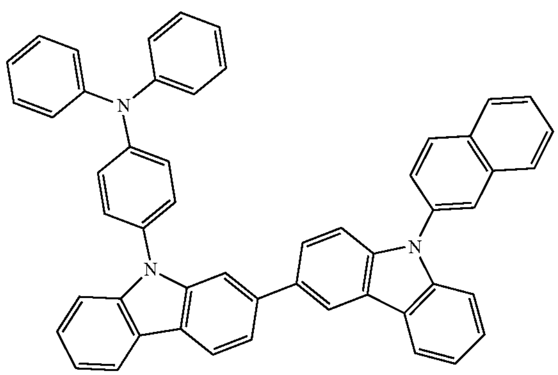
B-130
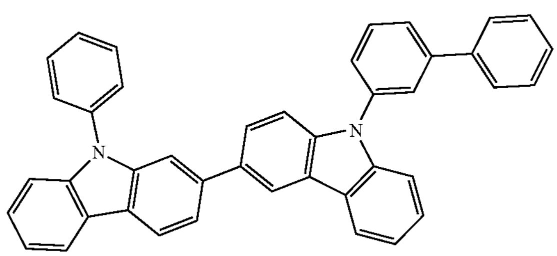
B-131
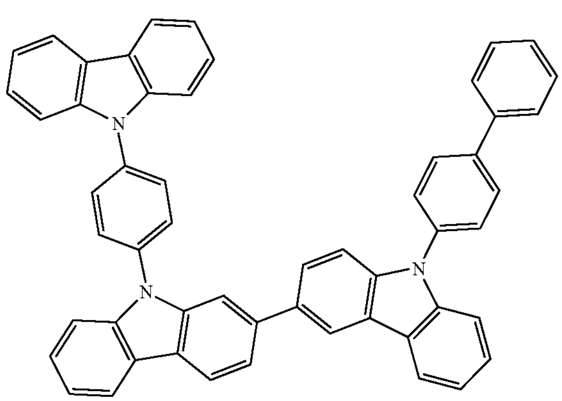
B-132
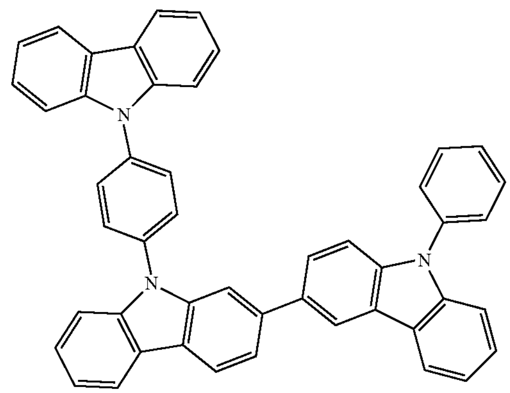
B-133
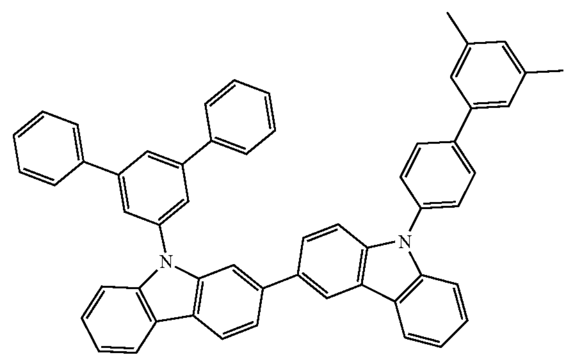
B-134
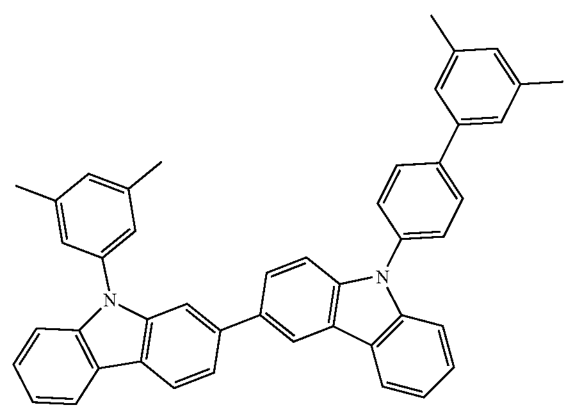
B-135
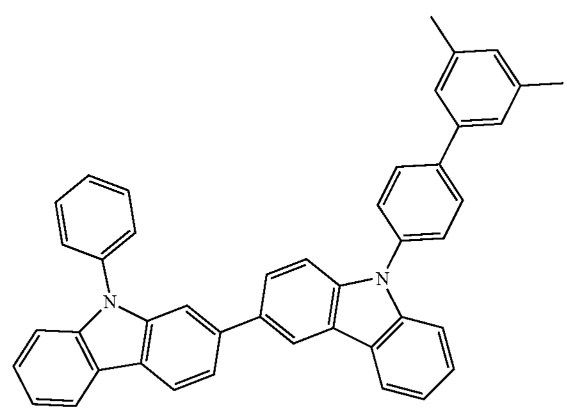

-continued
B-136
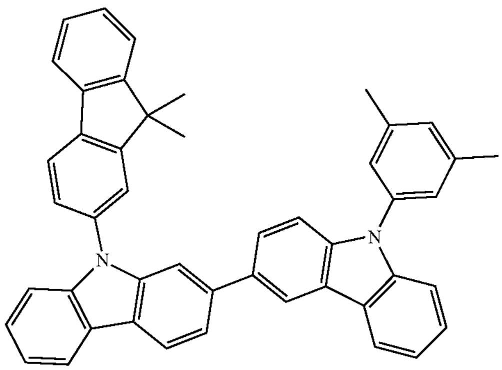
B-137
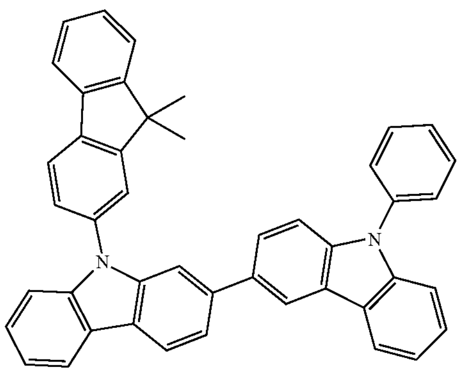
B-138
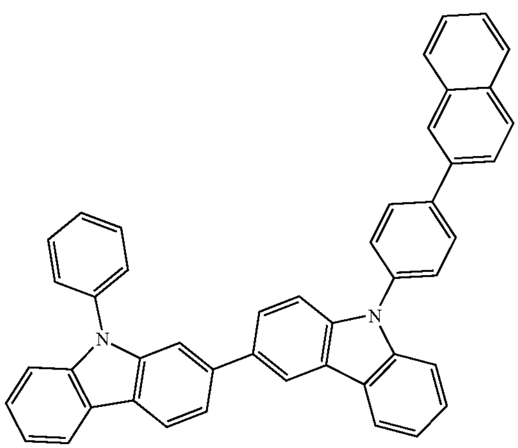
B-139
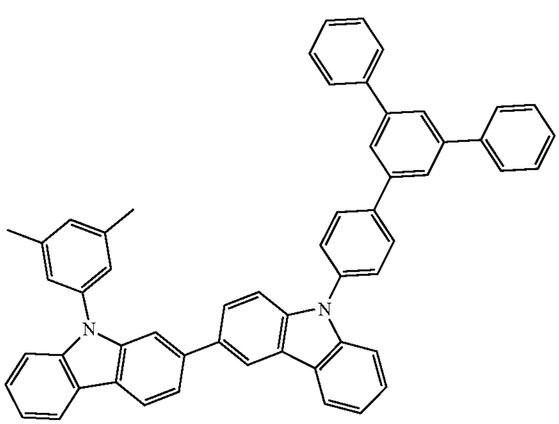
-continued
B-140
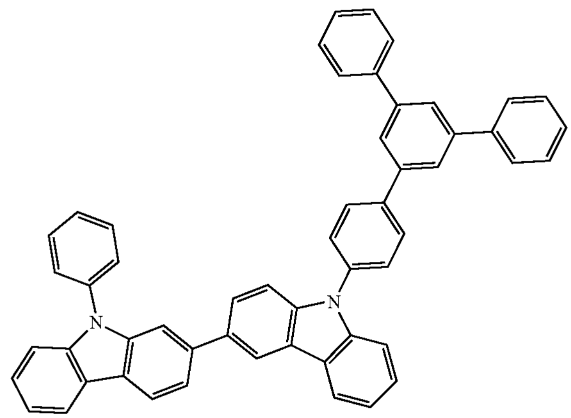
B-141
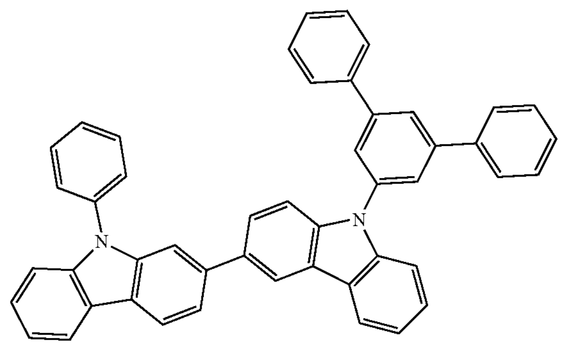
B-142
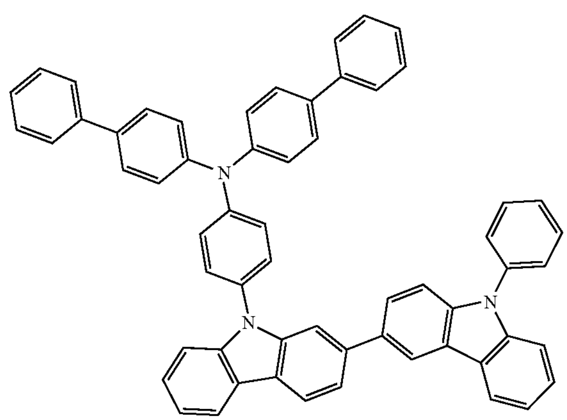
B-143
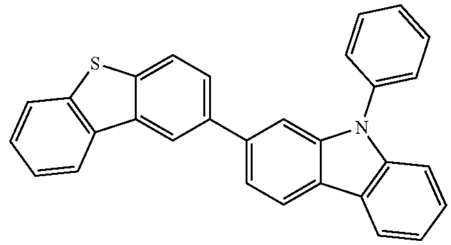

-continued
B-144
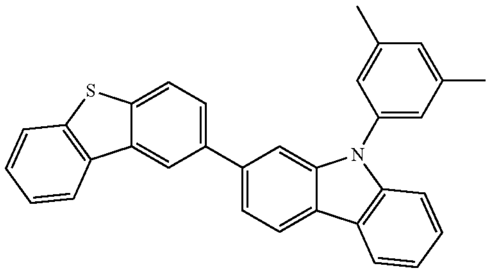
B-145
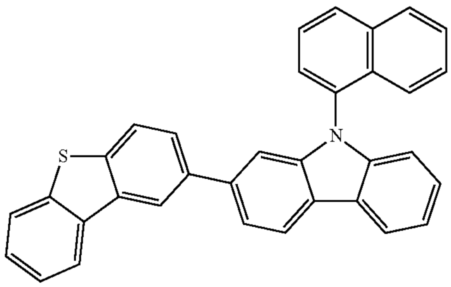
B-146
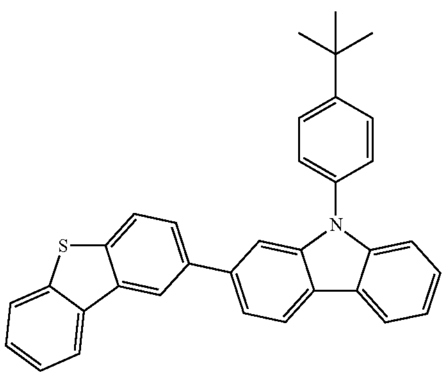
B-147
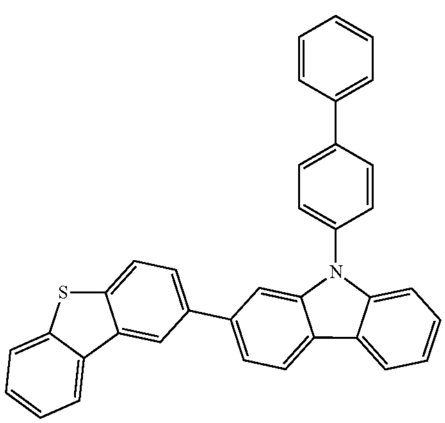
-continued
B-148
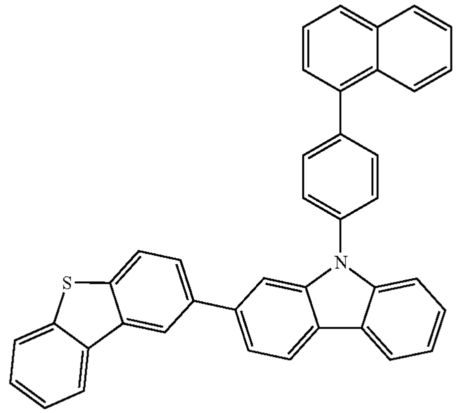
B-149
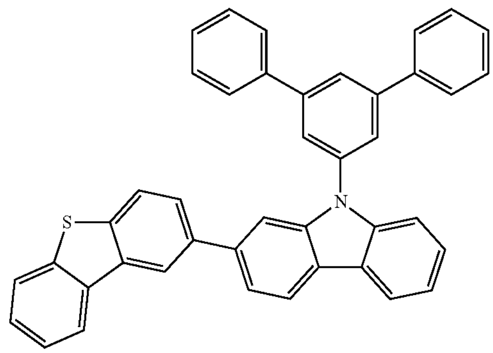
B-150
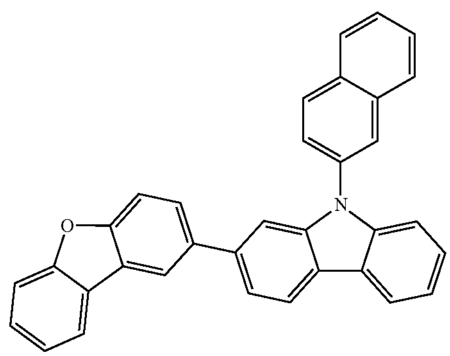
B-151
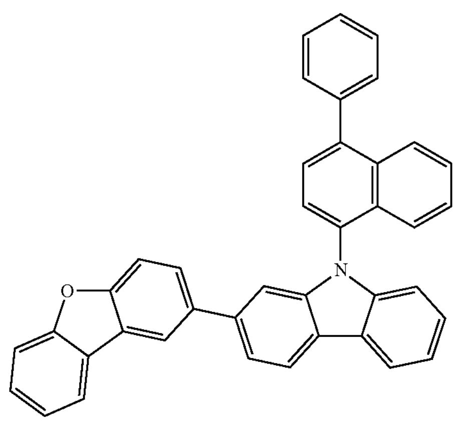

-continued
B-152
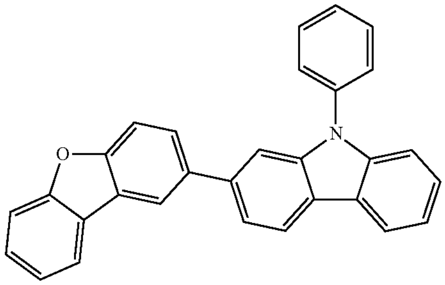
B-153
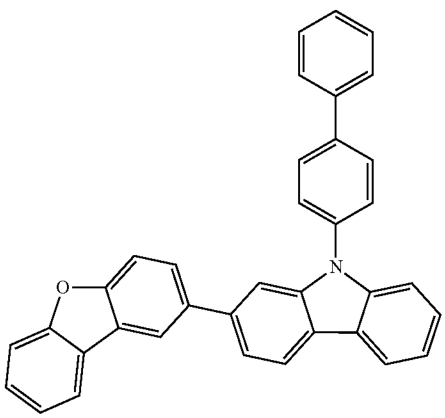
B-154
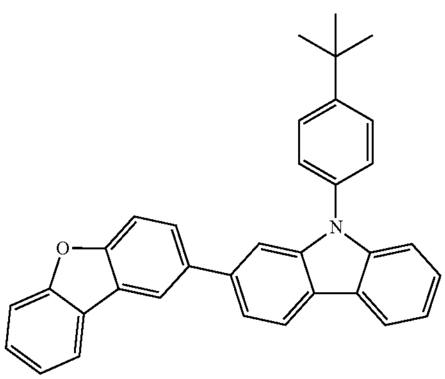
B-155
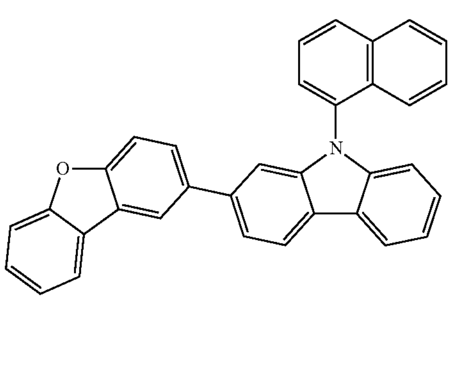
-continued
B-156
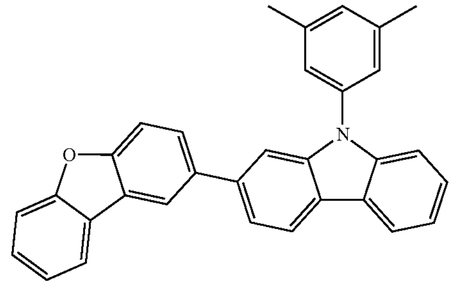
B-157
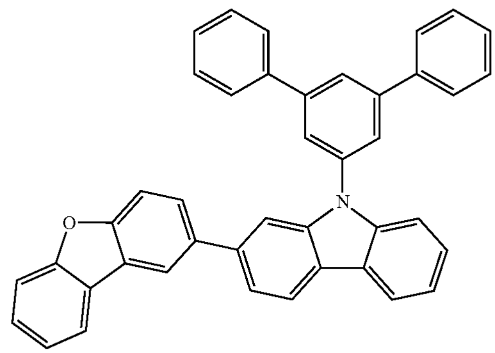
B-158
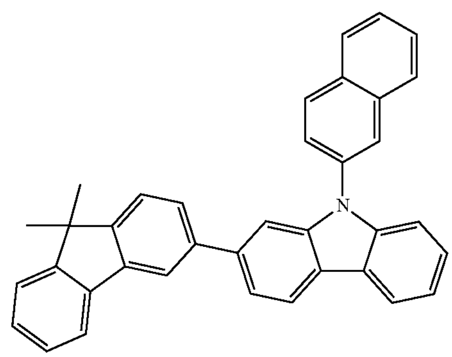
B-159
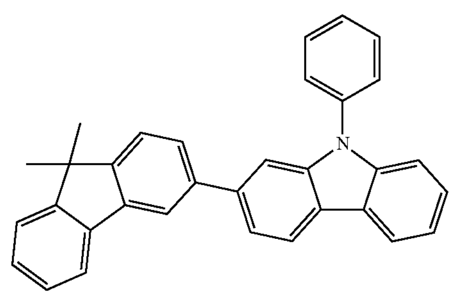
B-160
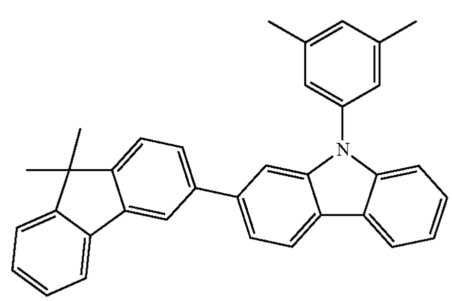

-continued
B-161
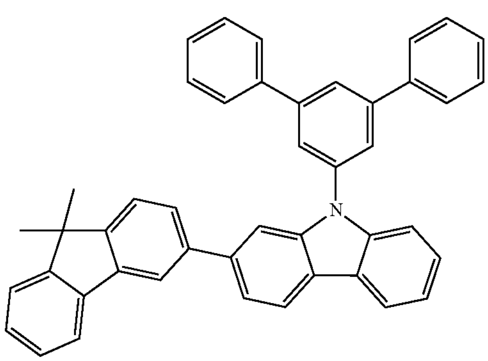
B-162
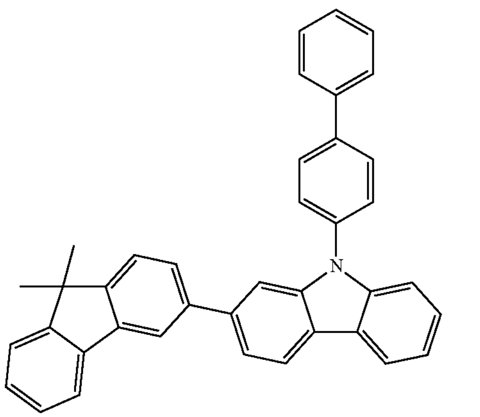
B-163
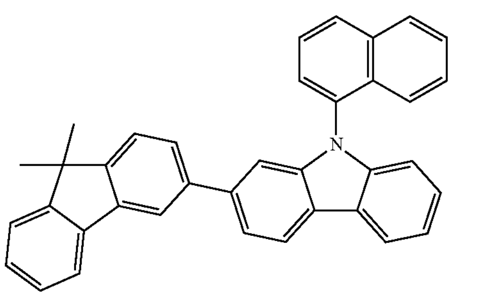
B-164
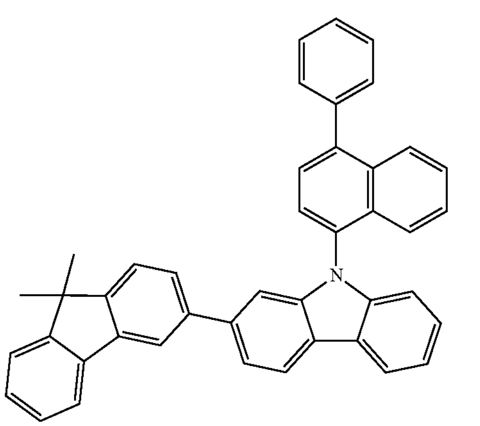
-continued
B-165
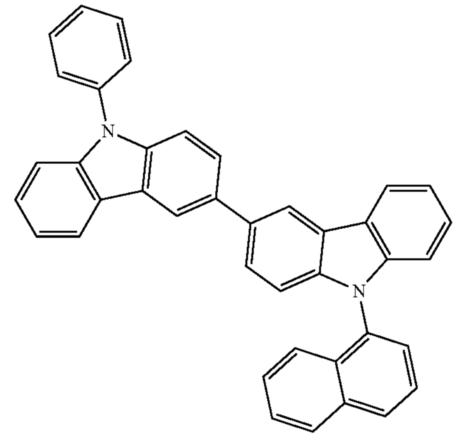
B-166
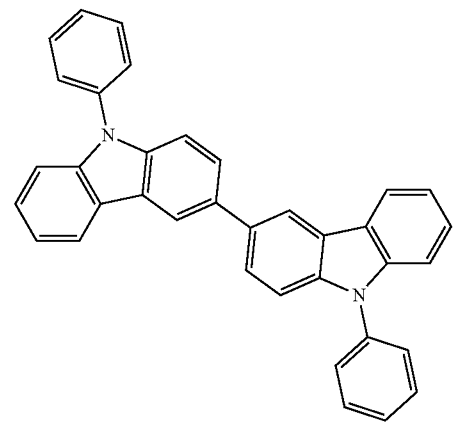
B-167
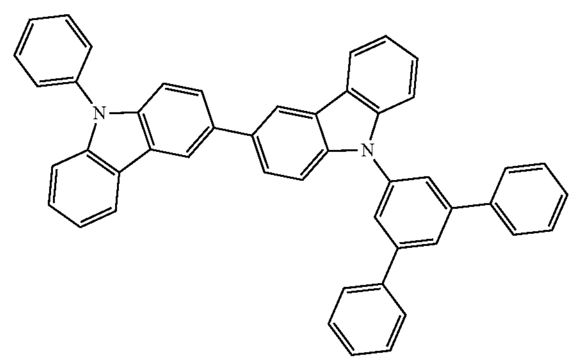
B-168
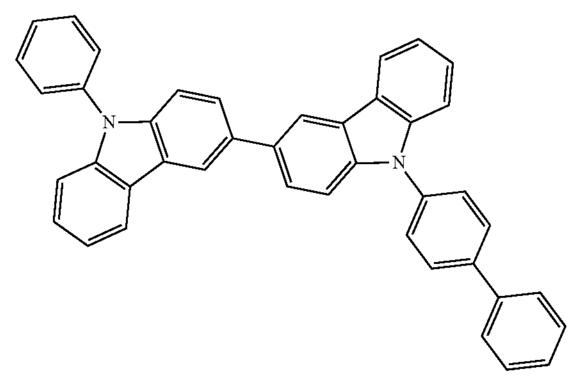

-continued
B-169
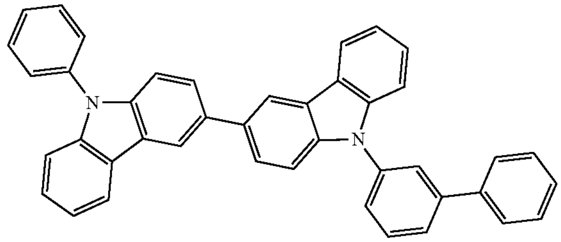
B-170
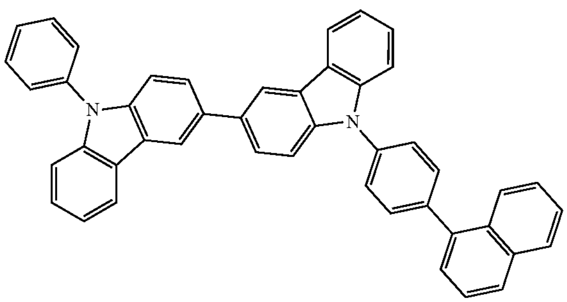
B-171
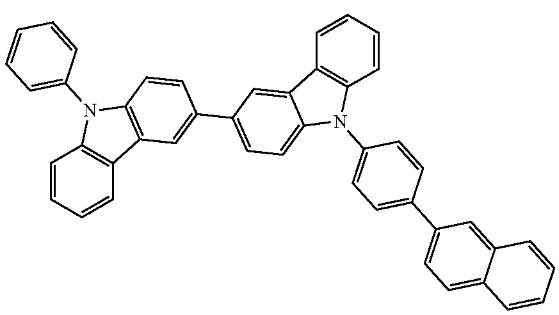
B-172
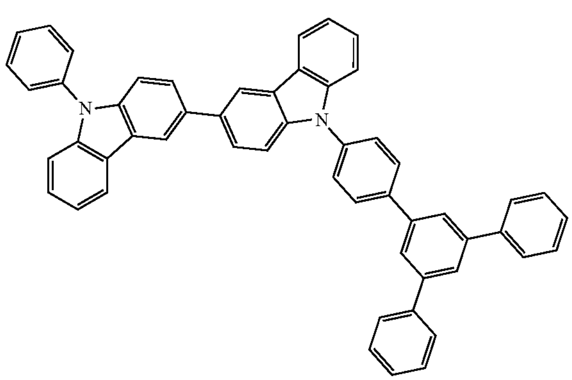
-continued
B-173
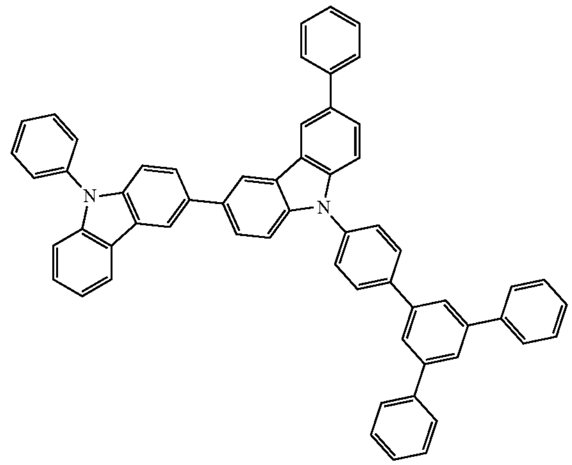
B-174
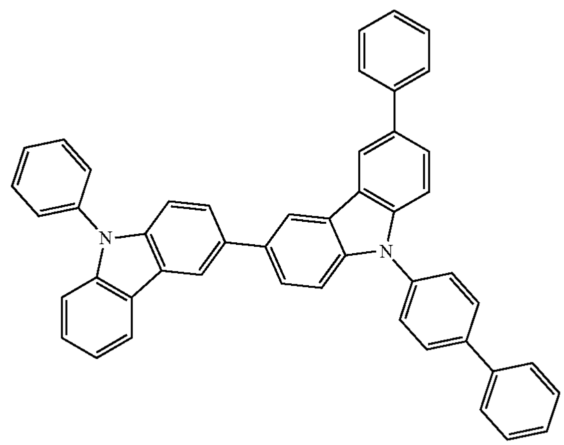
B-175
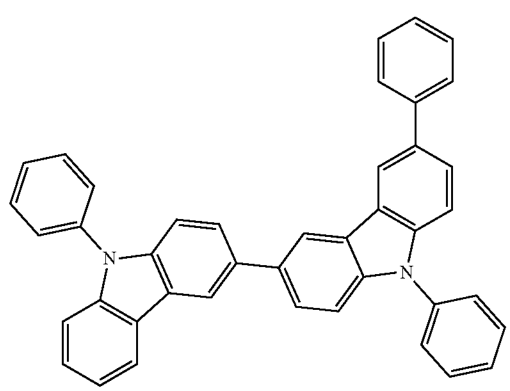

-continued
B-176
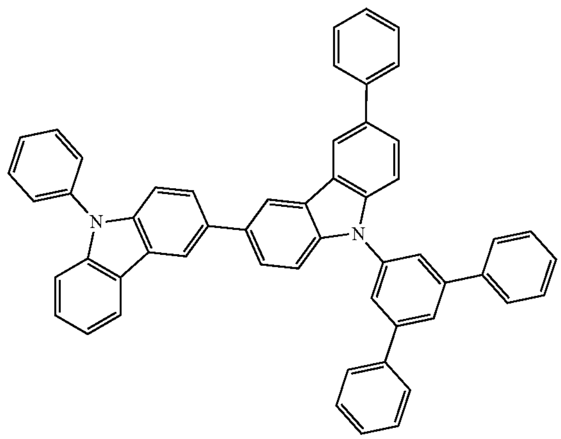
B-177
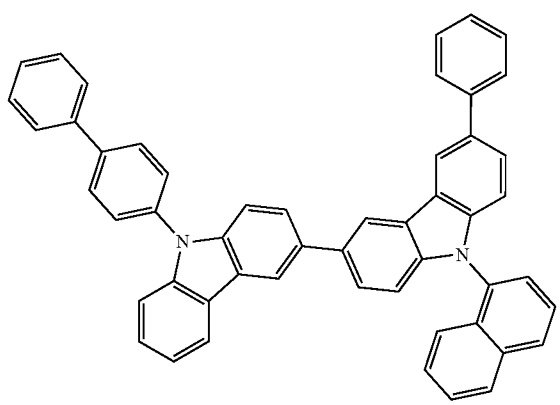
B-178
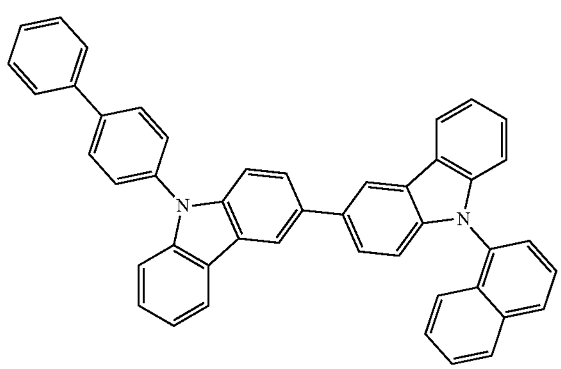
B-179
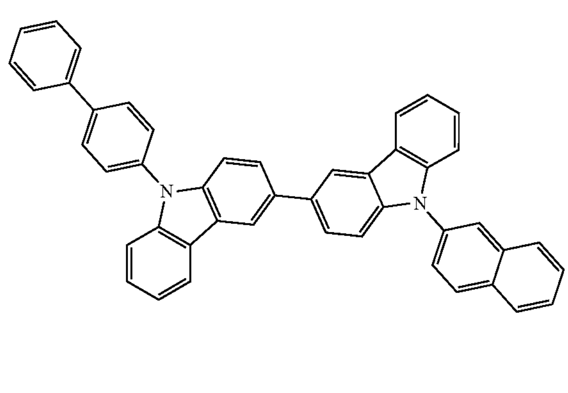
-continued
B-180
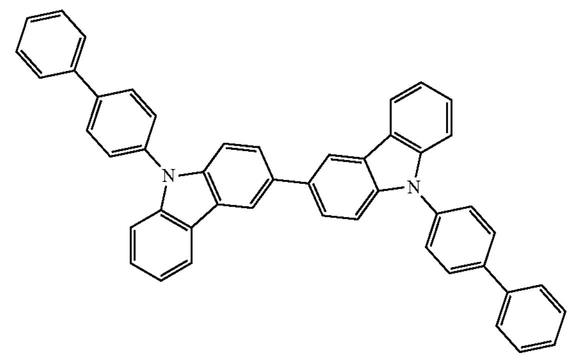
B-181
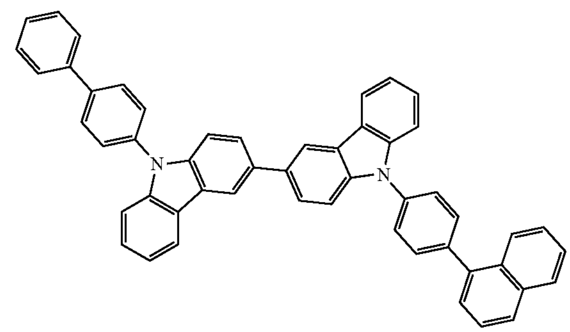
B-182
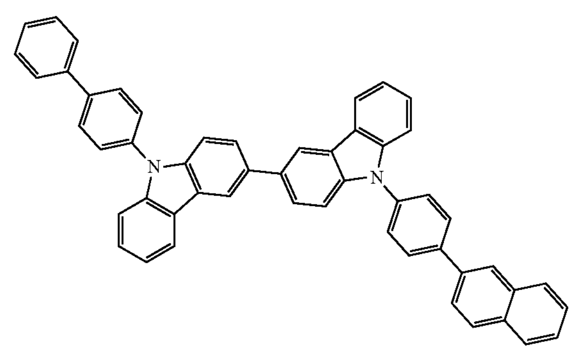
B-183
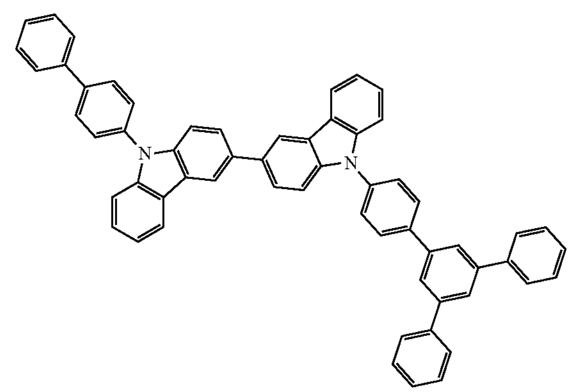

-continued
B-184
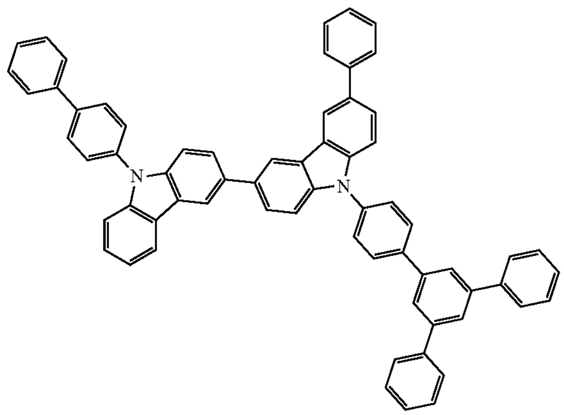
B-185
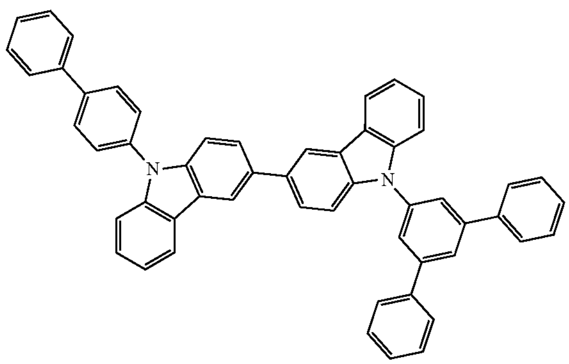
B-186
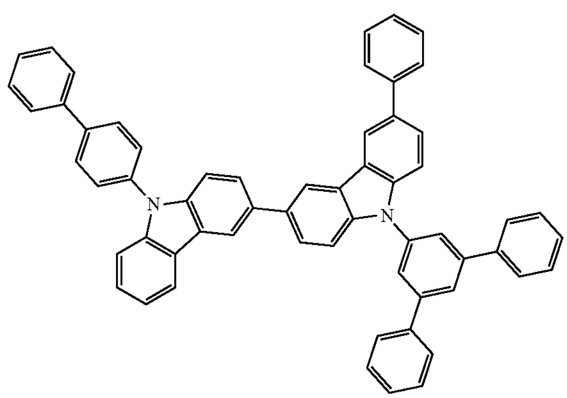
B-187
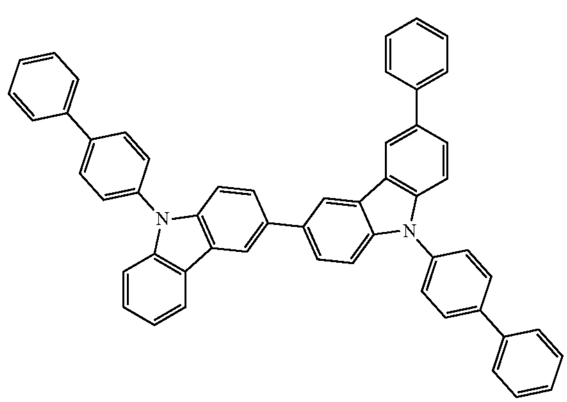
-continued
B-188
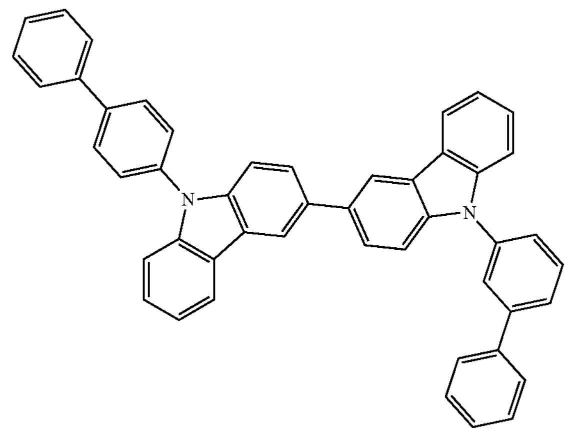
B-189
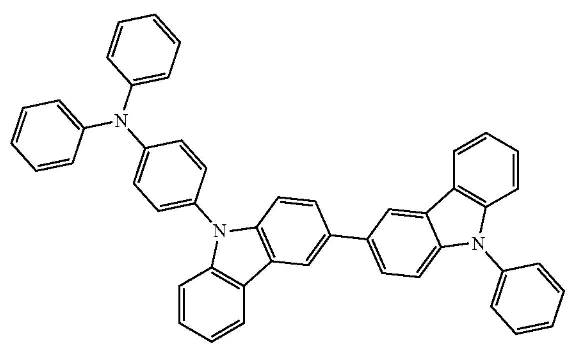
B-190
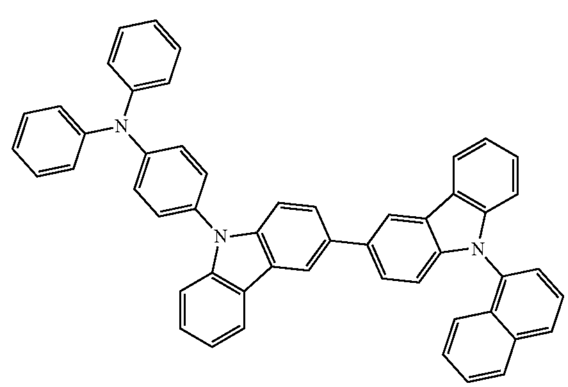

-continued
B-191
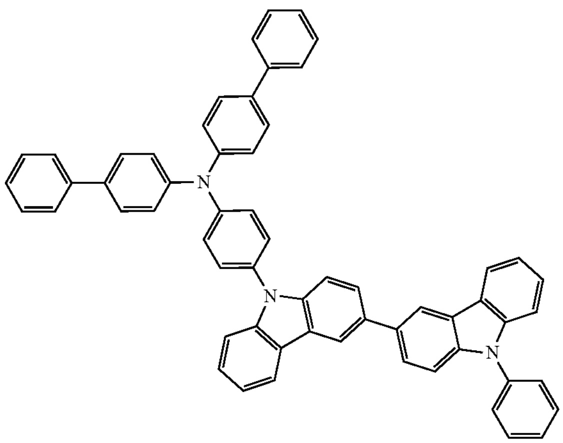
B-192
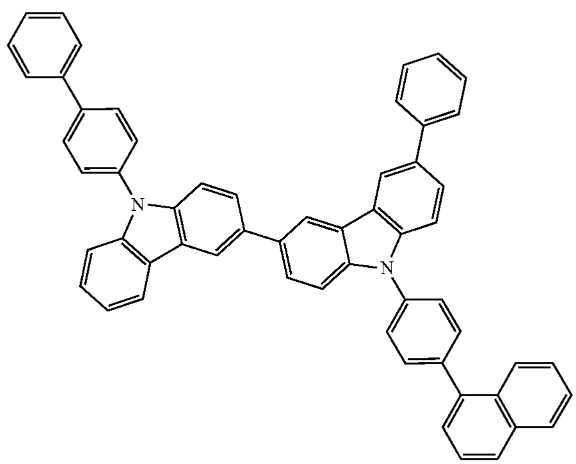
B-193
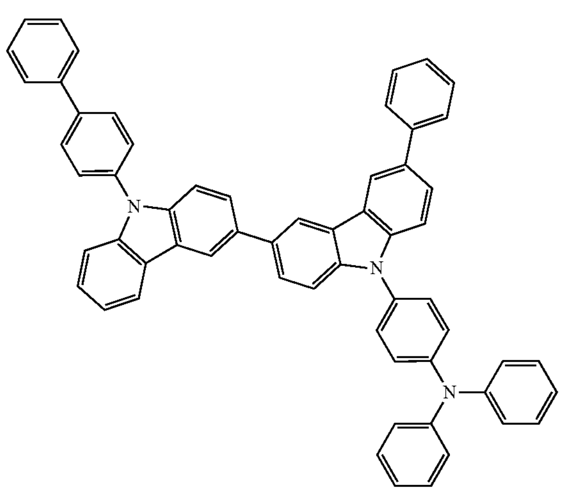
-continued
B-194
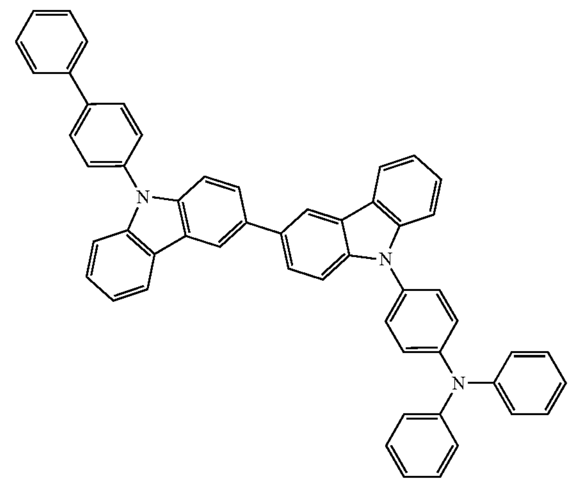
B-195
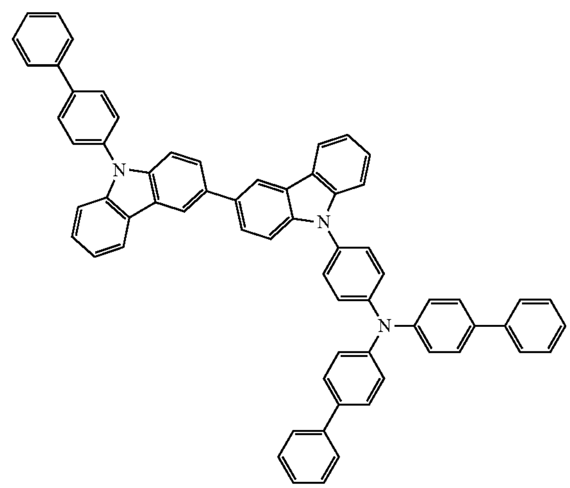
B-196
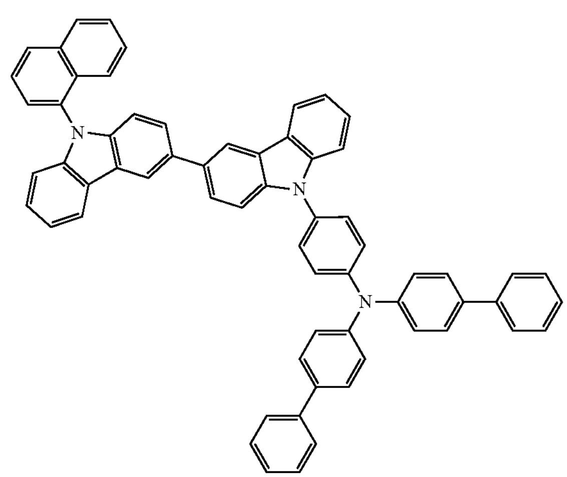

-continued
B-197
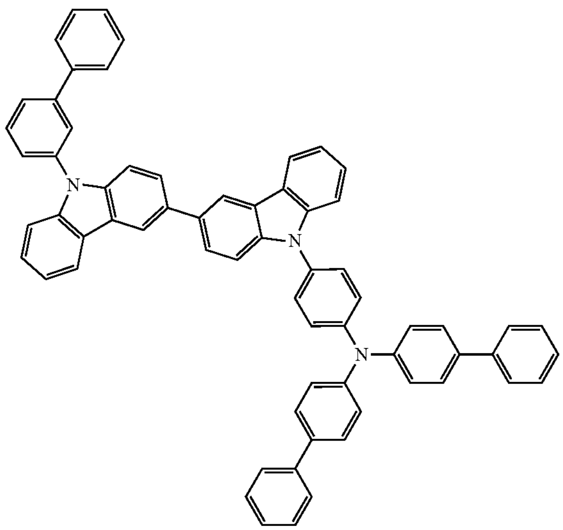
B-198
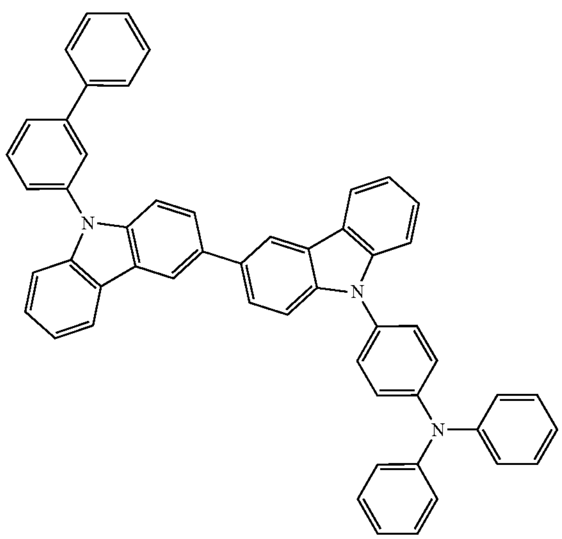
B-199
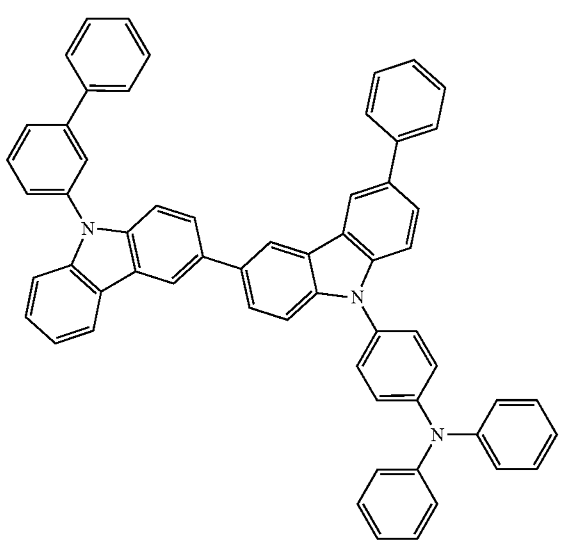
-continued
B-200
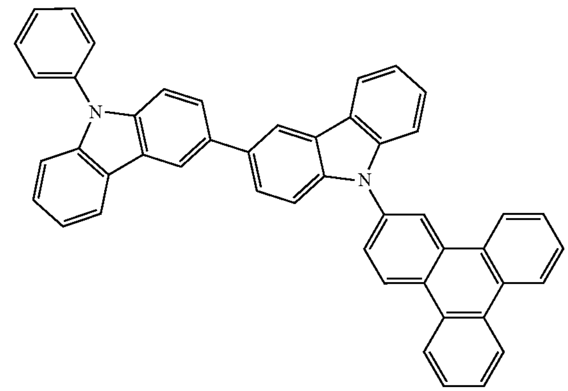
B-201
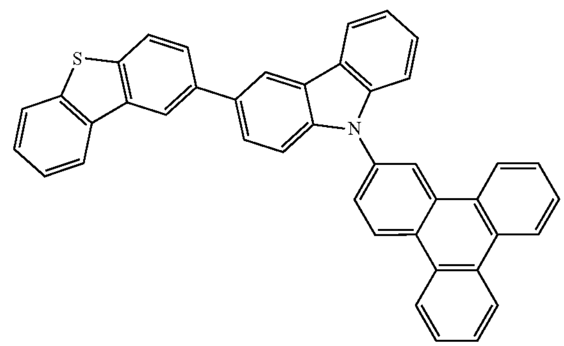
B-202
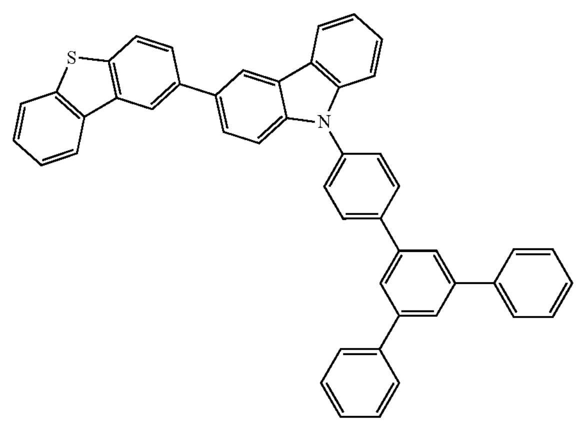
B-203
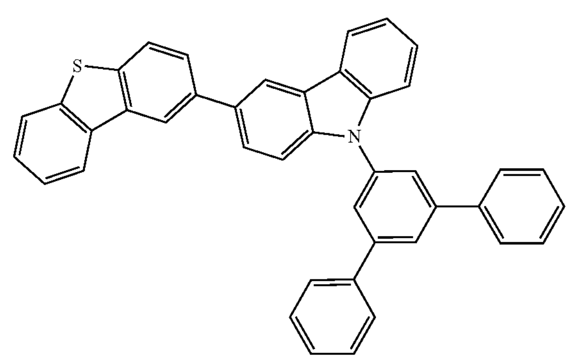

-continued
B-204
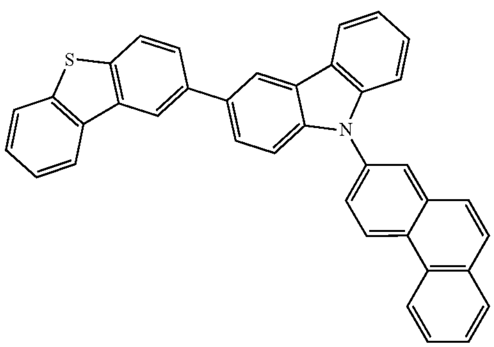
B-205
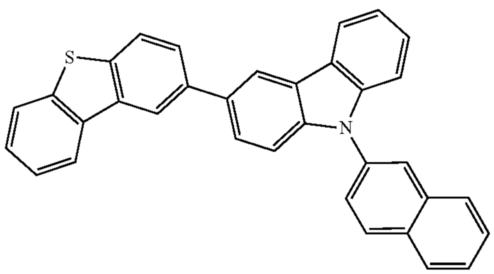
B-206
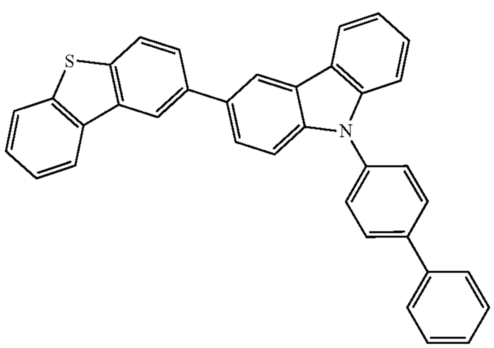
B-207
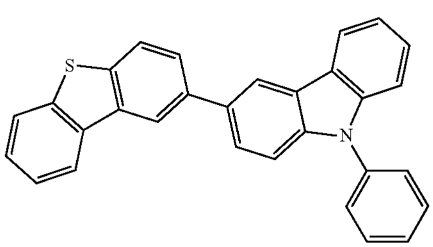
B-208
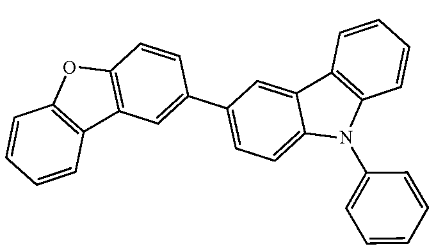
-continued
B-209
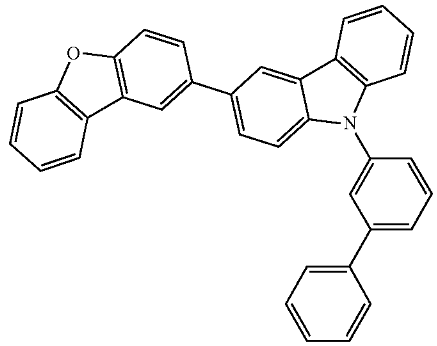
B-210
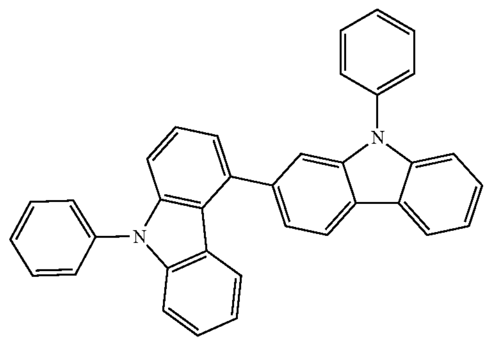
B-211
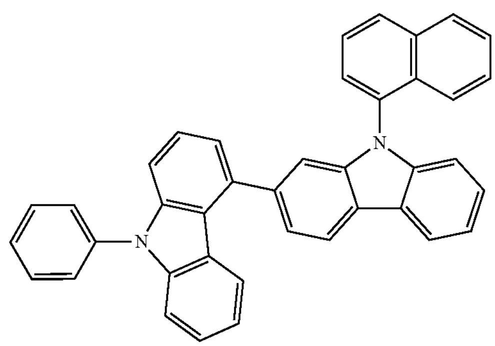
B-212
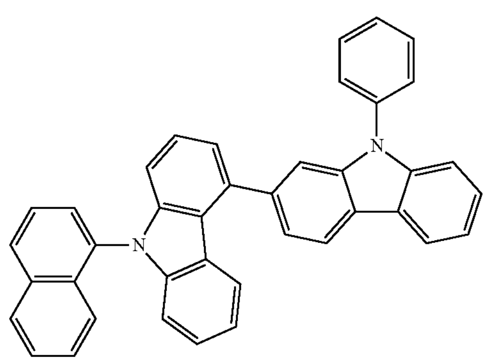

-continued
B-213
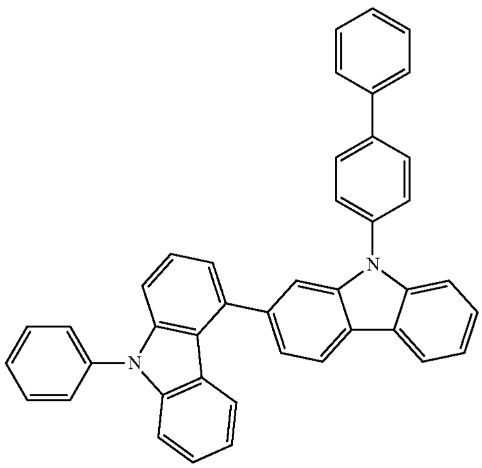
B-214
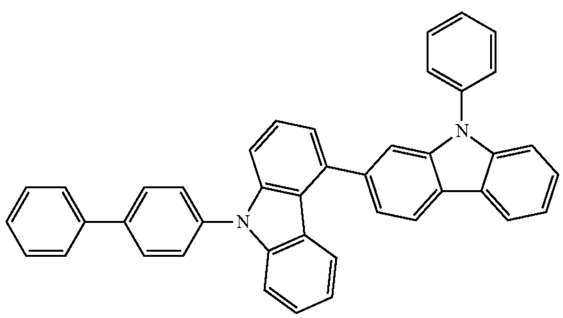
B-215
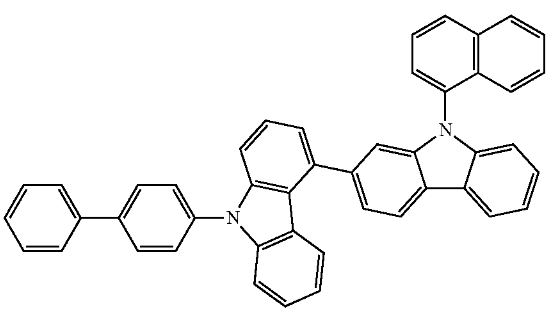
B-216
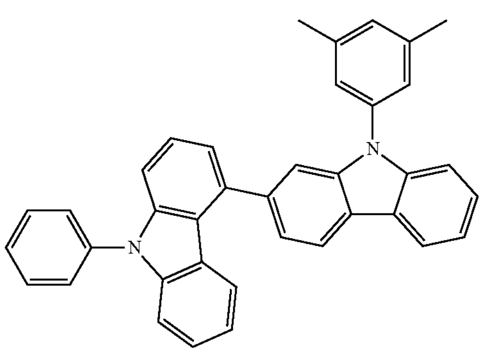
-continued
B-217
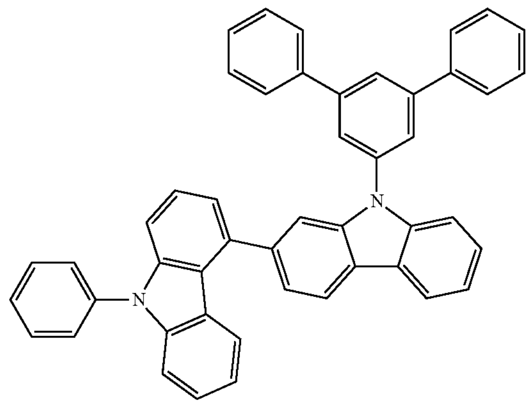
B-218
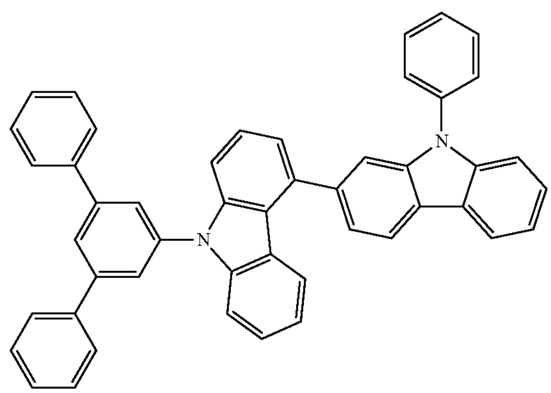
B-219
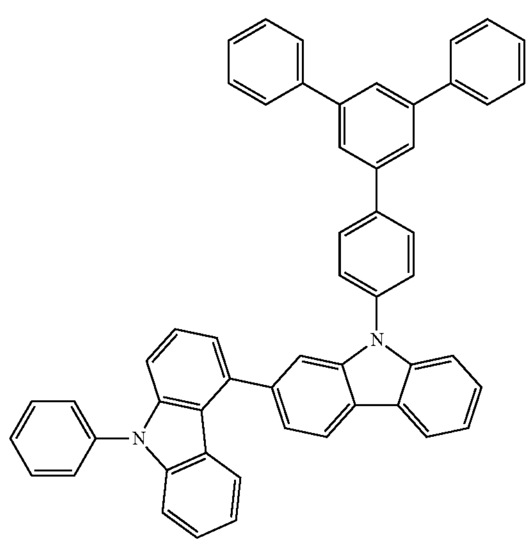

-continued
B-220
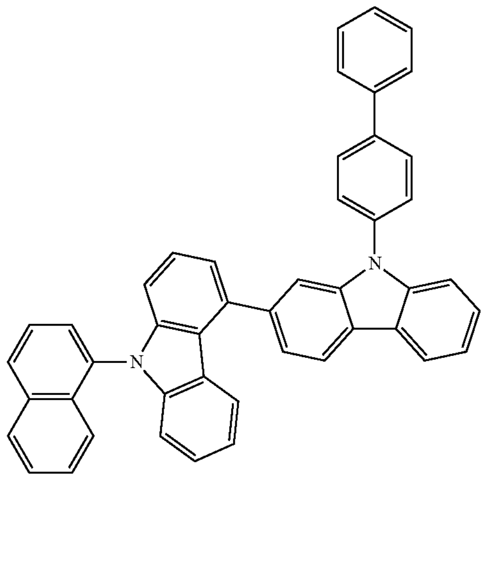
B-221
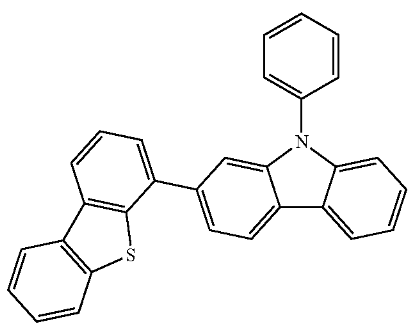
B-222
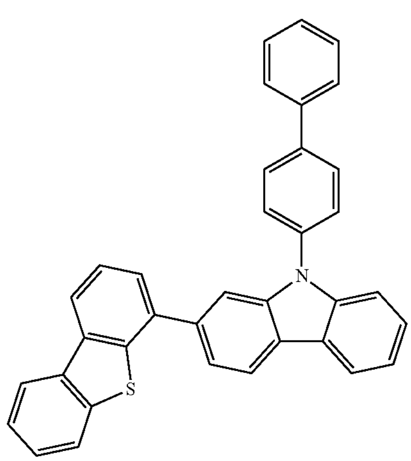
-continued
B-223
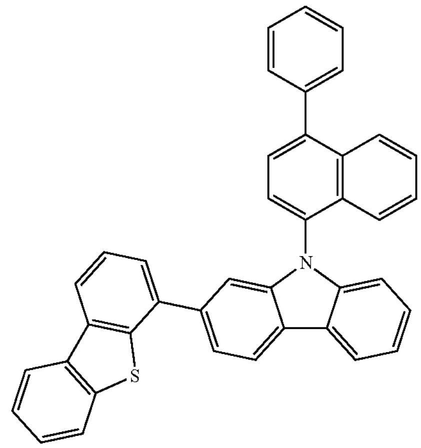
B-224
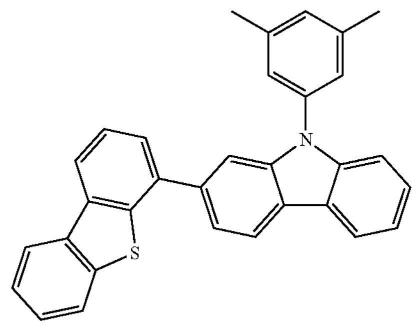
B-225
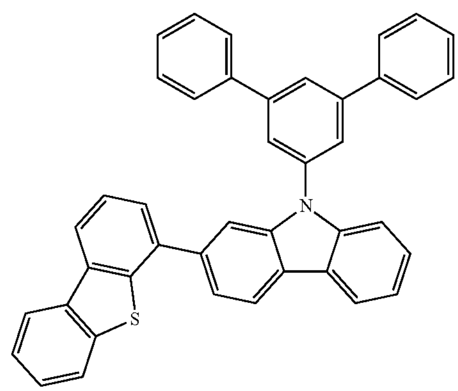
B-226
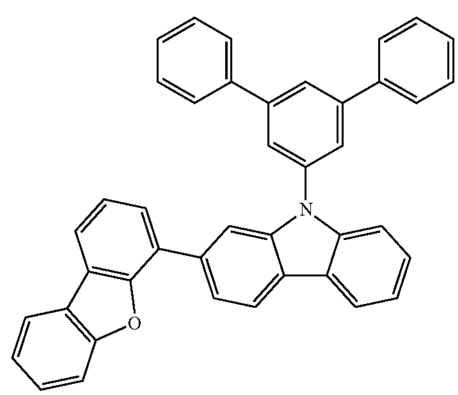

-continued
B-227
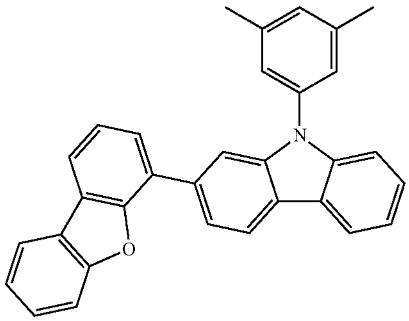
B-228
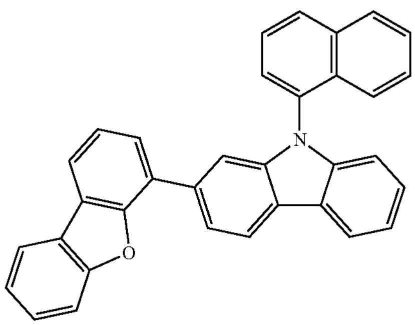
A-101
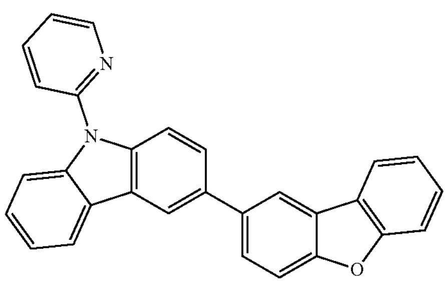
A-103
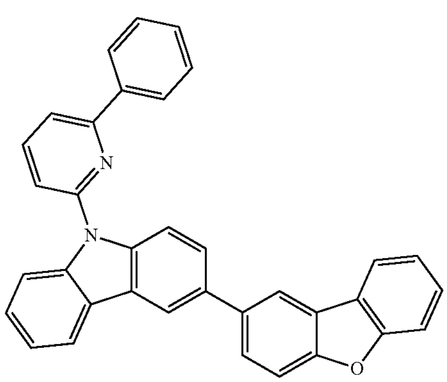
-continued
B-229
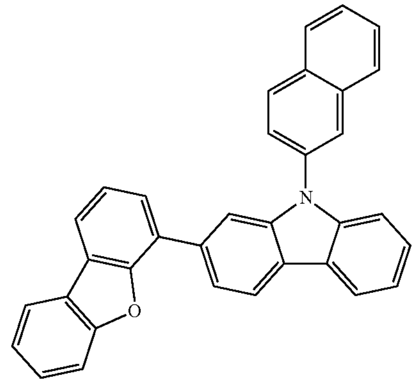
B-230
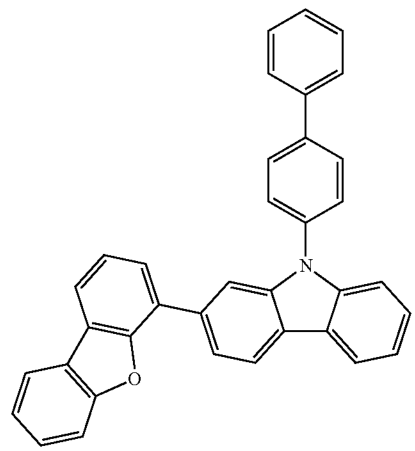
A-102
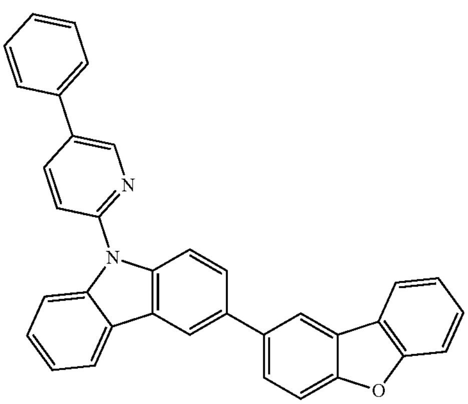
A-104
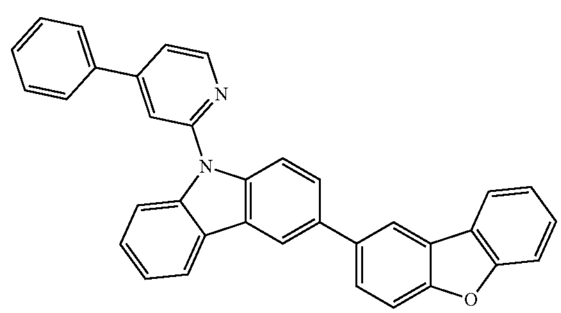

-continued
A-105
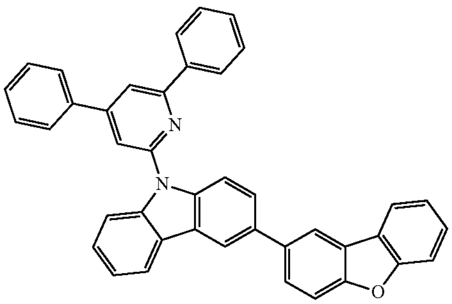
A-106
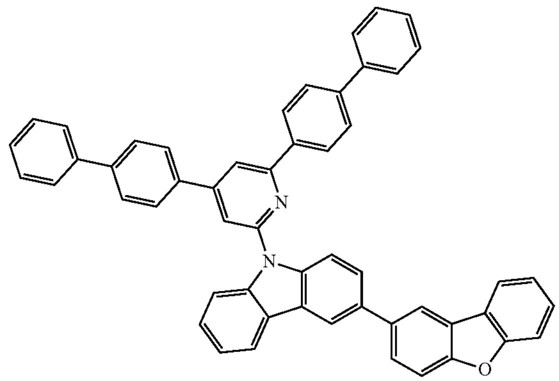
A-107
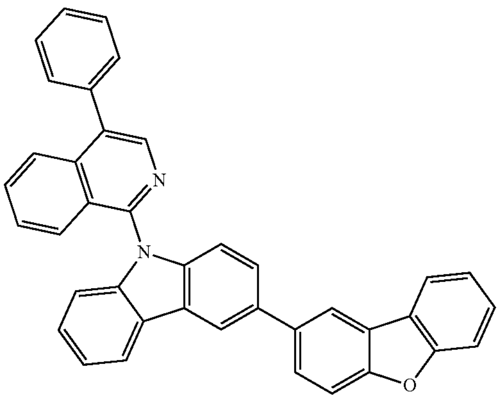
A-108
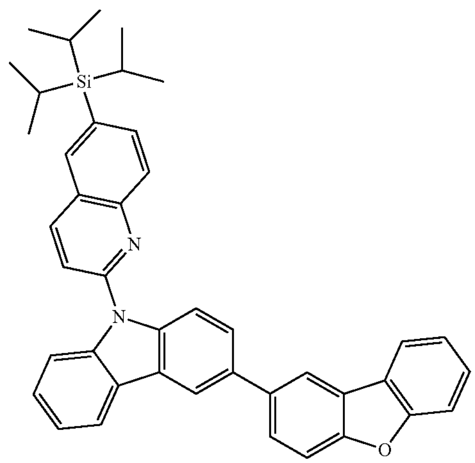
A-109
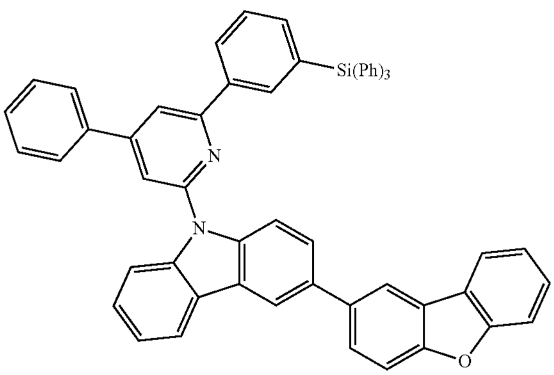
A-110
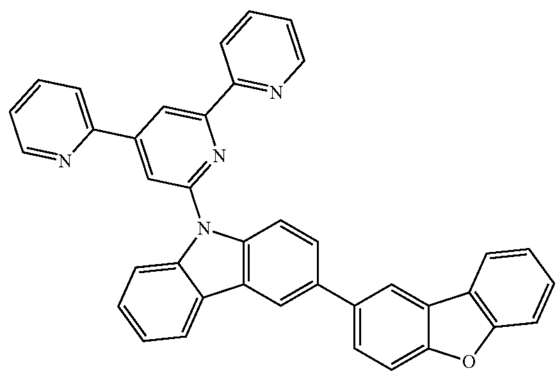
A-111
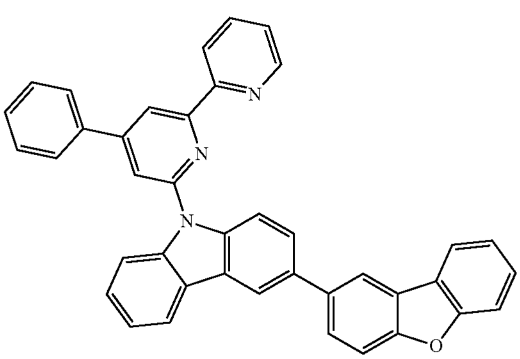
A-112
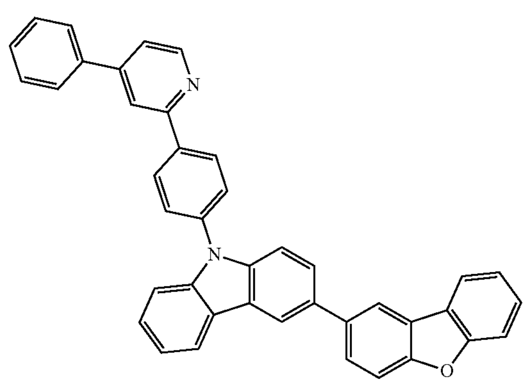

-continued
A-113
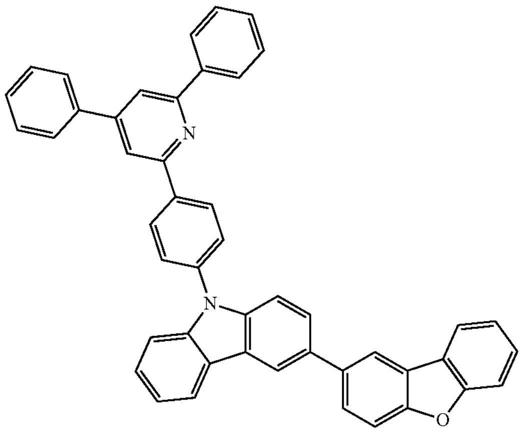
A-114
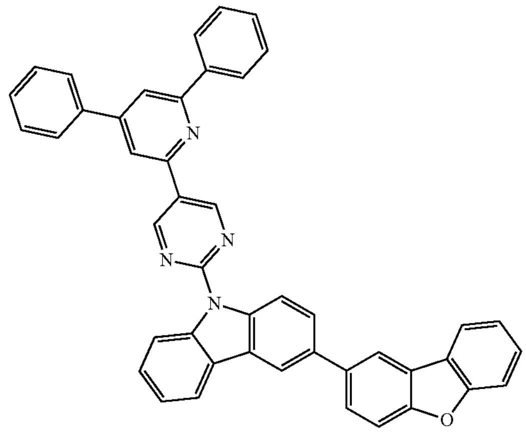
A-115
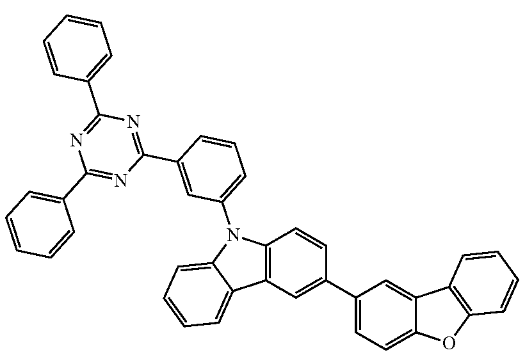
A-116
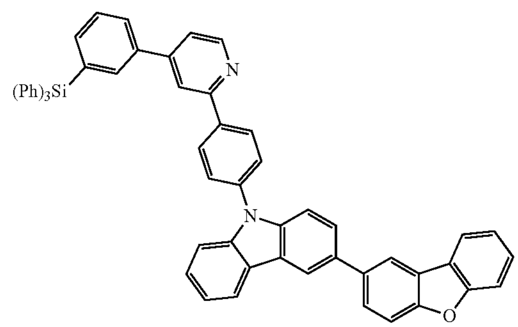
A-117
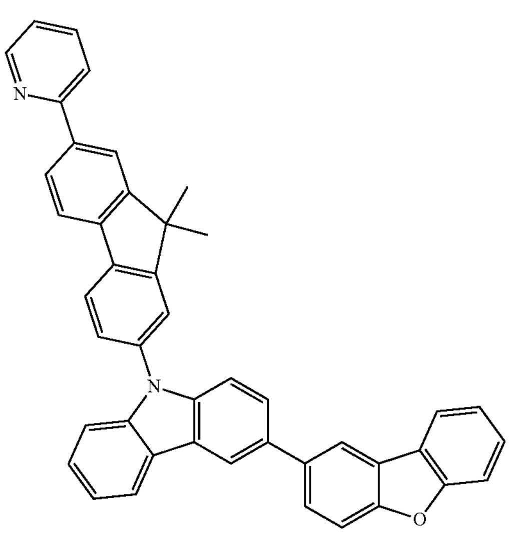
A-118
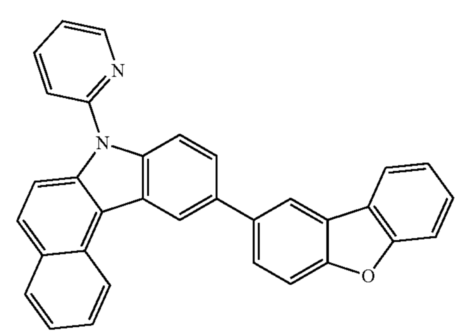

-continued
A-119
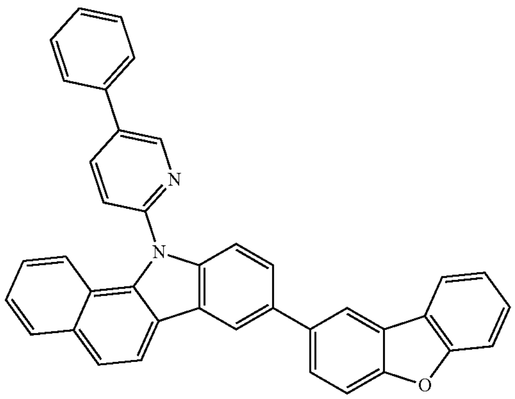
A-120
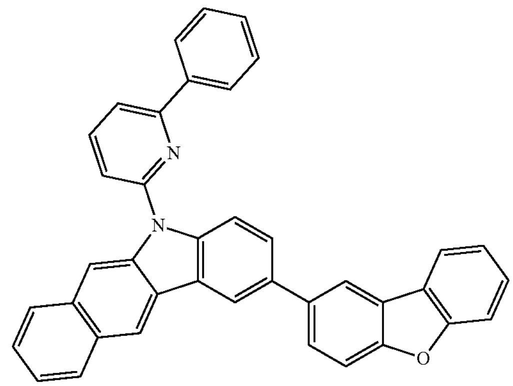
A-121
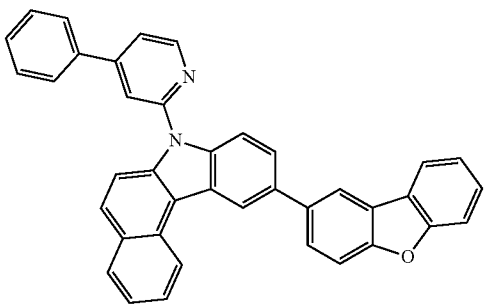
A-122
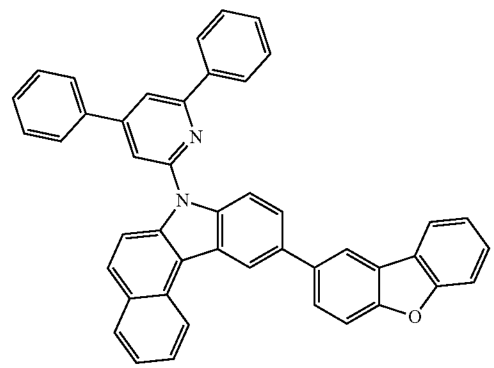
A-123
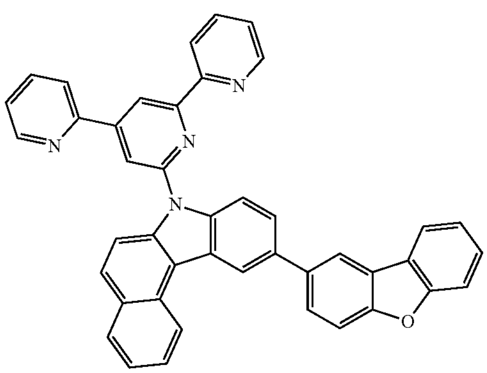
A-124
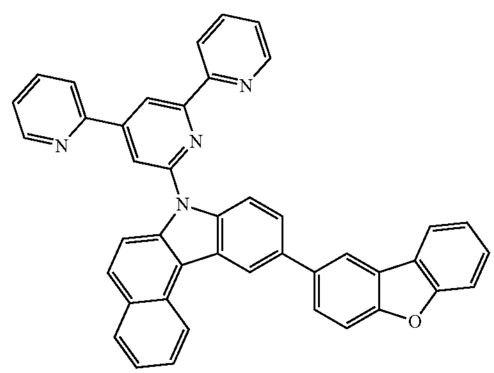
A-125
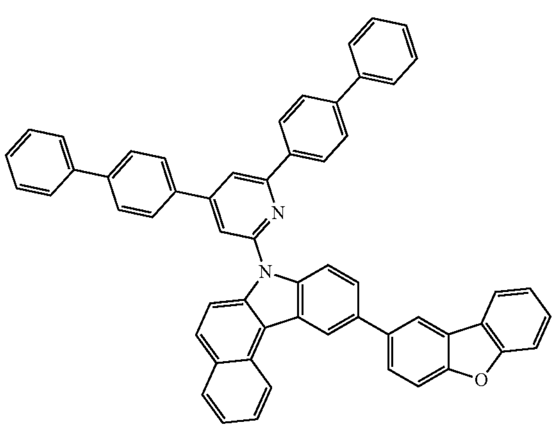
A-126
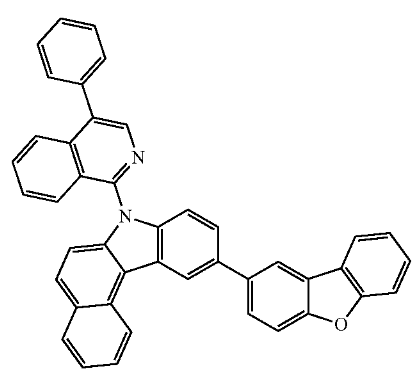

-continued
A-127
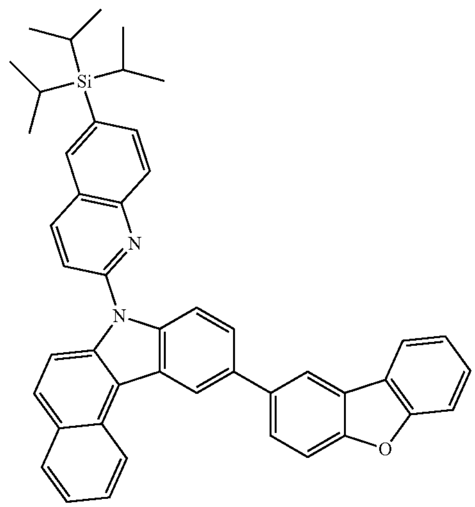
A-128
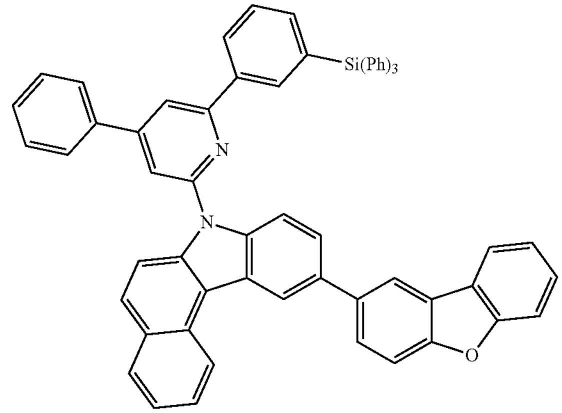
A-129
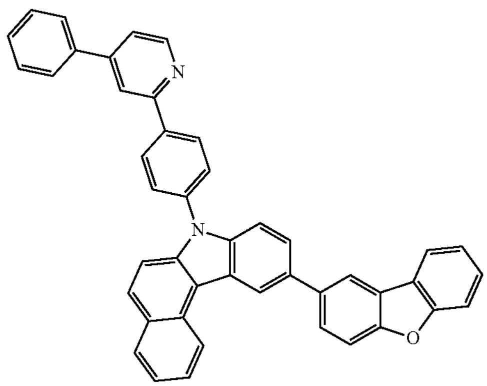
A-130
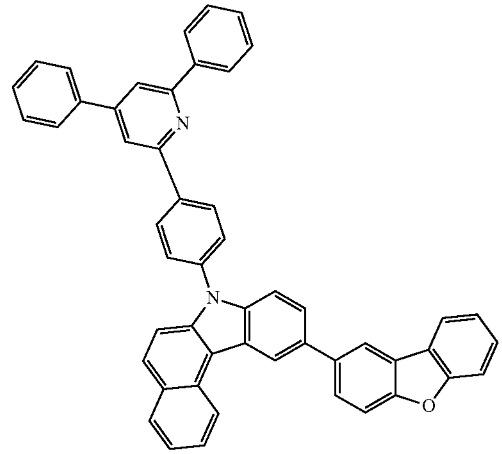
A-131
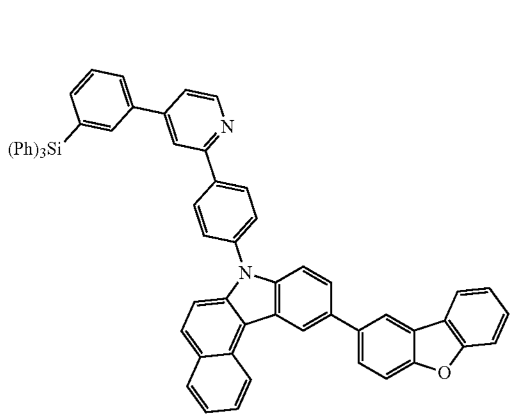
A-132
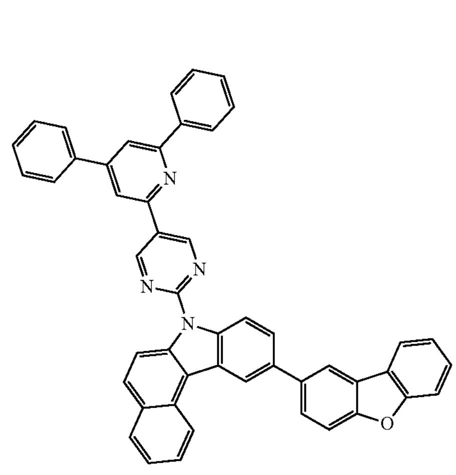

-continued
A-133
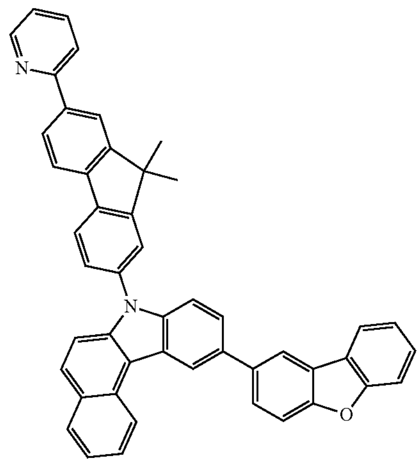
A-134
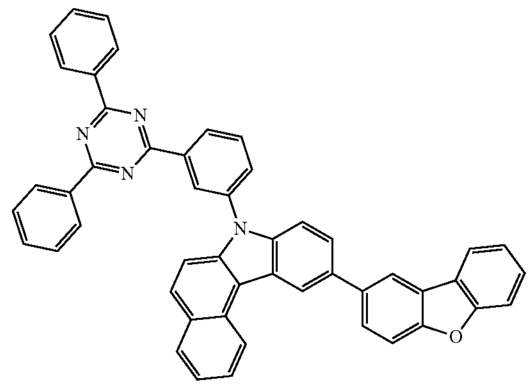
A-135
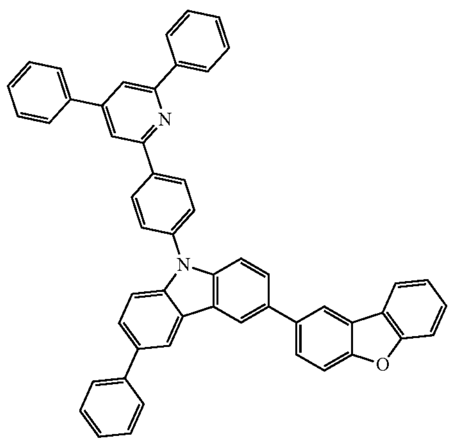
A-136
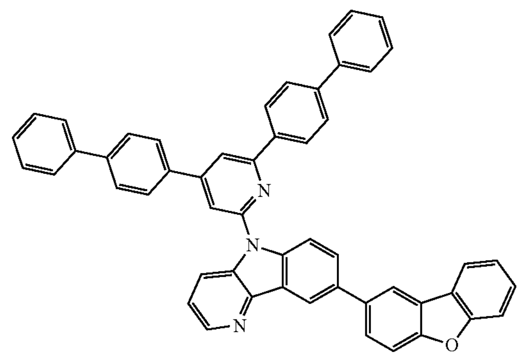
A-137
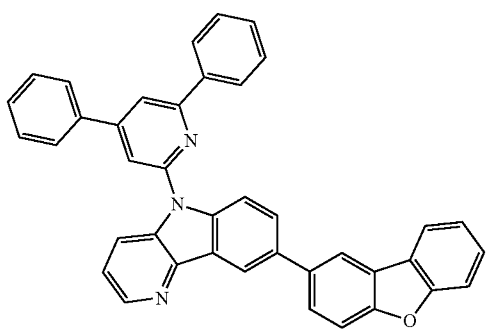
A-138
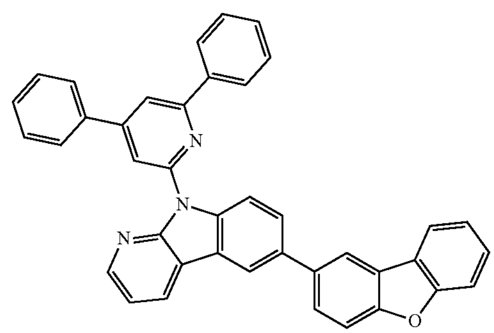
A-139
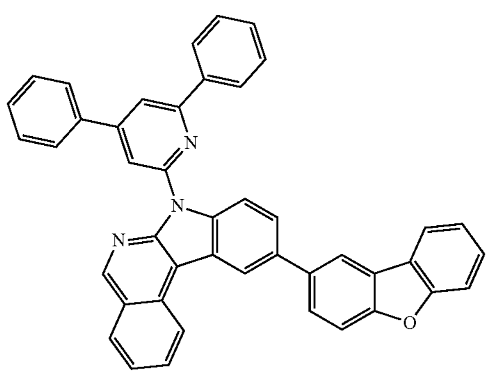
A-140
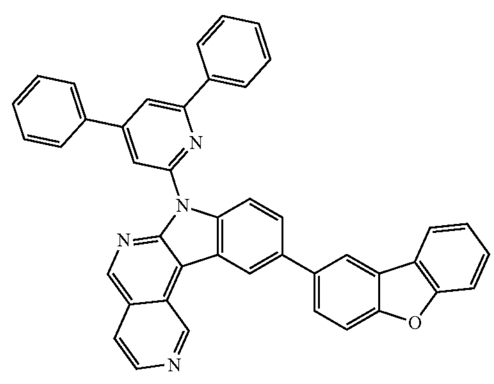

-continued
A-141
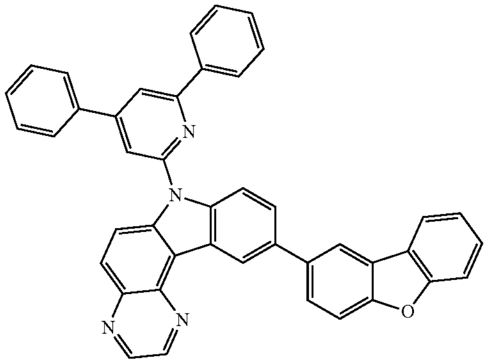
A-142
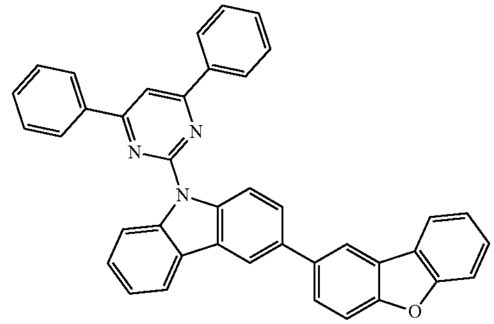
A-143
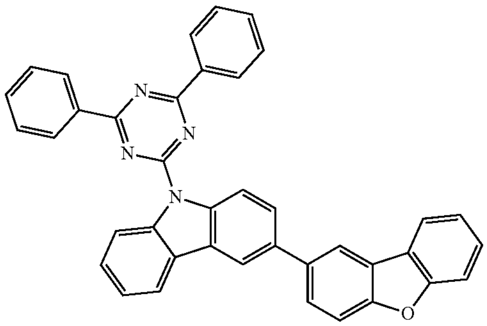
A-144
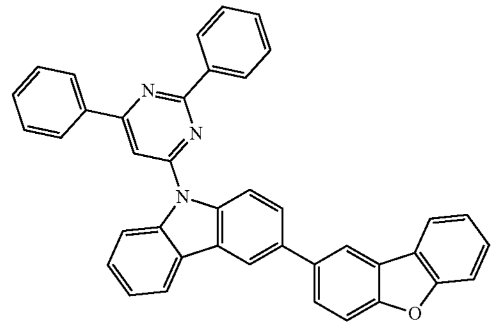
A-145
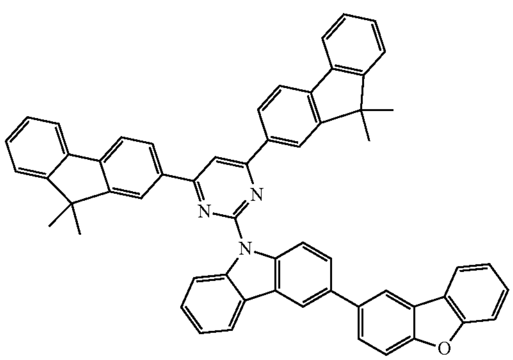
A-146
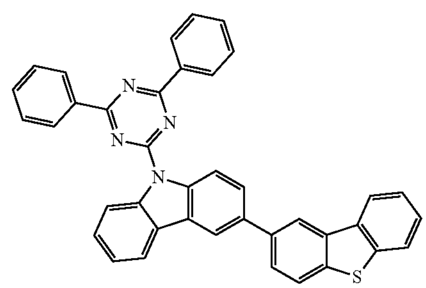
A-147
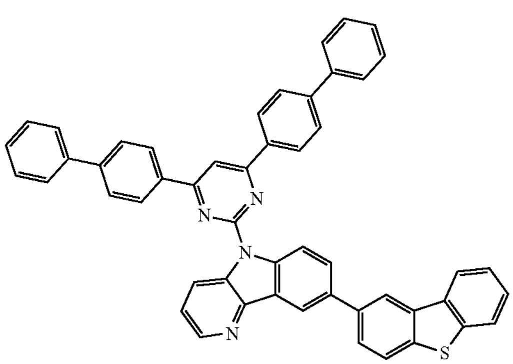
A-148
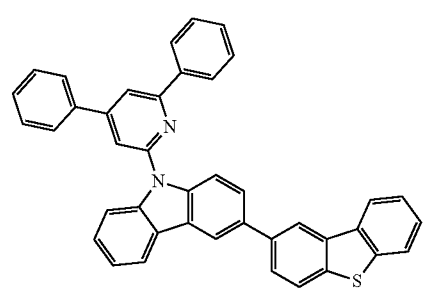

-continued
A-149
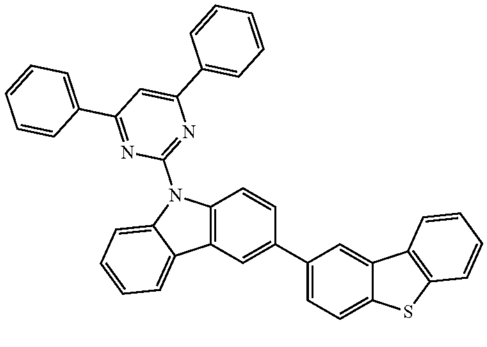
A-150
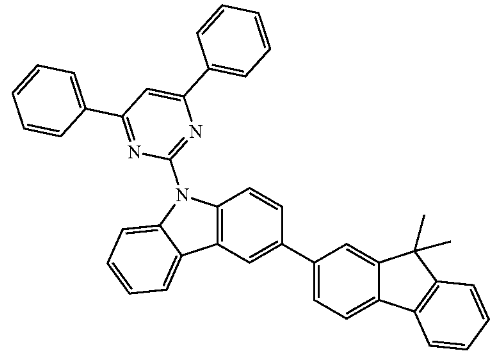
A-151
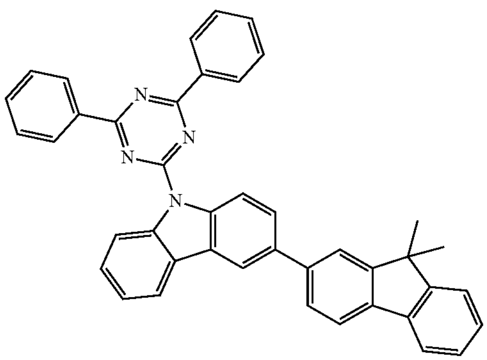
A-152
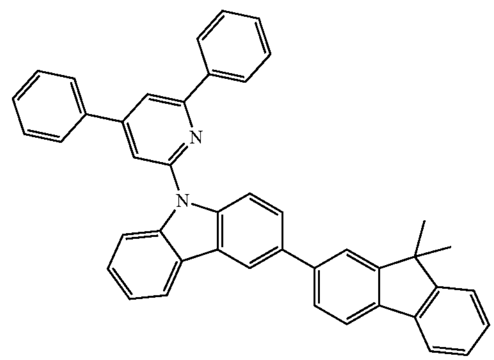
A-153
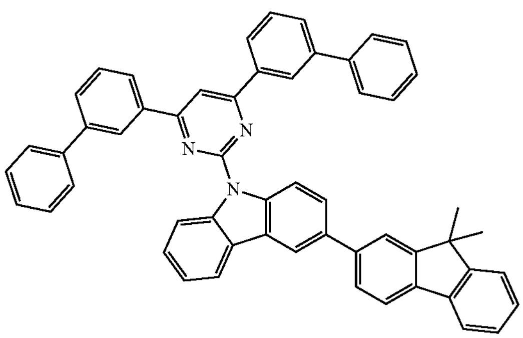
A-154
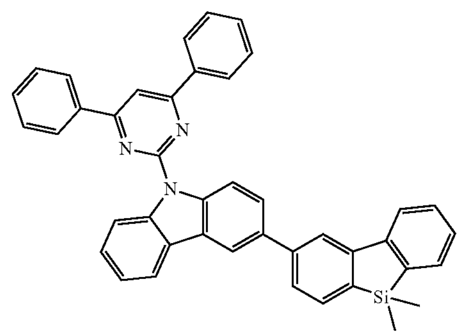
A-155
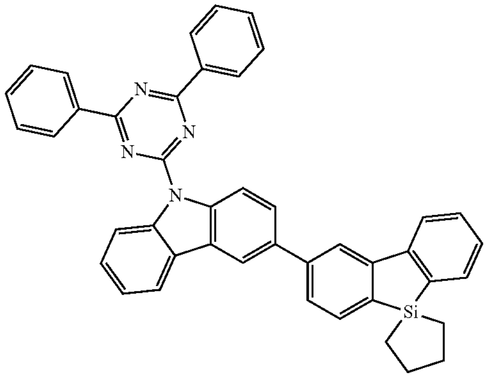
A-156
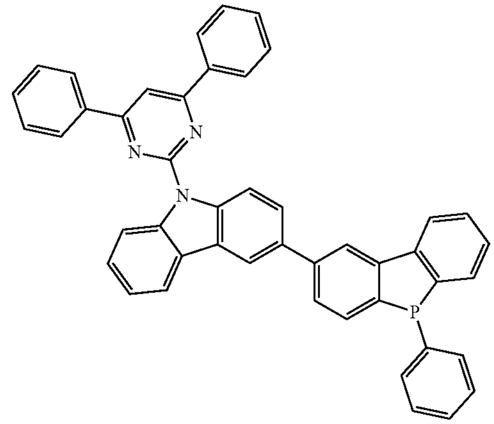

-continued
A-157
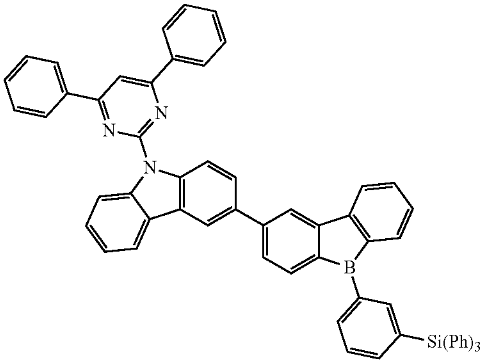
A-158
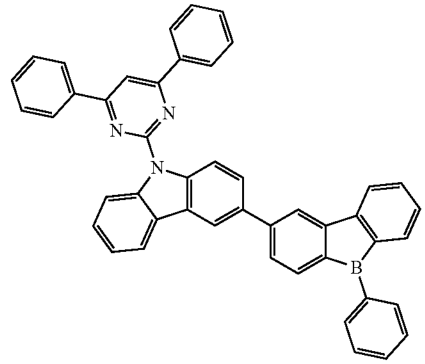
A-159
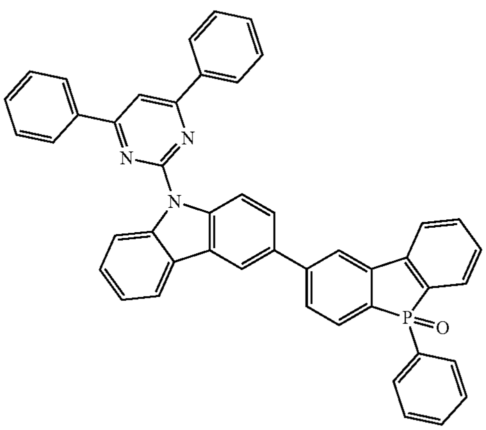
A-160
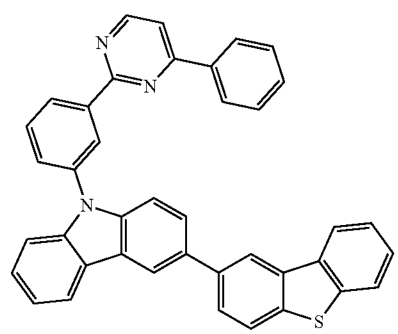
A-161
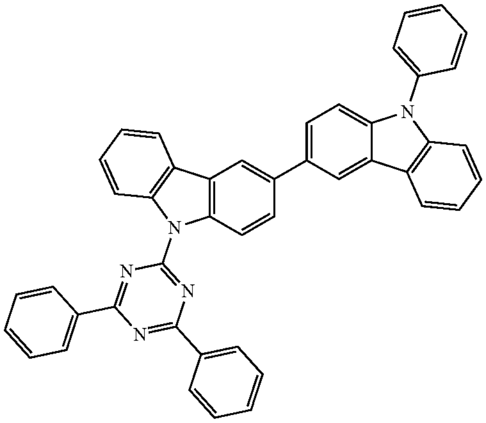
A-162
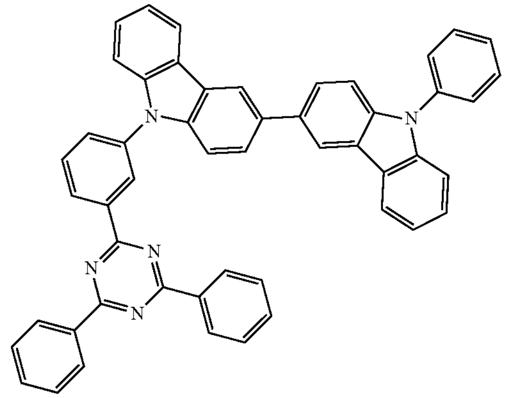

-continued
A-163
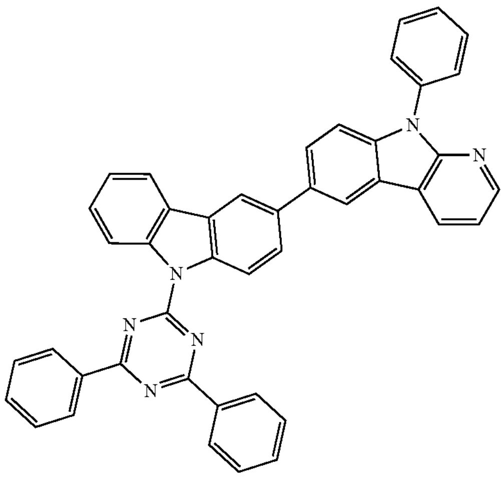
A-164
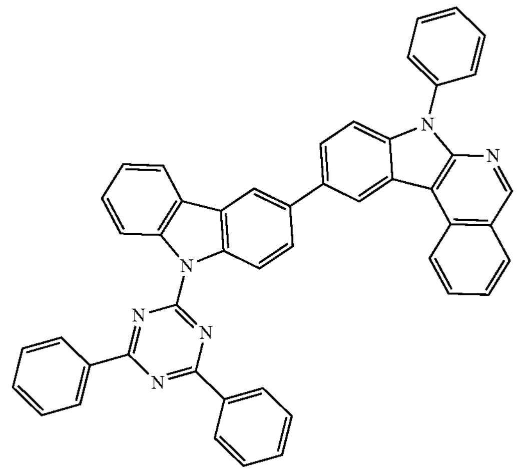
A-165
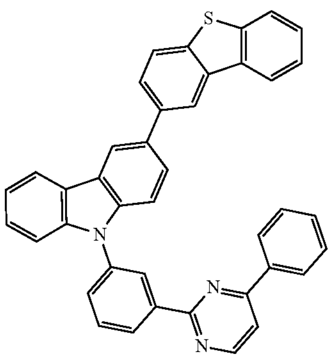
A-166
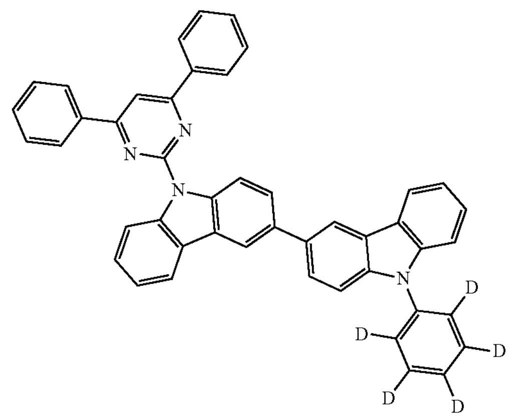
A-167
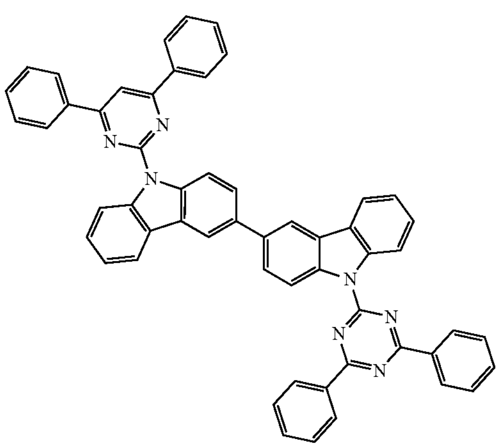
A-168
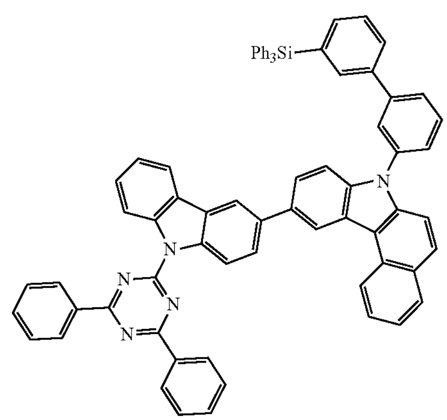

-continued
A-169
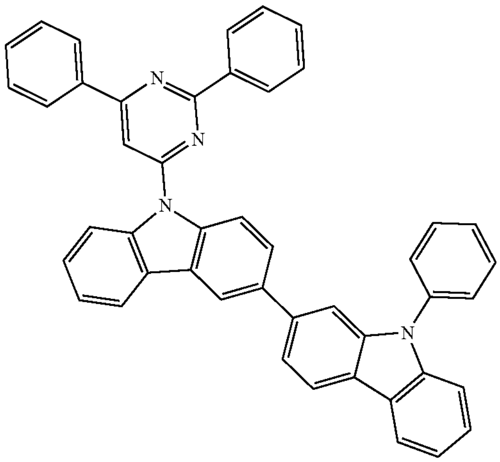
A-170
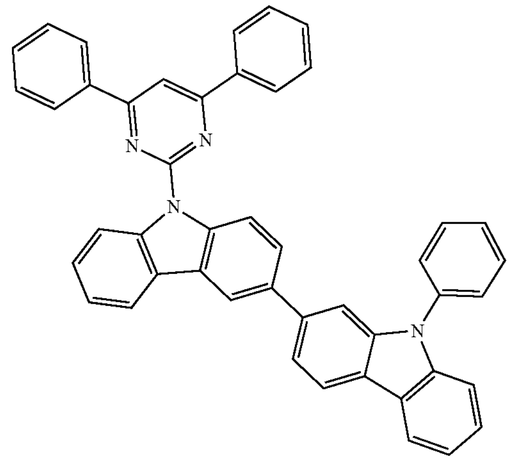
A-171
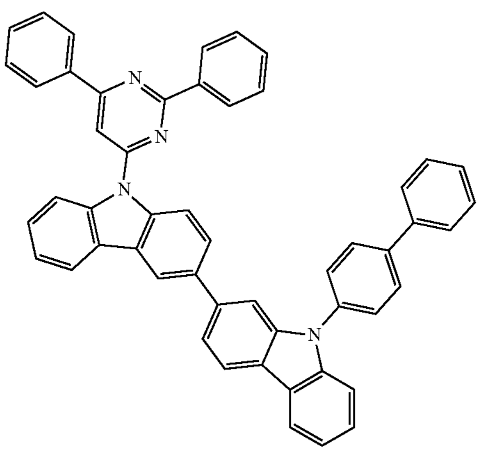
A-172
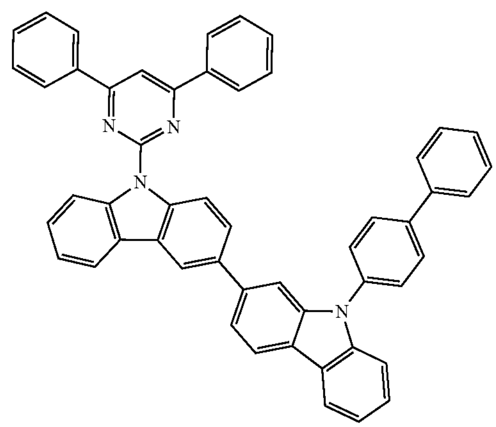
A-173
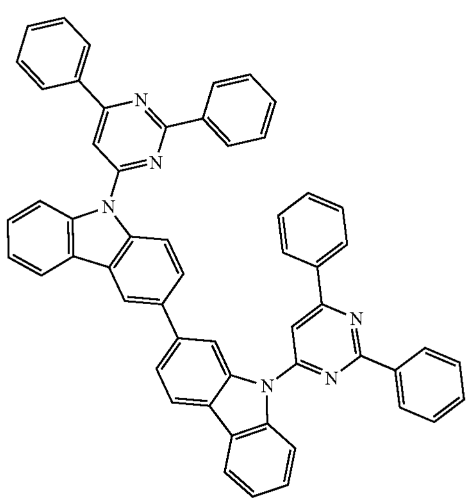
A-174
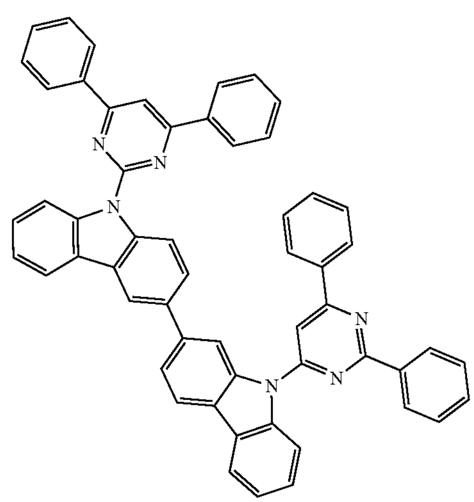

-continued
A-175
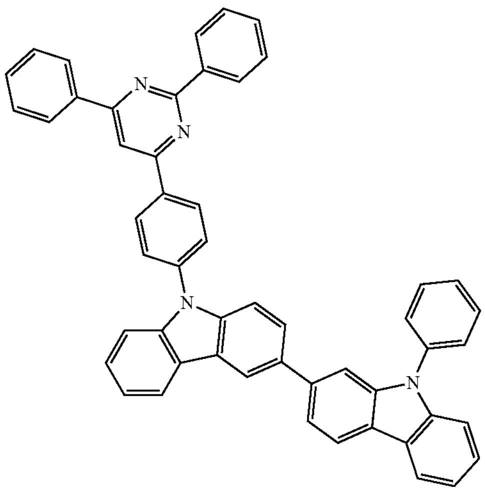
A-176
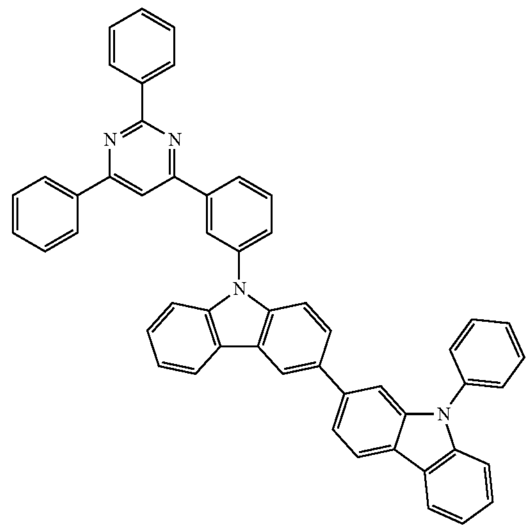
A-177
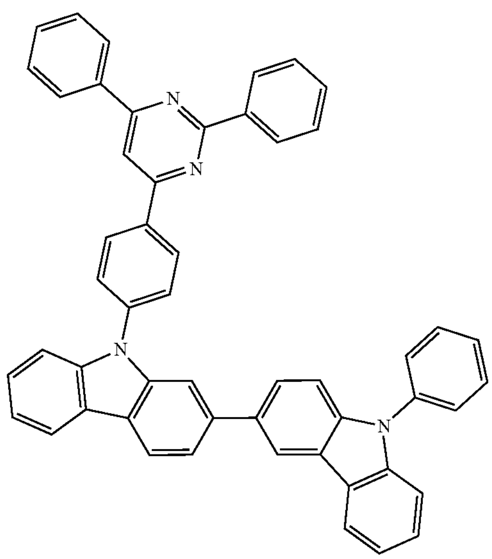
A-178
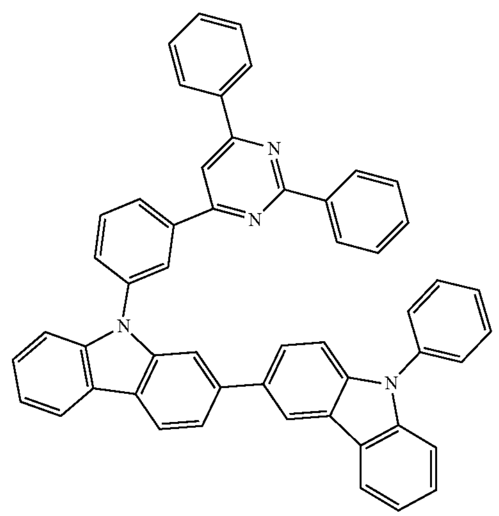
A-179
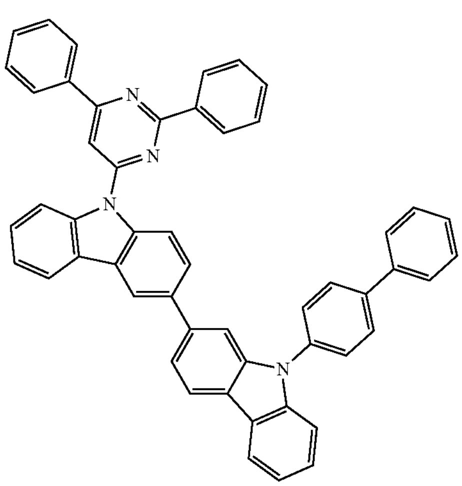
A-180
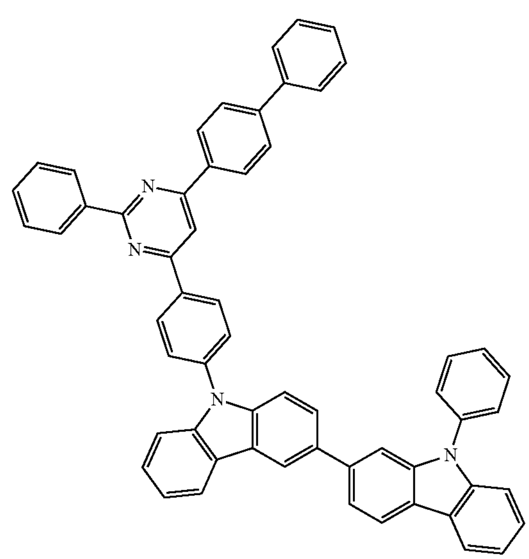

-continued
A-181
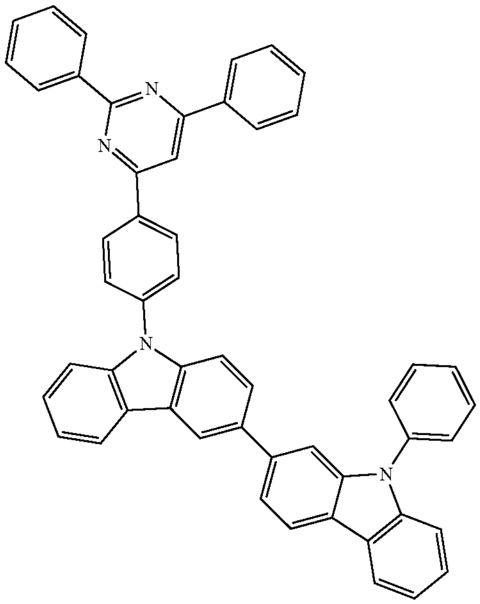
A-182
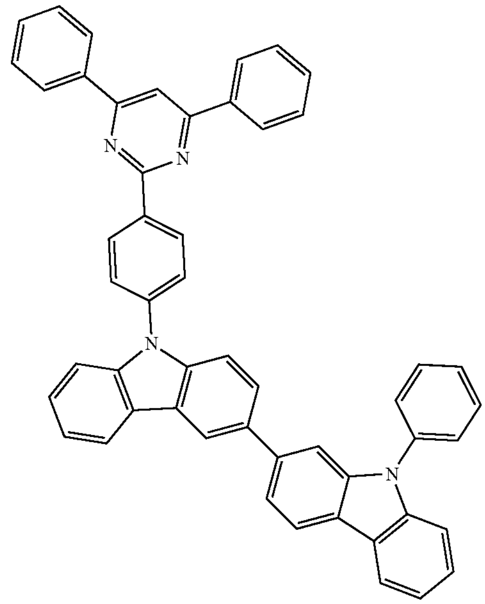
A-183
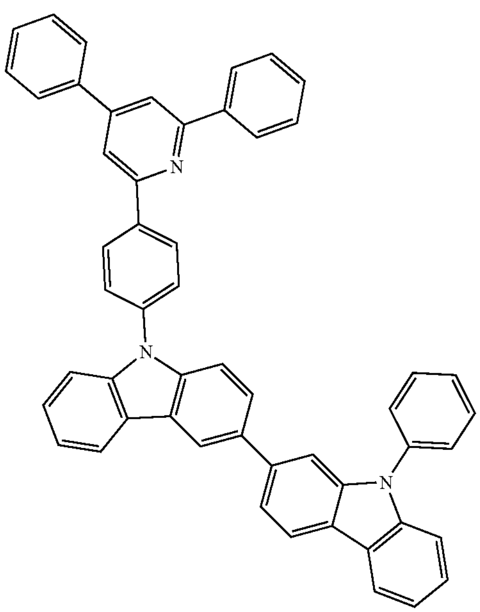
A-184
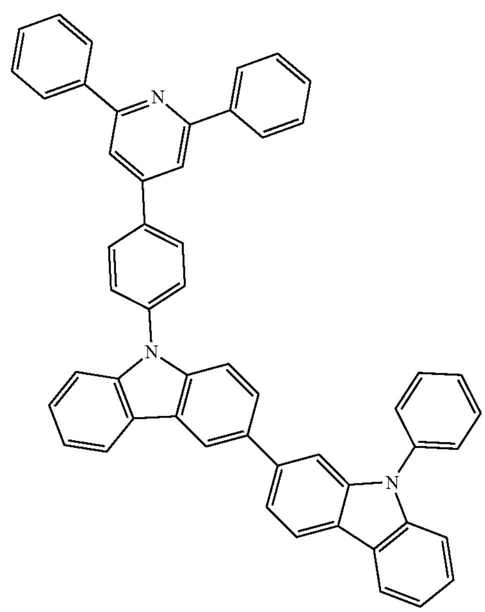

-continued
A-185
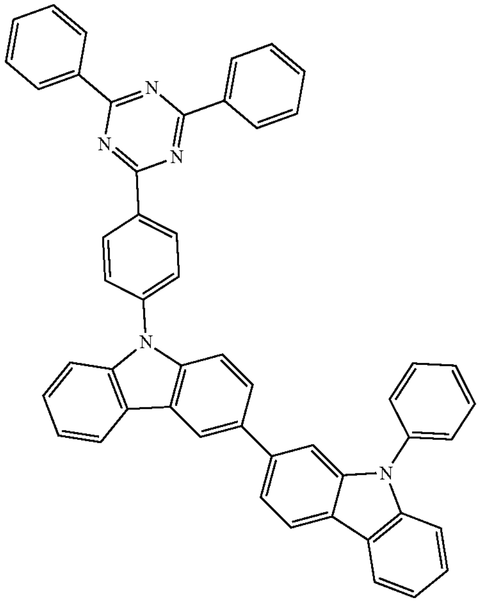
A-186
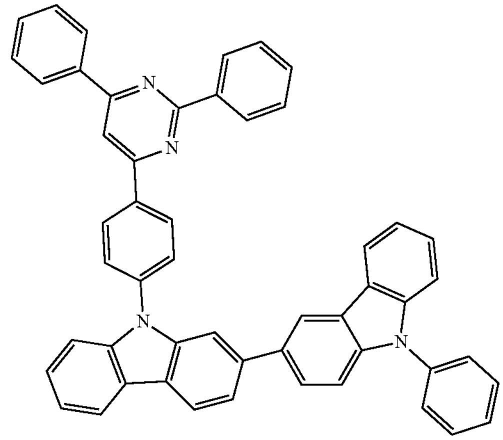
A-187
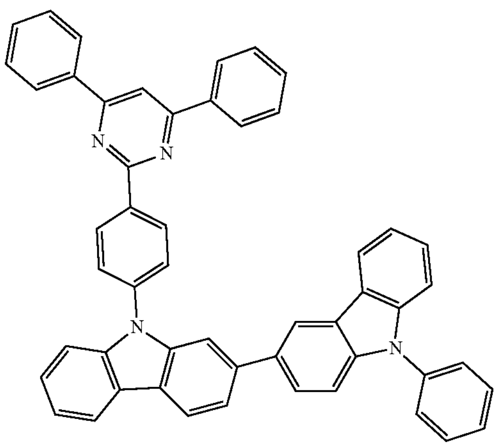
A-188
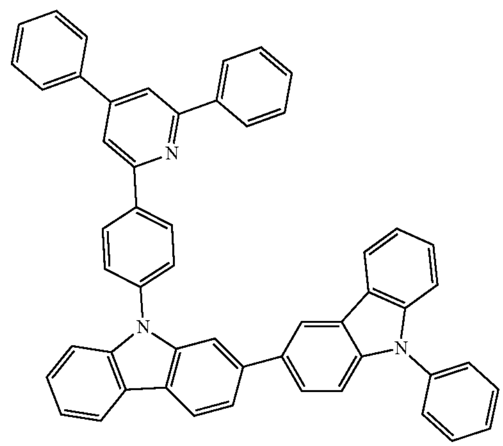
A-189
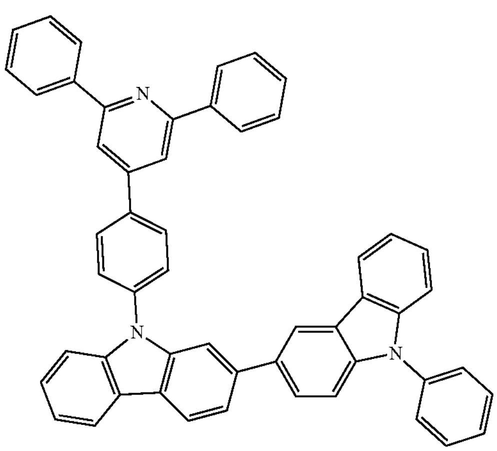
A-190
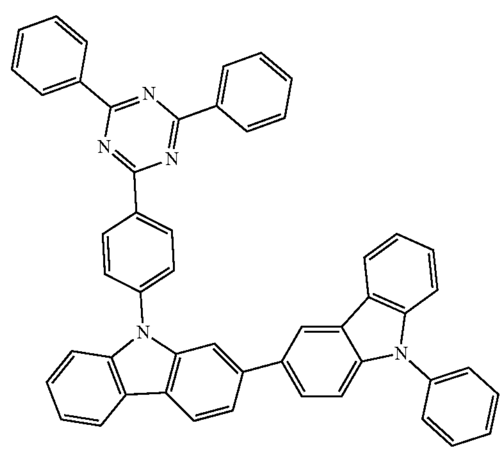

-continued
A-191
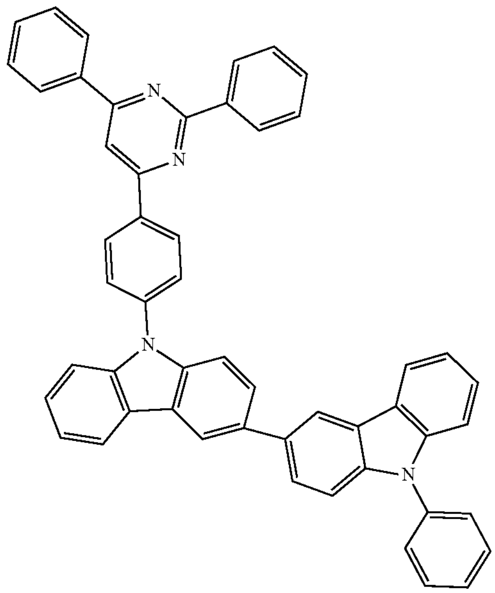
A-192
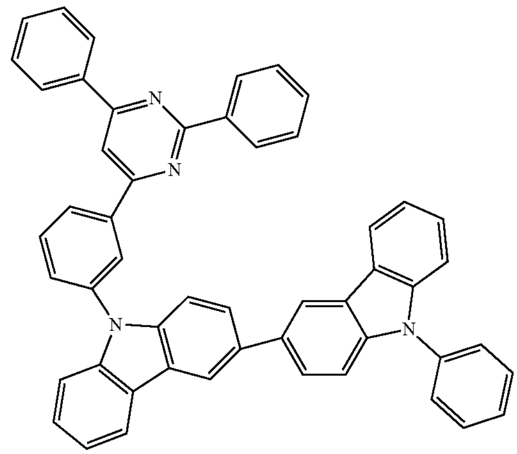
A-193
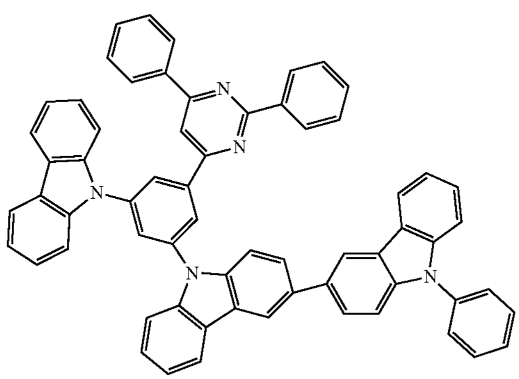
A-194
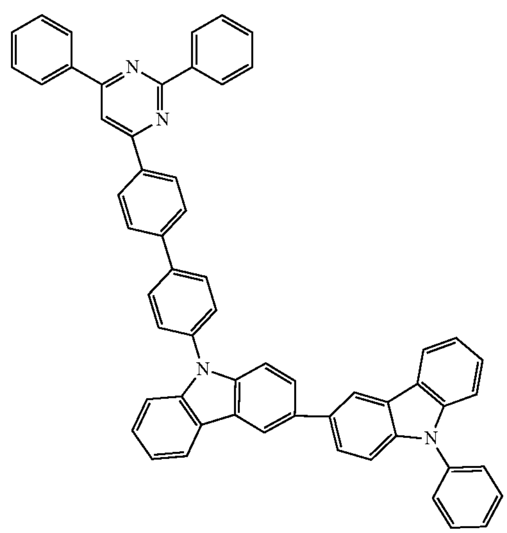

-continued
A-195
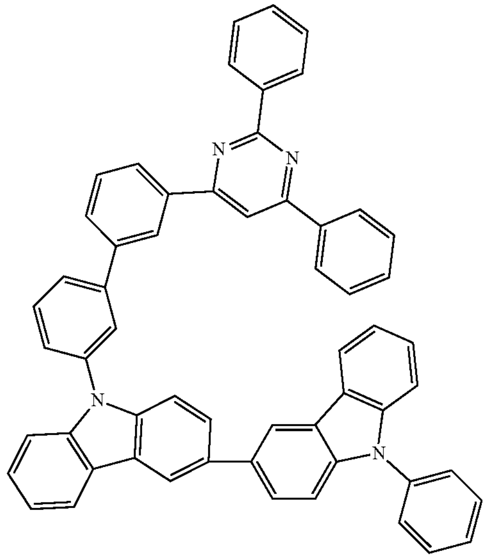
A-196
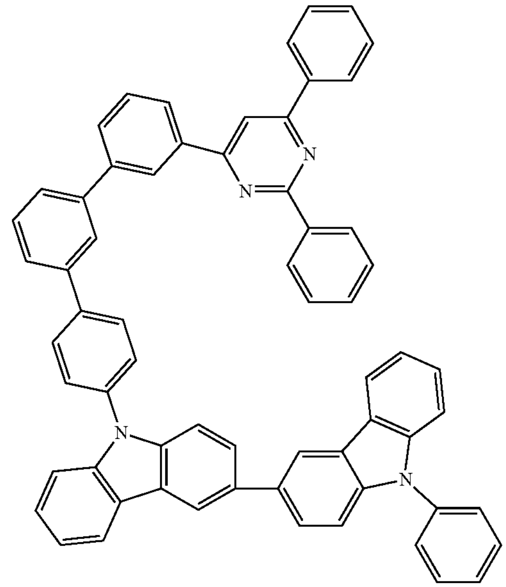
A-197
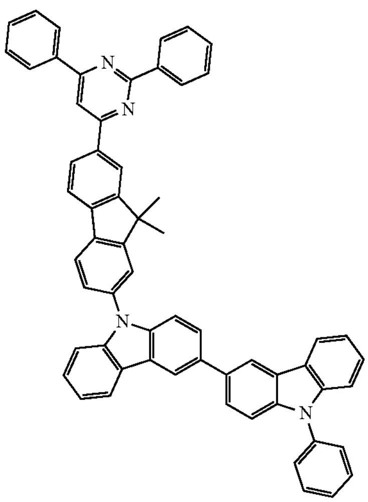
A-198
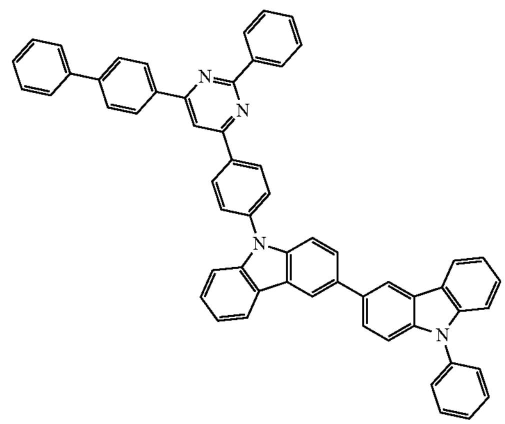
A-199
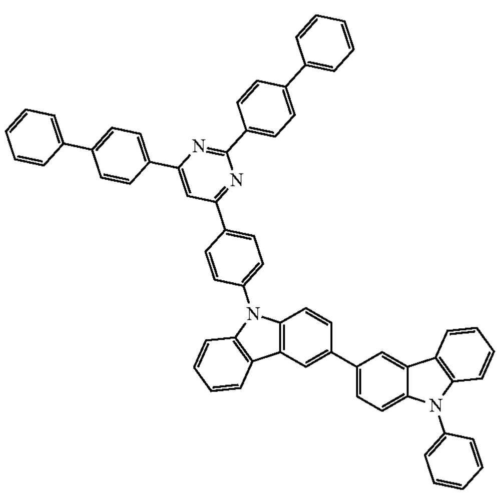
A-200
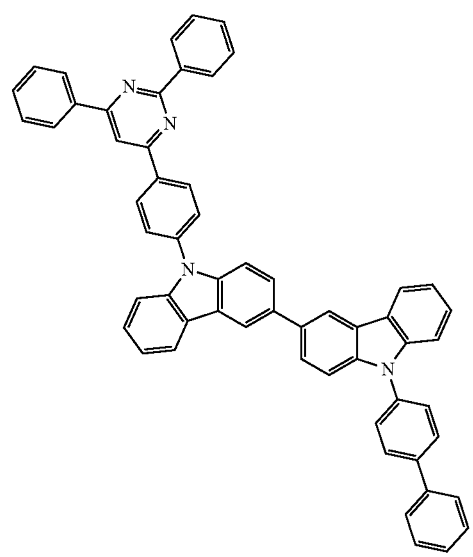

-continued
A-201
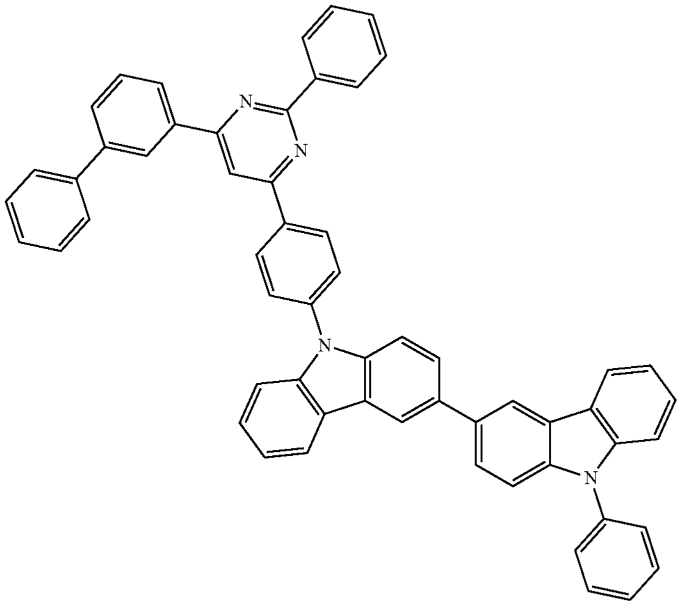
A-202
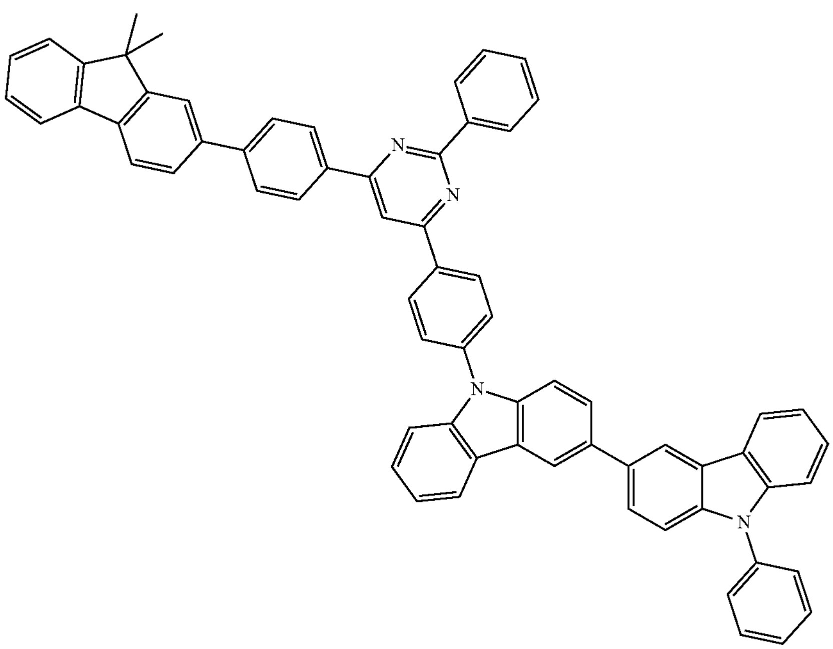

-continued
A-203
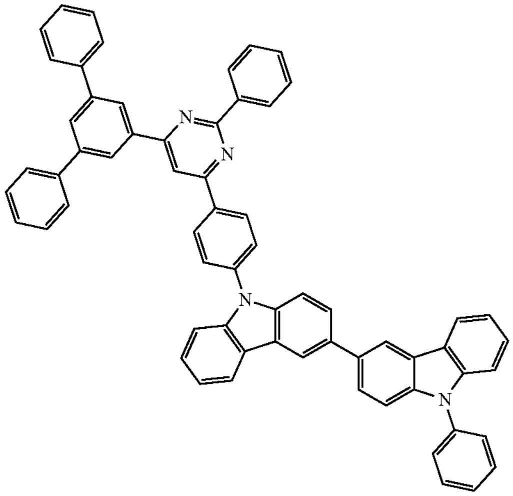
A-204
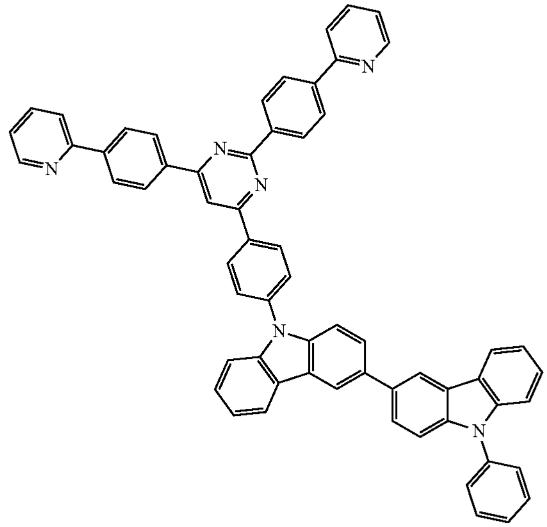
A-205
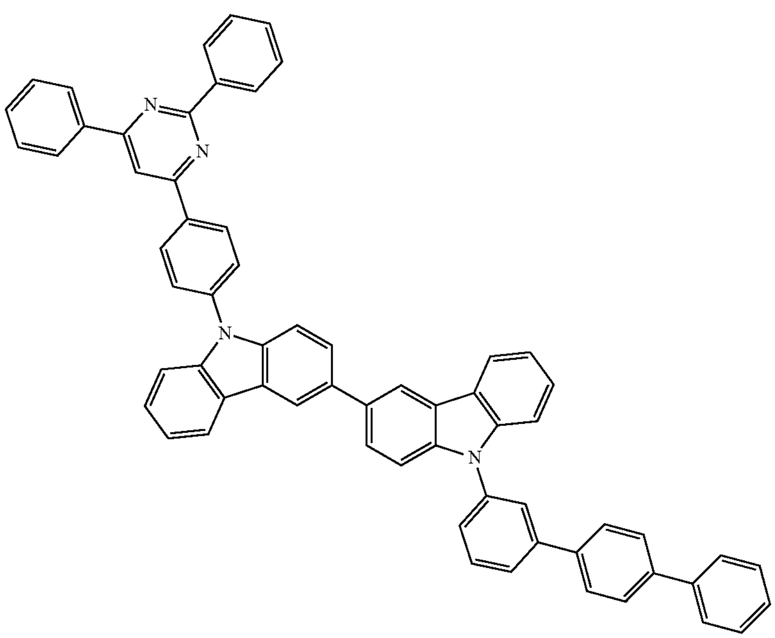

-continued
A-206
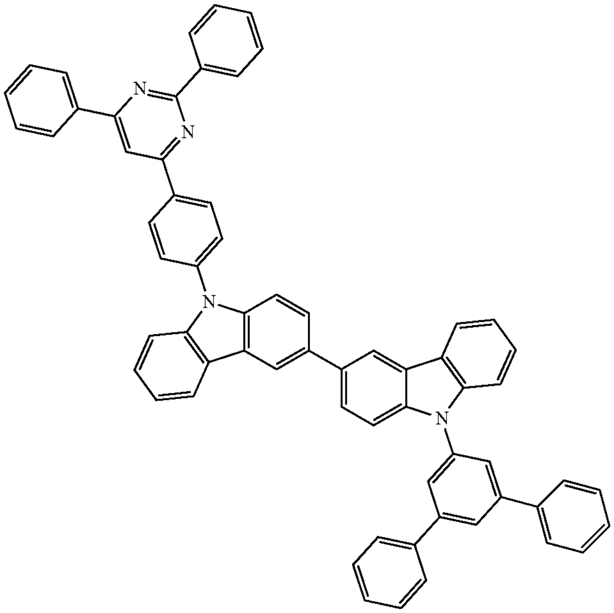
G-101
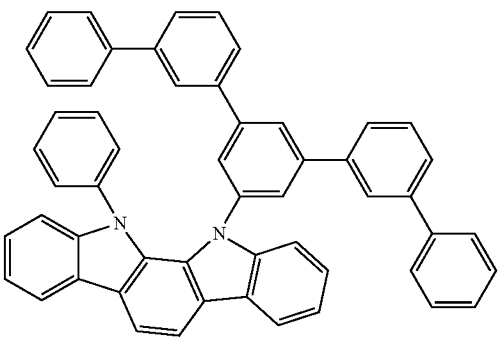
G-102
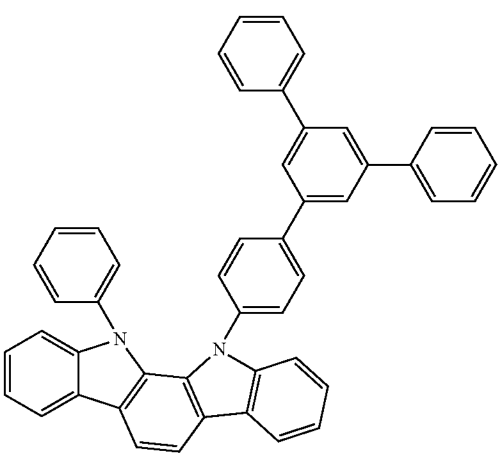
-continued
G-103
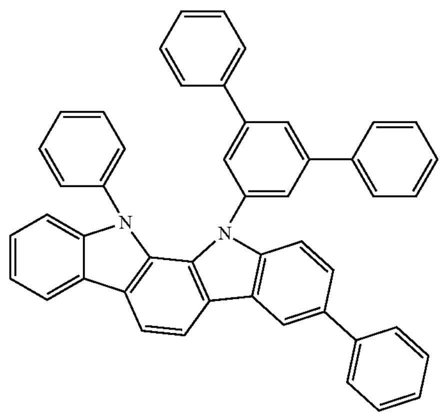
G-104
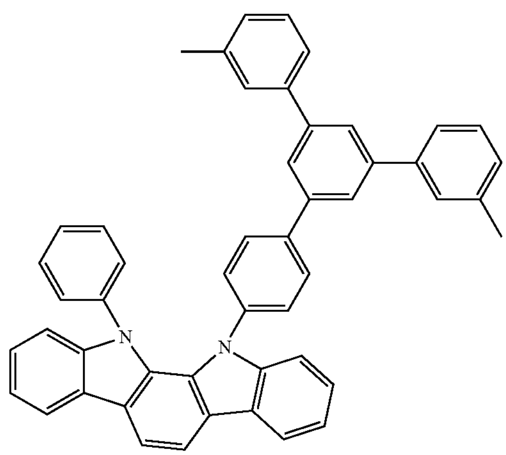

-continued
G-105
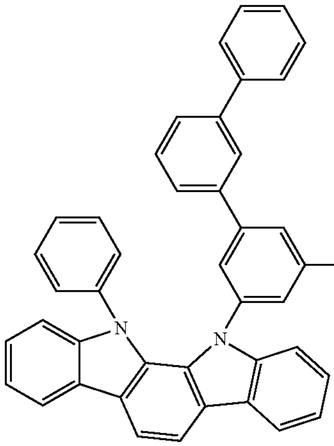
G-106
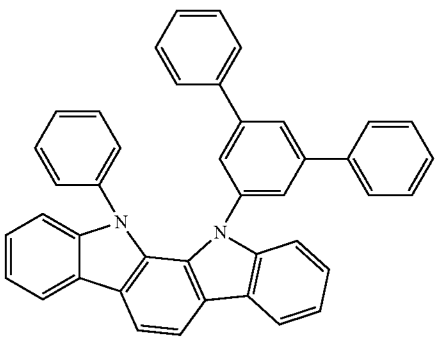
G-107
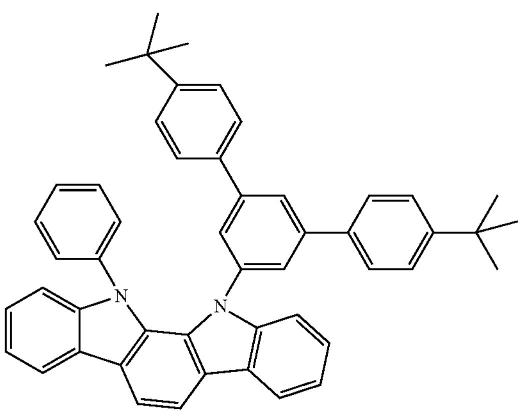
G-108
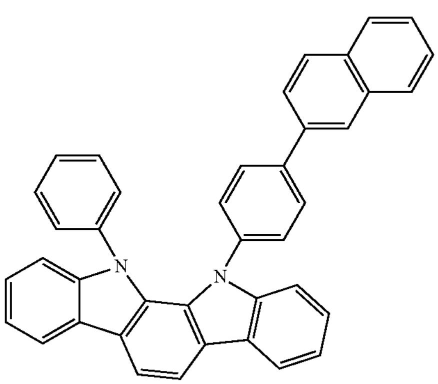
-continued
G-109
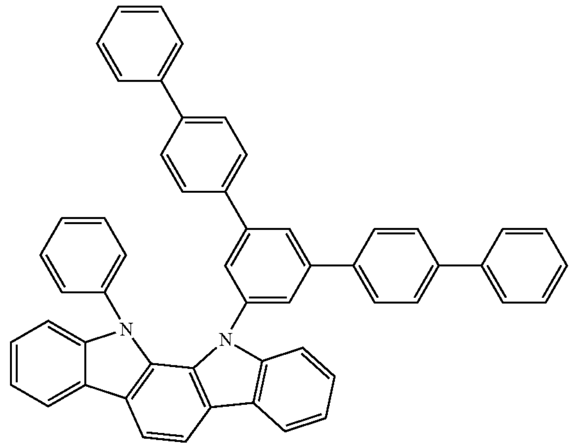
G-110
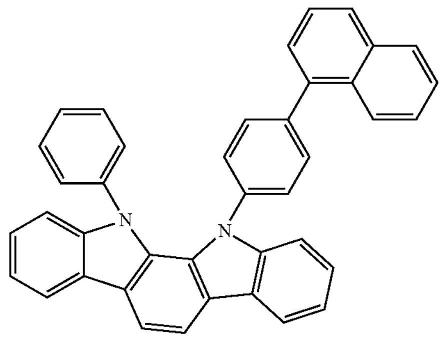
G-111
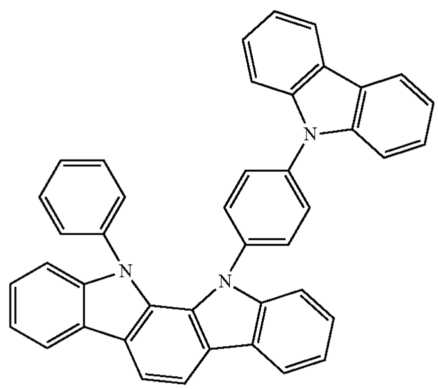
G-112
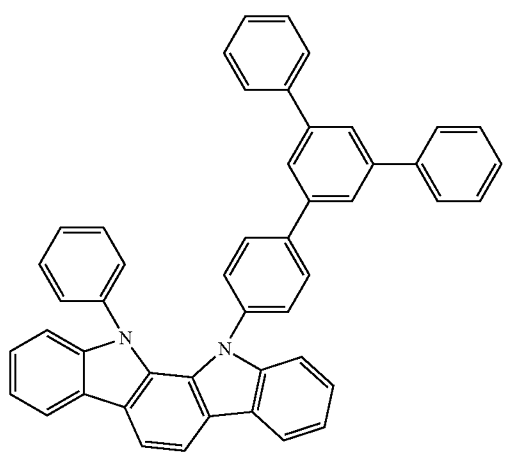

-continued
G-113
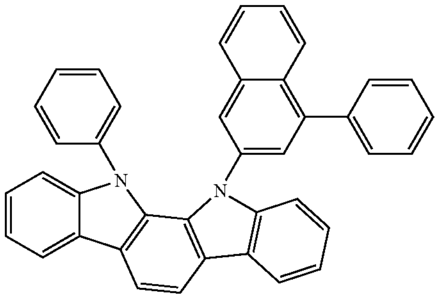
G-114
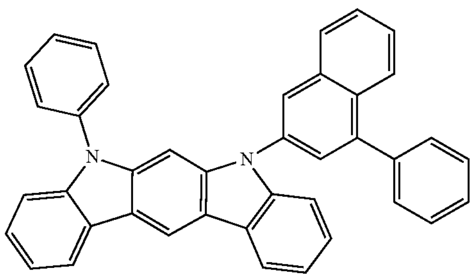
G-115
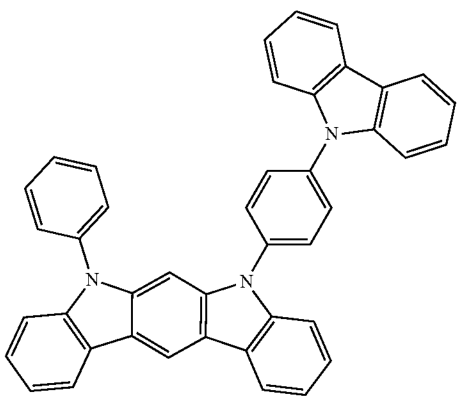
G-116
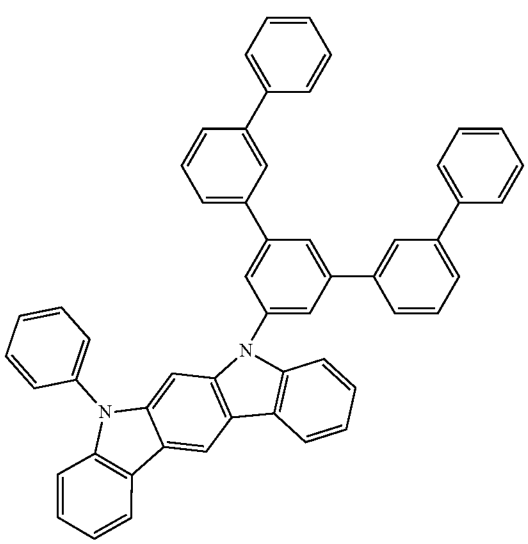
-continued
G-117
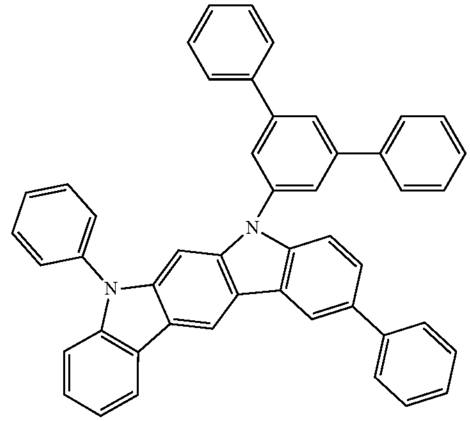
G-118
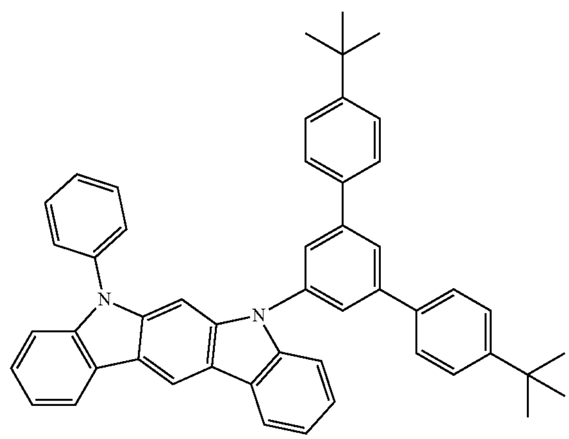
G-119
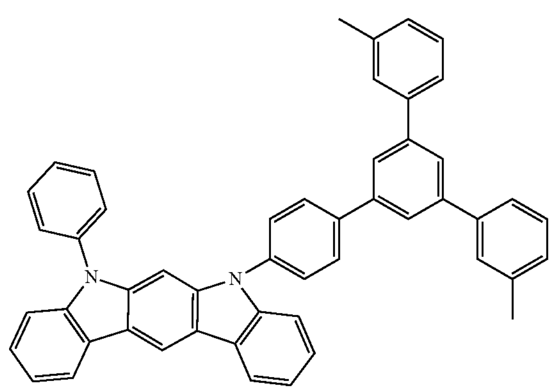

-continued
G-120
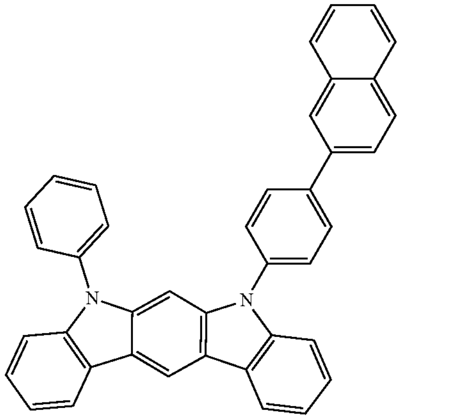
G-121
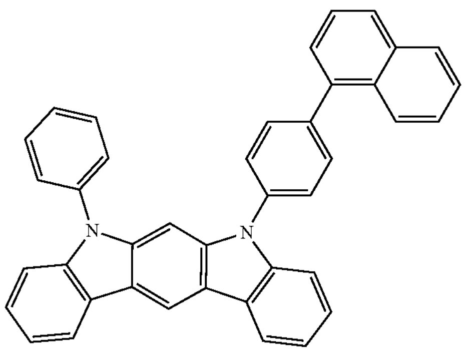
G-122
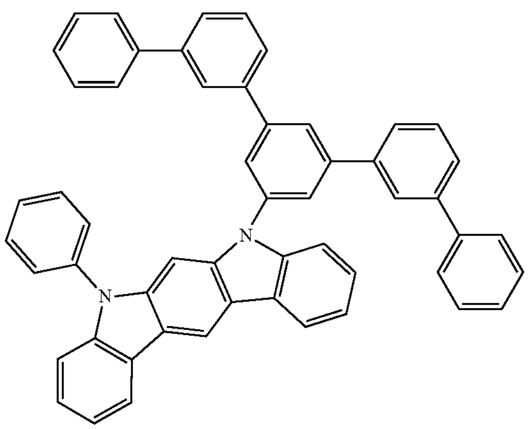
G-123
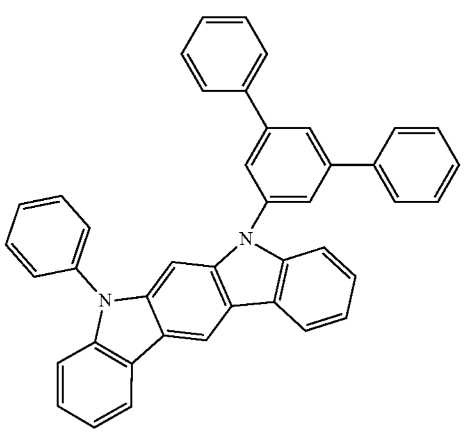
-continued
G-124
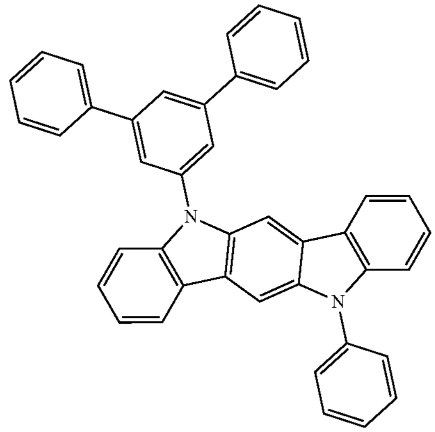
G-125
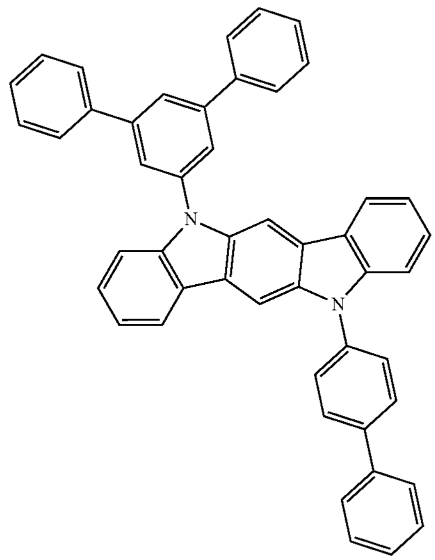
G-126
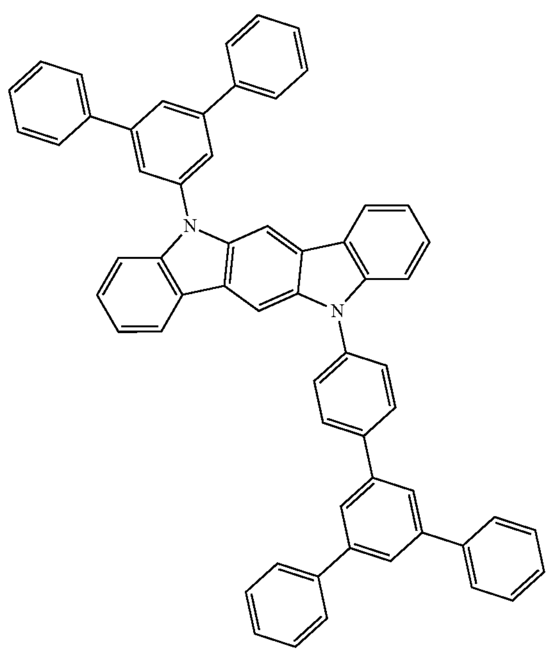

-continued
G-127
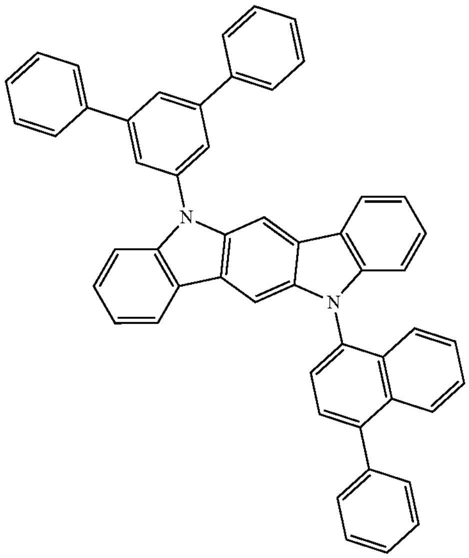
G-128
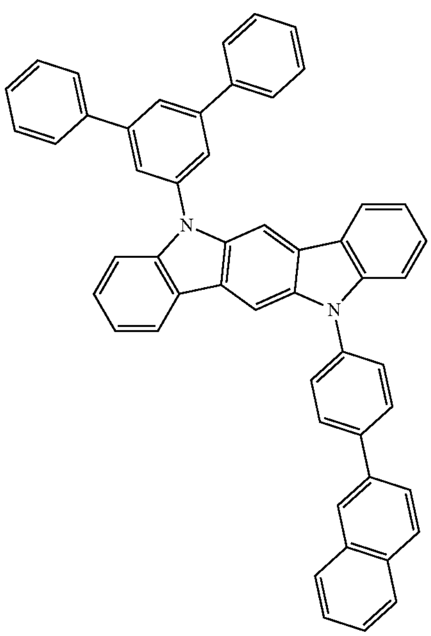
-continued
G-129
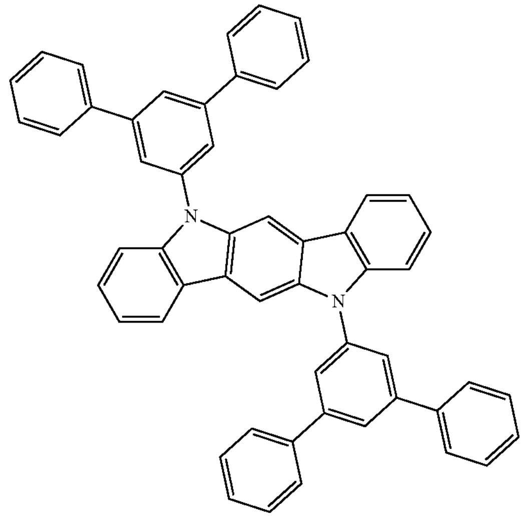
G-130
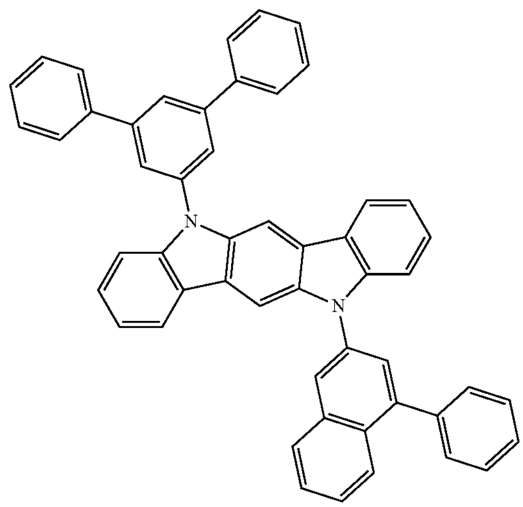
G-131
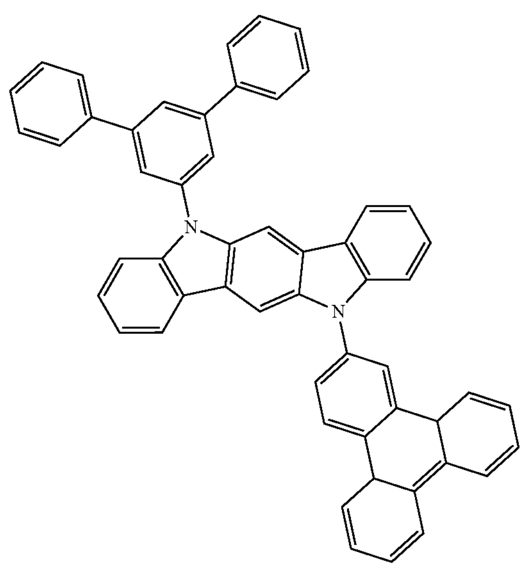

G-132
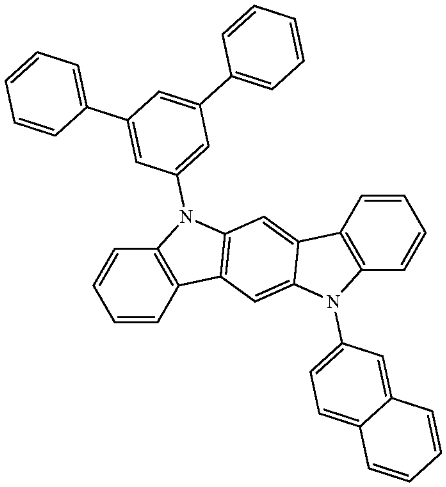
G-133
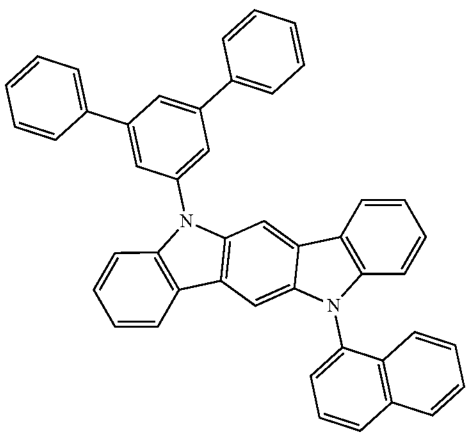
G-134
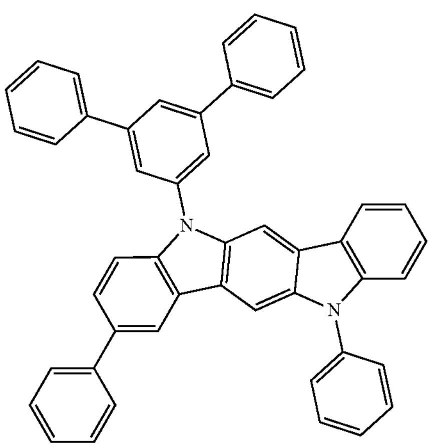
G-135
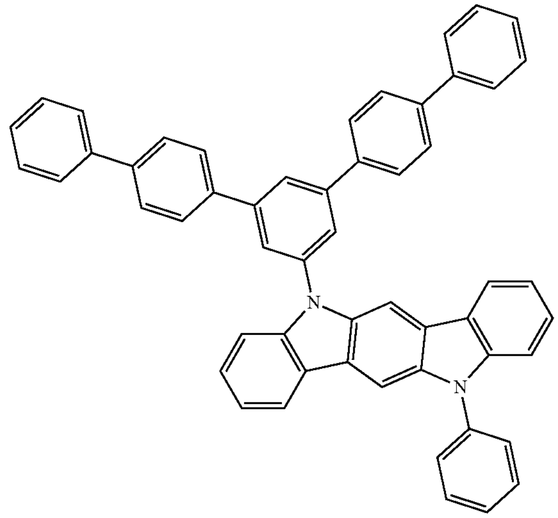
G-136
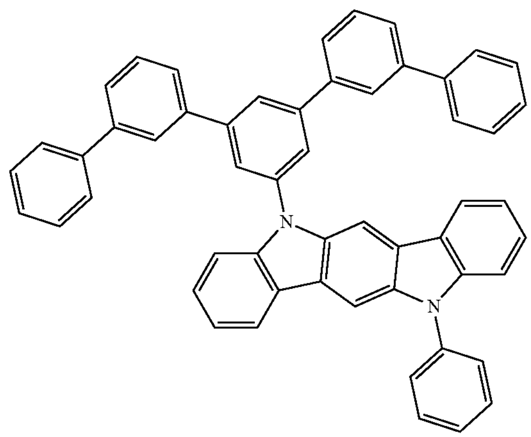
G-137
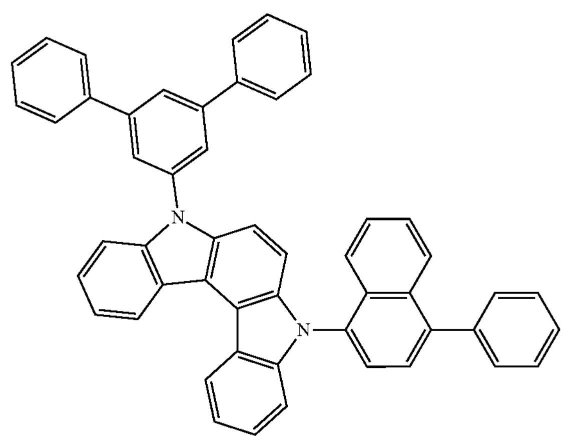

-continued
G-138
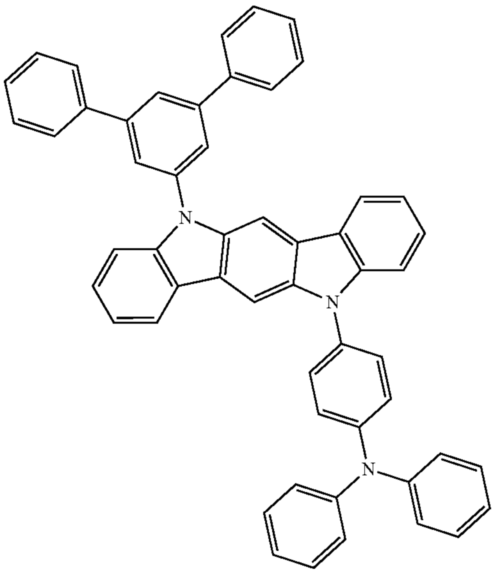
G-139
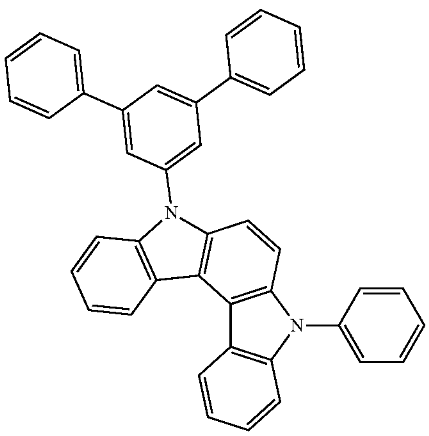
G-140
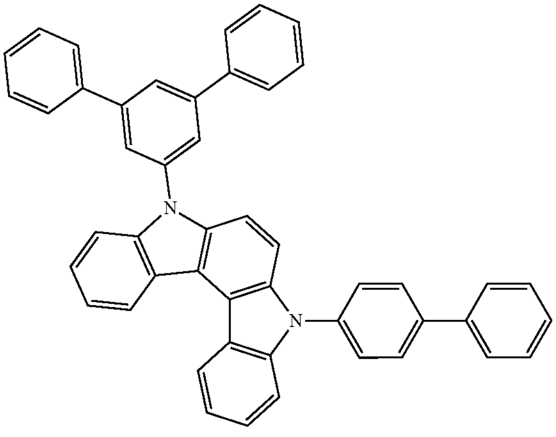
-continued
G-141
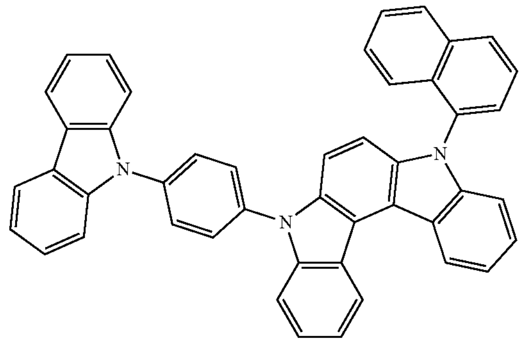
G-142
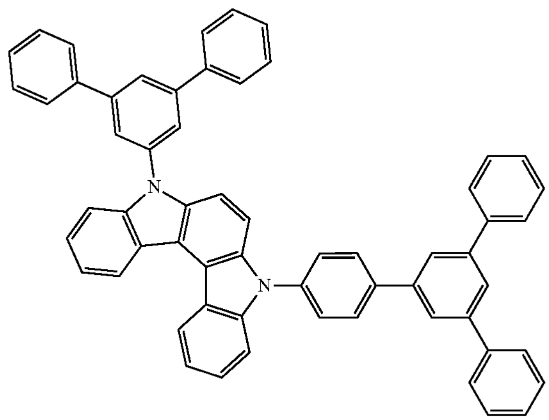
G-143
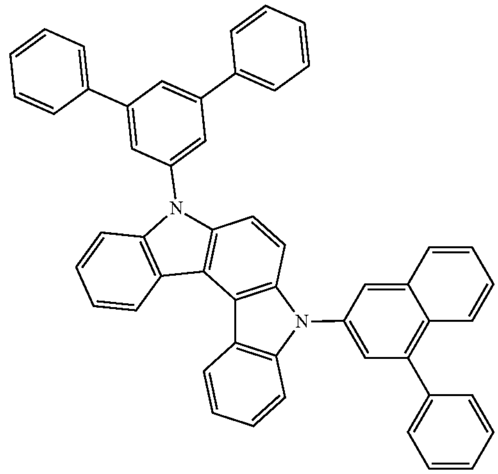

-continued
G-144
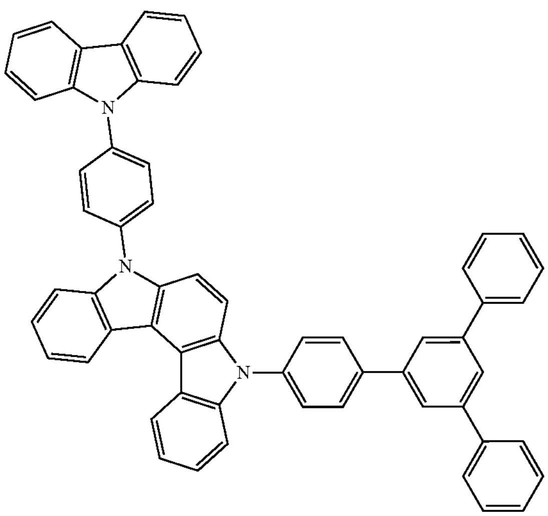
G-145
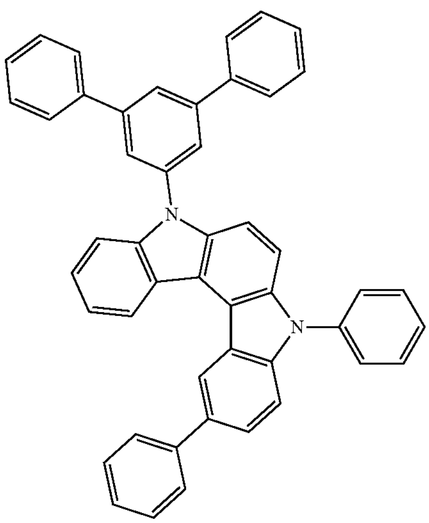
G-146
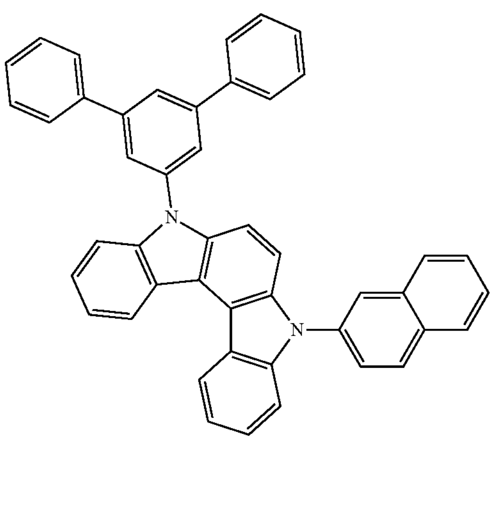
-continued
G-147
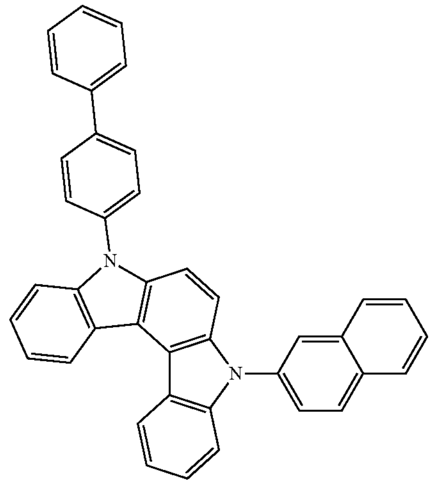
G-148
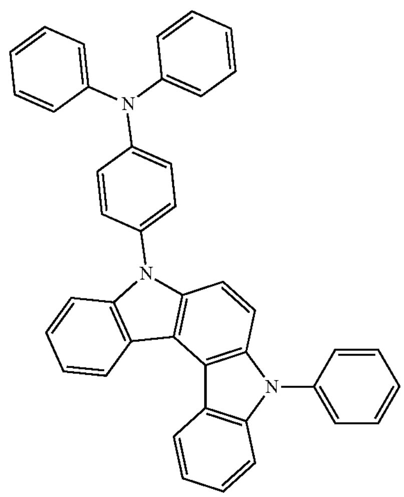
G-149
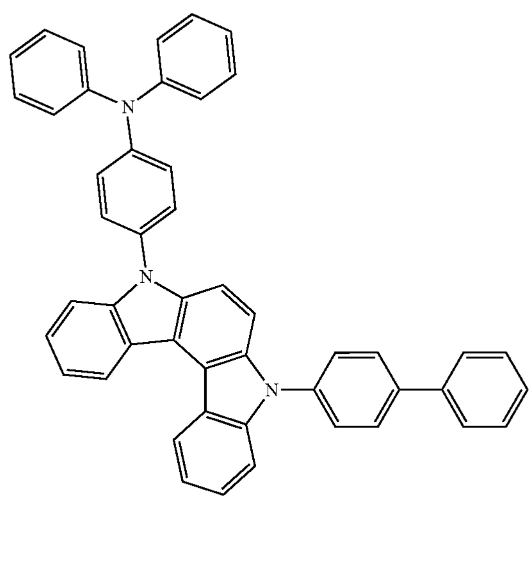

-continued
G-150
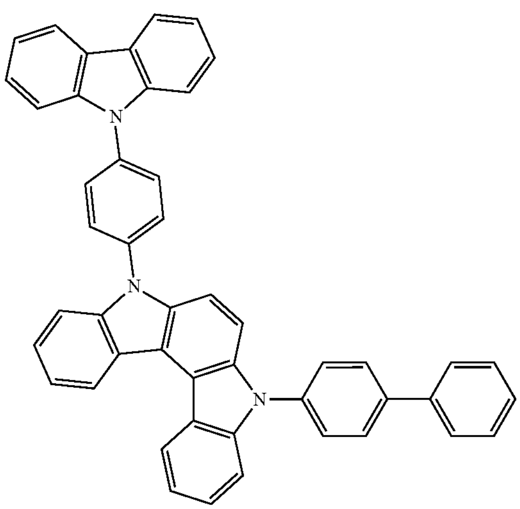
G-151
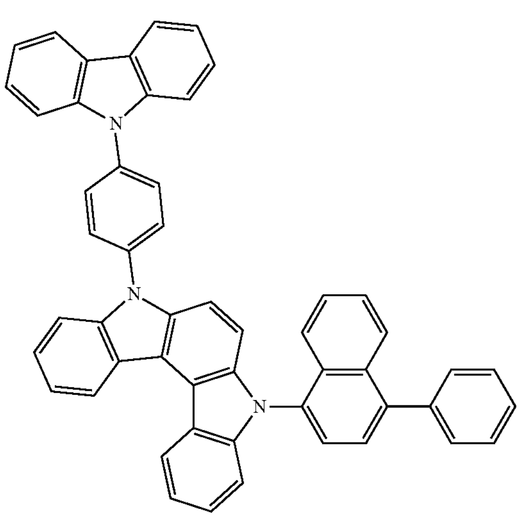
G-152
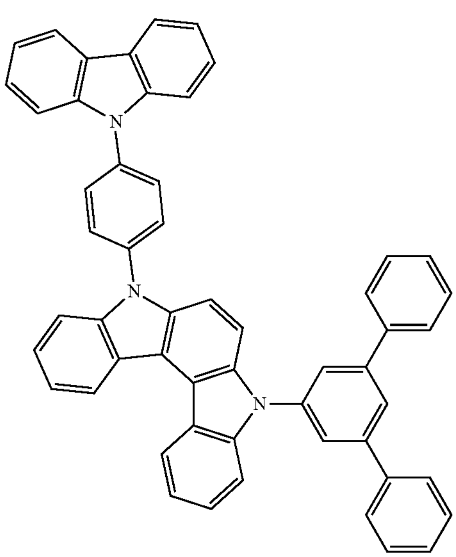
-continued
G-153
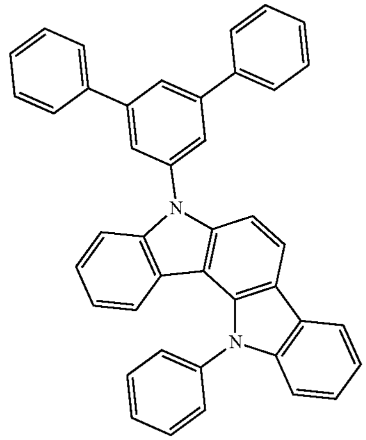
G-154
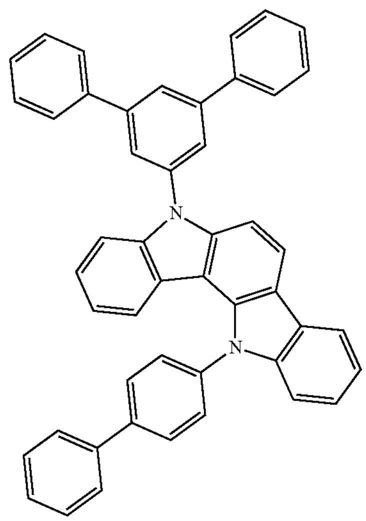
G-155
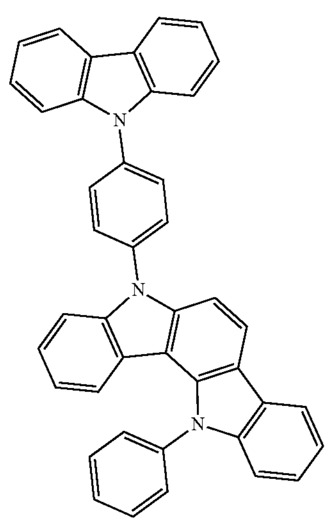

-continued
G-156
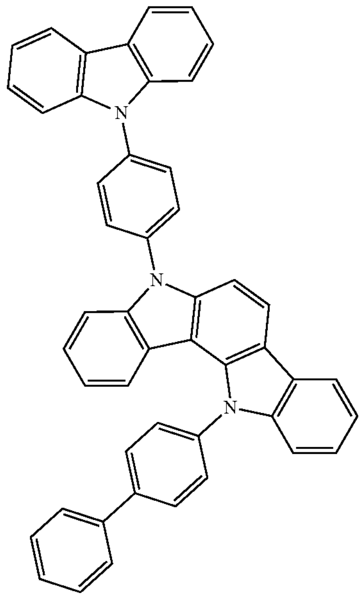
G-157
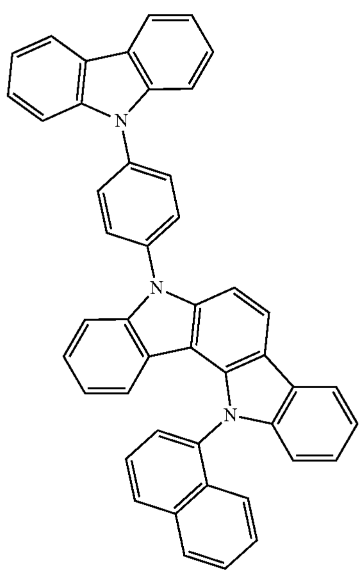
-continued
G-158
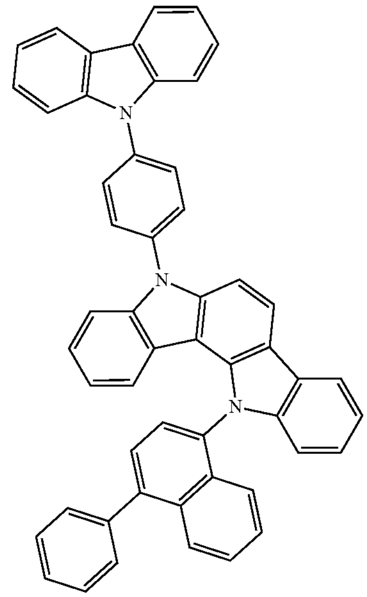
G-159
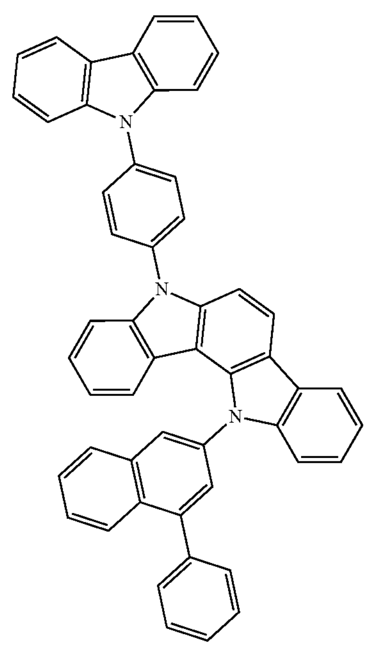

-continued
G-160
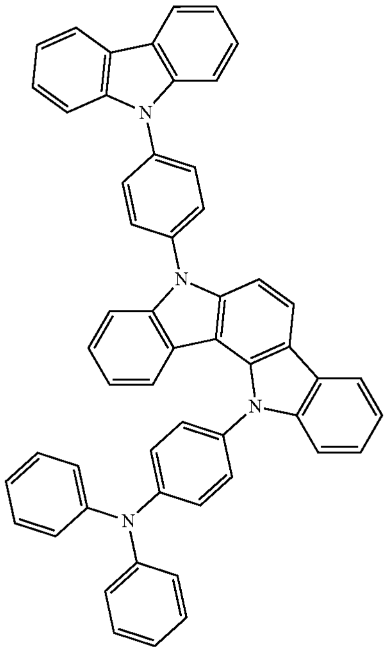
G-161
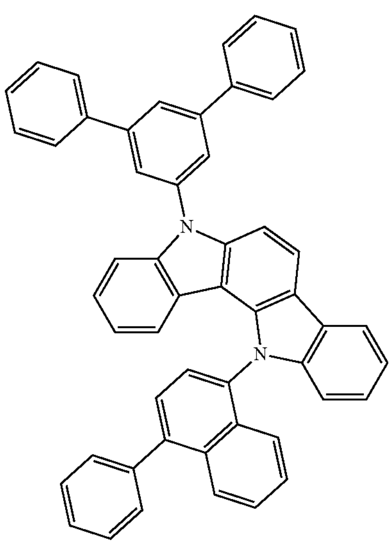
-continued
G-162
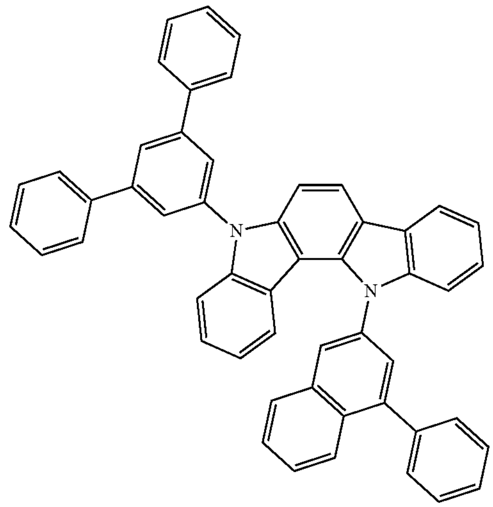
G-163
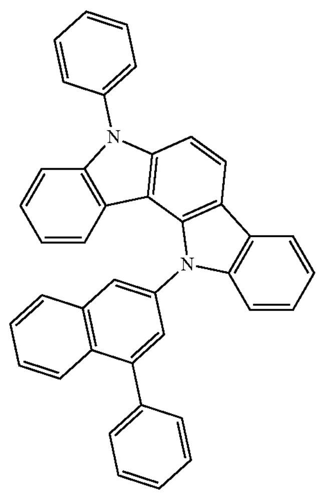
G-164
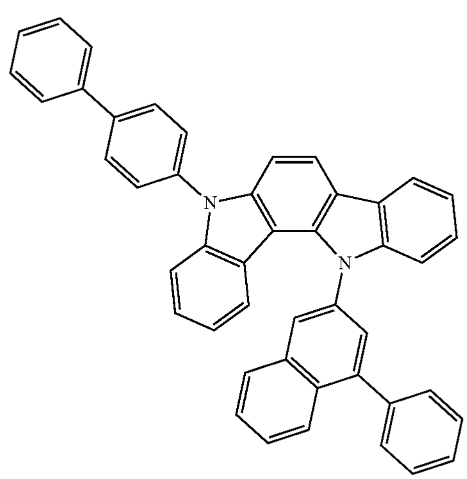

-continued
G-165
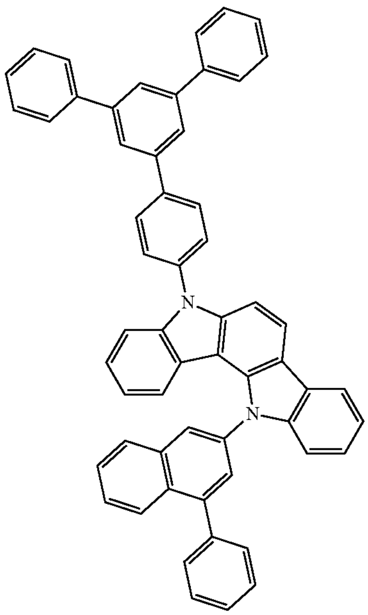
G-166
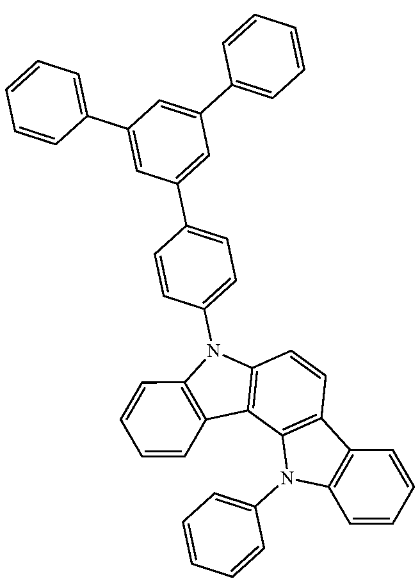
-continued
G-167
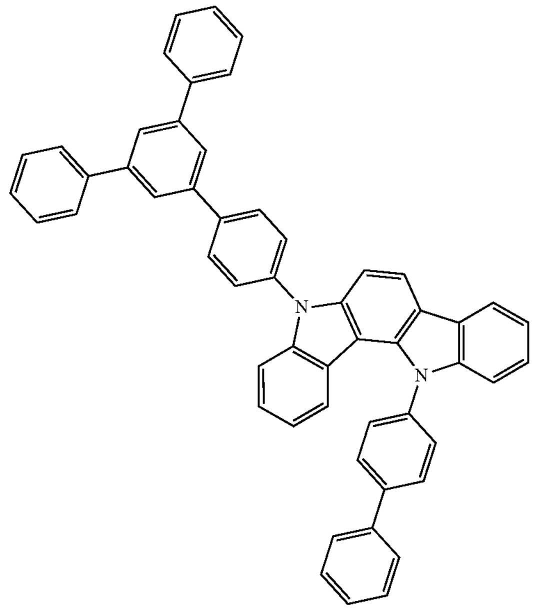
G-168
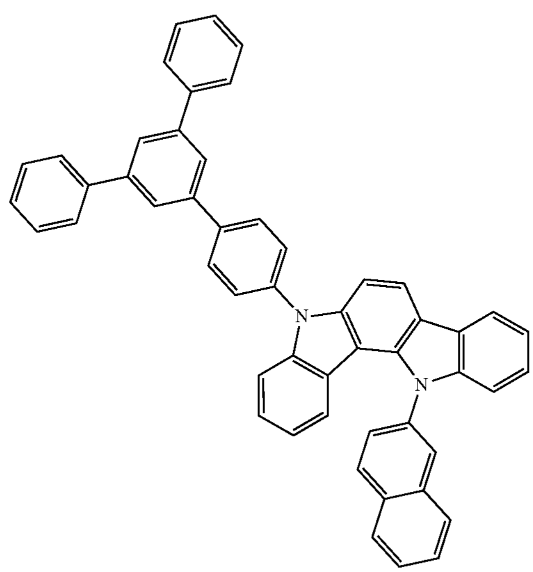

-continued
G-169
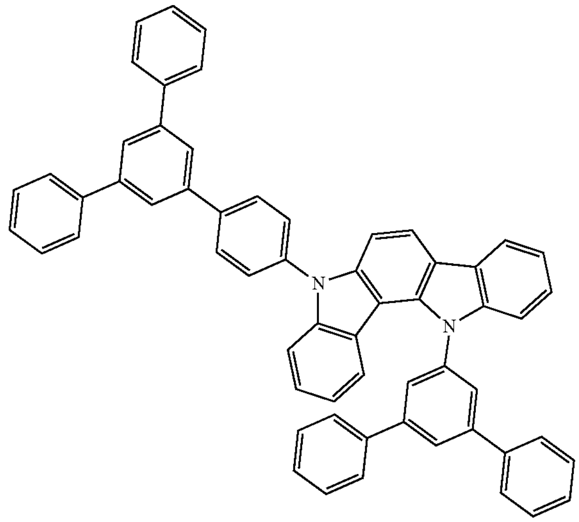
G-170
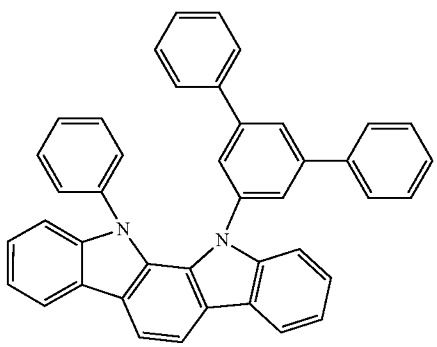
G-171
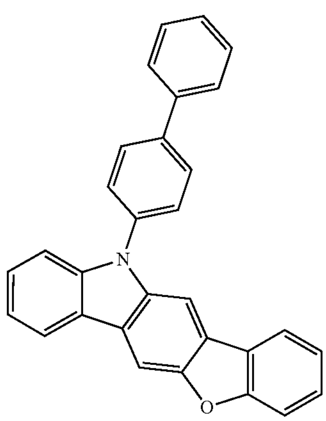
-continued
G-172
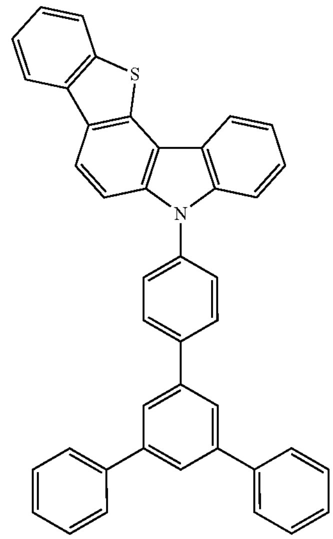
G-173
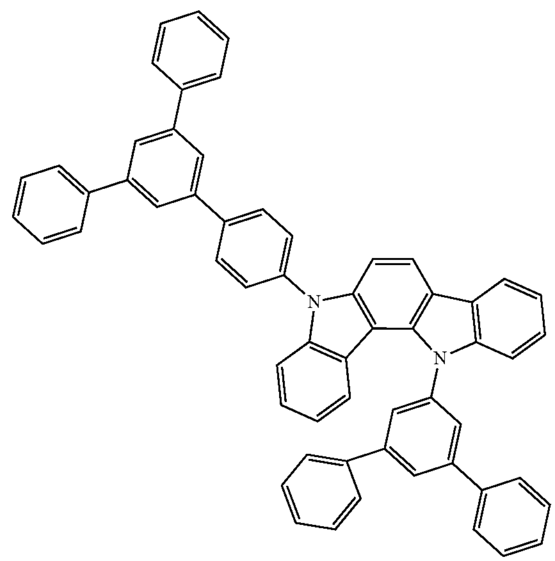
C-101
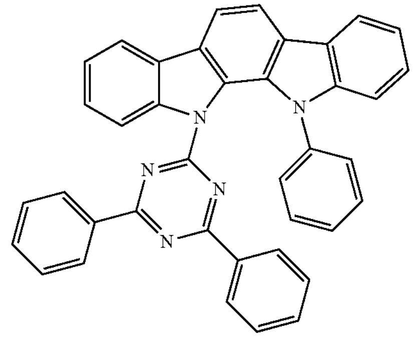

C-102
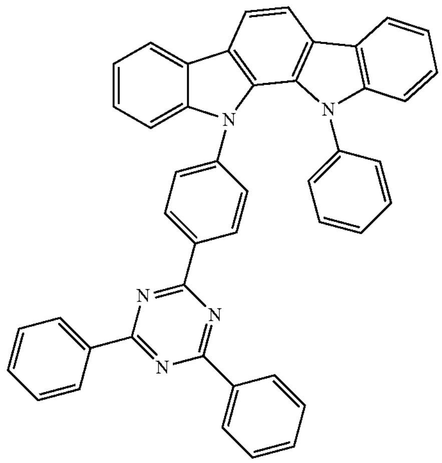
C-103
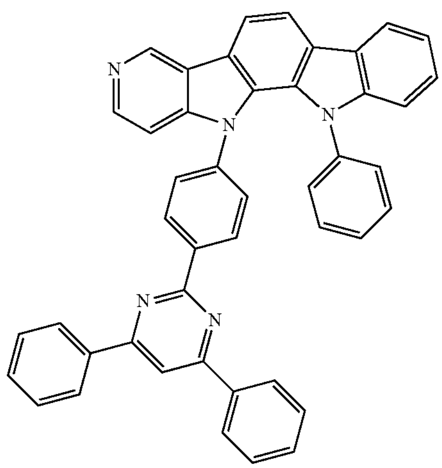
C-104
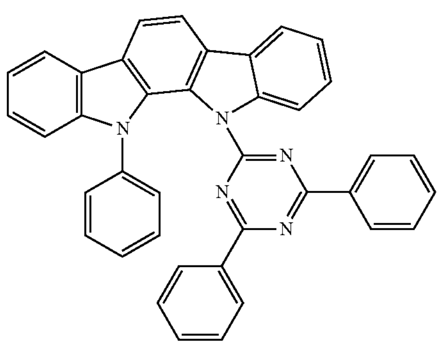
C-105
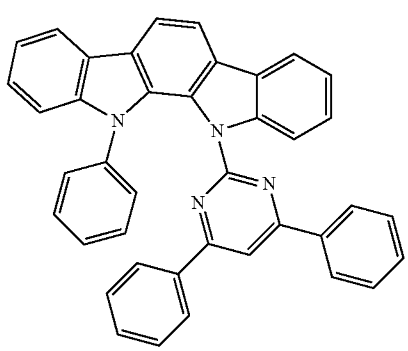
C-106
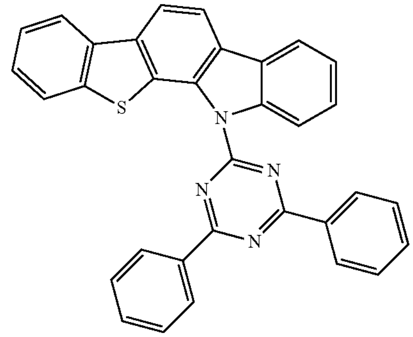
C-107
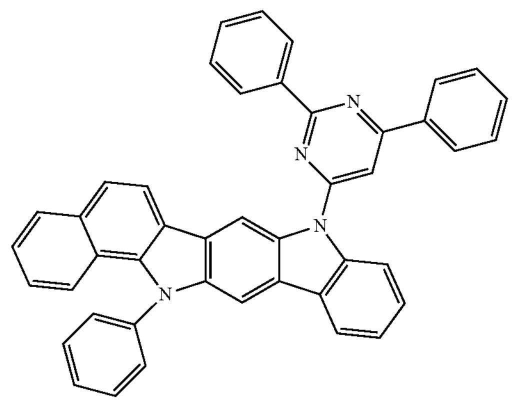
C-108
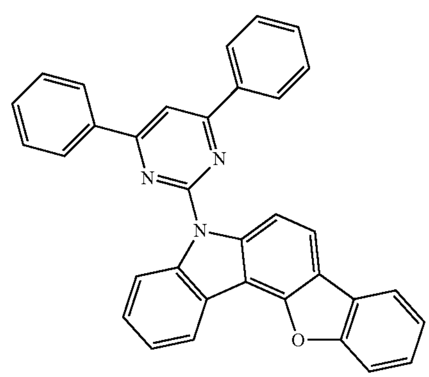
C-109
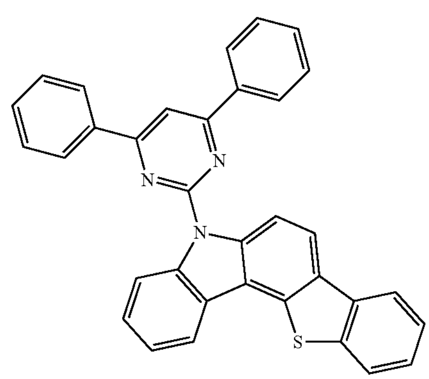

-continued
C-110
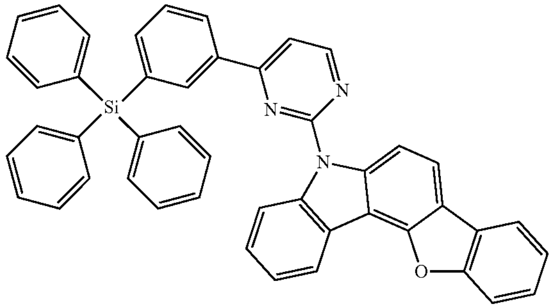
C-111
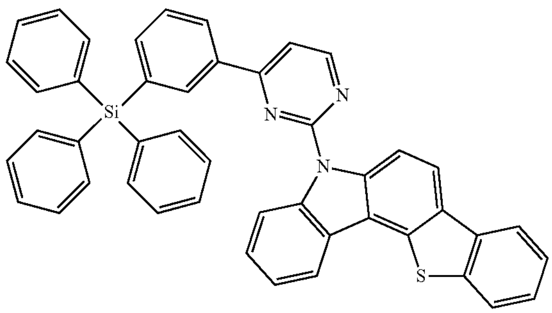
C-112
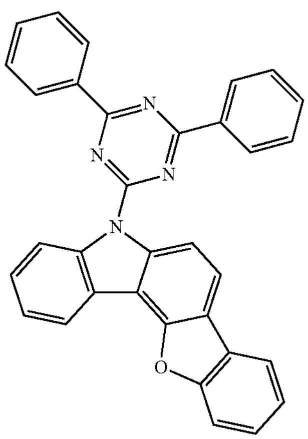
C-113
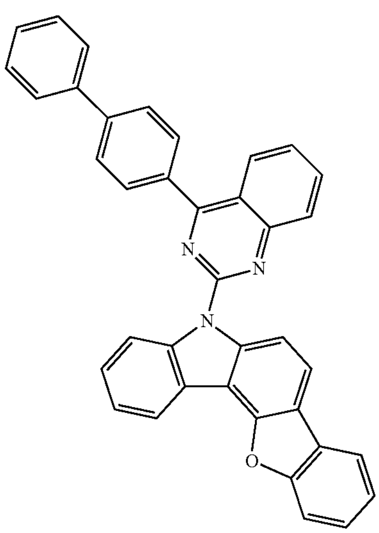
-continued
C-114
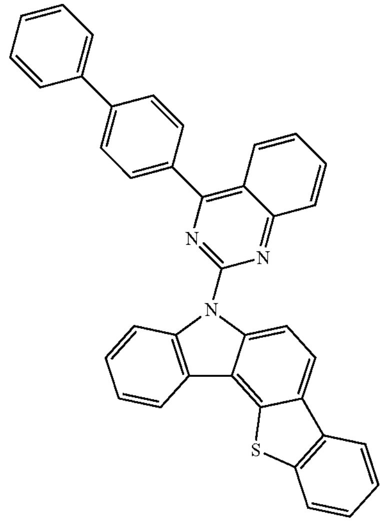
C-115
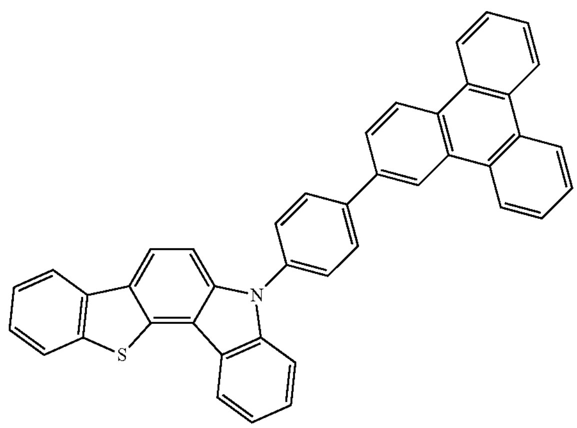
C-116
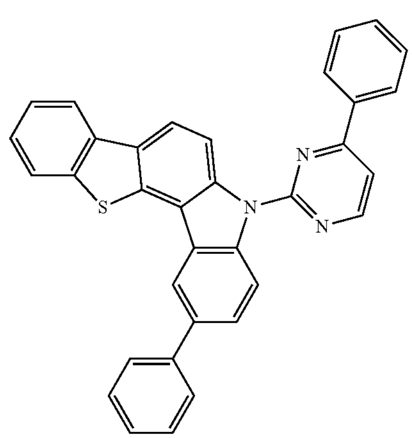

C-117
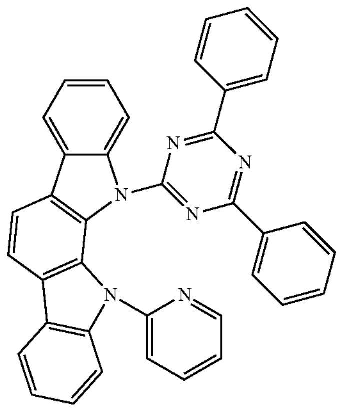
C-118
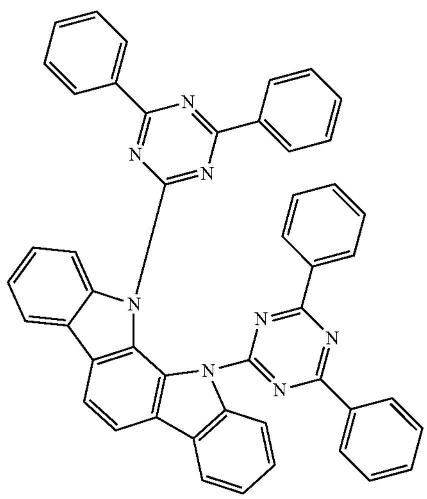
C-119
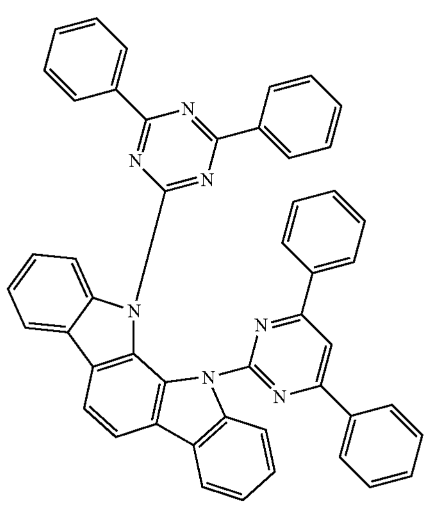
C-120
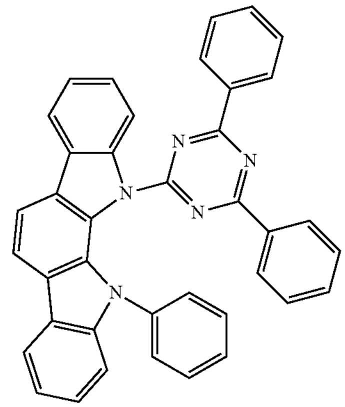
C-121
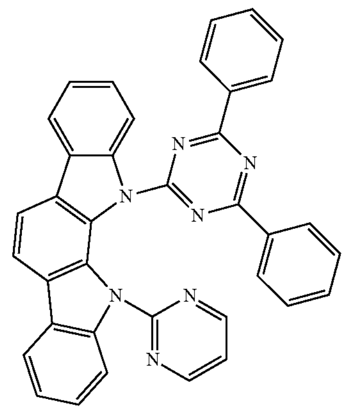
C-122
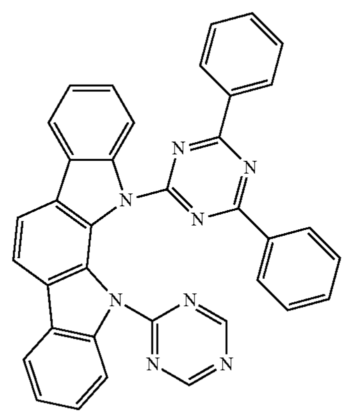
C-123
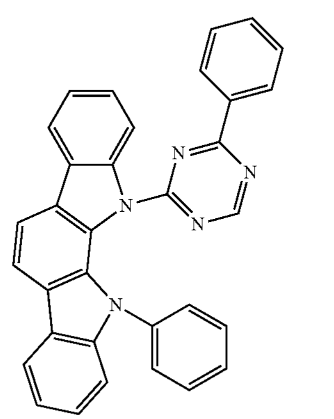

C-124
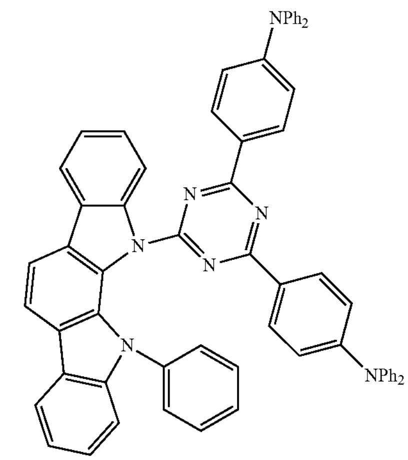
C-125
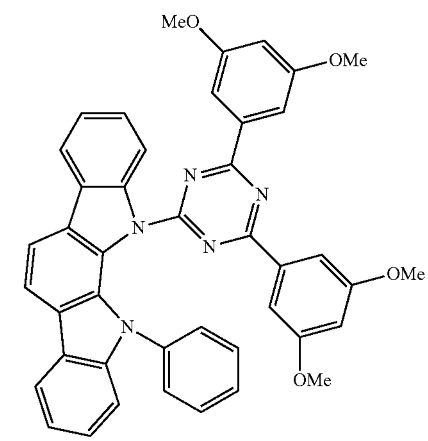
C-126
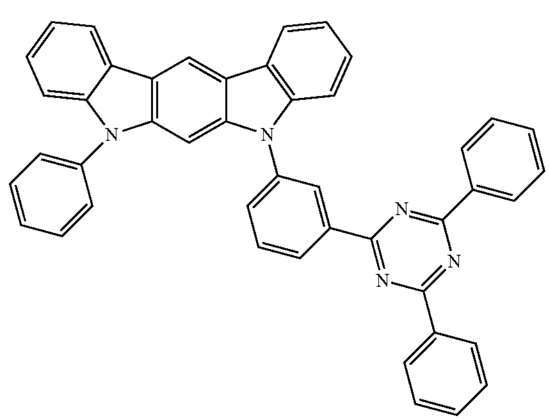
C-127
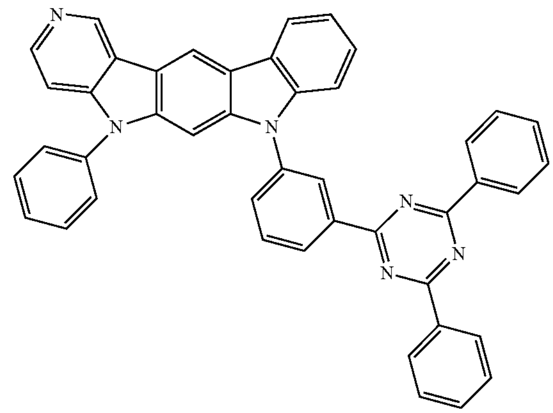
C-128
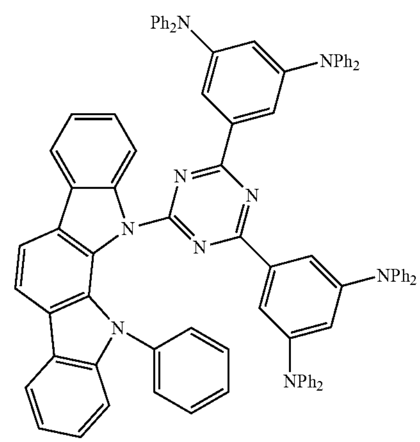
C-129
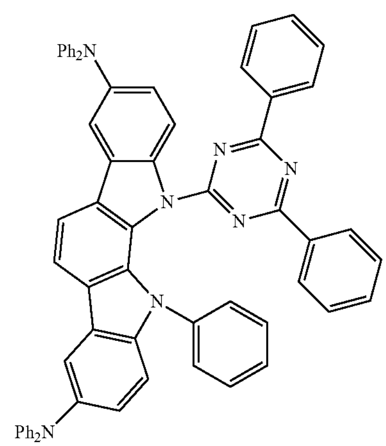

-continued
C-130
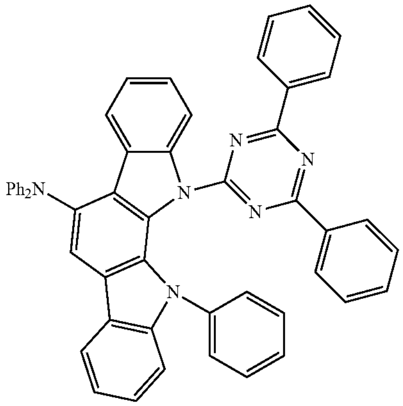
C-131
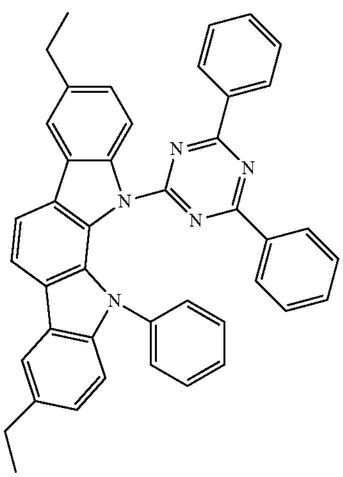
C-132
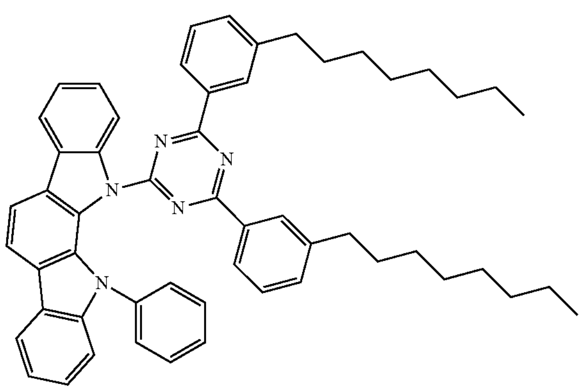
-continued
C-133
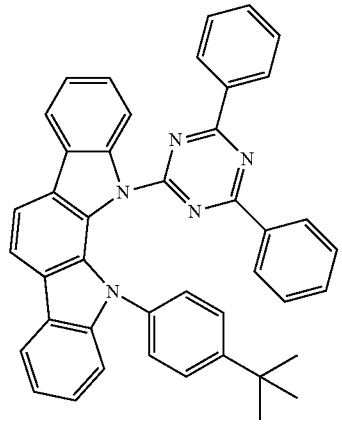
C-134
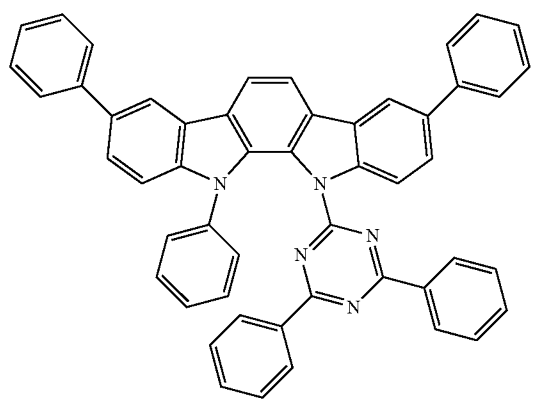
C-135
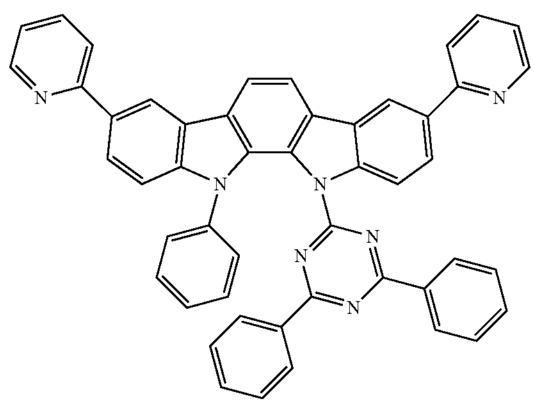

-continued
C-136
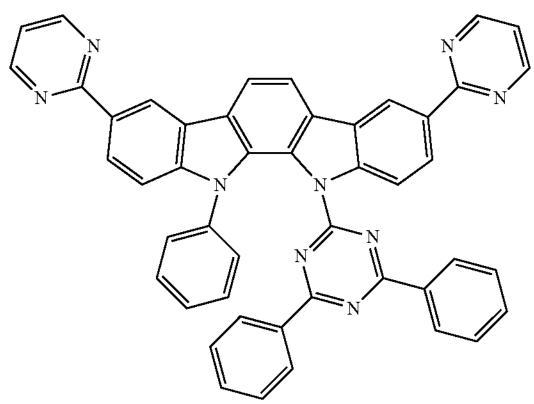
C-137
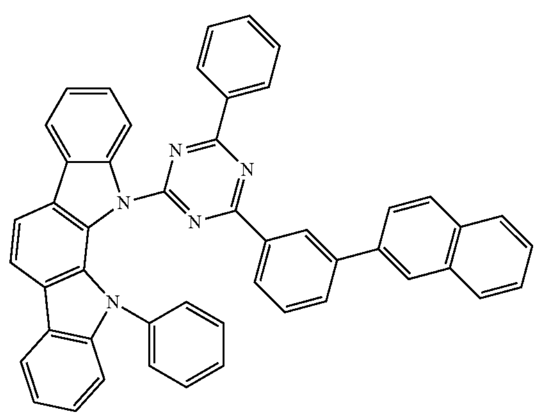
C-138
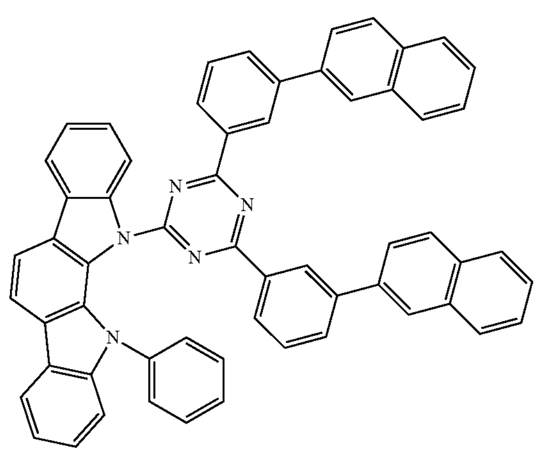
-continued
C-139
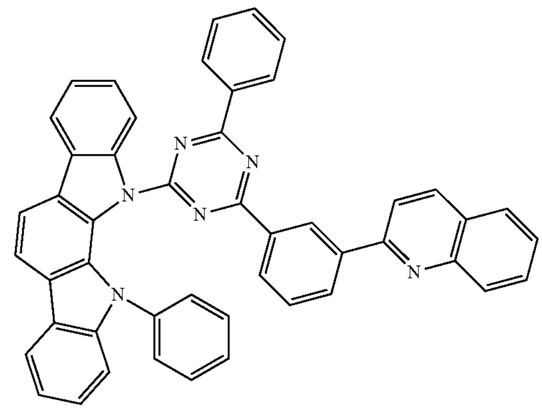
C-140
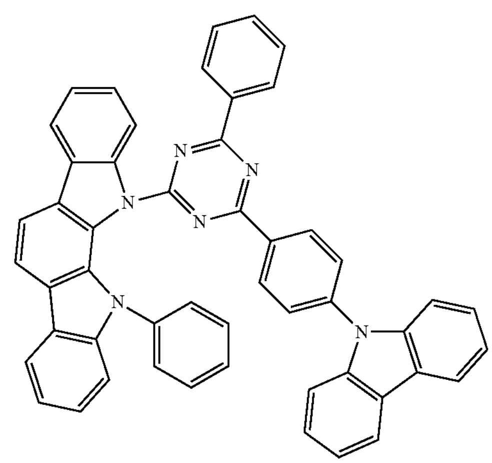
C-141
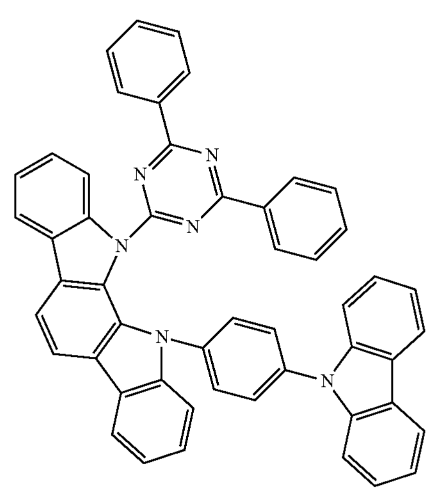

-continued
C-142
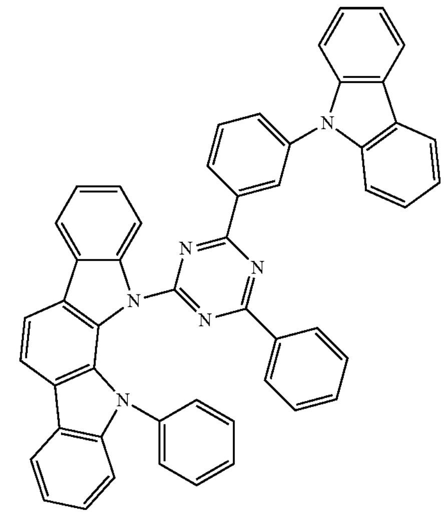
C-143
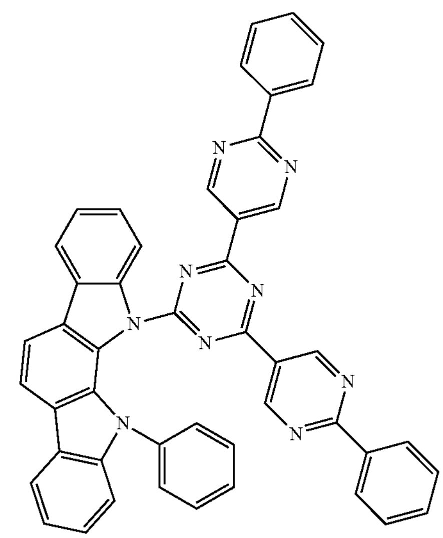
C-144
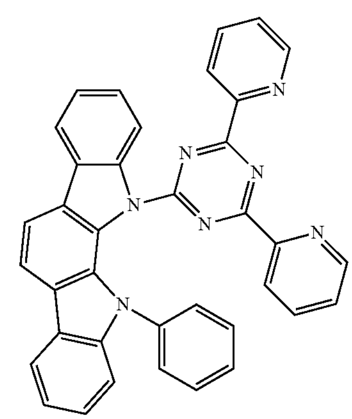
-continued
C-145
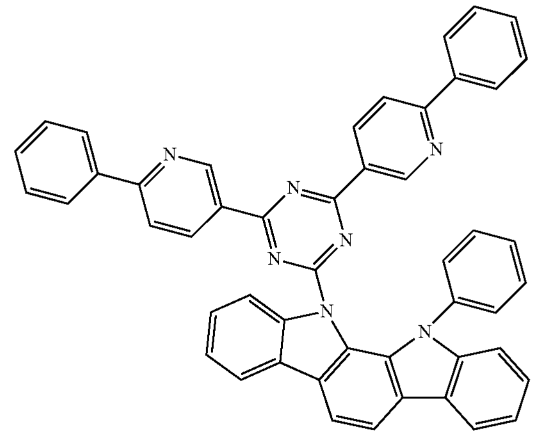
C-146
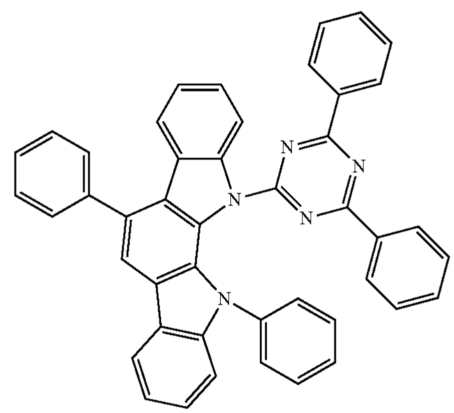
C-147
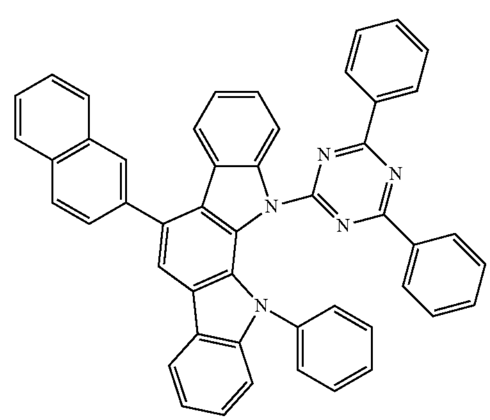

C-148
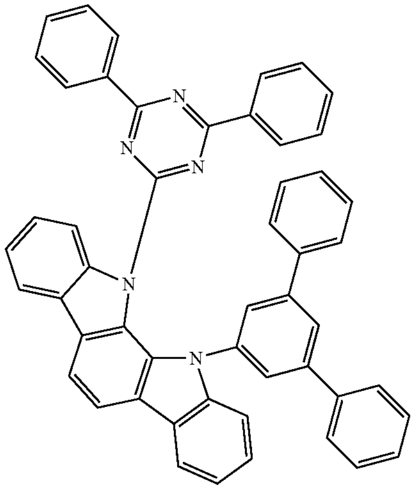
C-149
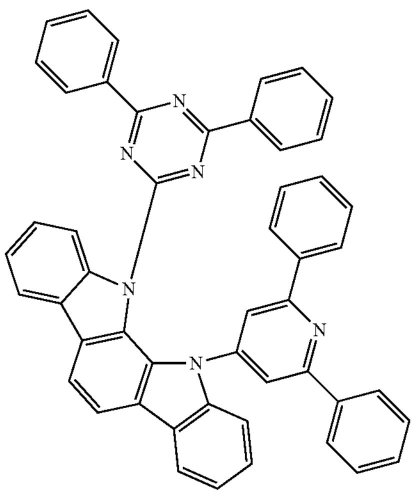
C-150
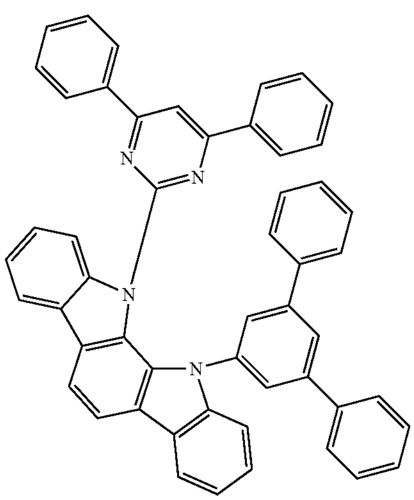
C-151
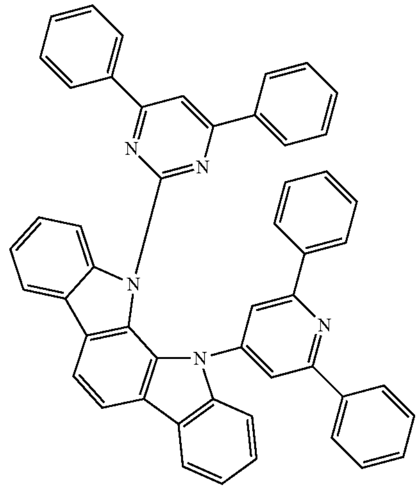
C-152
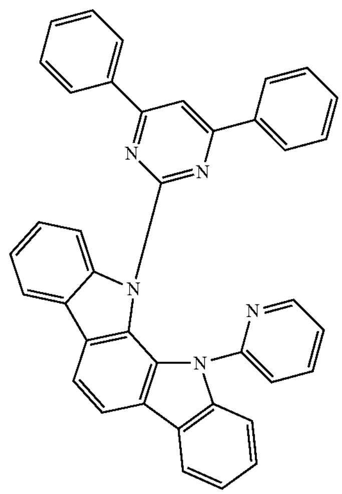
C-153
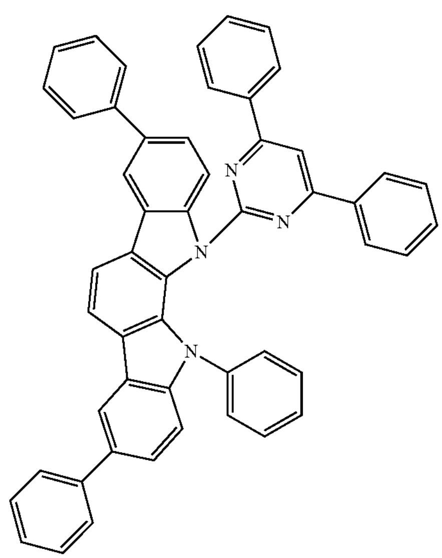

-continued
C-154
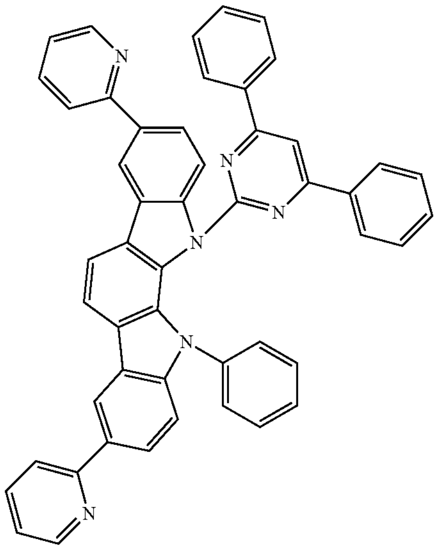
C-155
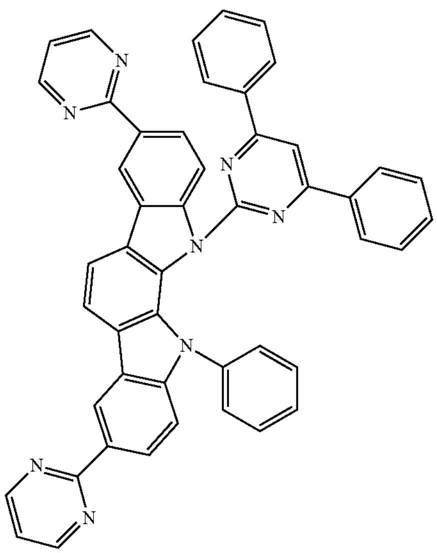
C-156
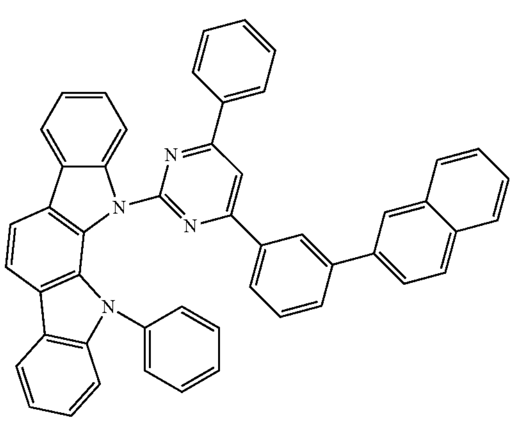
-continued
C-157
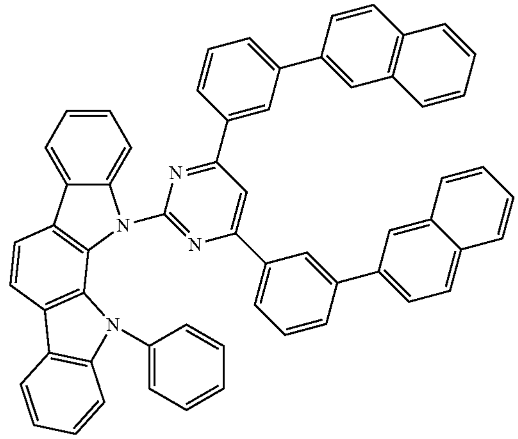
C-158
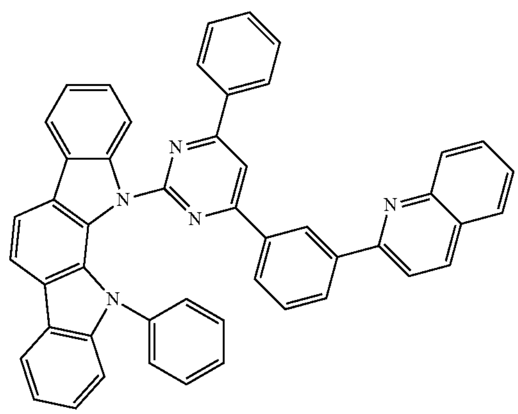
C-159
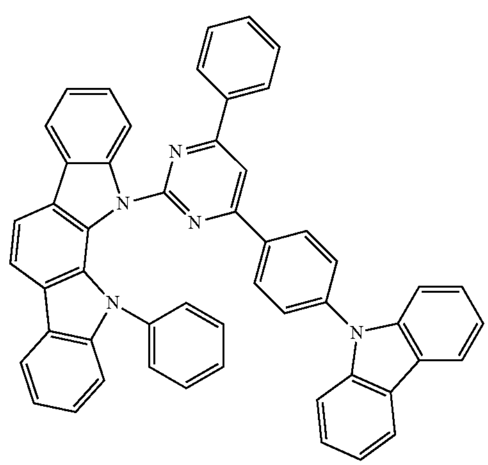

C-160
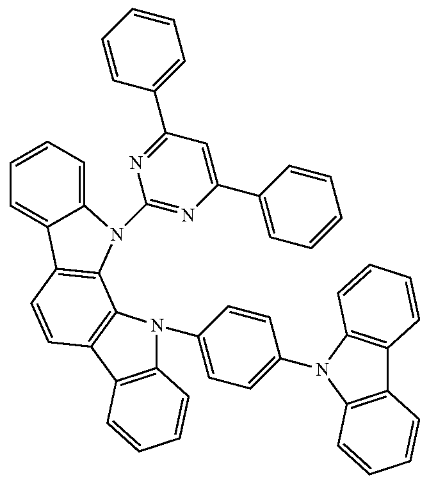
C-161
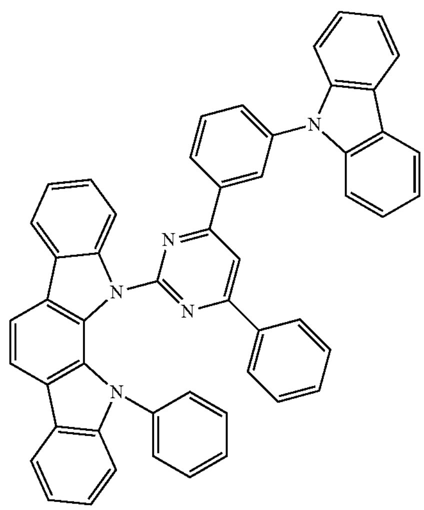
C-162
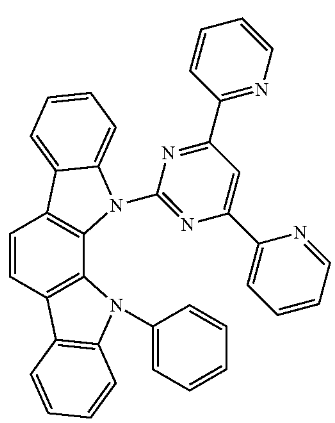
C-163
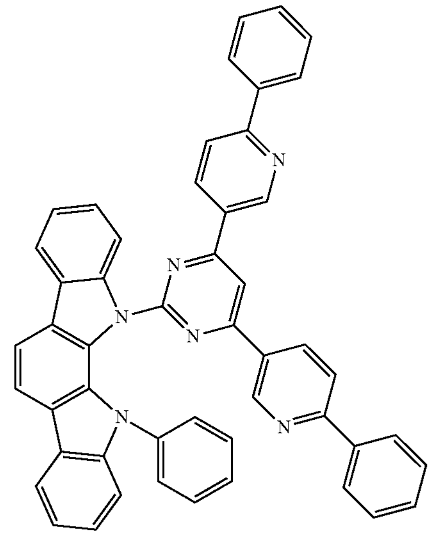
C-164
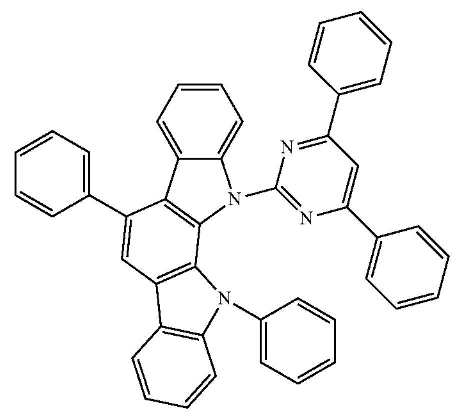
C-165
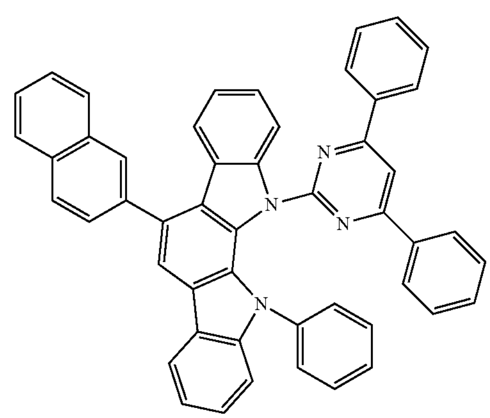

-continued
C-166
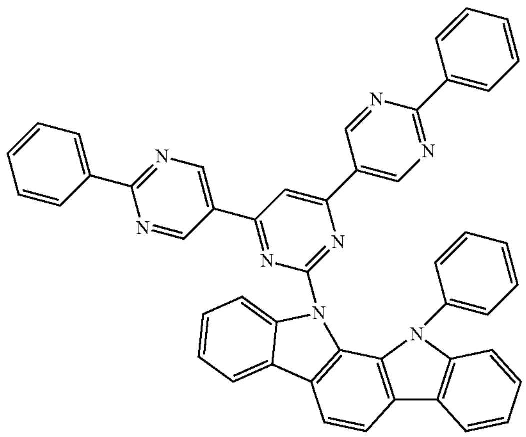
C-167
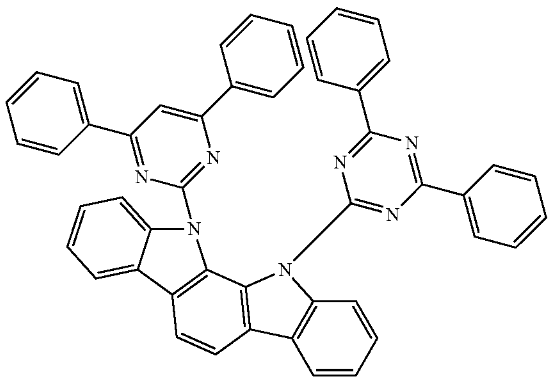
C-168
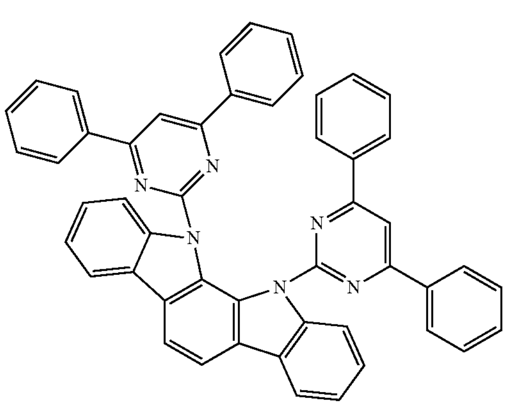
-continued
C-169
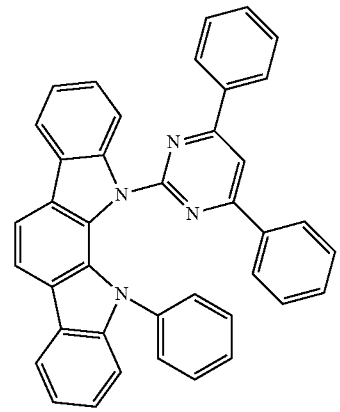
C-170
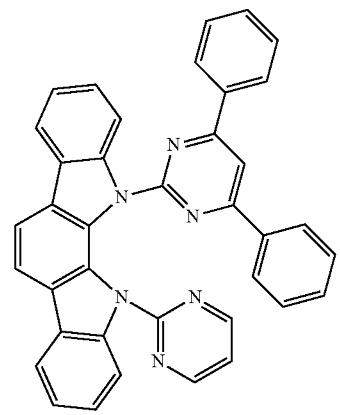
C-171
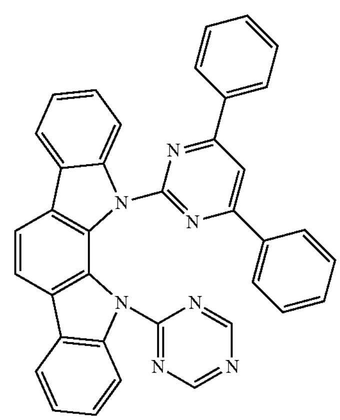
C-172
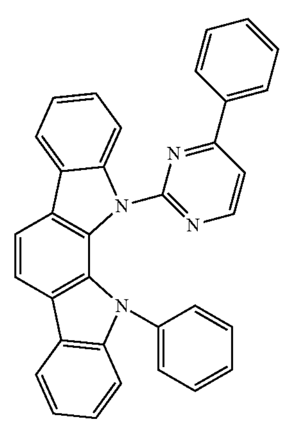

-continued
C-173
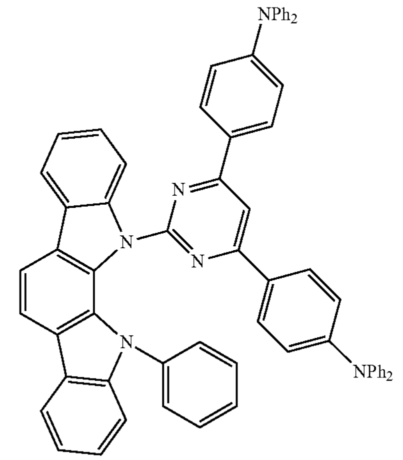
C-174
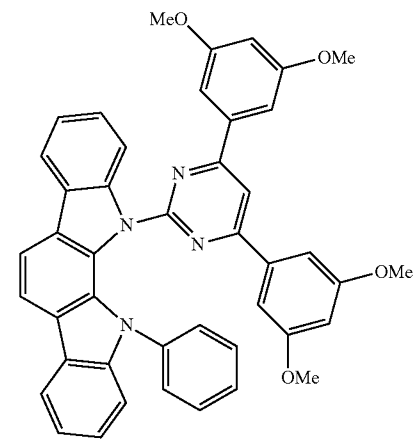
C-175
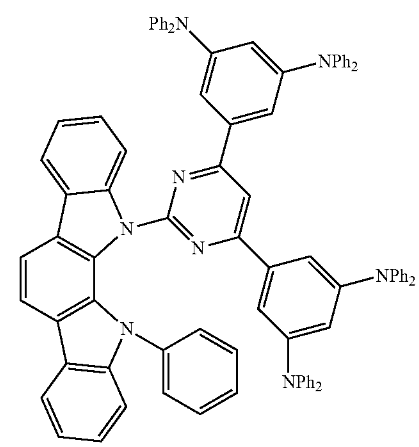
-continued
C-176
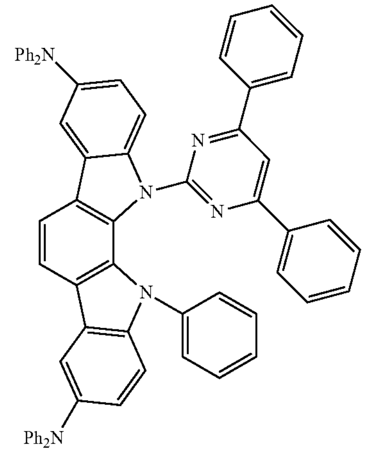
C-177
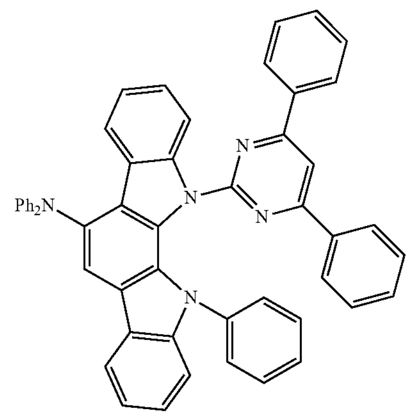
C-178
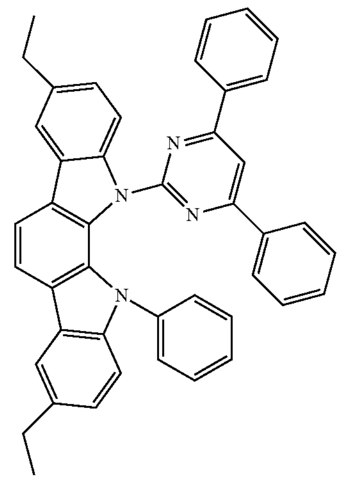

-continued
C-179
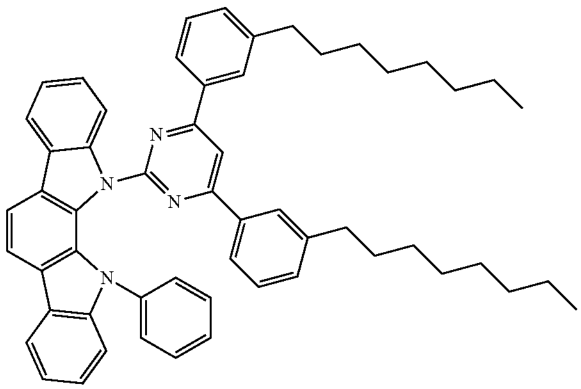
C-180
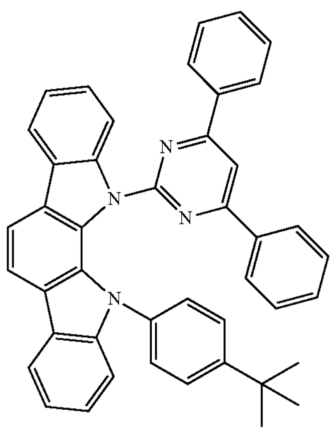
C-181
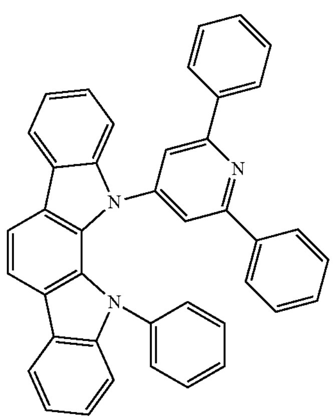
-continued
C-182
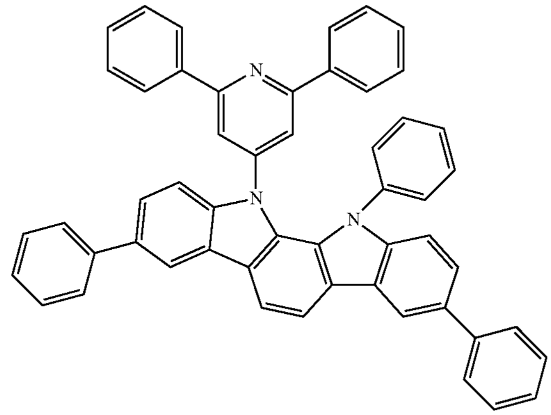
C-183
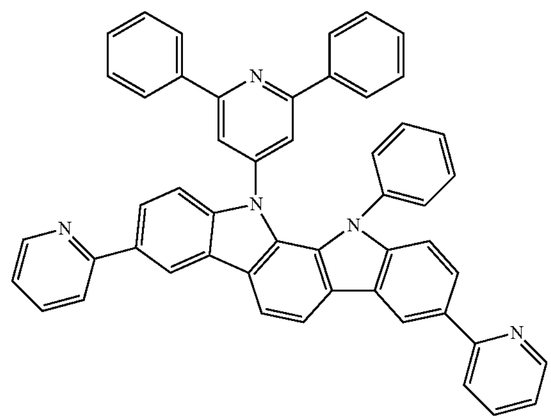
C-184
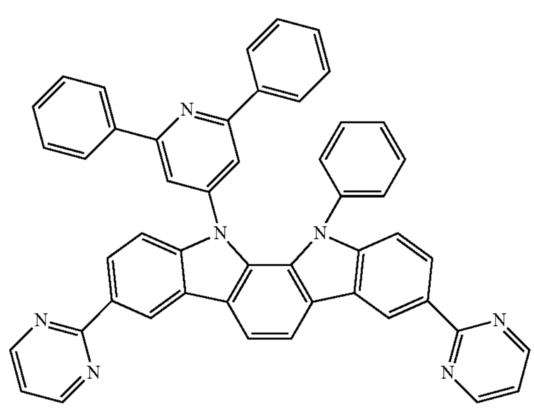

-continued
C-185
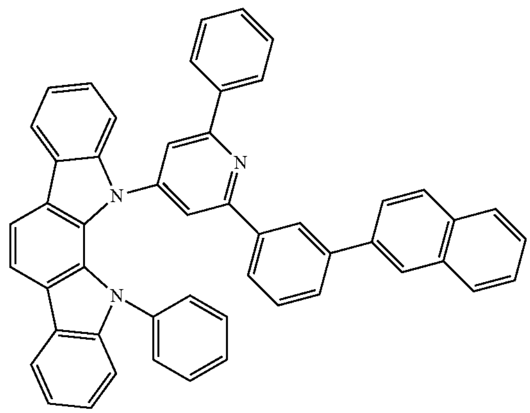
C-186
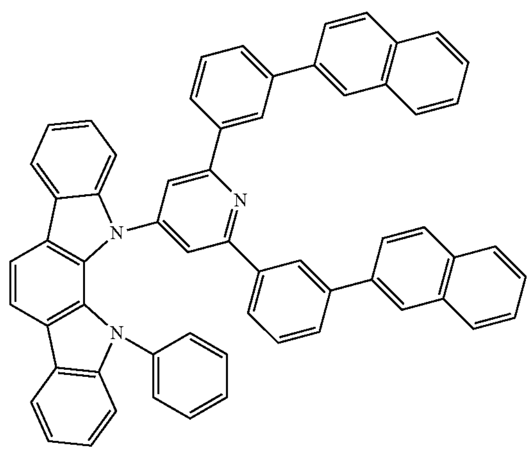
C-187
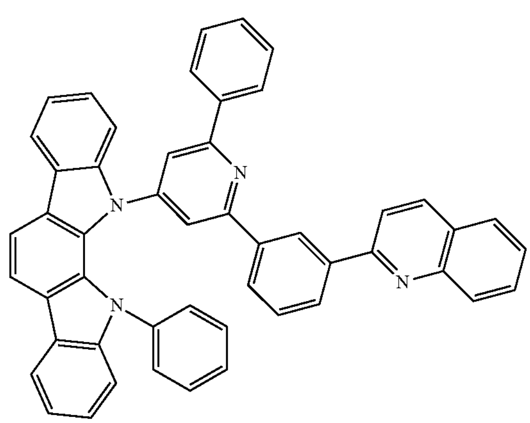
-continued
C-188
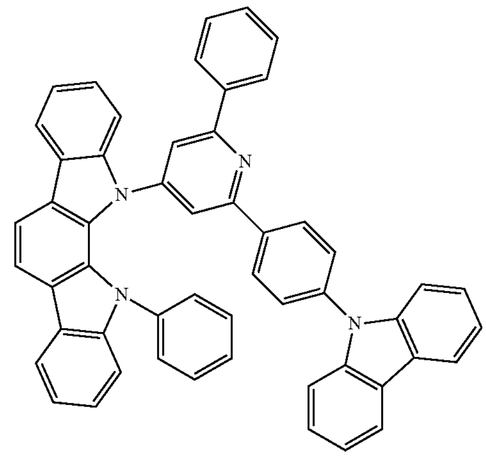
C-189
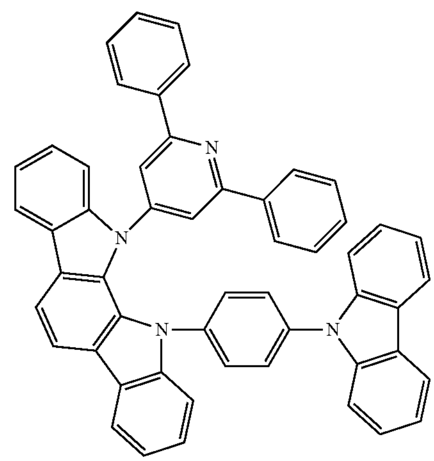
C-190
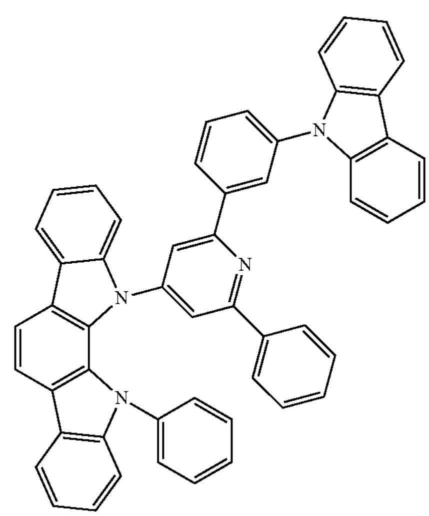

-continued
C-191
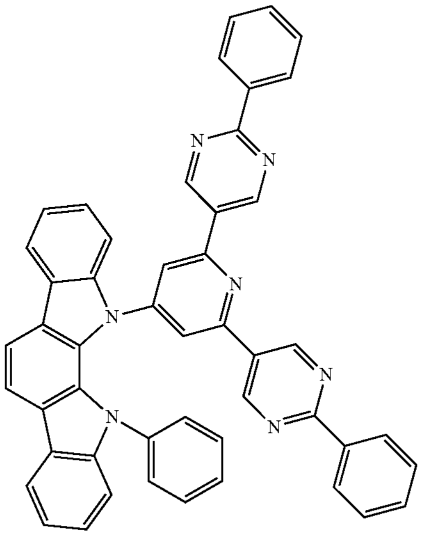
C-192
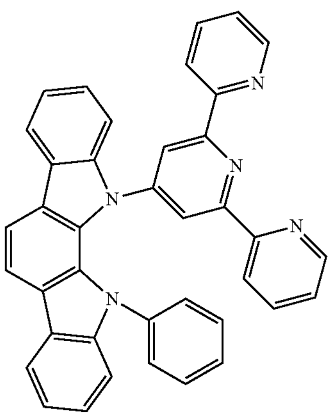
C-193
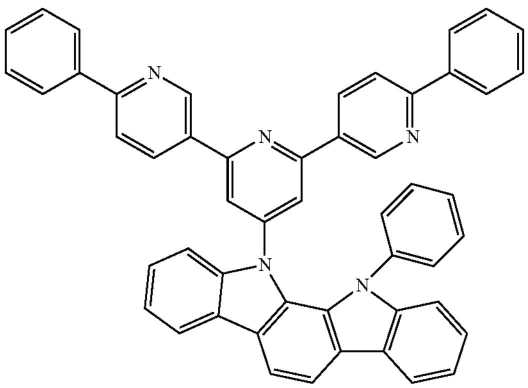
-continued
C-194
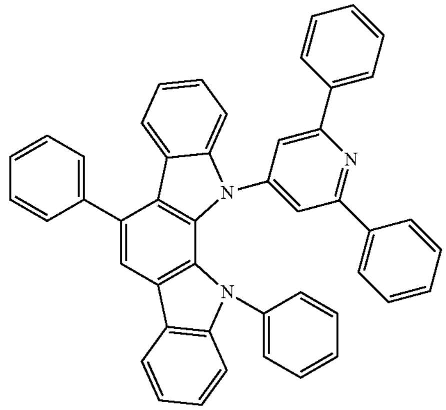
C-195
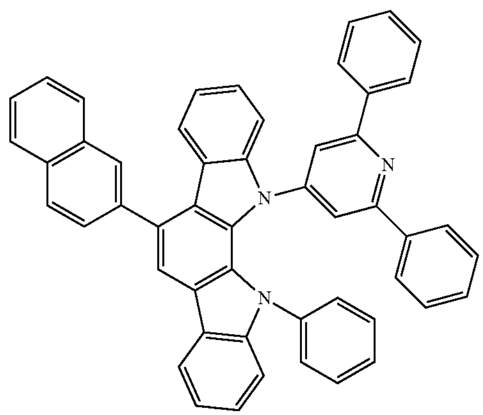
C-196
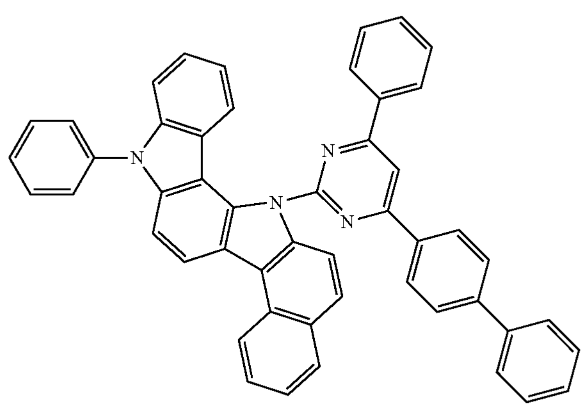

-continued
C-197
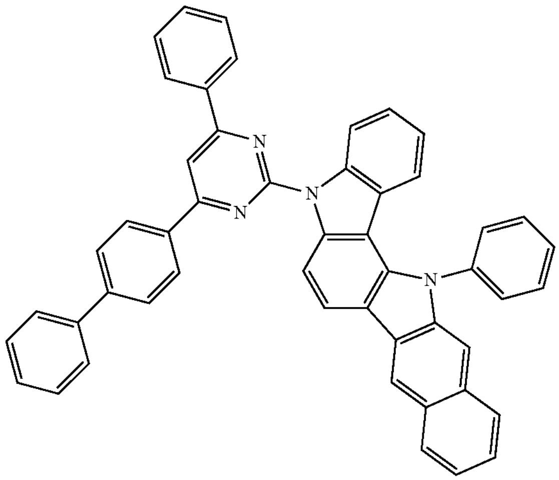
C-198
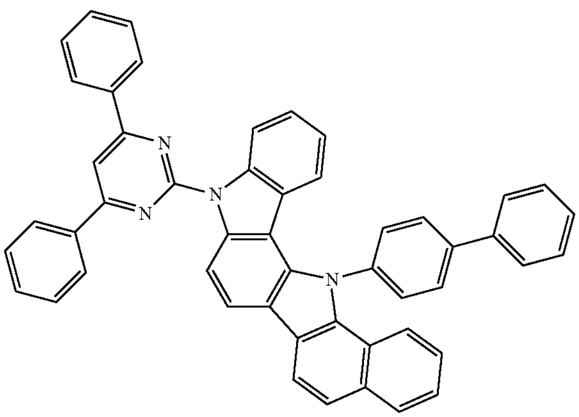
C-199
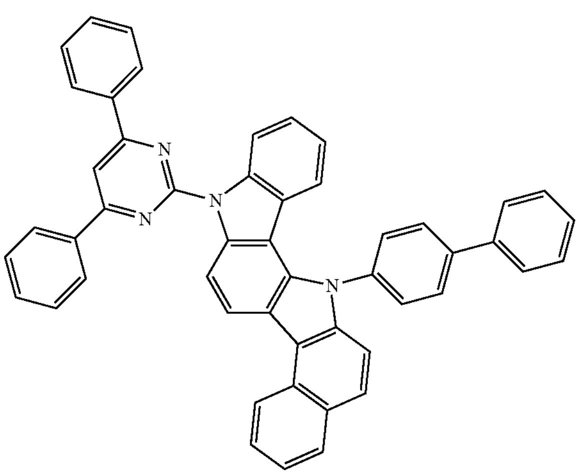
-continued
C-200
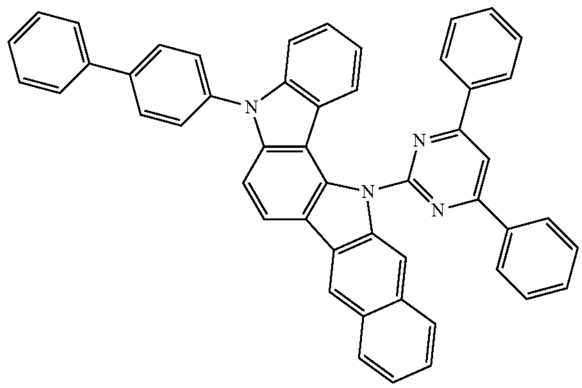
C-201
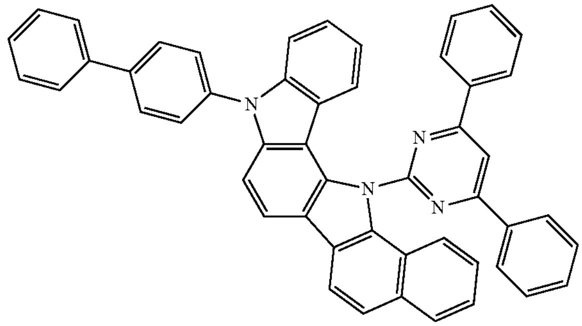
C-202
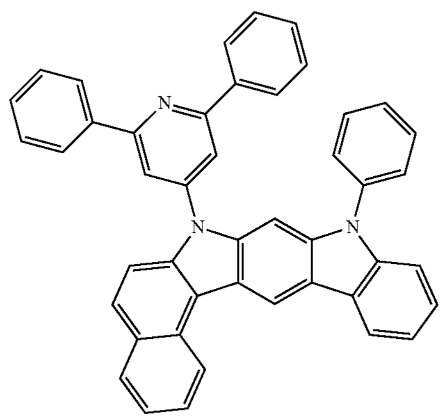
C-203
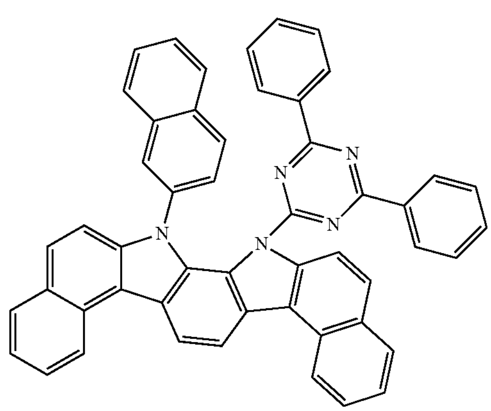

-continued
C-204
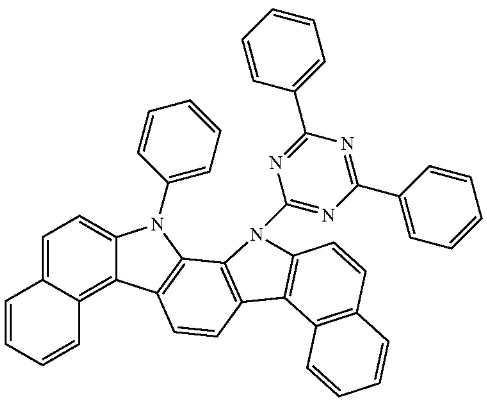
C-205
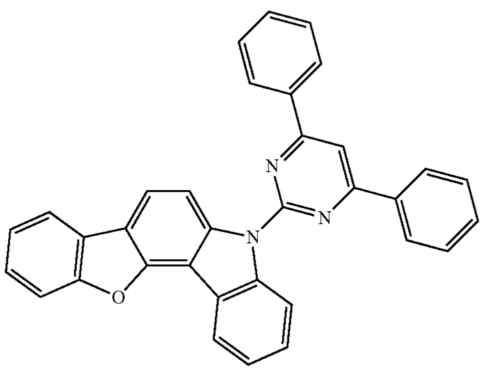
C-206
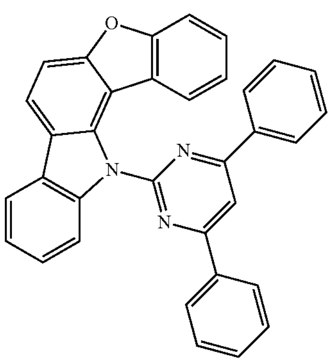
C-207
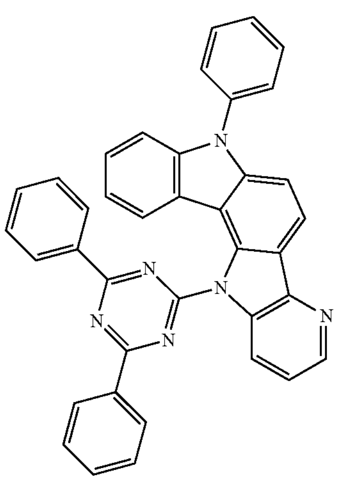
-continued
C-208
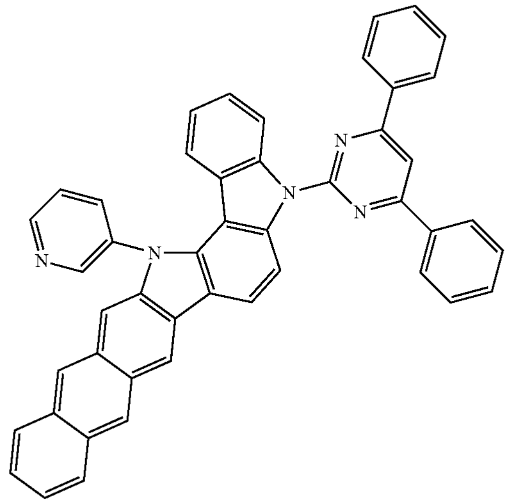
C-209
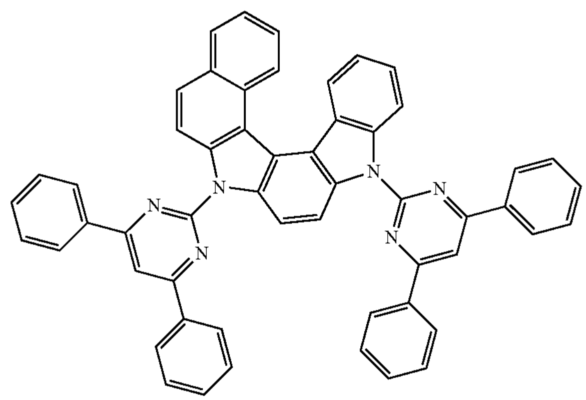
C-210
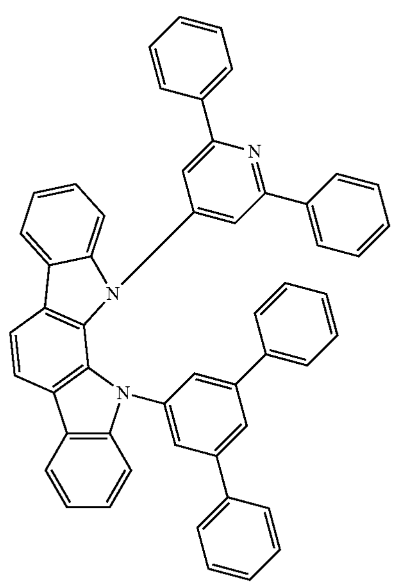

-continued
C-211
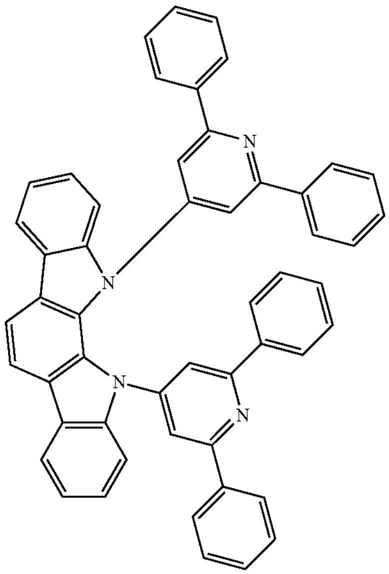
C-212
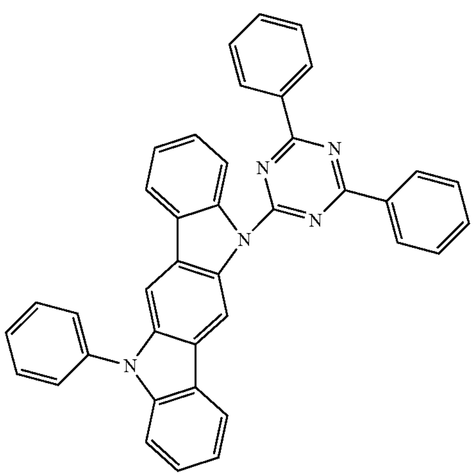
C-213
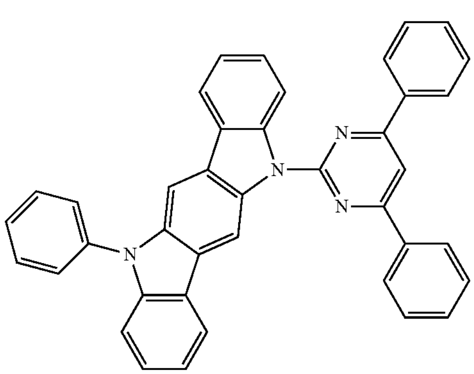
-continued
C-214
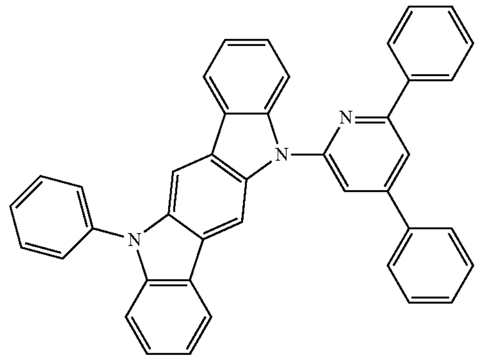
C-215
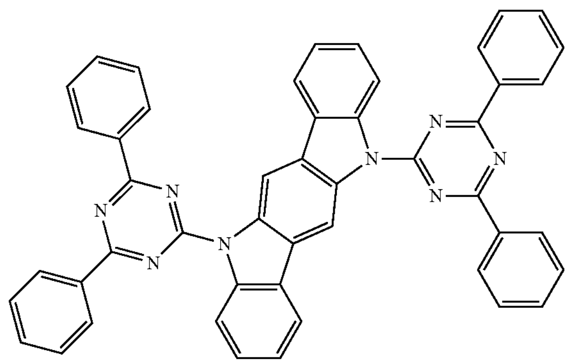
C-216
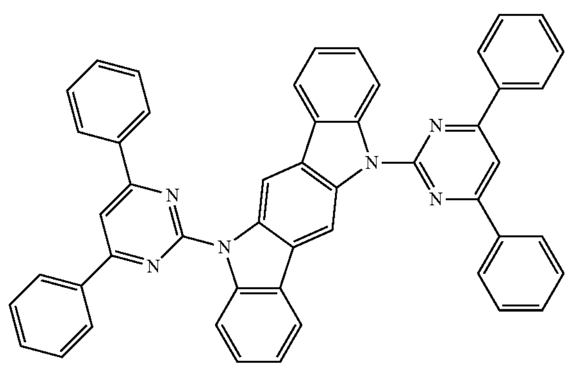
C-217
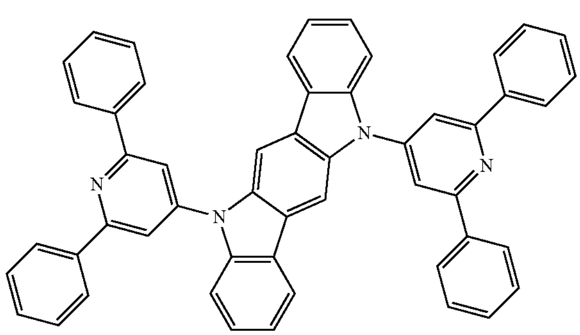

-continued
C-218
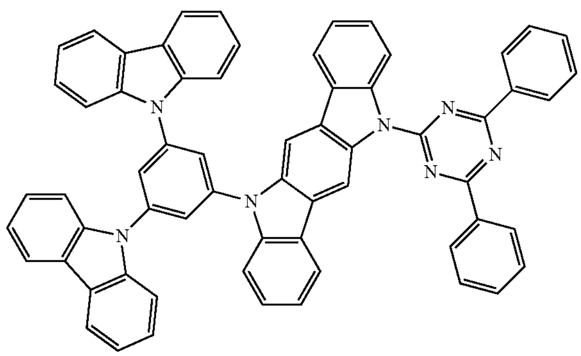
C-219
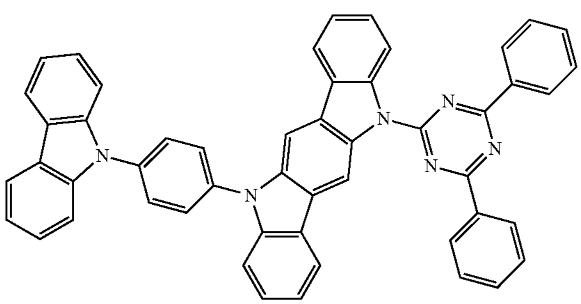
C-220
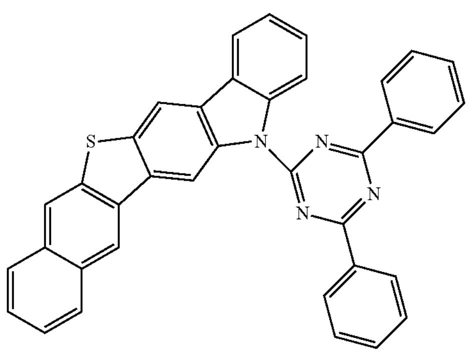
C-221
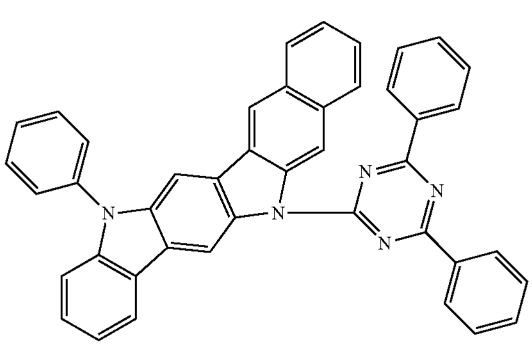
-continued
C-222
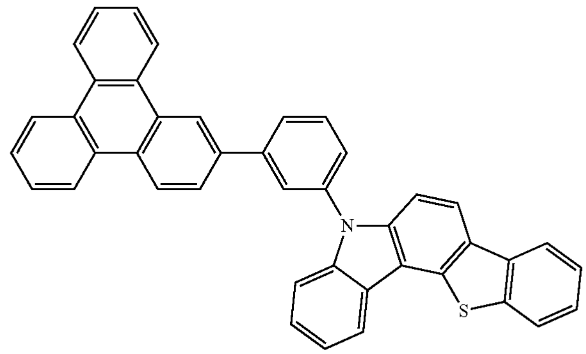
C-223
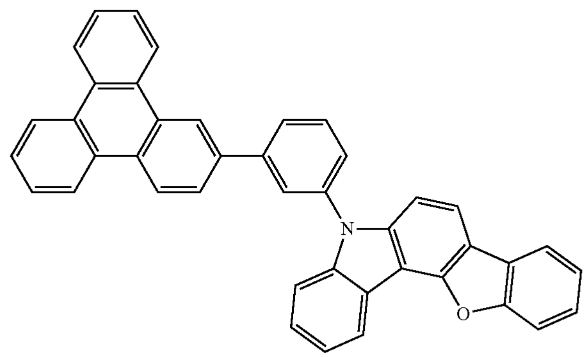
C-224
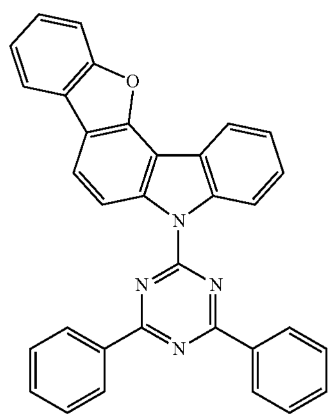
C-225
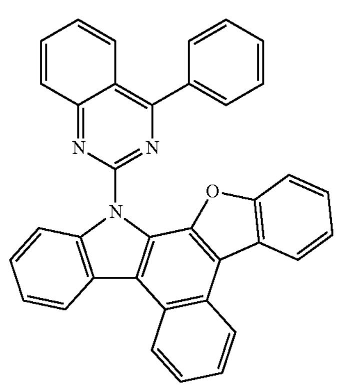

-continued
C-226
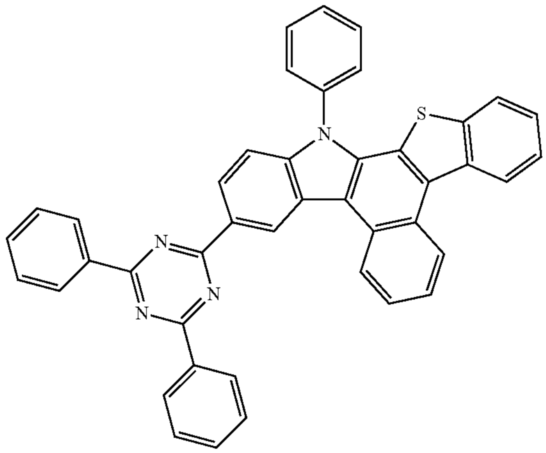
C-227
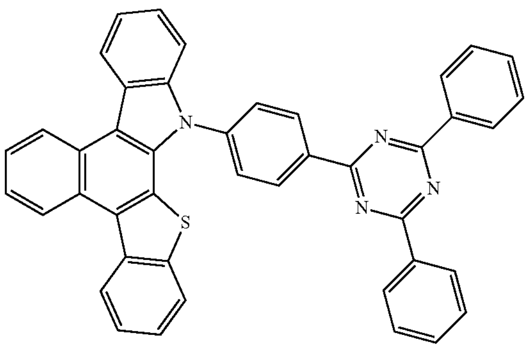
C-228
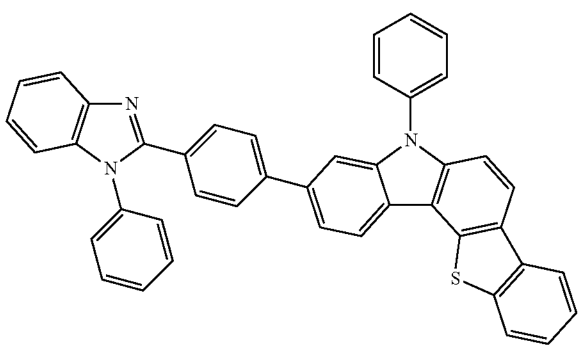
C-229
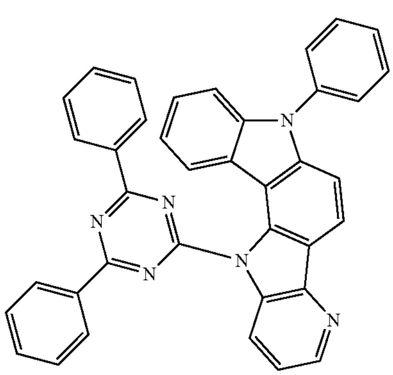
-continued
C-230
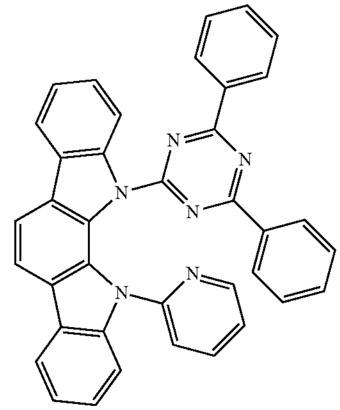
C-231
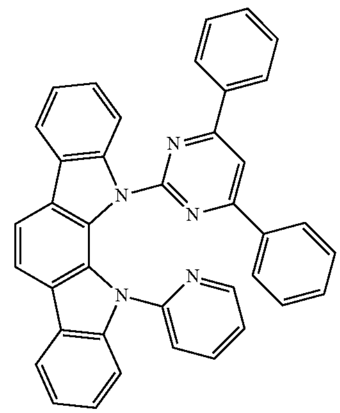
C-232
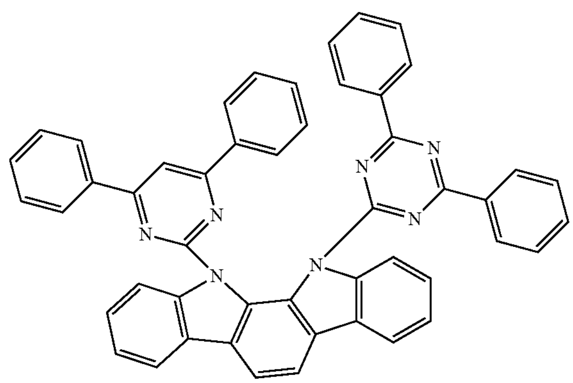
C-233
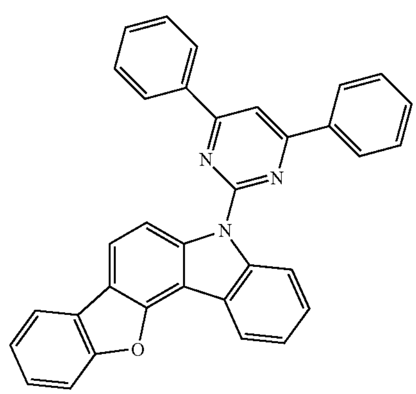

-continued
C-234
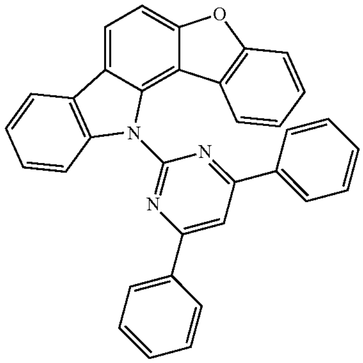
C-235
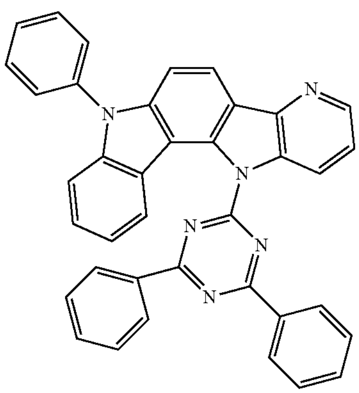
C-236
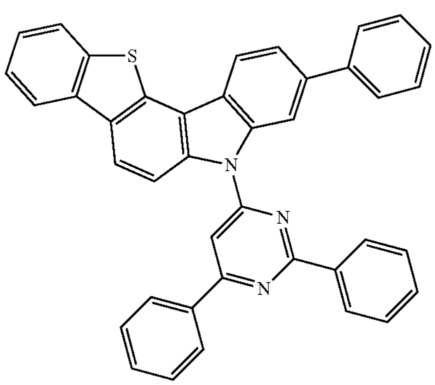
C-237
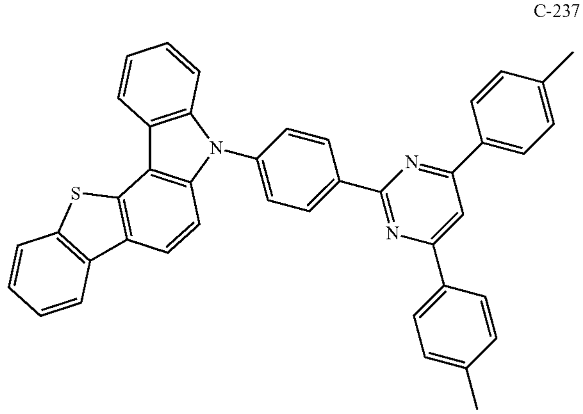
-continued
C-238
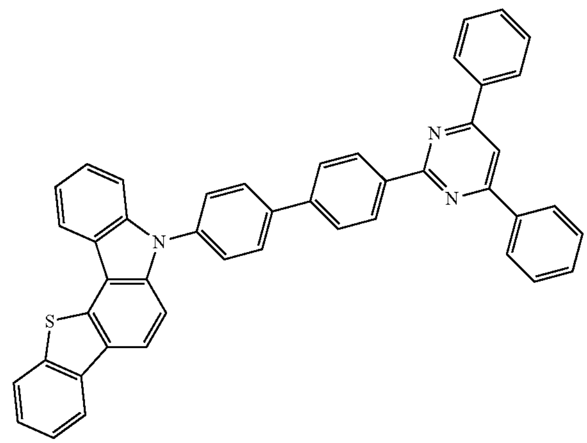
C-239
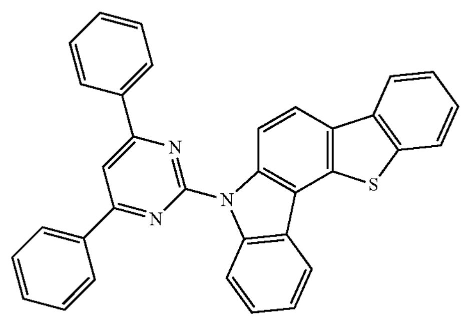
C-240
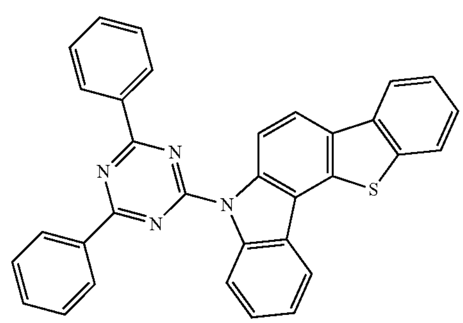
C-241
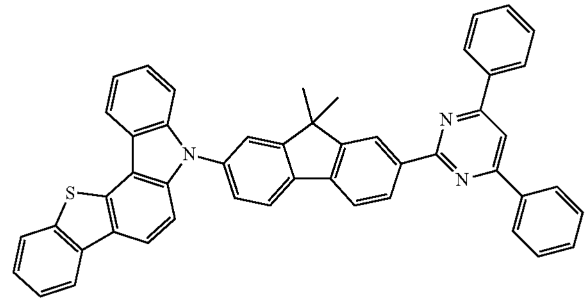

-continued
C-242
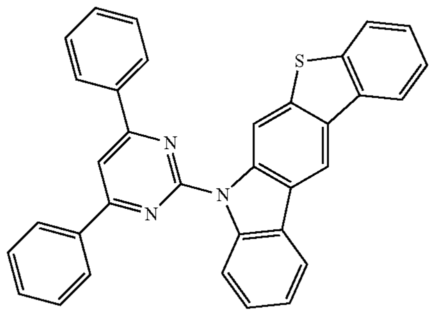
C-243
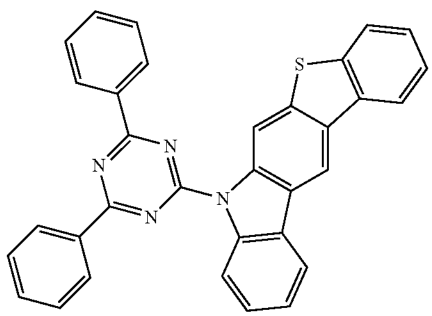
C-244
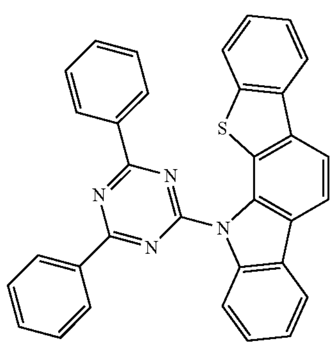
C-245
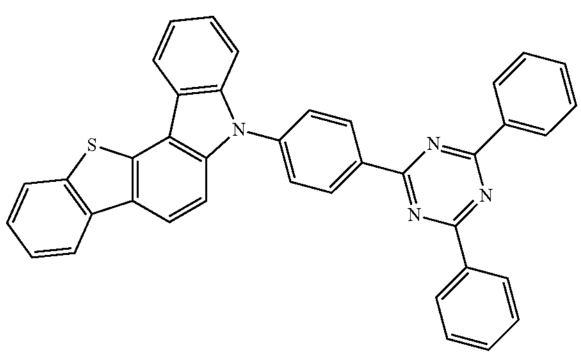
-continued
C-246
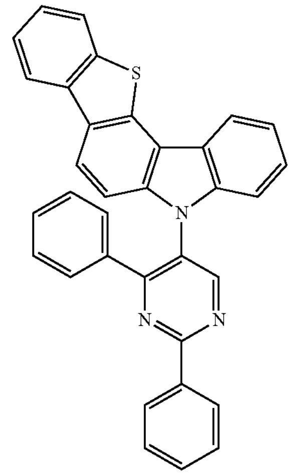
C-247
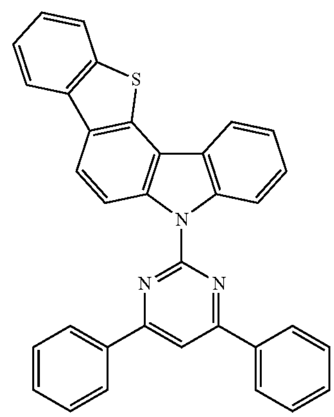
C-248
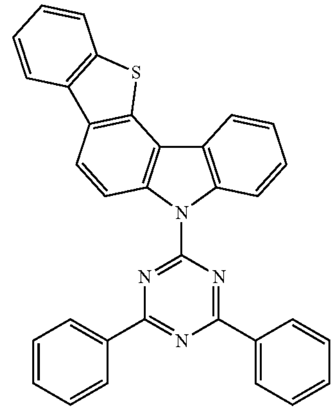

C-249
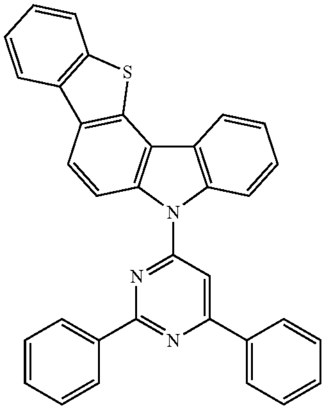
C-250
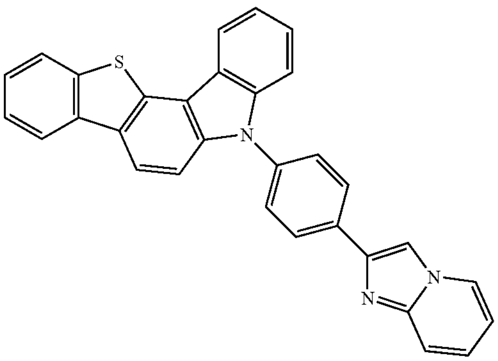
C-251
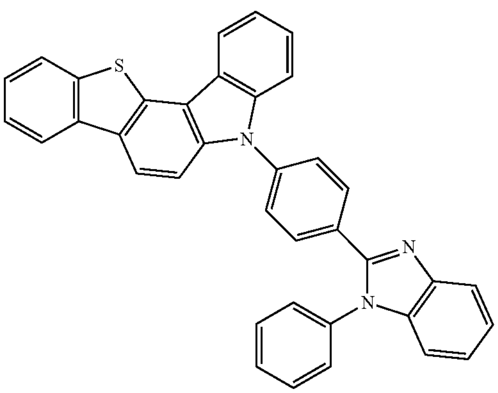
C-252
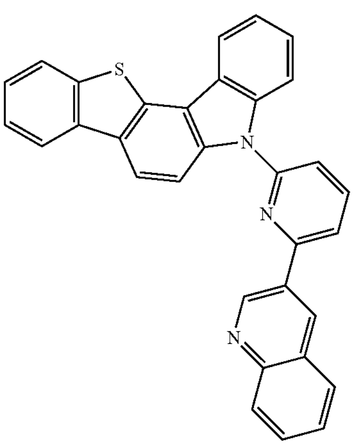
C-253
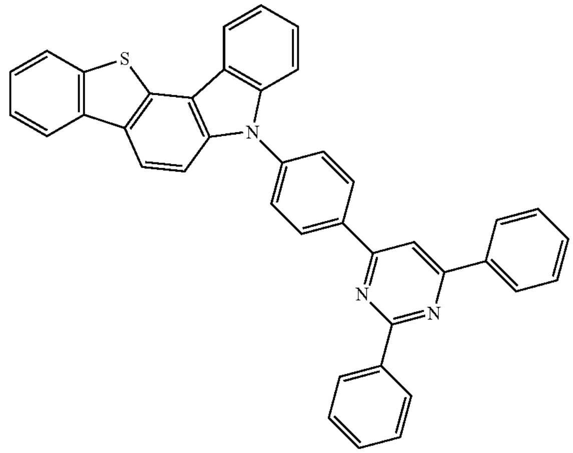
C-254
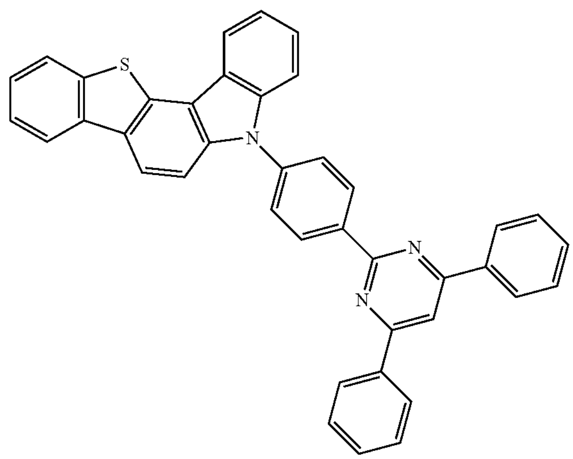
C-255
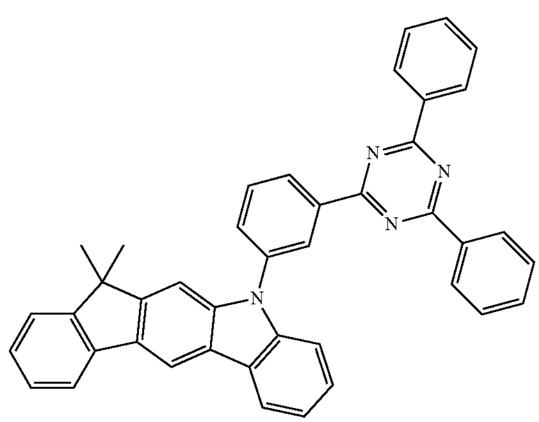

-continued
C-256
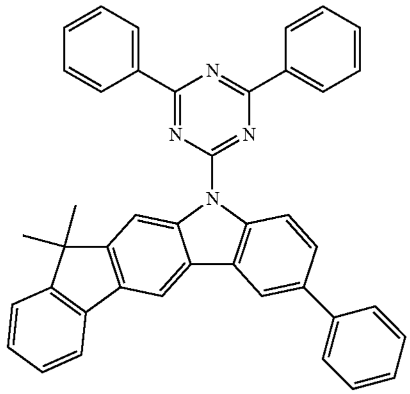
C-257
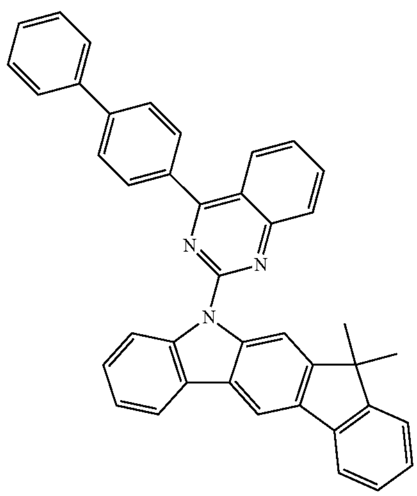
C-258
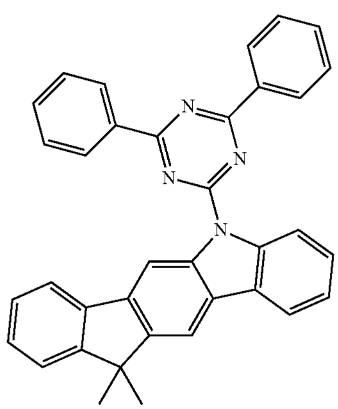
-continued
C-259
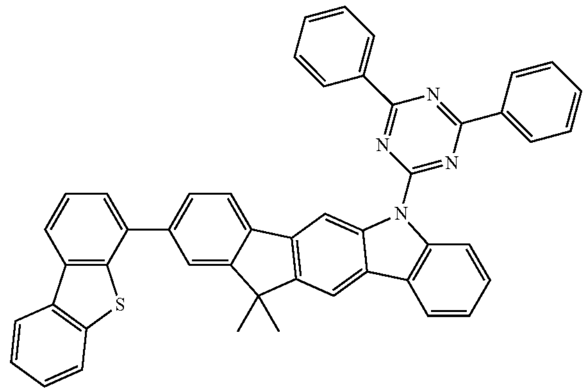
C-260
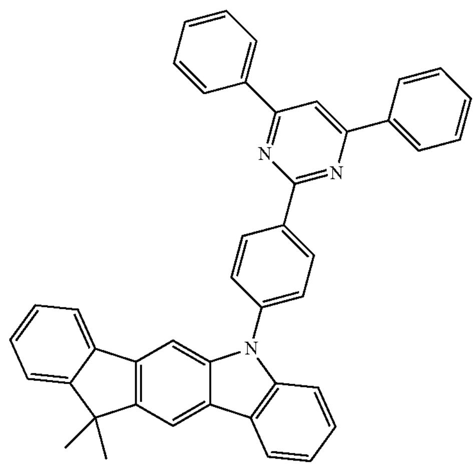
C-261
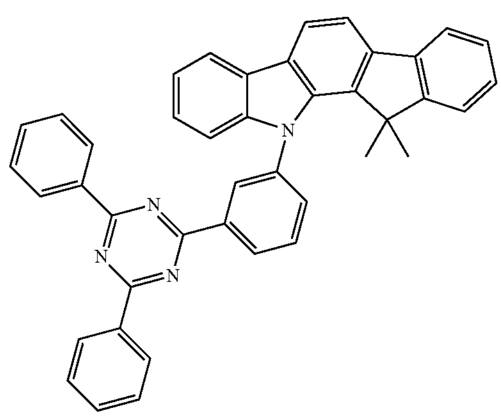

-continued
C-262
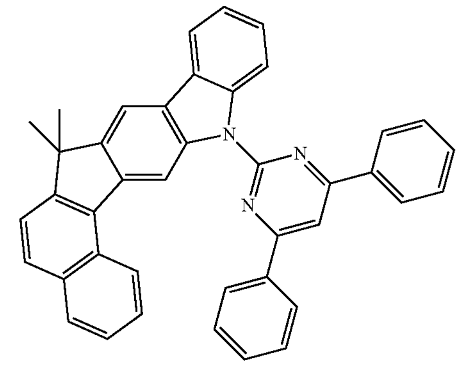
C-263
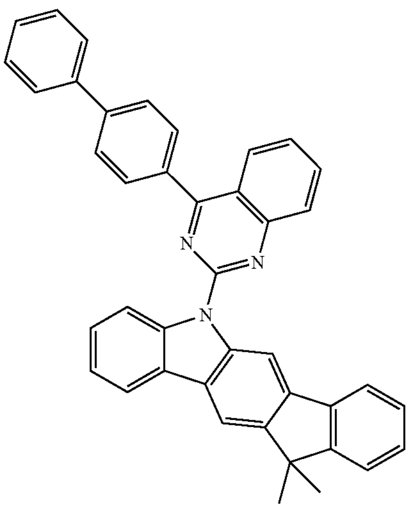
C-264
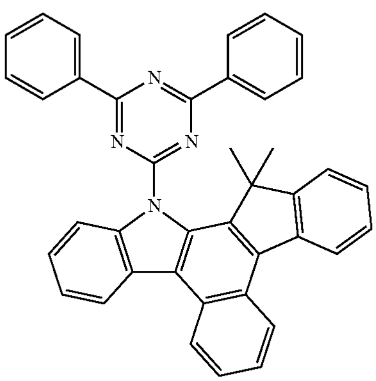
C-265
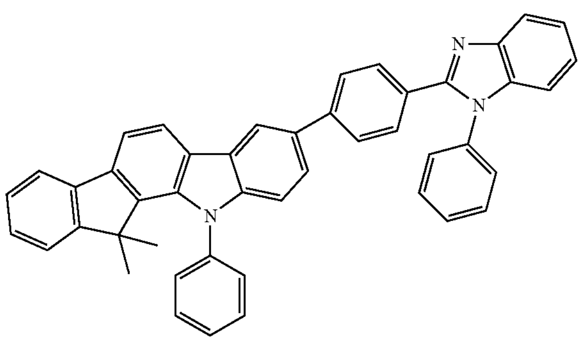
-continued
C-266
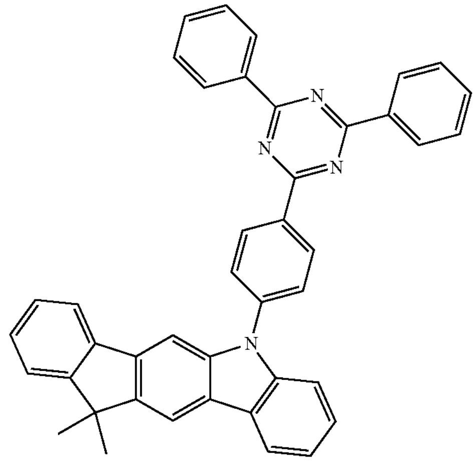
C-267
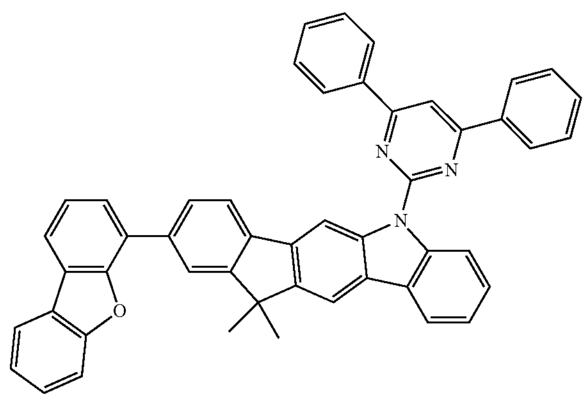
C-268
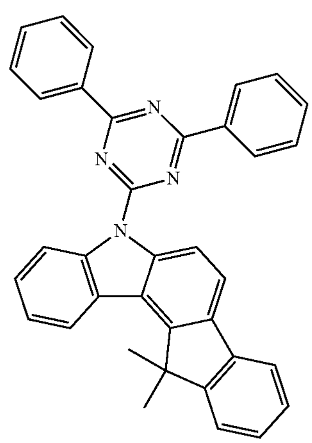

-continued
C-269
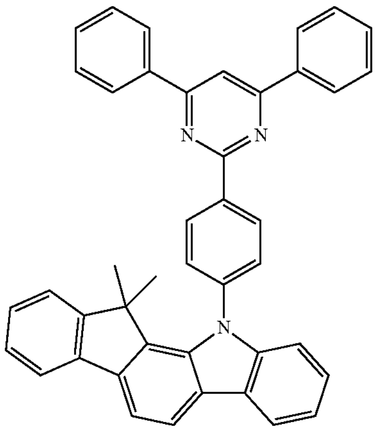
C-270
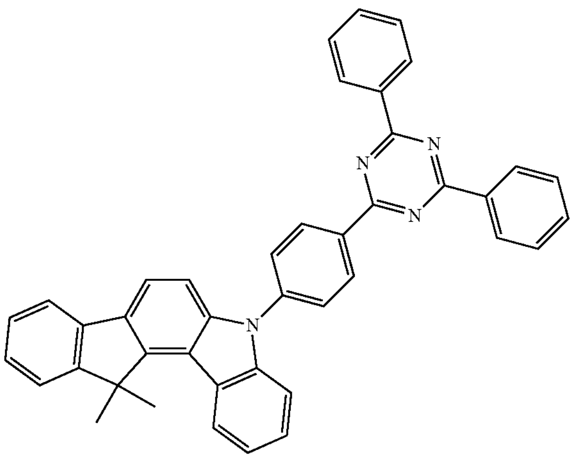
E-101
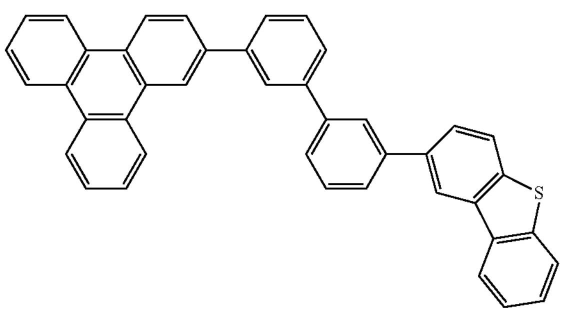
E-102
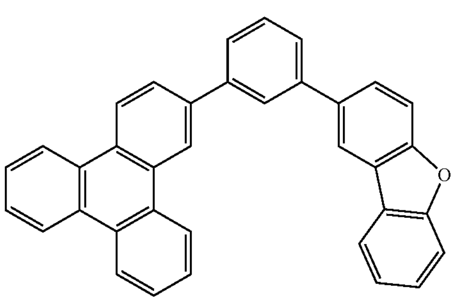
-continued
E-103
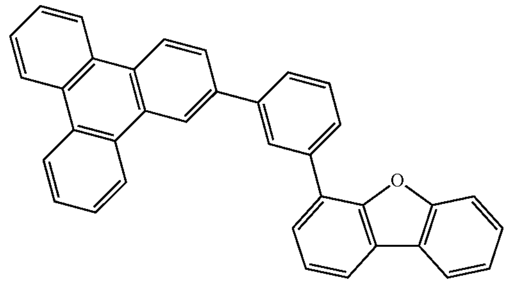
E-104
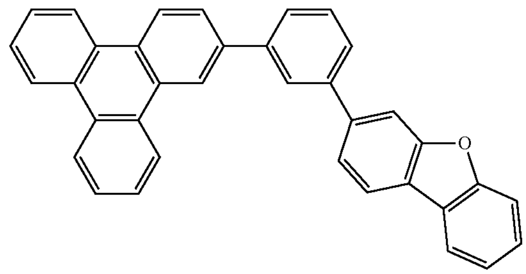
E-105
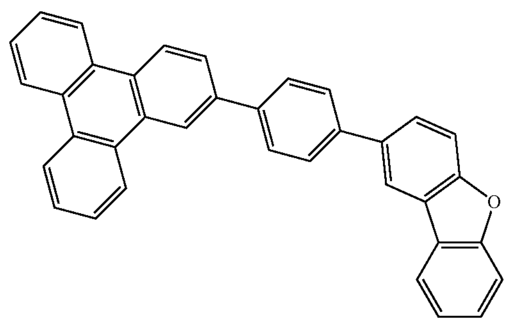
E-106
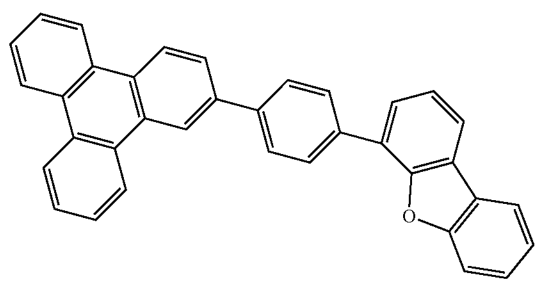
E-107
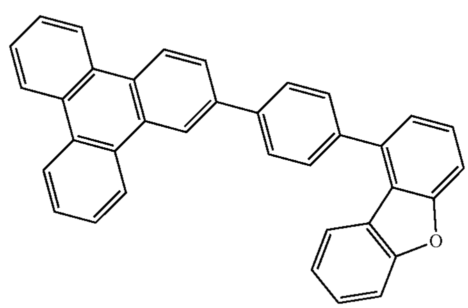

-continued
E-108
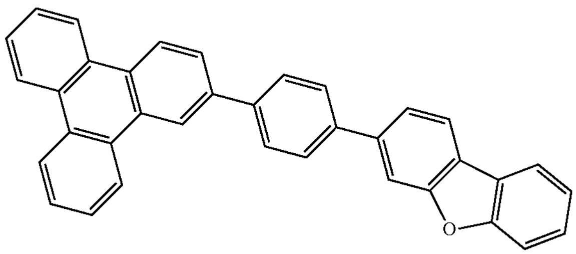
E-109
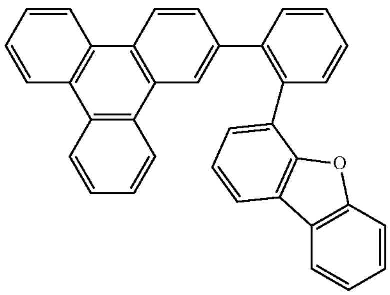
E-110
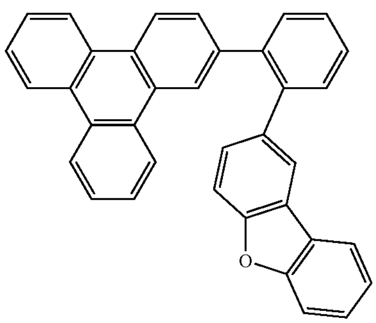
E-111
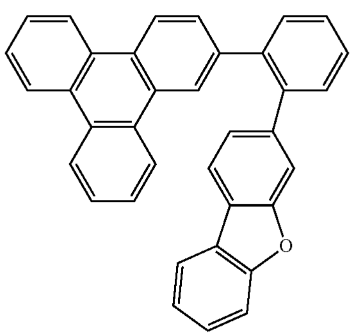
E-112
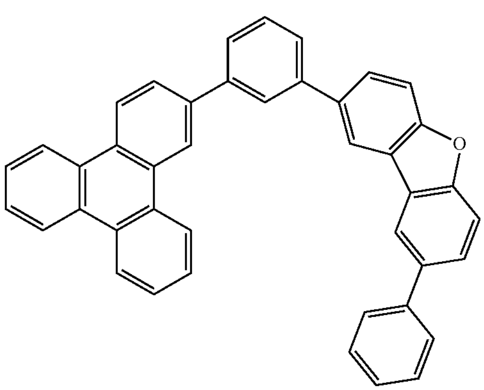
-continued
E-113
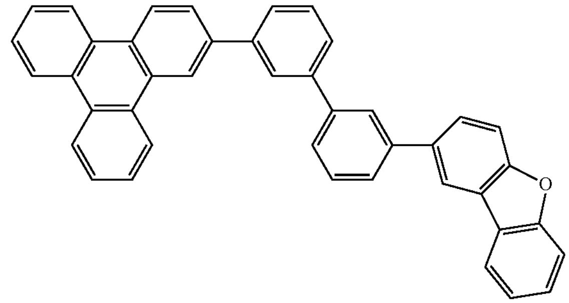
E-114
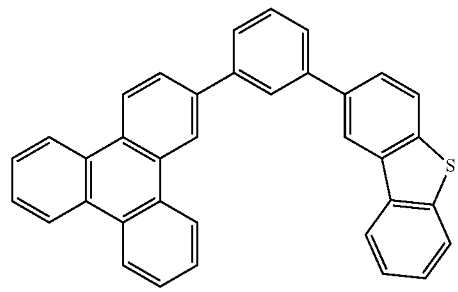
E-115
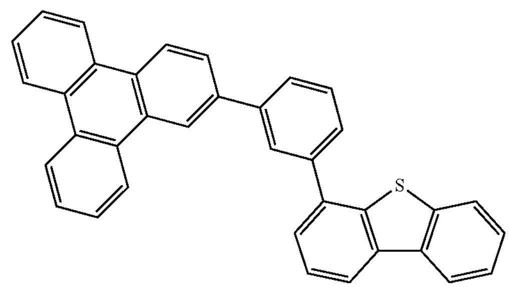
E-116
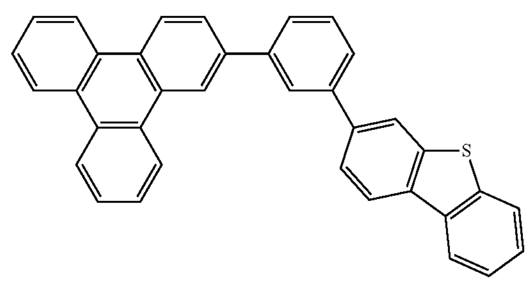
E-117
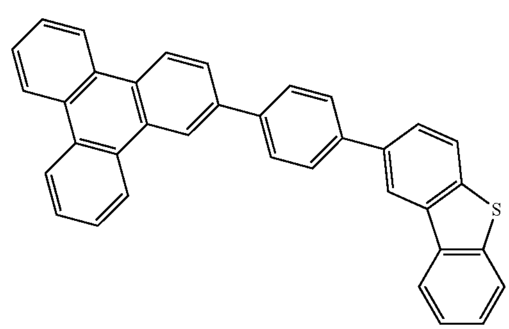

-continued
E-118
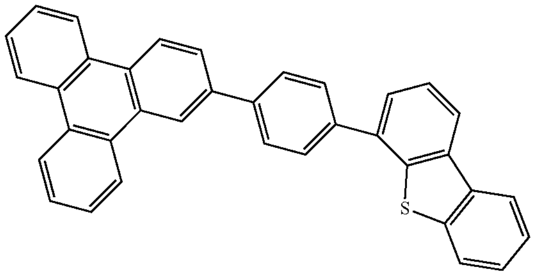
E-119
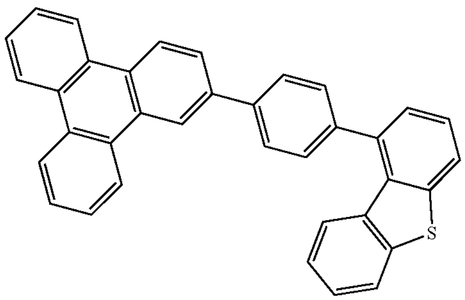
E-120
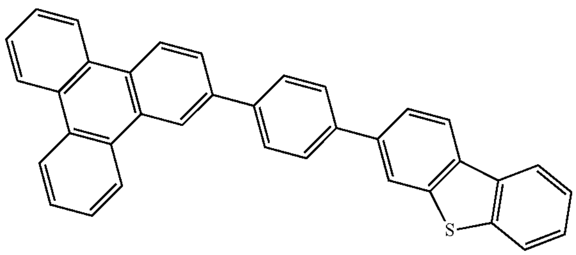
E-121
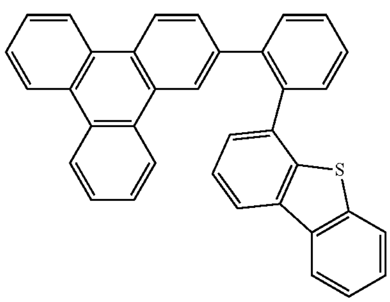
E-122
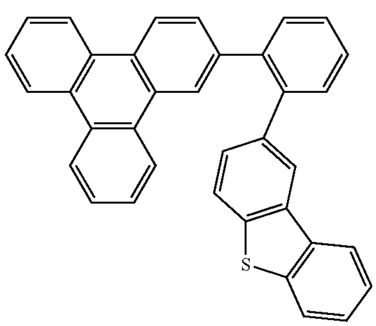
-continued
E-123
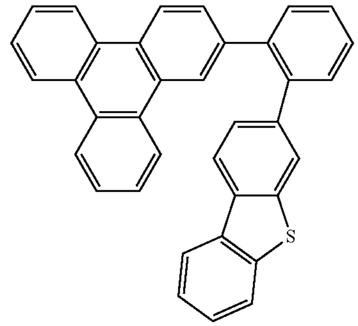
E-124
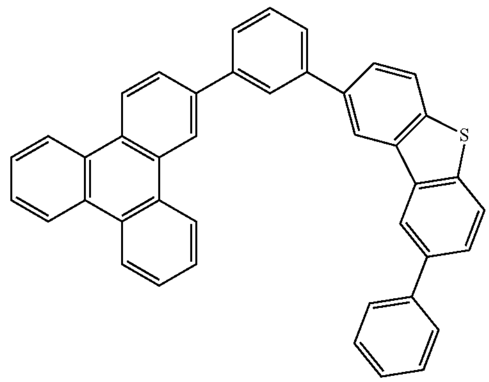
E-125
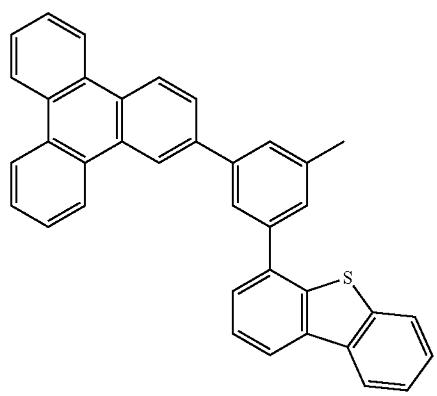
E-126
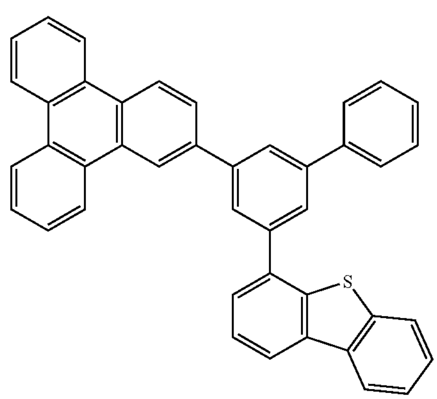

-continued
E-127
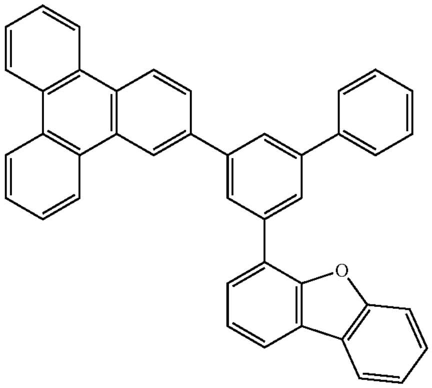
E-128
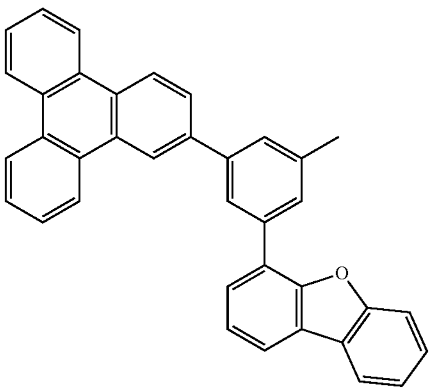
E-129
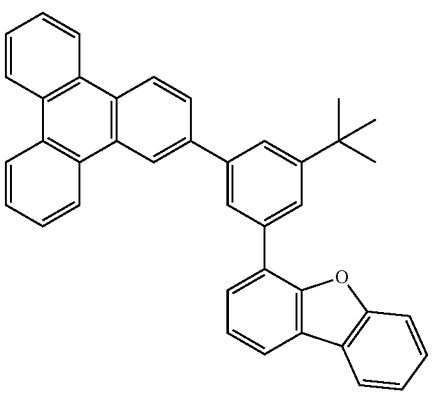
E-130
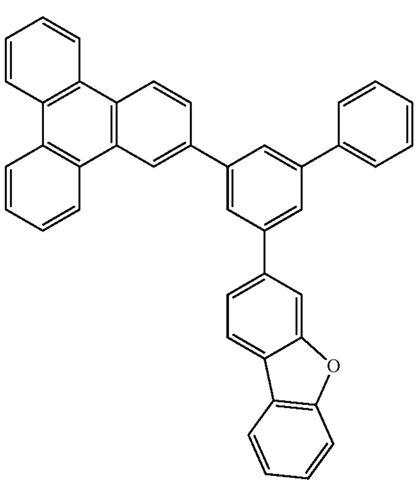
-continued
E-131
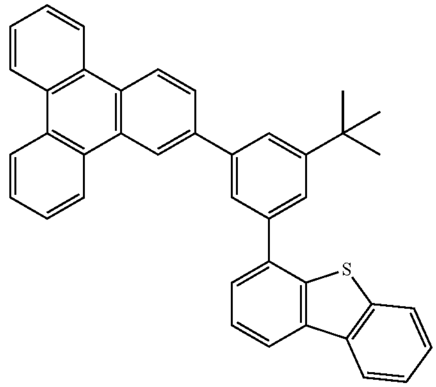
E-132
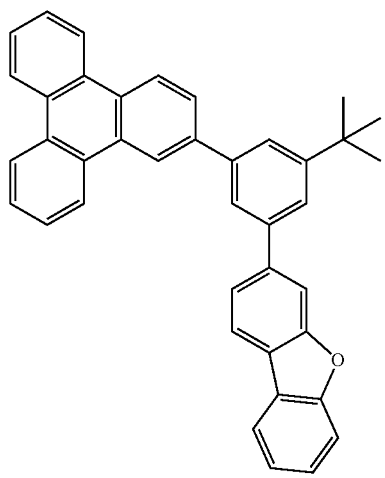
E-133
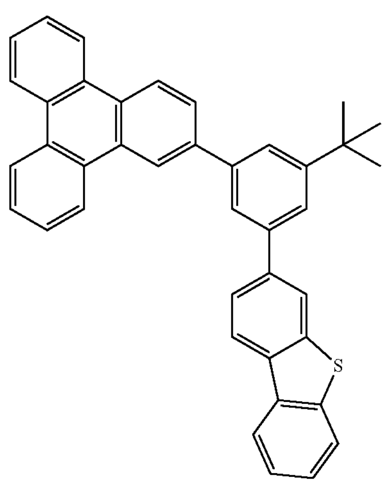

-continued
E-134
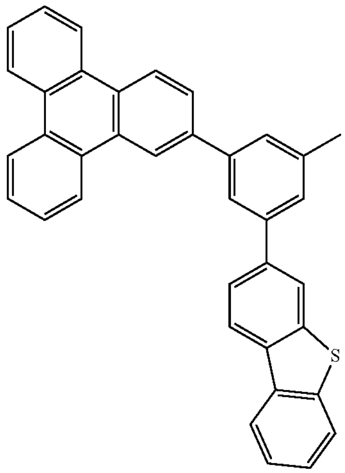
E-135
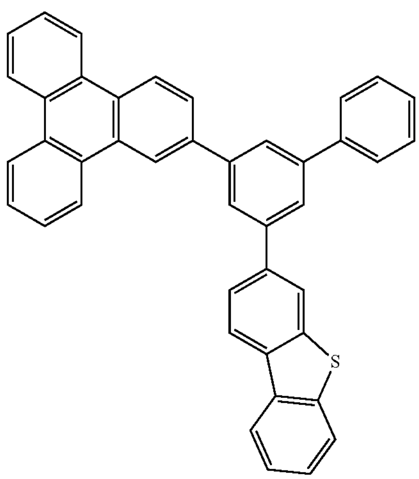
E-136
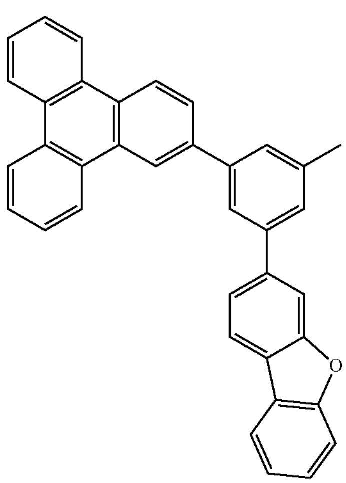
-continued
E-137
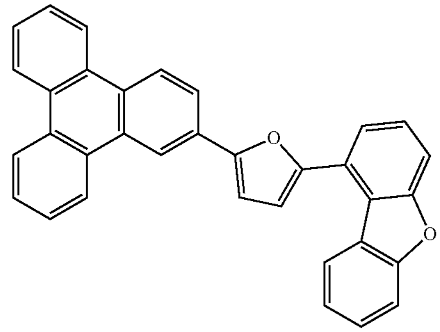
E-138
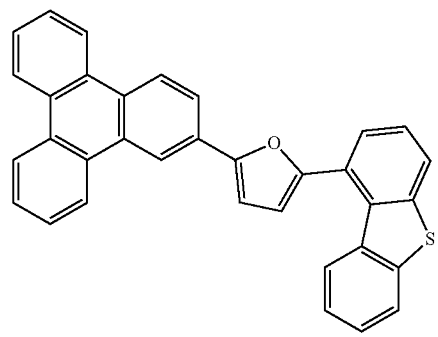
E-139
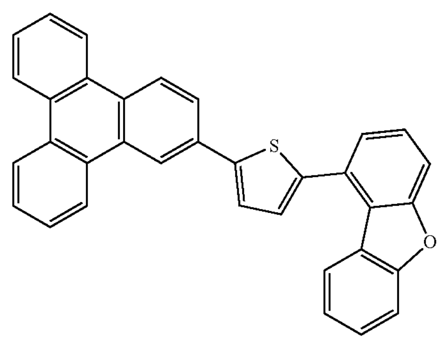
E-140
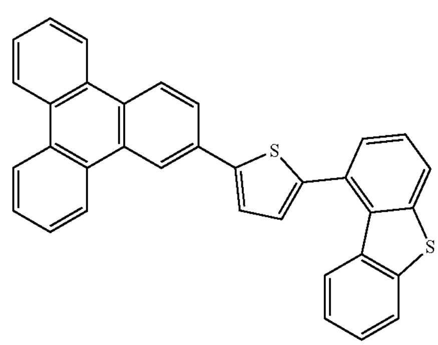

-continued
E-141
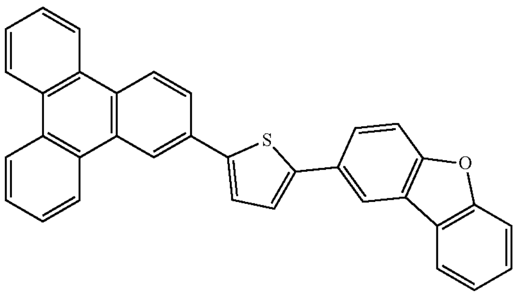
E-142
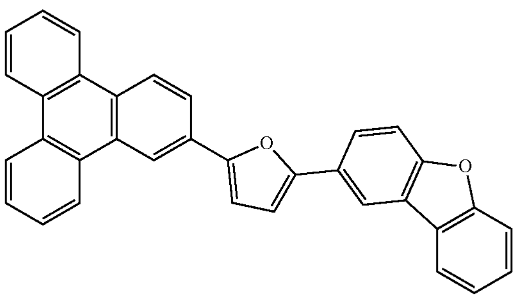
E-143
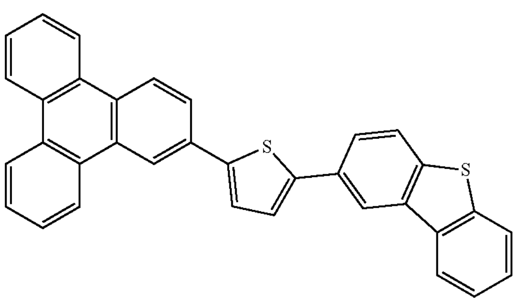
E-144
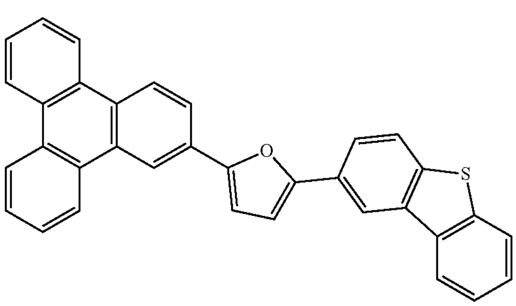
-continued
E-145
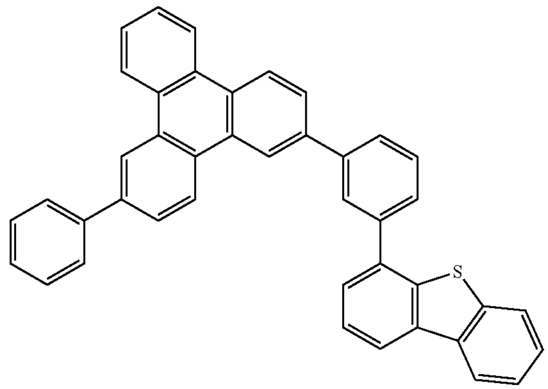
E-146
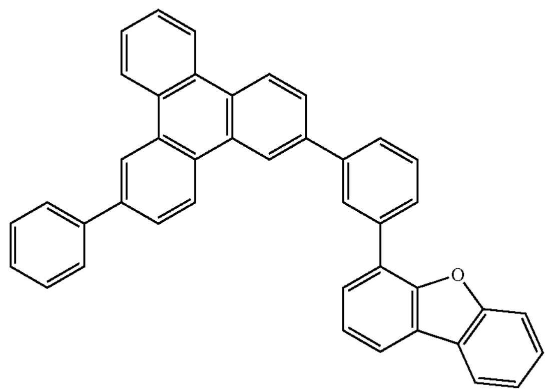
E-147
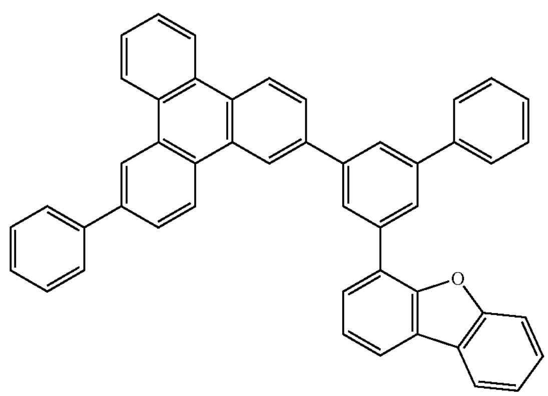
E-148
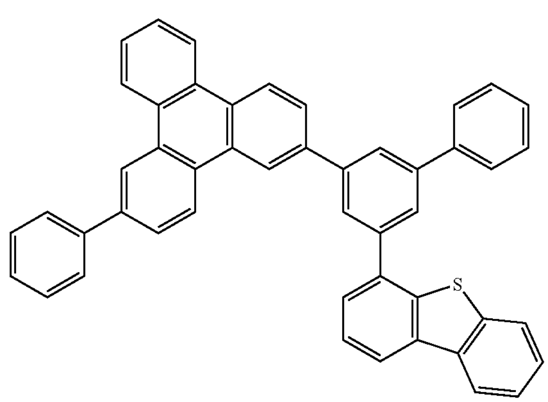

-continued
E-149
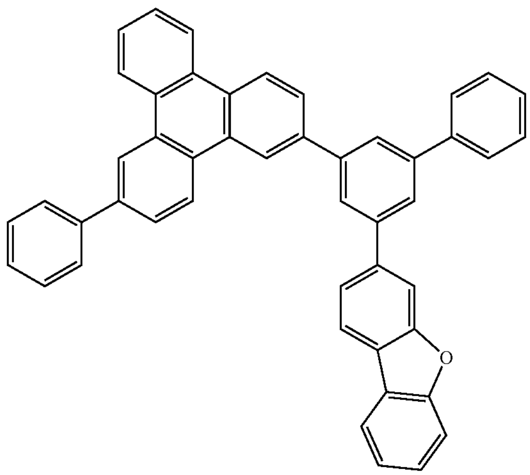
E-150
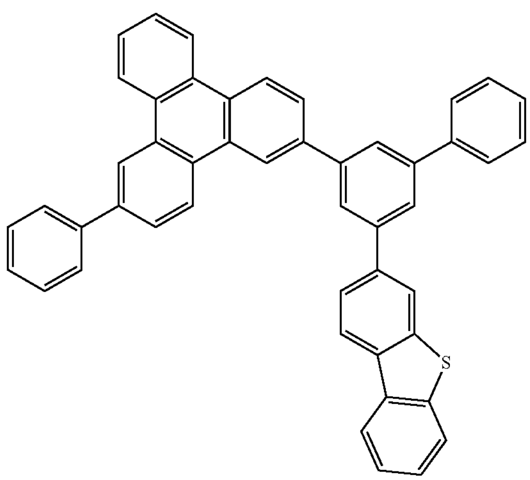
E-151
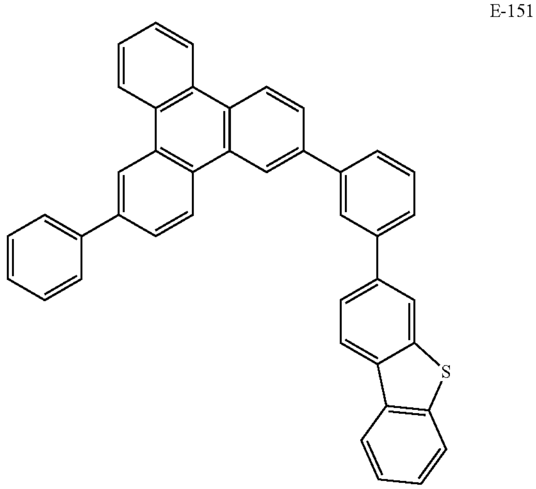 [SMILES: c1ccc(-c2ccc3c(c2)c2ccccc2c2ccc(-c4cccc(-c5ccc6c(c5)oc5ccccc56)c4)cc23)cc1]
-continued
E-152
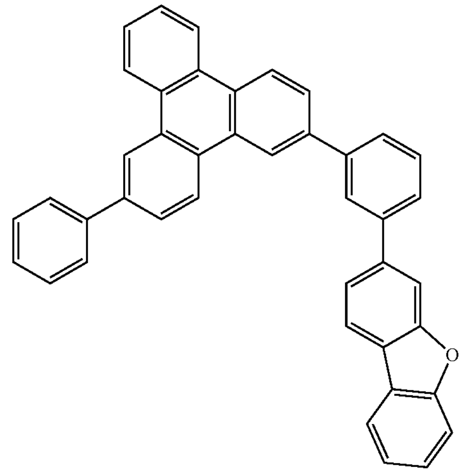
E-153
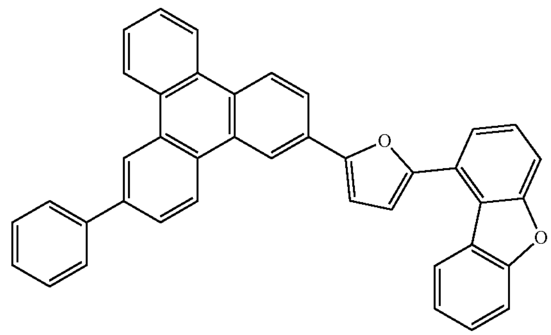
E-154
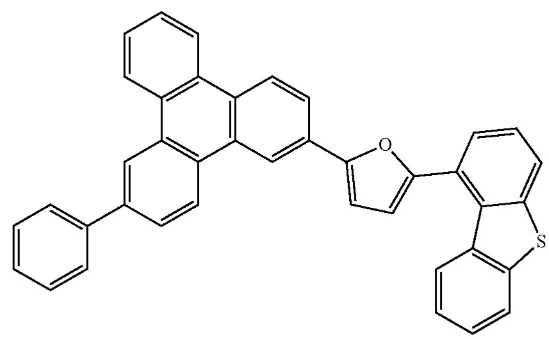
E-155
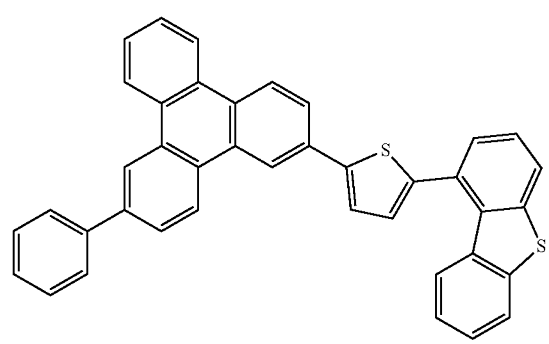

E-156
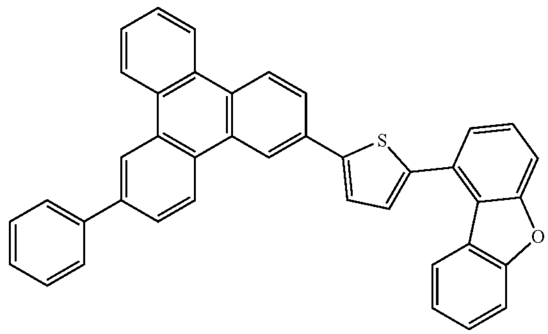
E-157
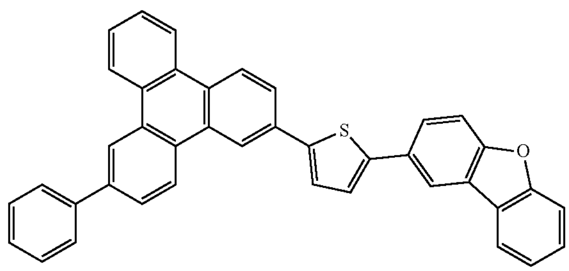
E-158
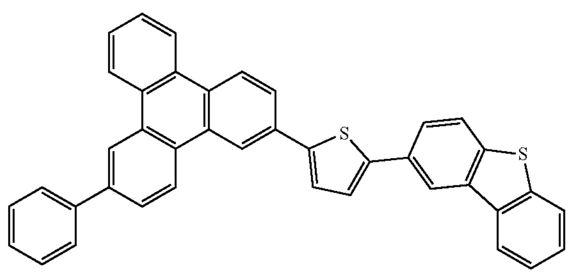
E-159
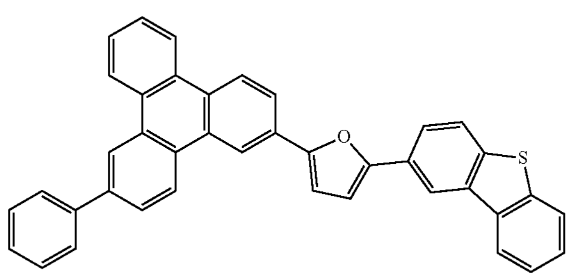
E-160
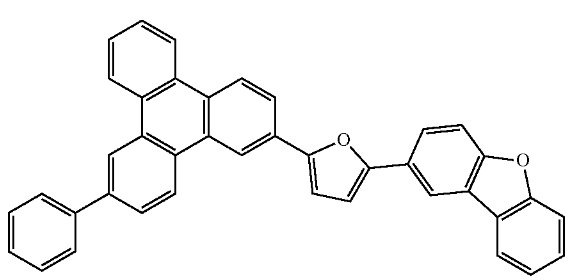
E-161
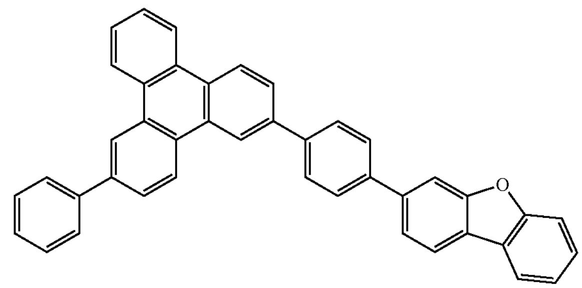
E-162
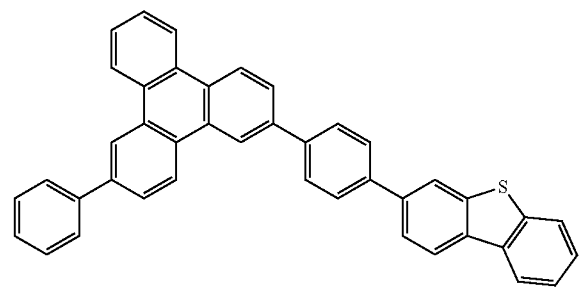
E-163
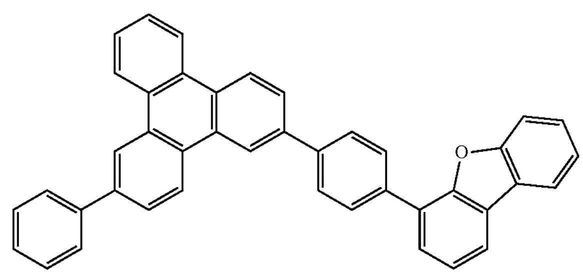
E-164
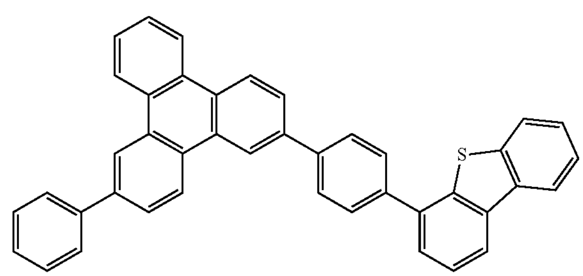
E-165
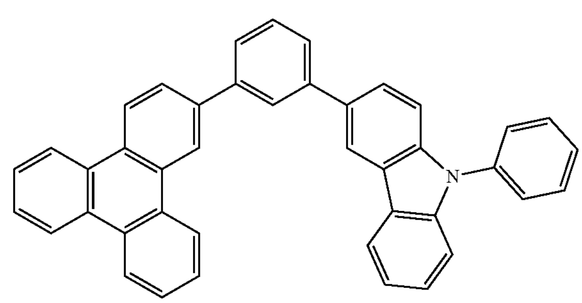

E-166
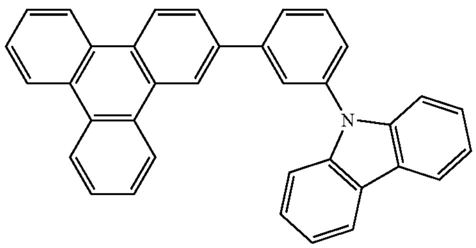
E-167
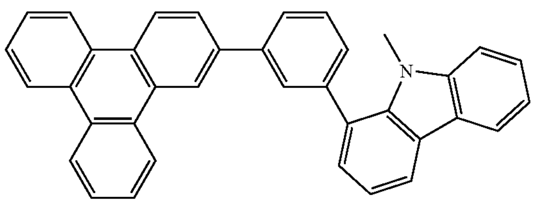
E-168
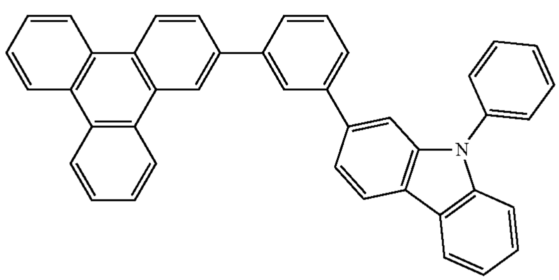
E-169
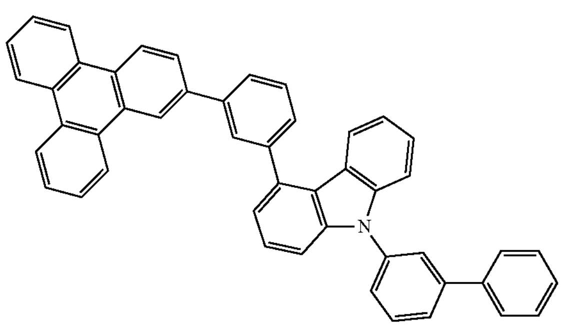
E-170
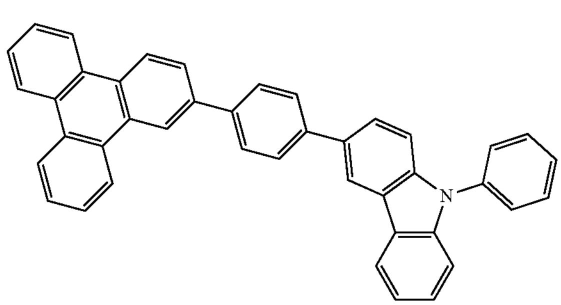
E-171
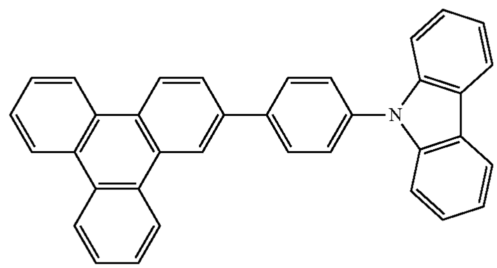
E-172
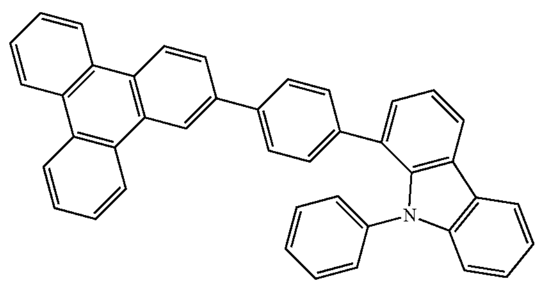
E-173
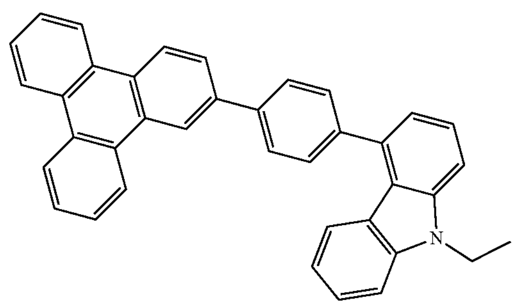
E-174
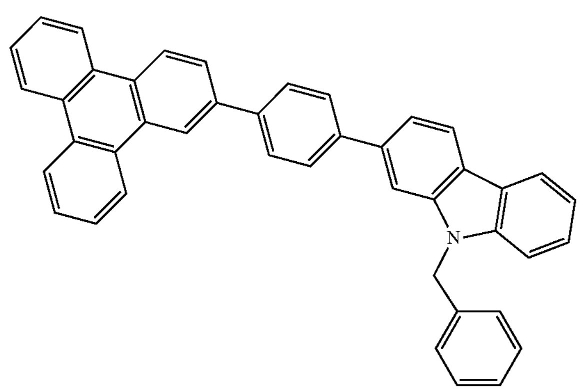
E-175
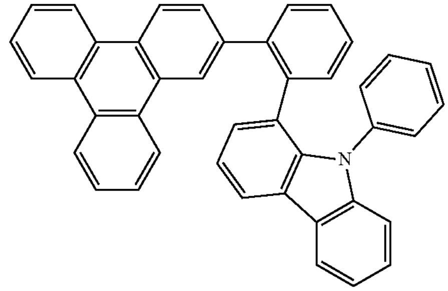

-continued
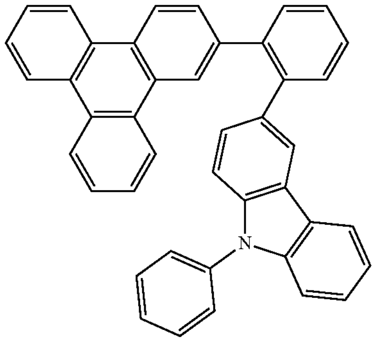
E-176
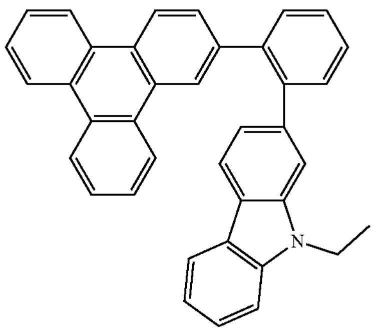
E-177
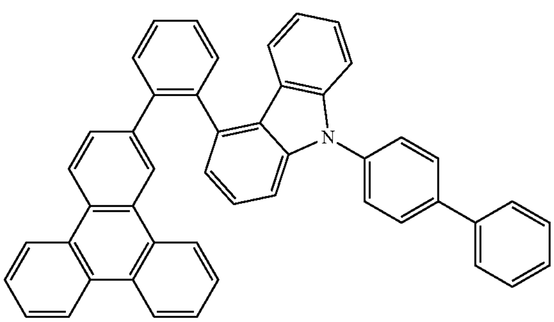
E-178
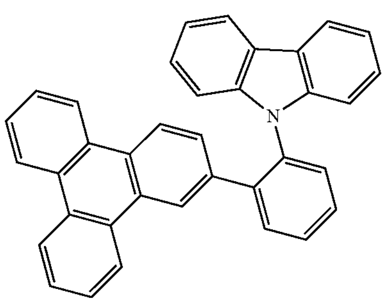
E-179
-continued
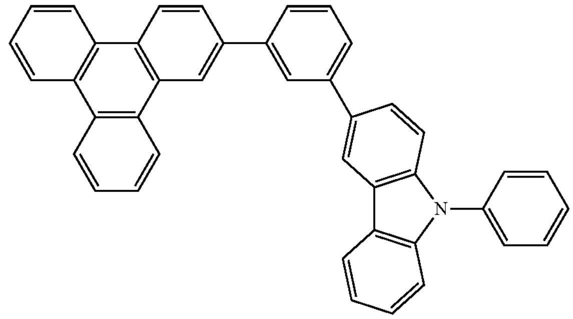
E-180
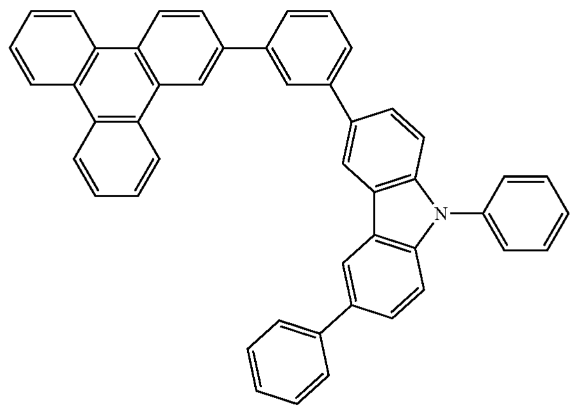
E-181
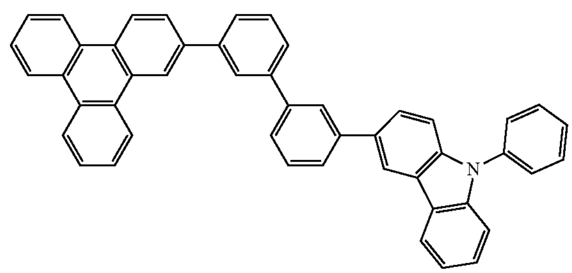
E-182
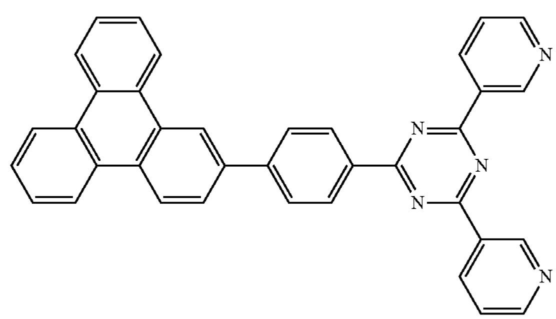
D-101

-continued
D-102
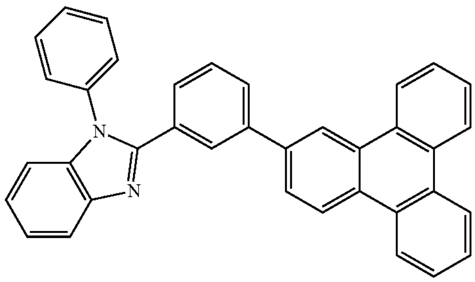
D-103
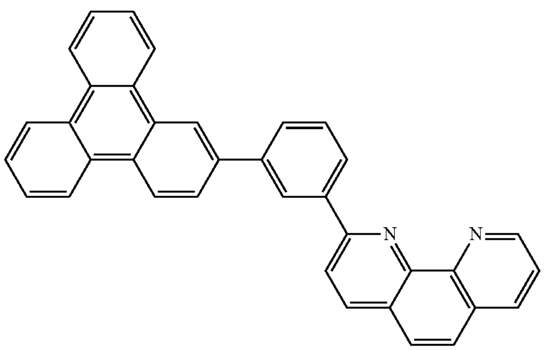
D-104
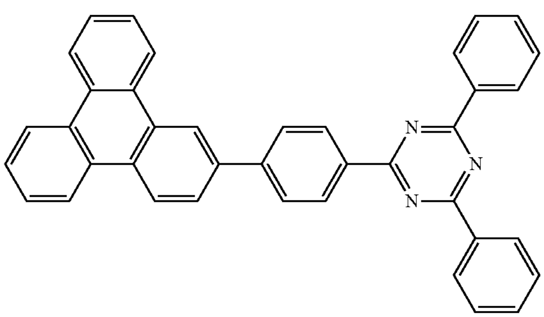
D-105
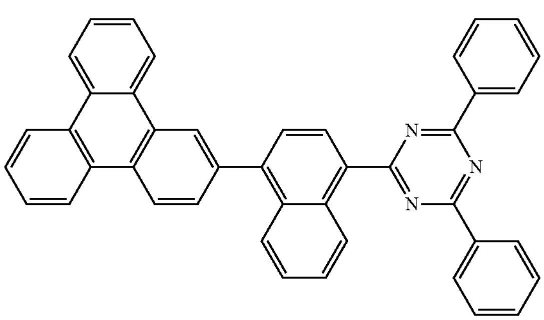
-continued
D-106
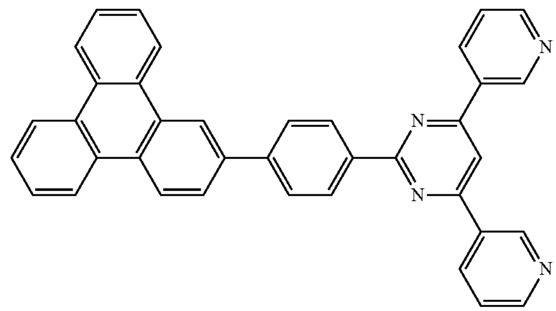
D-107
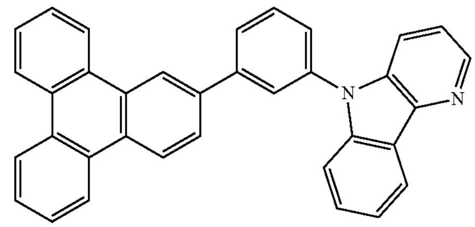
D-108
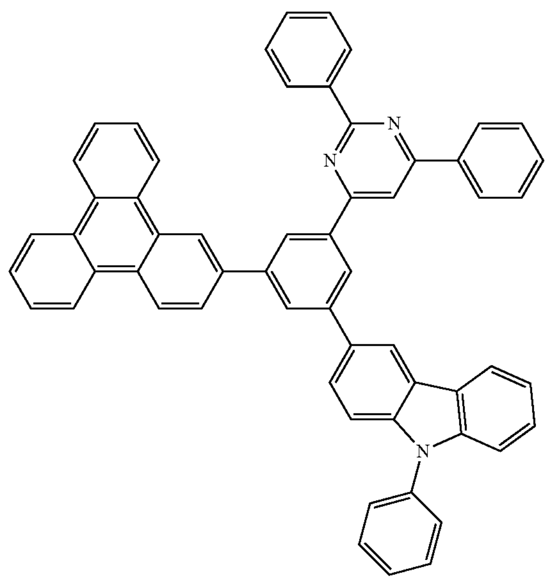
D-109
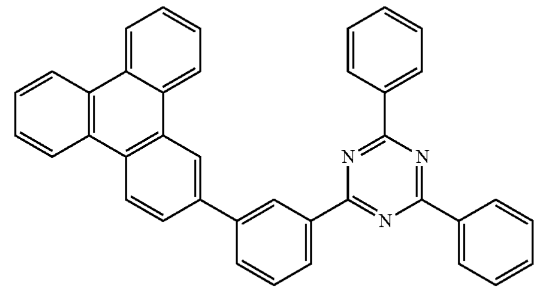

-continued
D-110
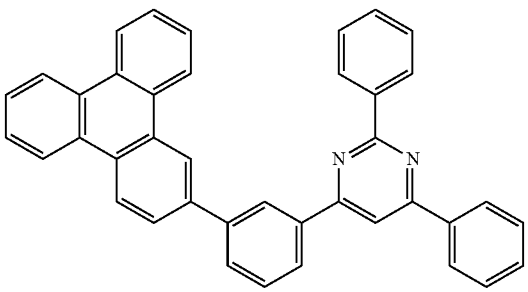
D-111
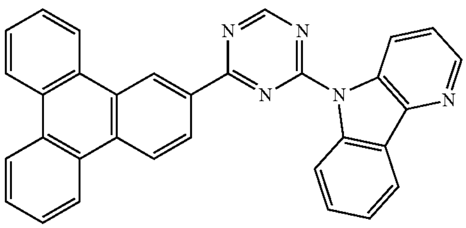
D-112
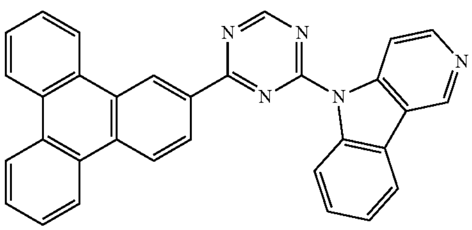
D-113
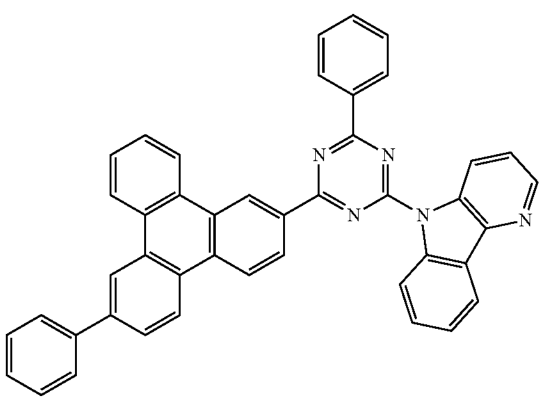
D-114
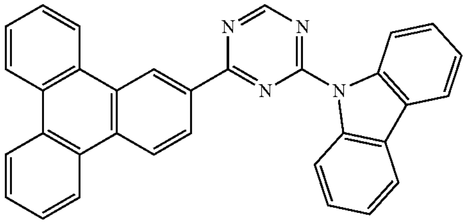
-continued
D-115
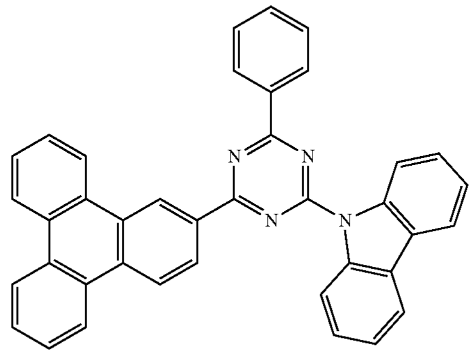
D-116
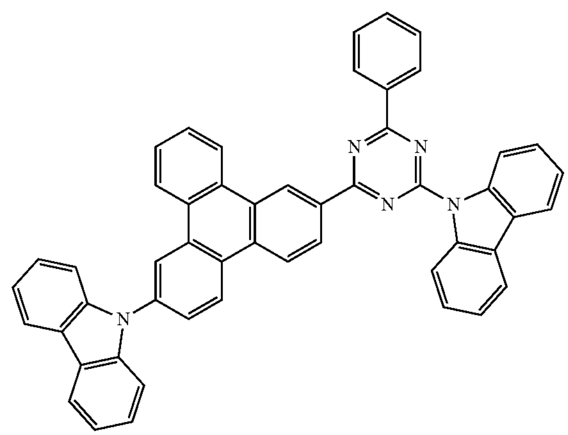
D-117
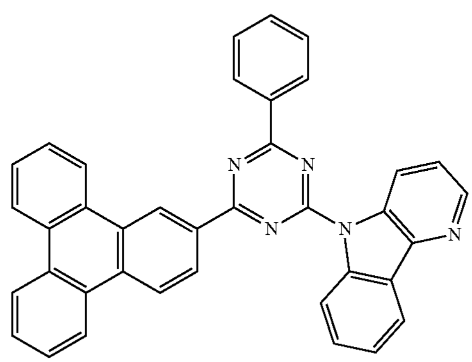
D-118
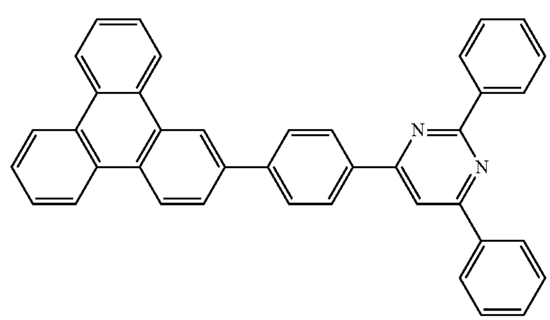

D-119
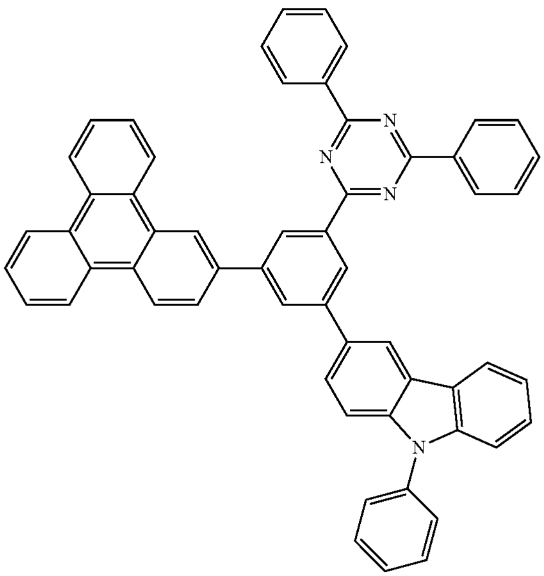
D-120
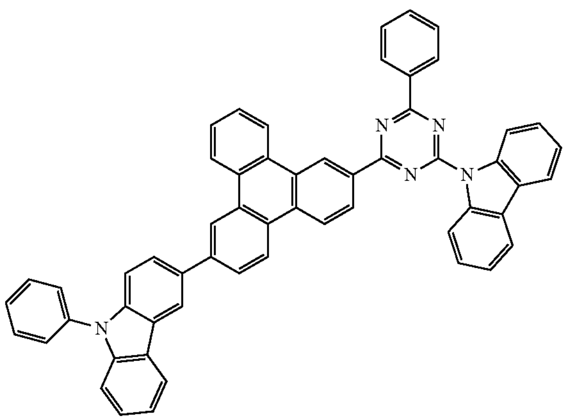
D-121
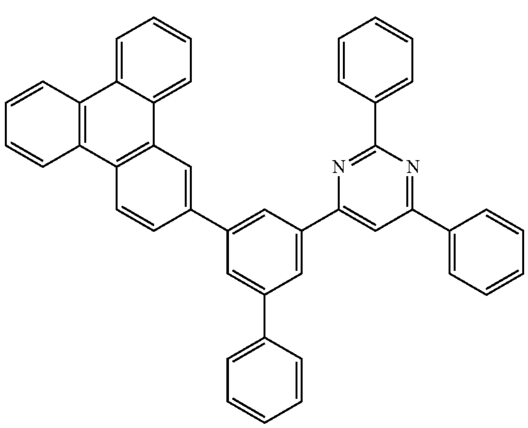
D-122
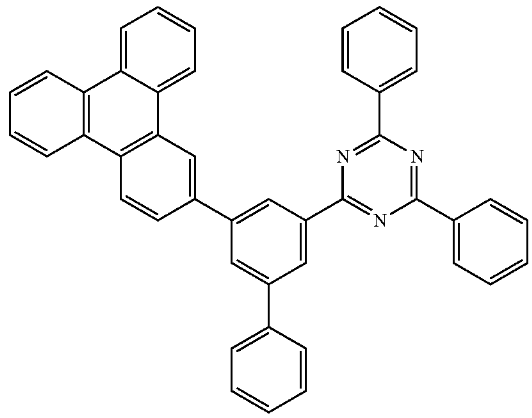
D-123
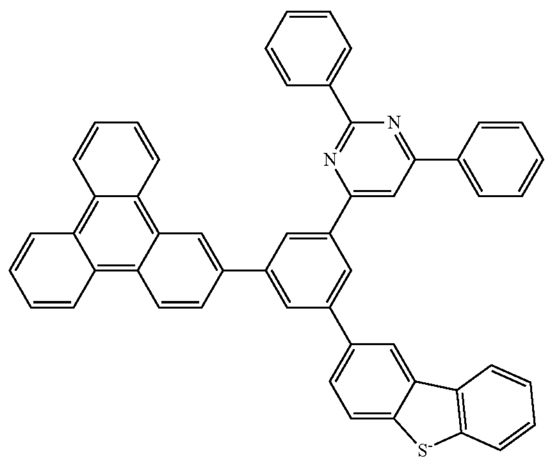
D-124
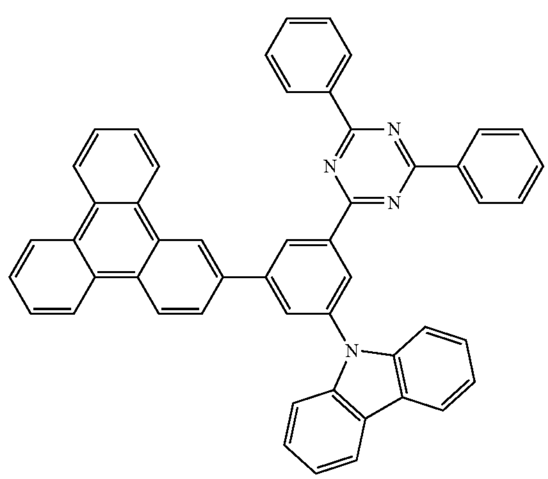

-continued
D-125
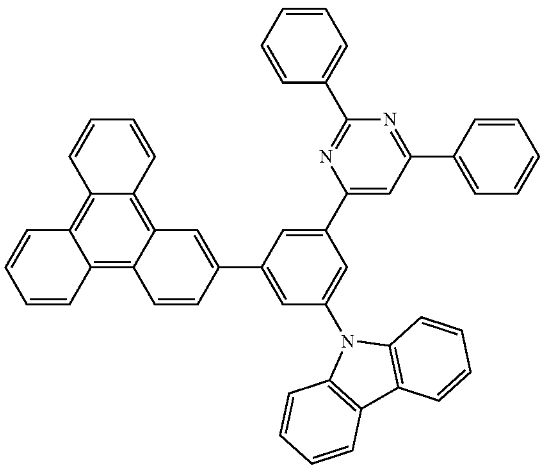
D-126
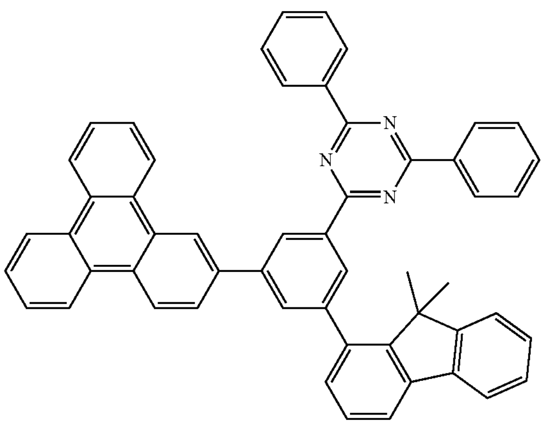
D-127
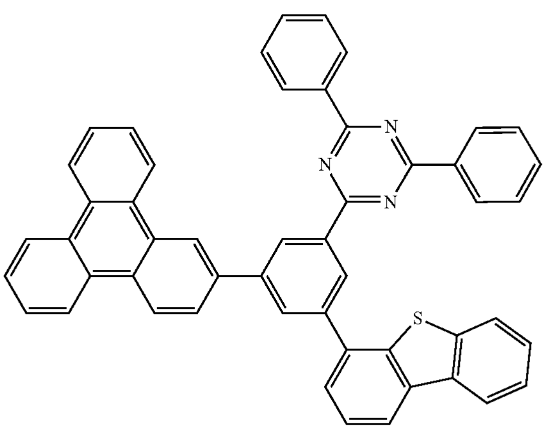
-continued
D-128
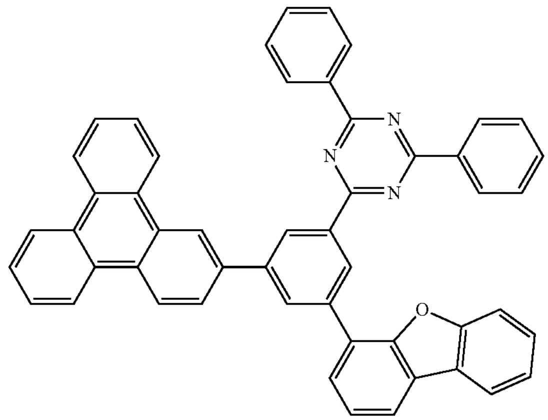
D-129
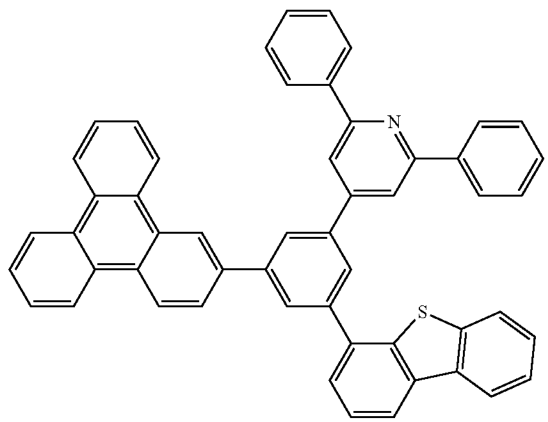
D-130
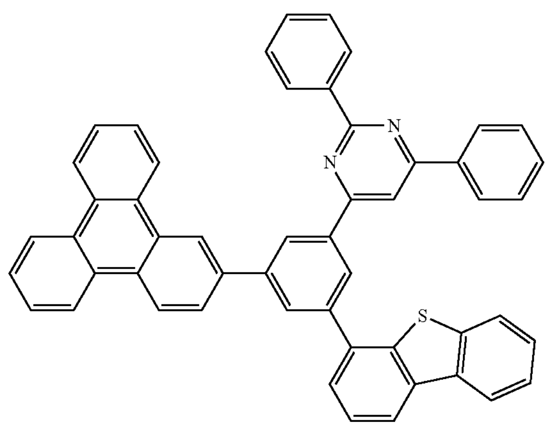

D-131
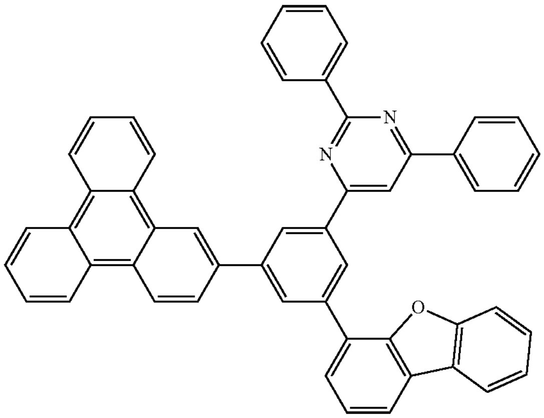
D-132
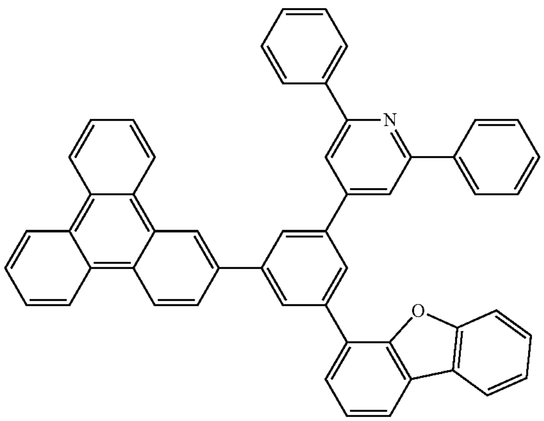
D-133
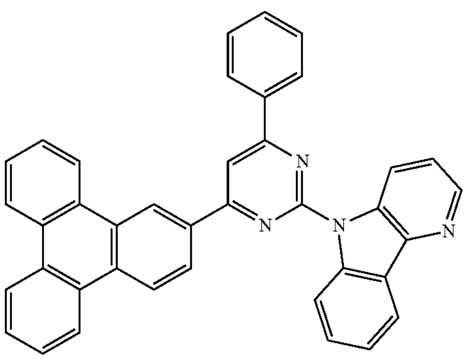
D-134
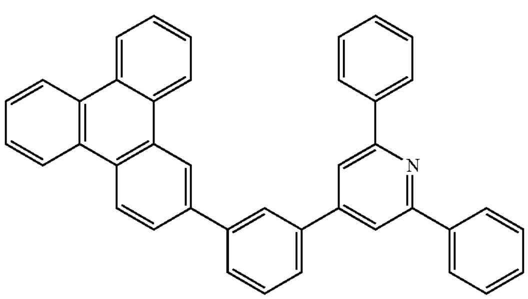
D-135
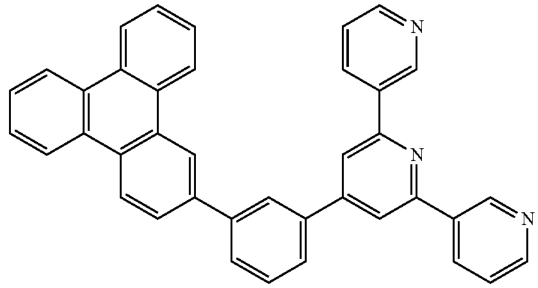
D-136
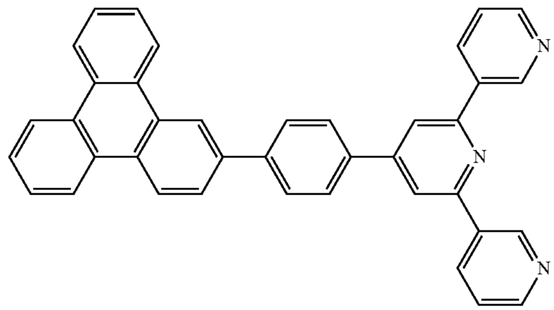
D-137
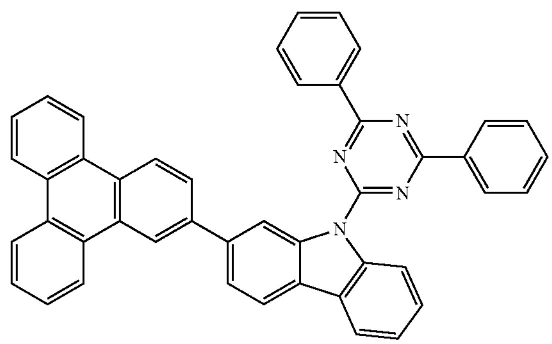
D-138
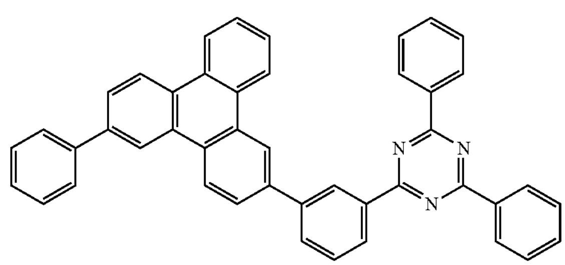

-continued
D-139
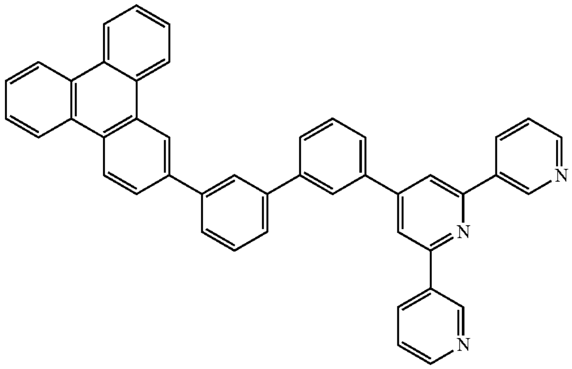
D-140
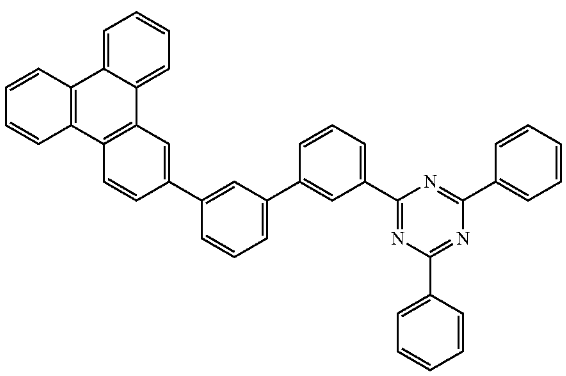
D-141
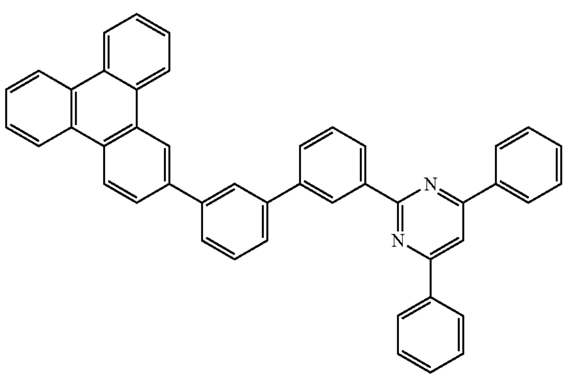
D-142
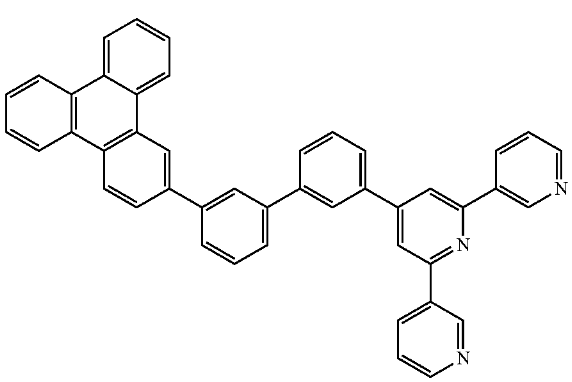
-continued
D-143
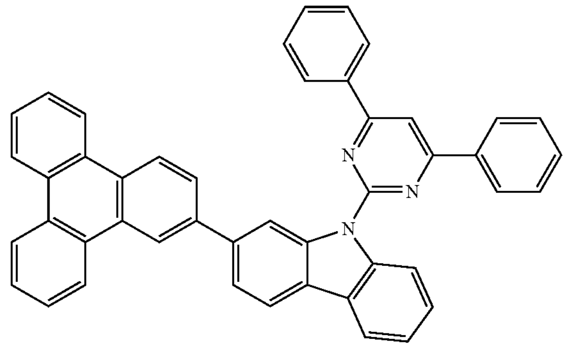
D-144
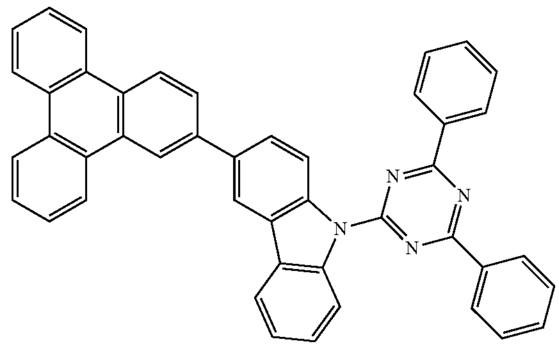
D-145
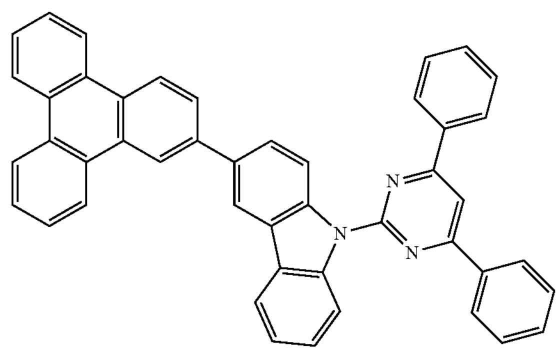
D-146
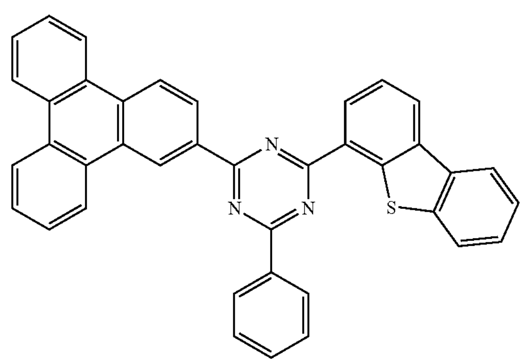

-continued
D-147
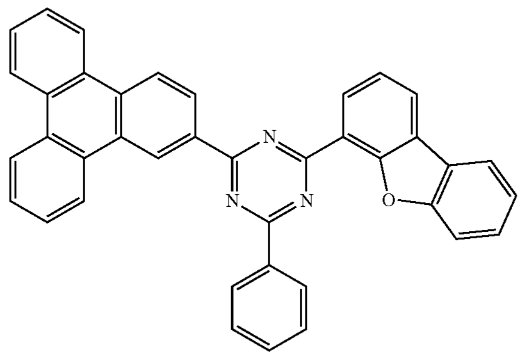
D-148
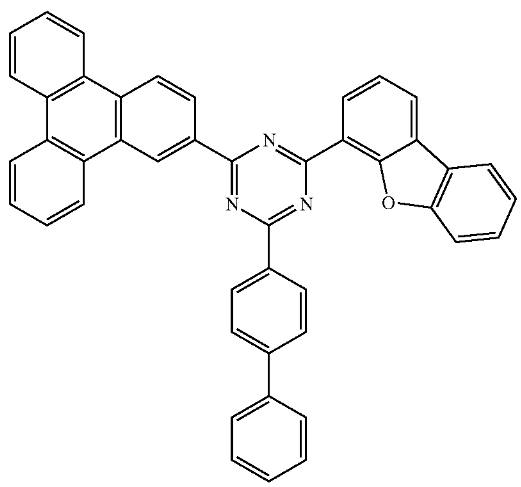
D-149
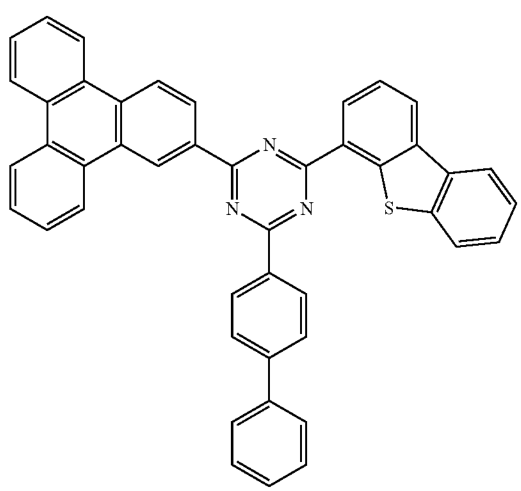
-continued
D-150
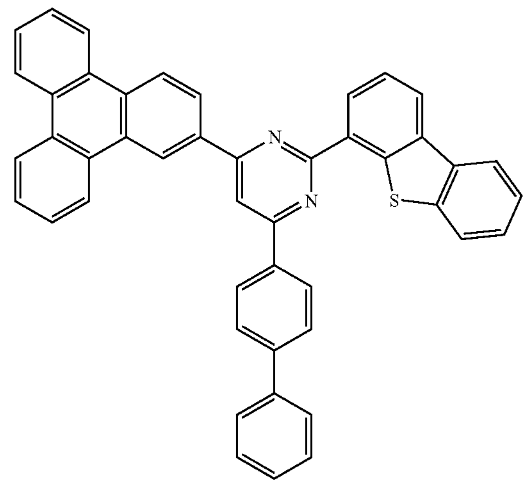
D-151
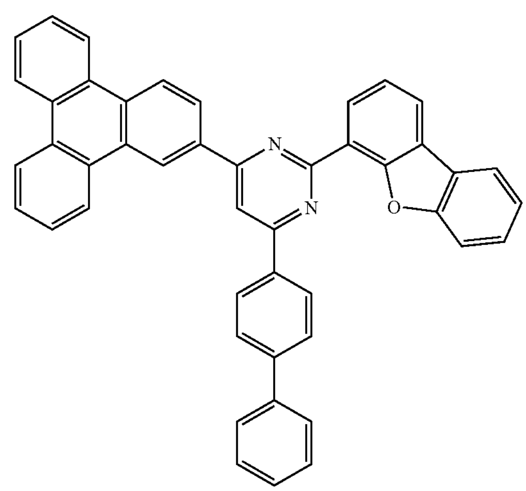
D-152
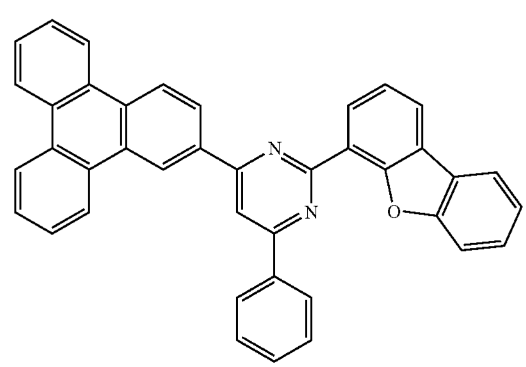

-continued
D-153
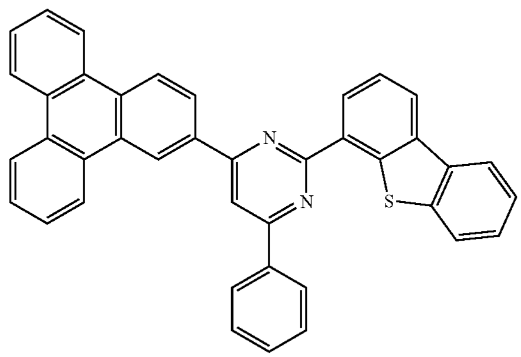
D-154
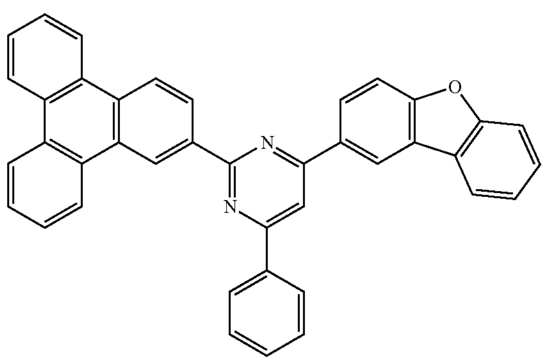
D-155
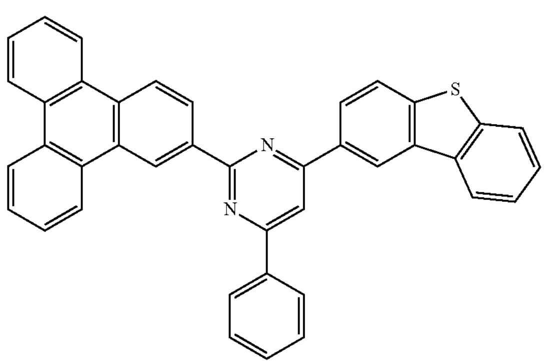
D-156
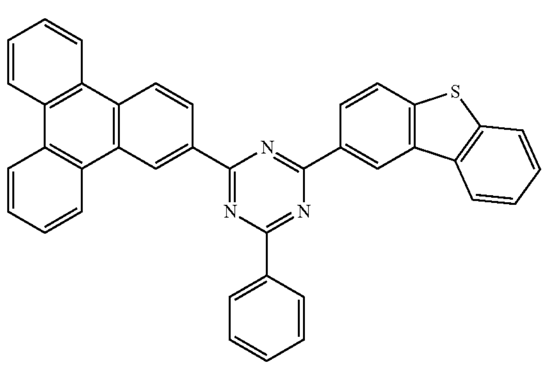
-continued
D-157
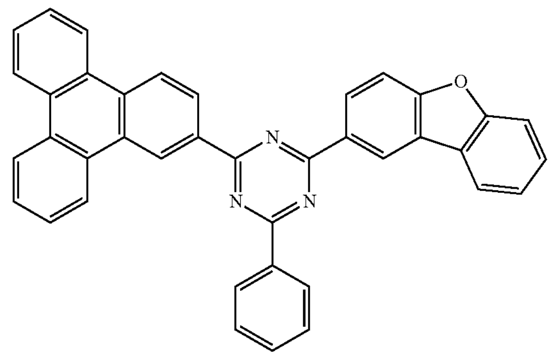
D-158
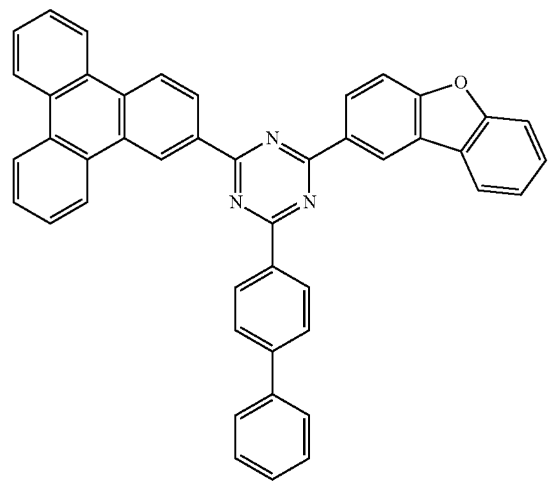
D-159
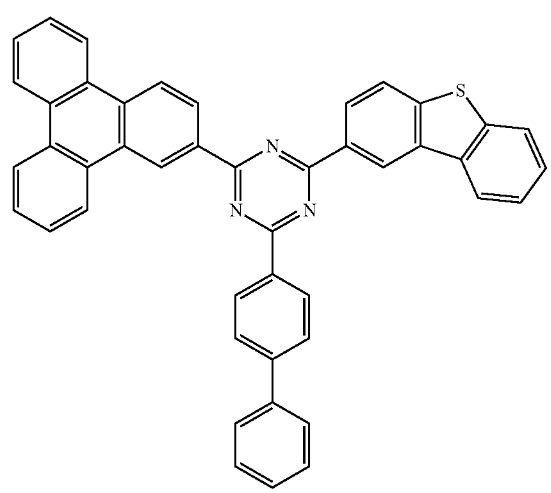

-continued
F-101
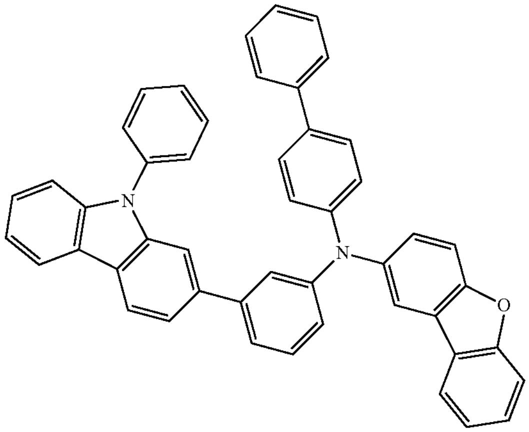
F-102
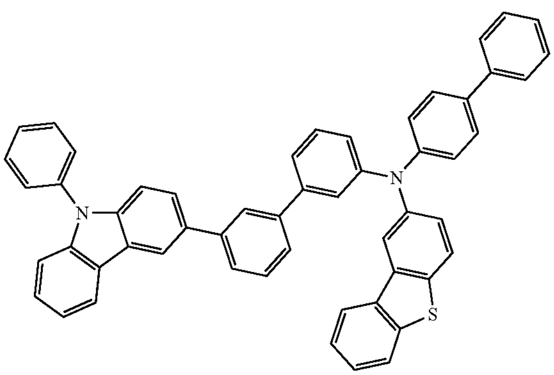
F-103
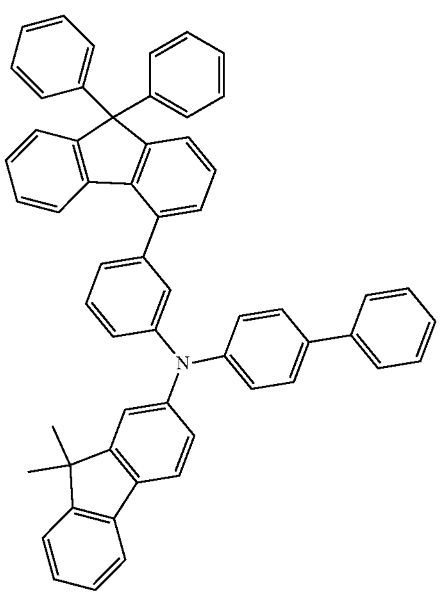
F-104
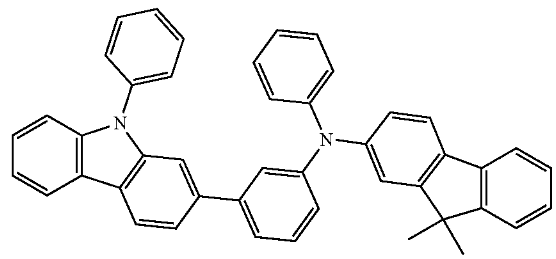
F-105
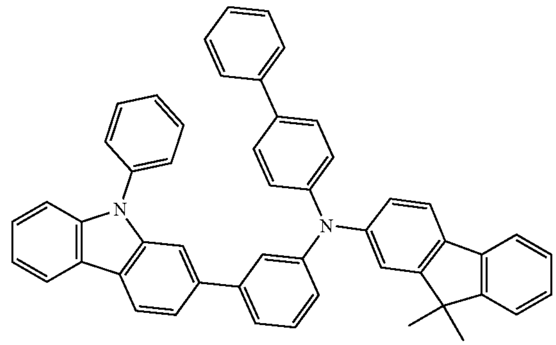
F-106
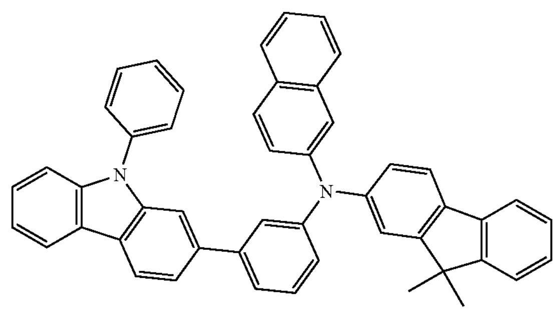
F-107
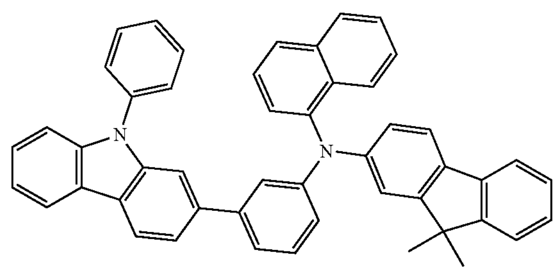
F-108
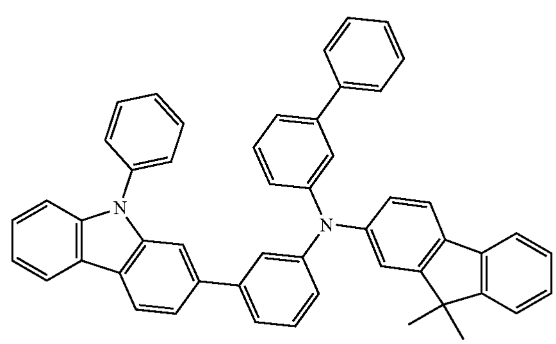

-continued
F-109
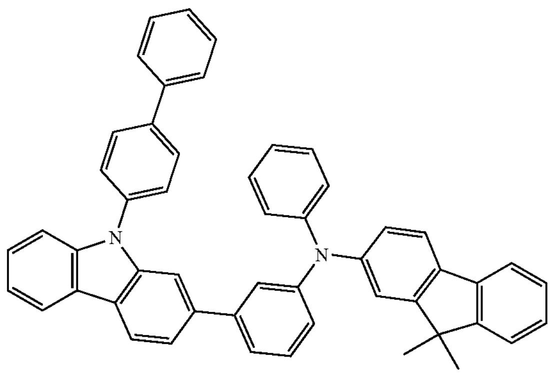
F-110
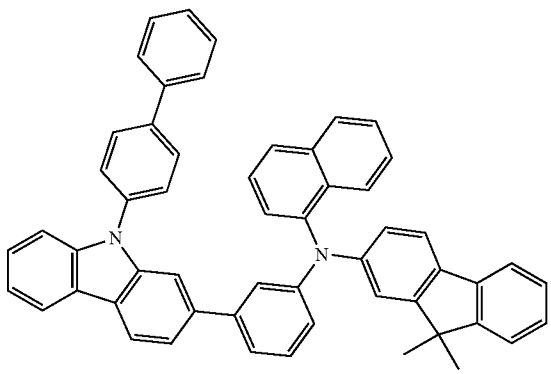
F-111
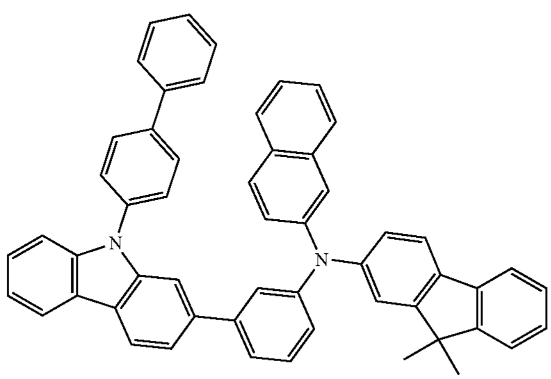
F-112
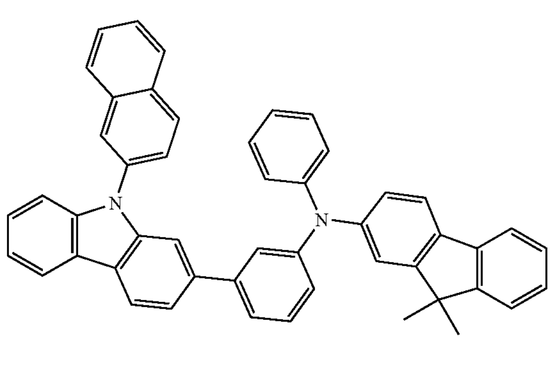
-continued
F-113
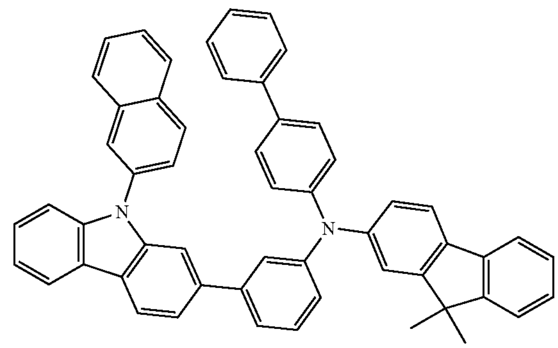
F-114
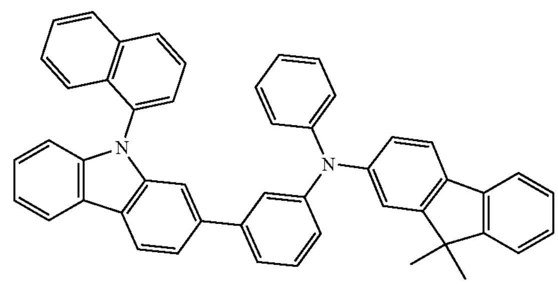
F-115
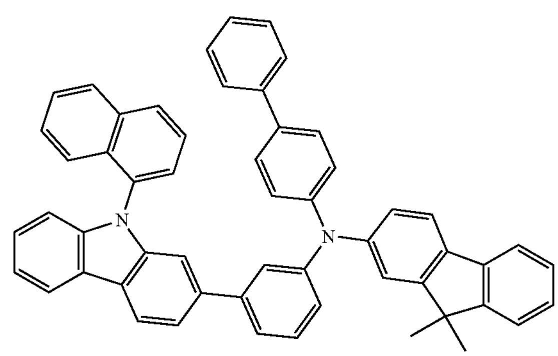
F-116
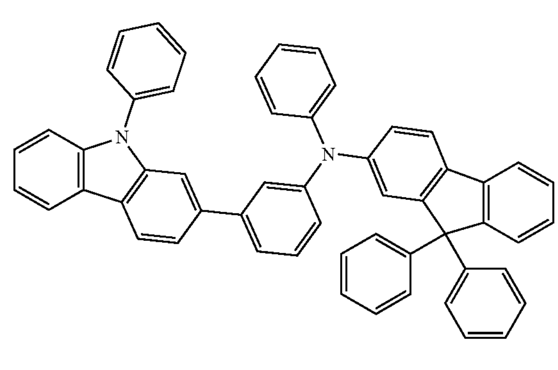

-continued
F-117
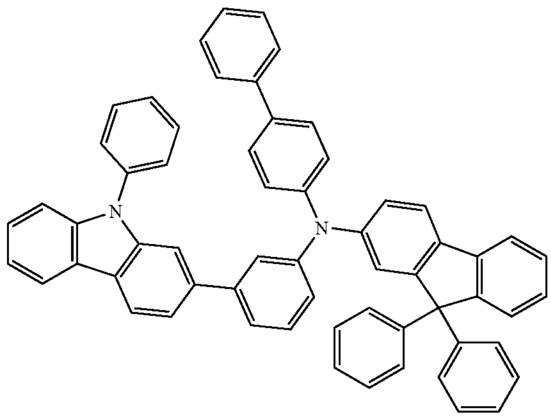
F-118
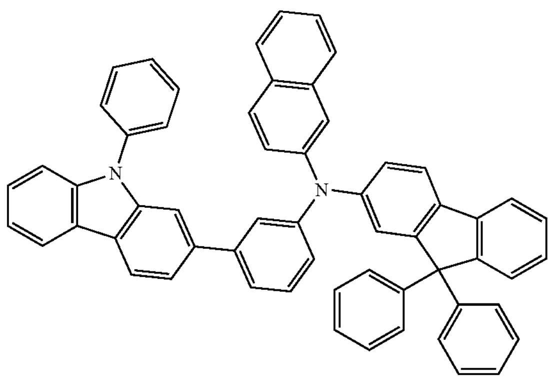
F-119
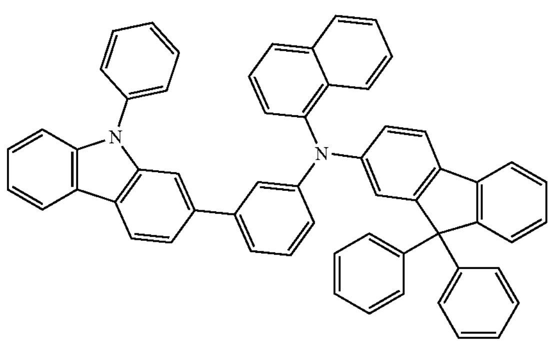
F-120
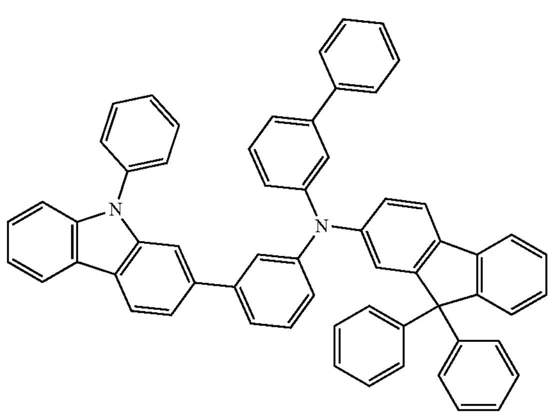
-continued
F-121
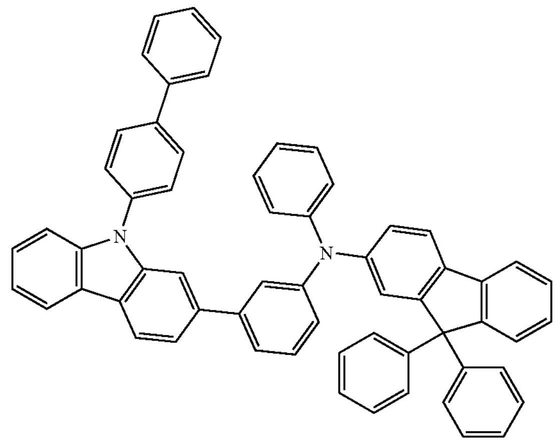
F-122
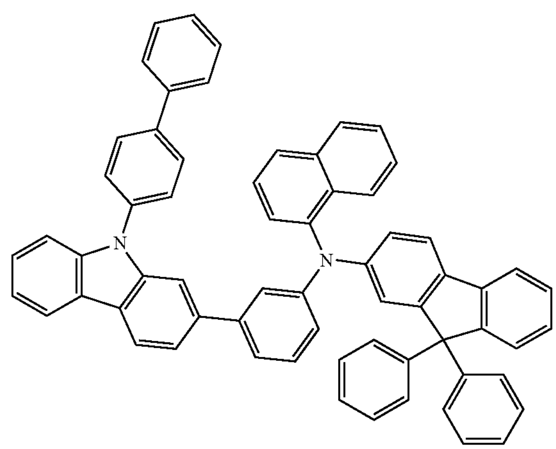
F-123
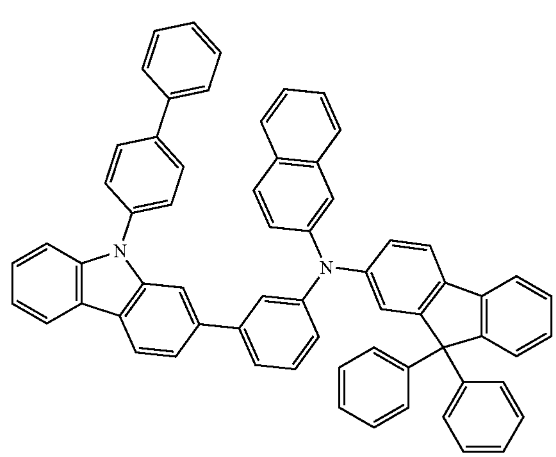

-continued
F-124
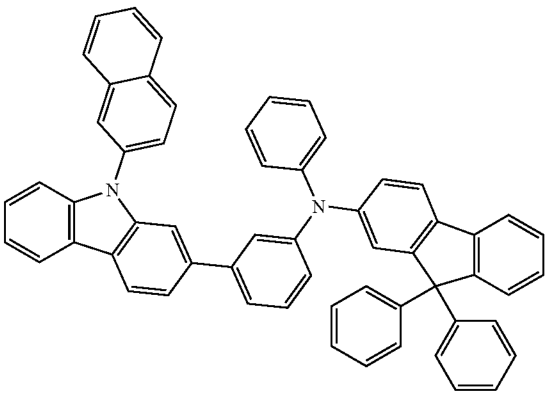
F-125
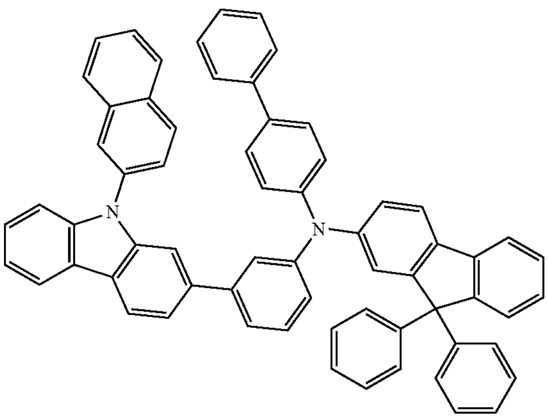
F-126
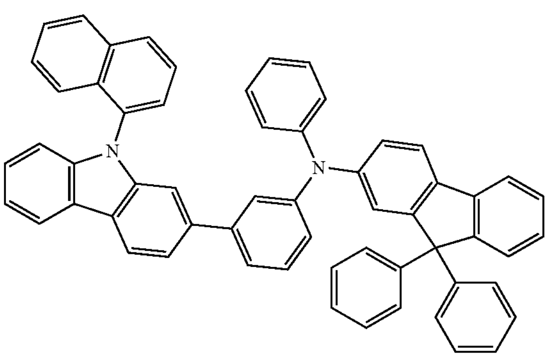
F-127
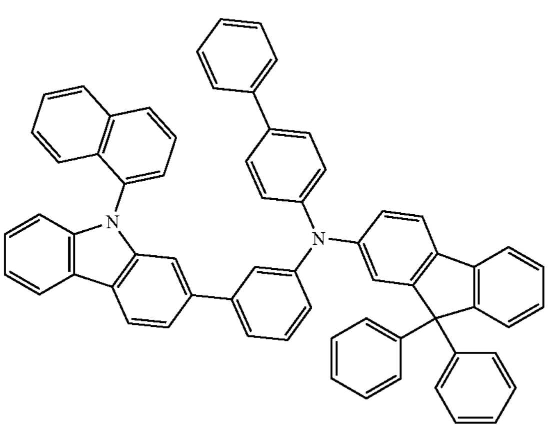
-continued
F-128
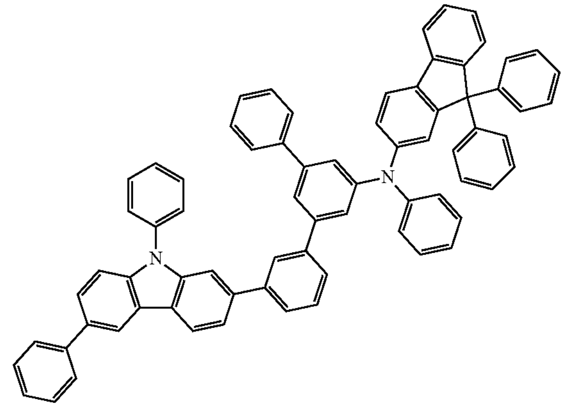
F-129
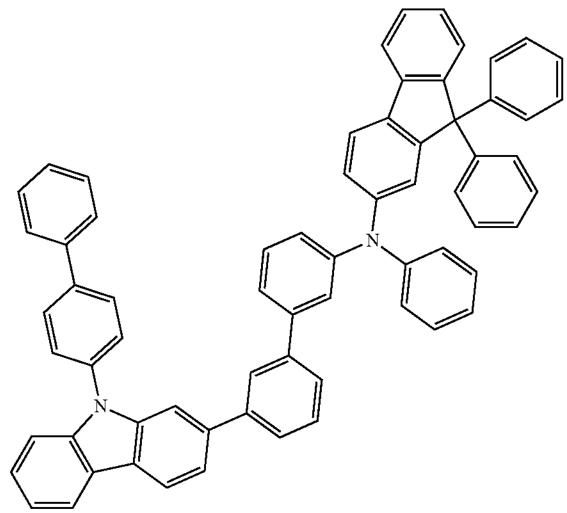
F-130
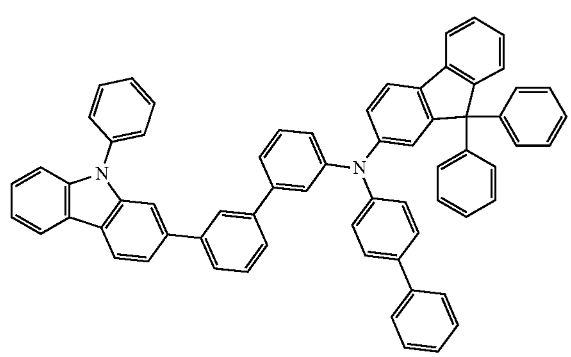
F-131
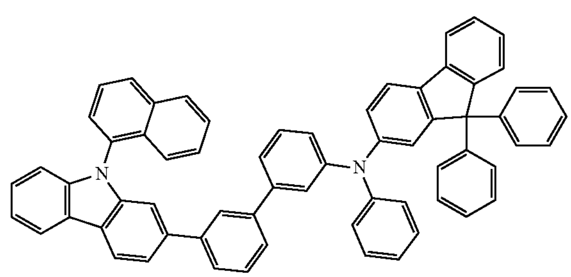

F-132
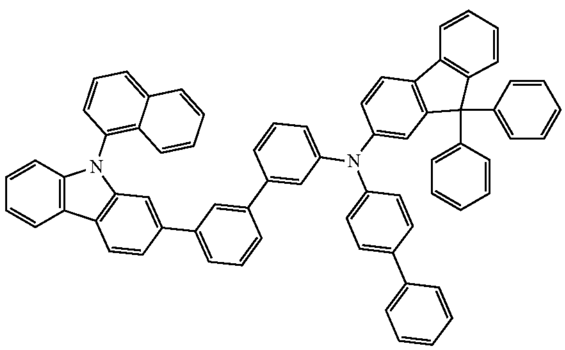
F-133
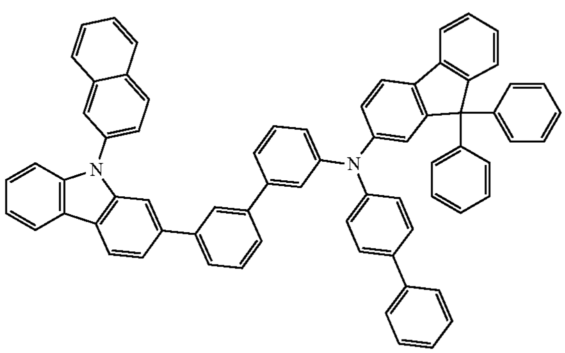
F-134
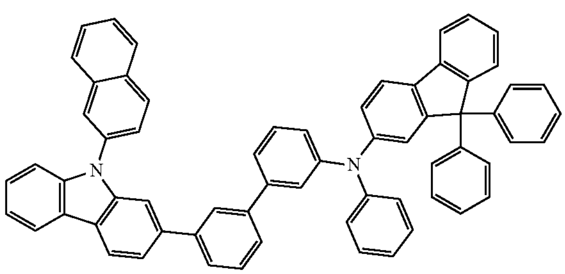
F-135
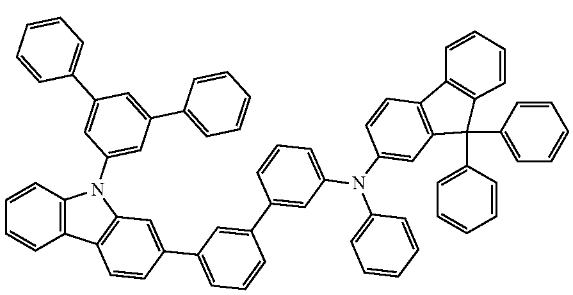
F-136
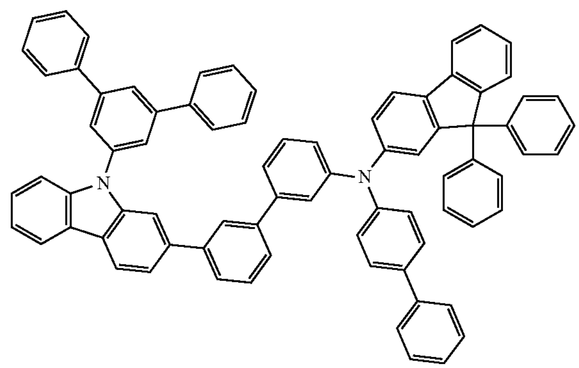
F-137
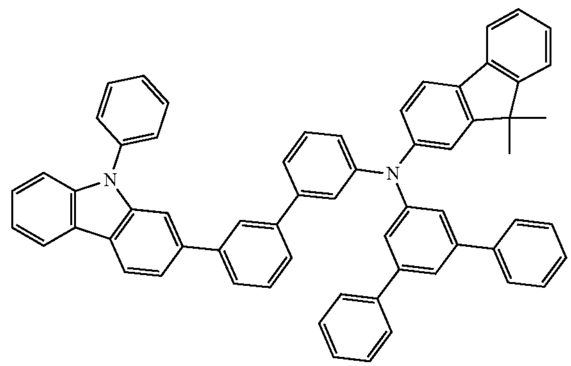
F-138
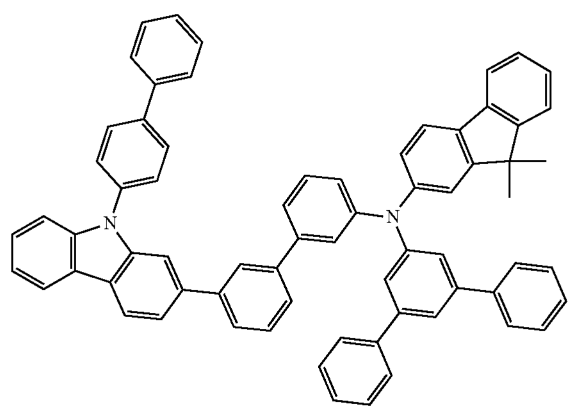
F-139
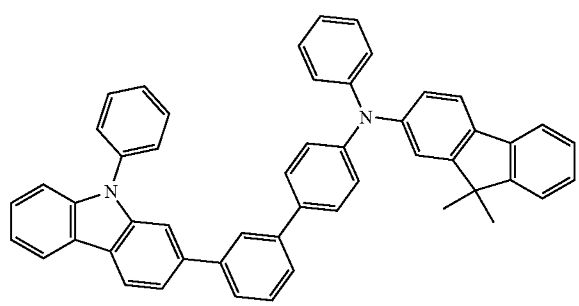

-continued
F-140
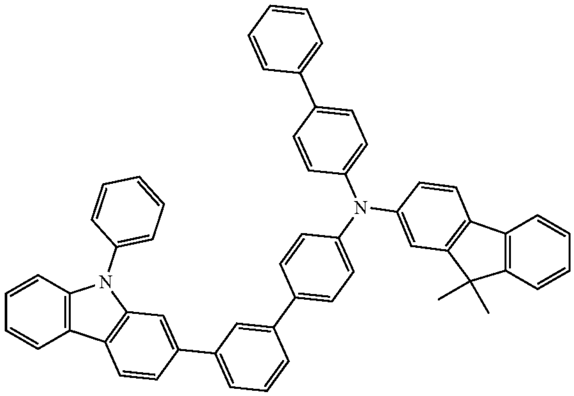
F-141
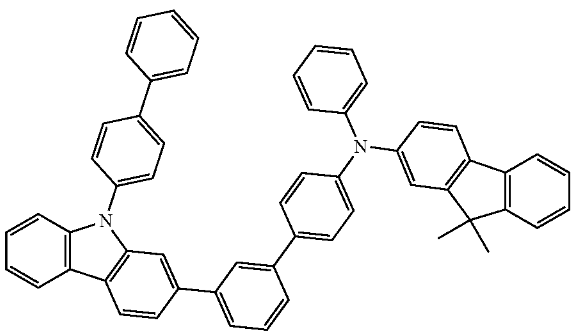
F-142
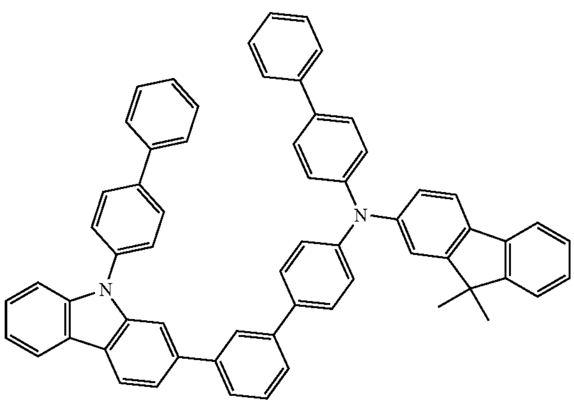
F-143
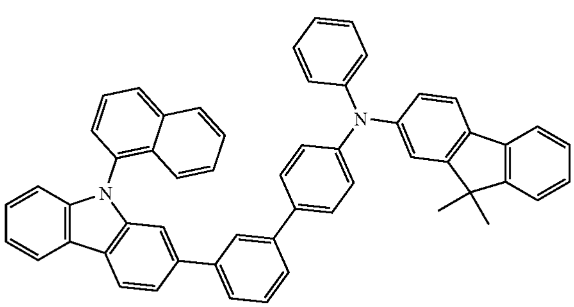
-continued
F-144
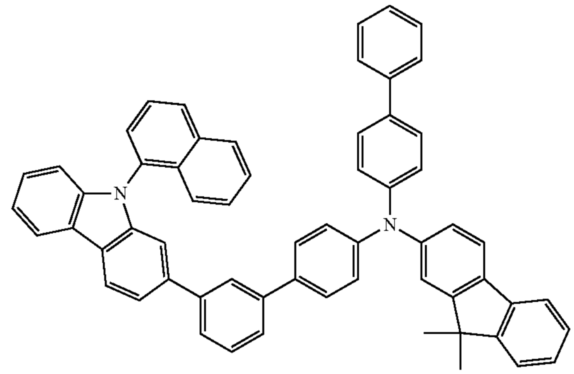
F-145
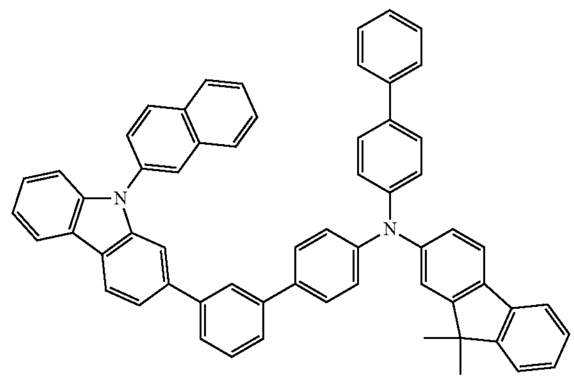
F-146
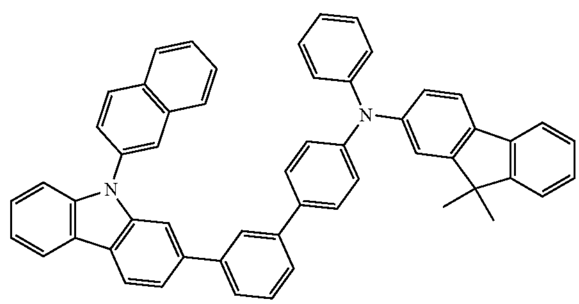
F-147
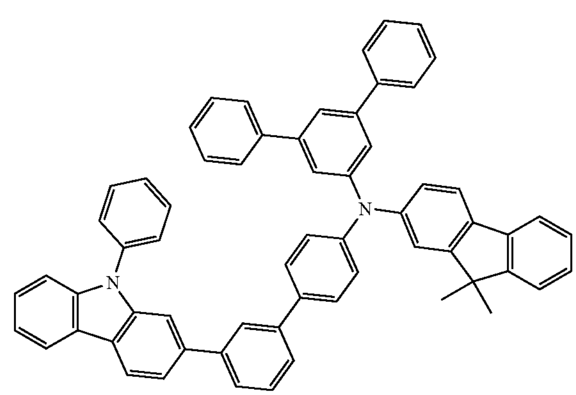

-continued
F-148
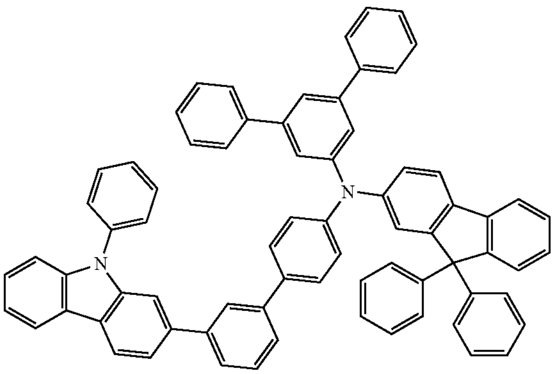
F-149
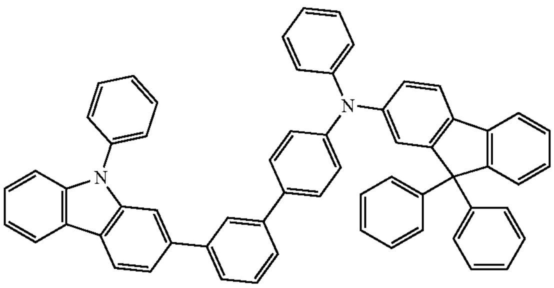
F-150
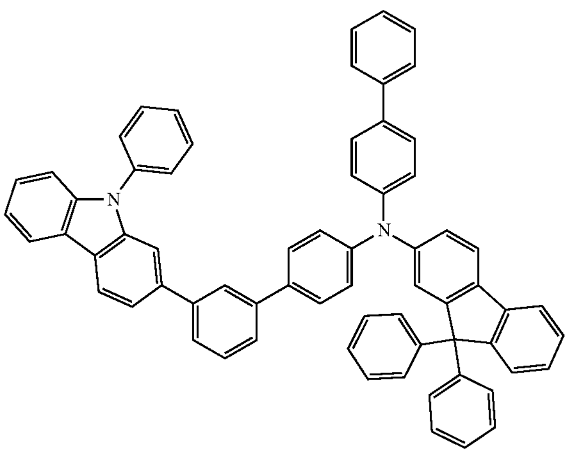
F-151
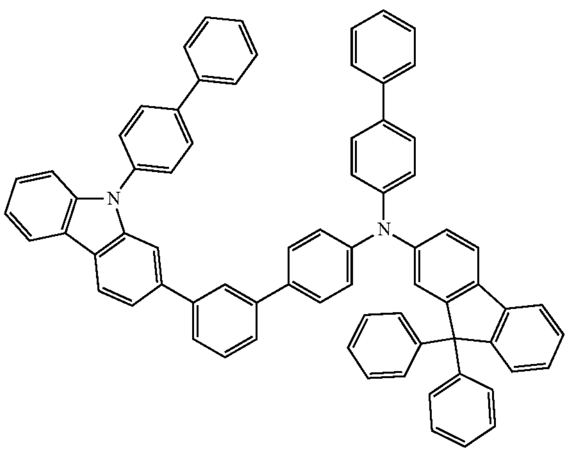
-continued
F-152
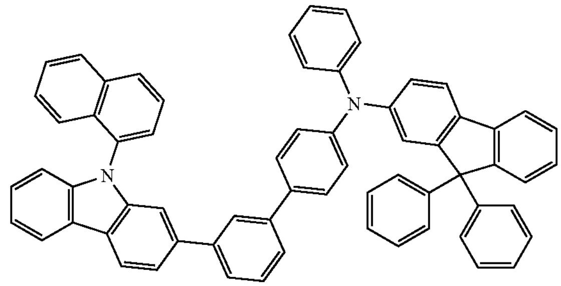
F-153
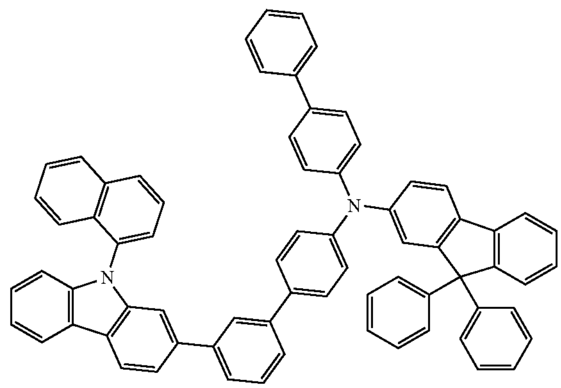
F-154
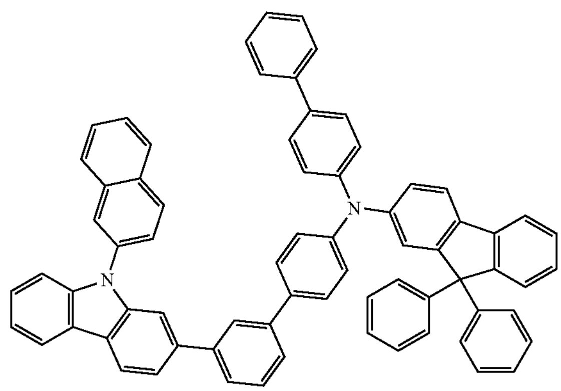
F-155
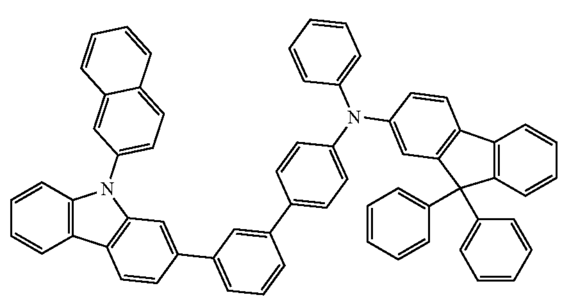

-continued
F-156
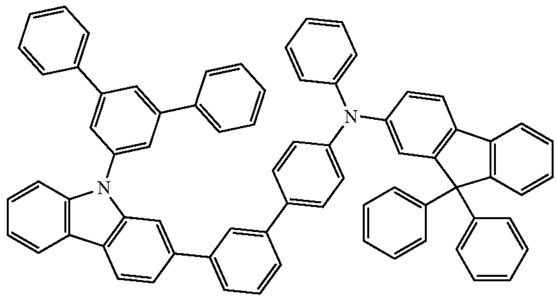
F-157
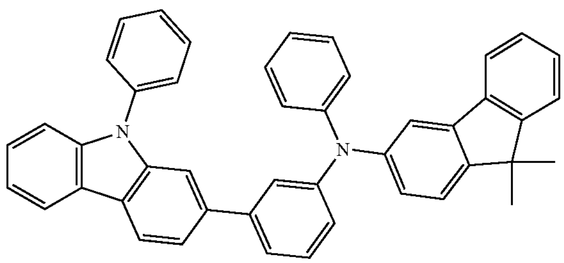
F-158
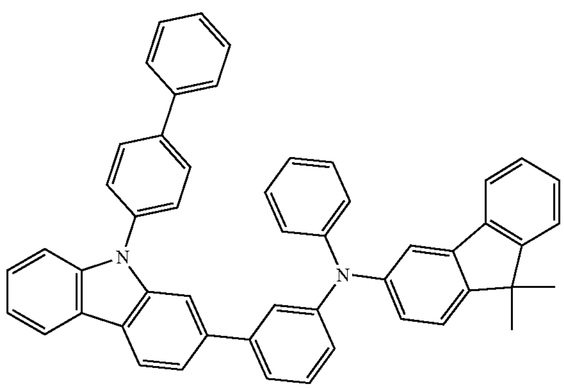
F-159
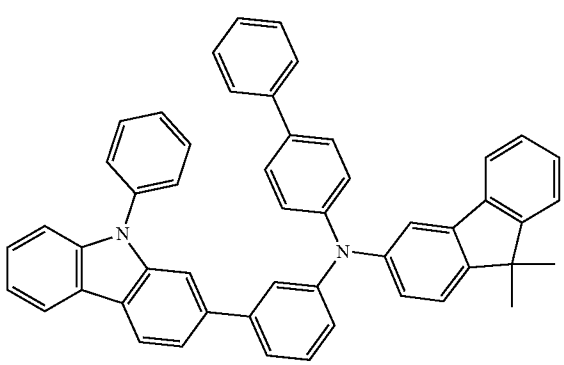
-continued
F-160
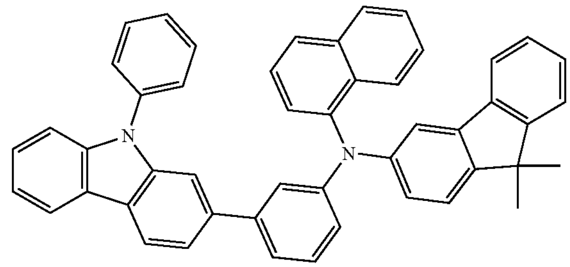
F-161
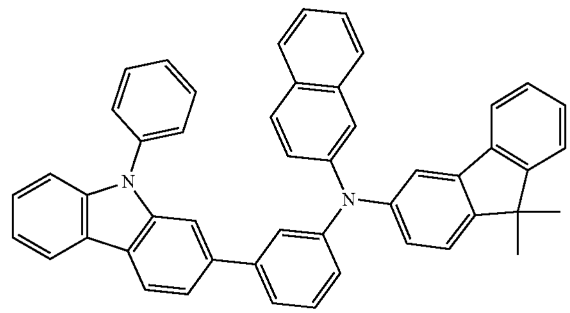
F-162
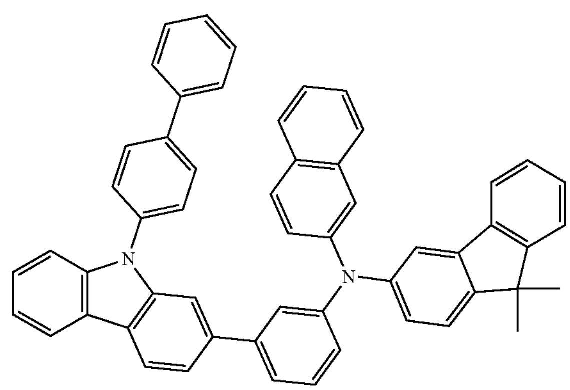
F-163
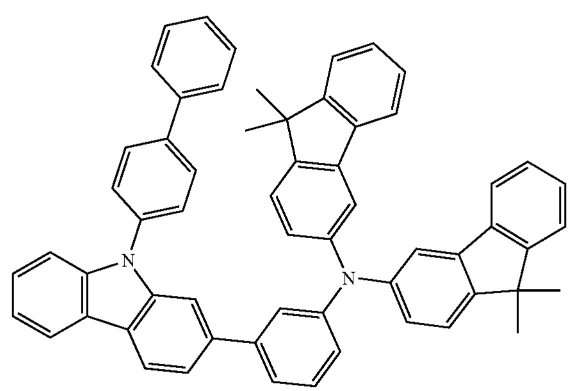

-continued
F-164
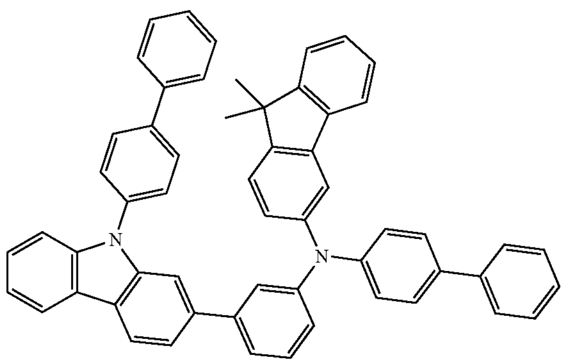
F-165
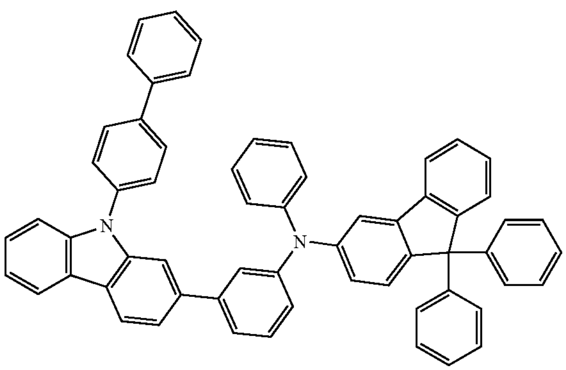
F-166
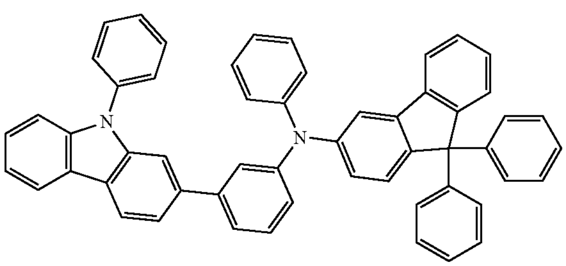
F-167
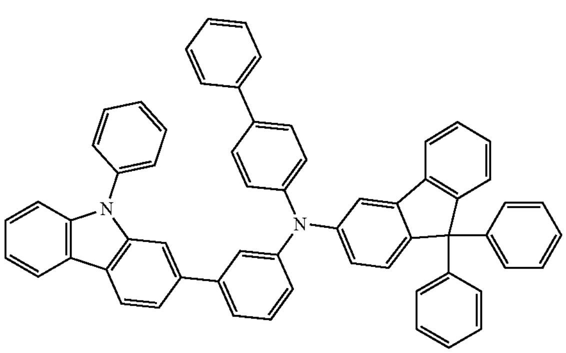
-continued
F-168
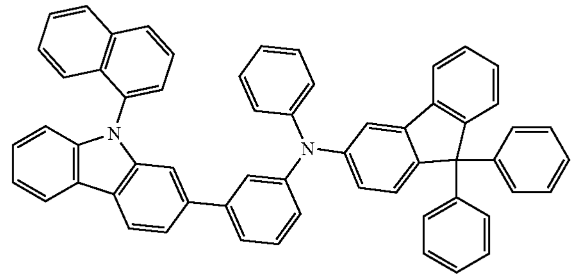
F-169
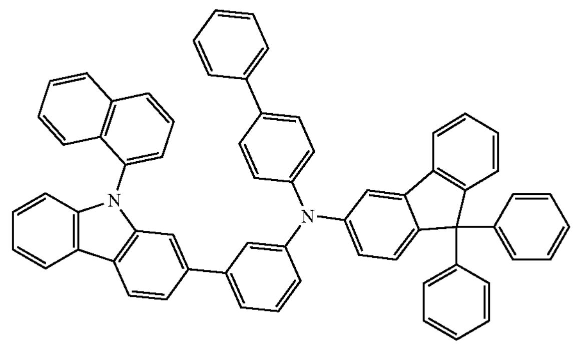
F-170
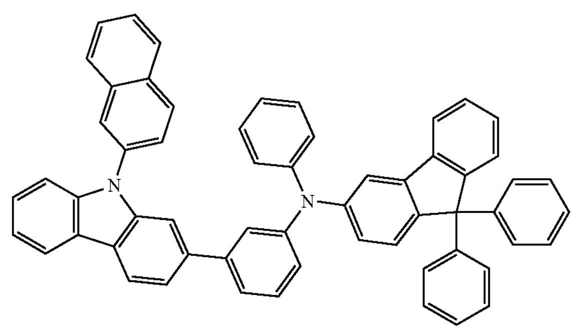
F-171
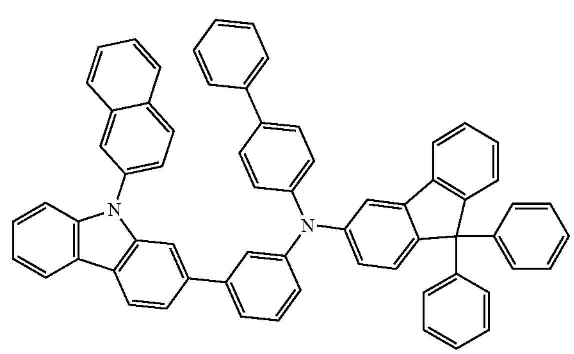

-continued
F-172
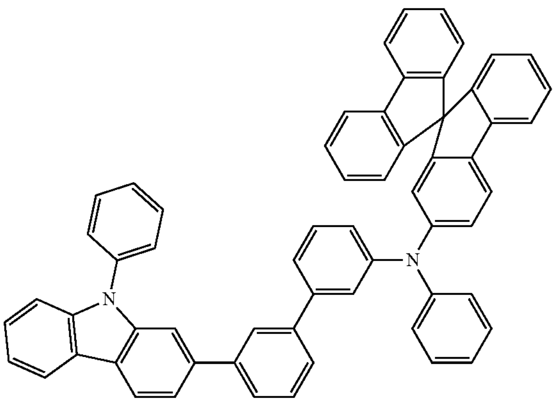
F-173
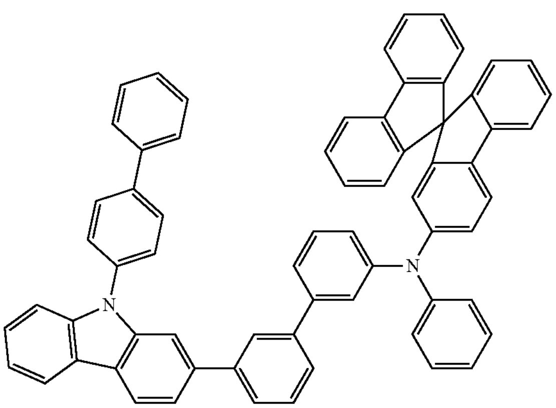
F-174
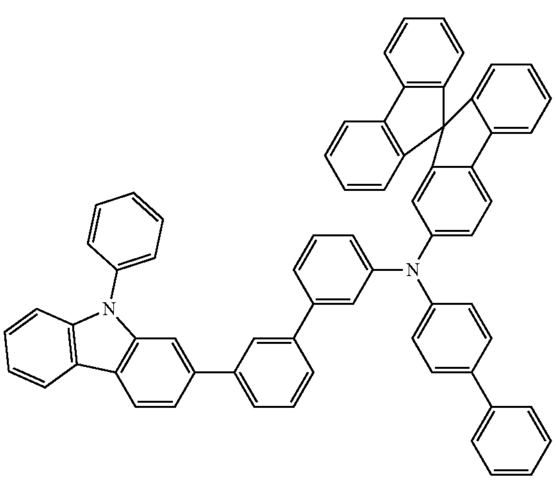
-continued
F-175
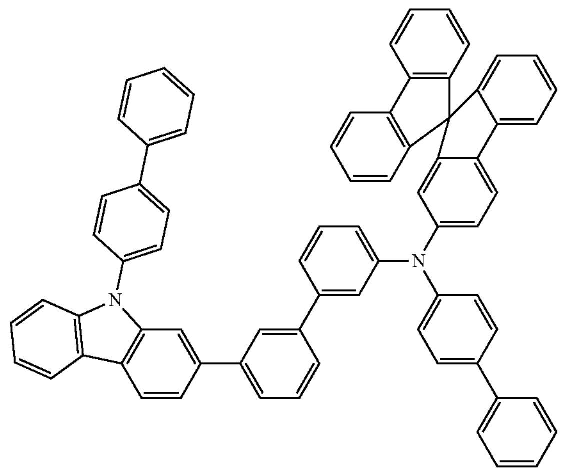
F-176
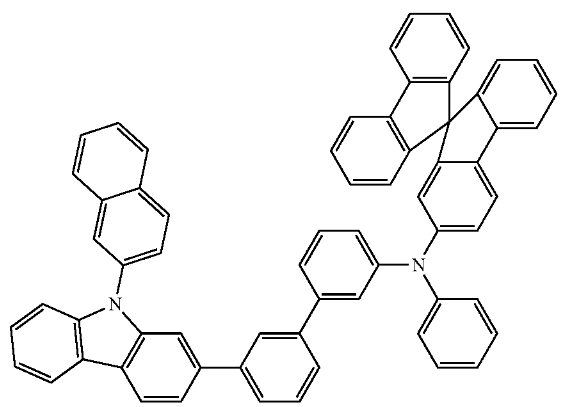
F-177
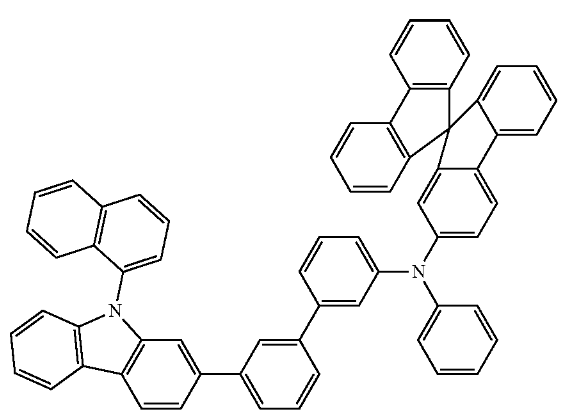

-continued
F-178
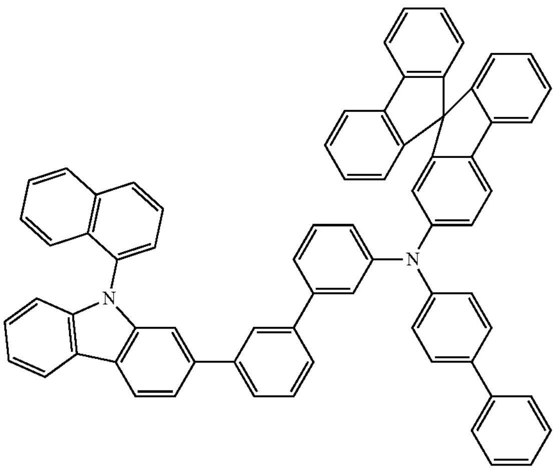
F-179
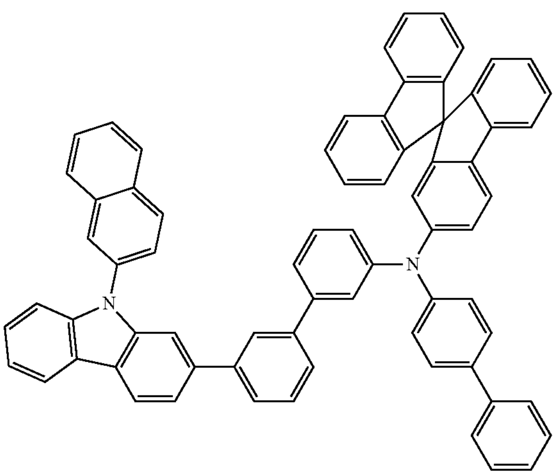
F-180
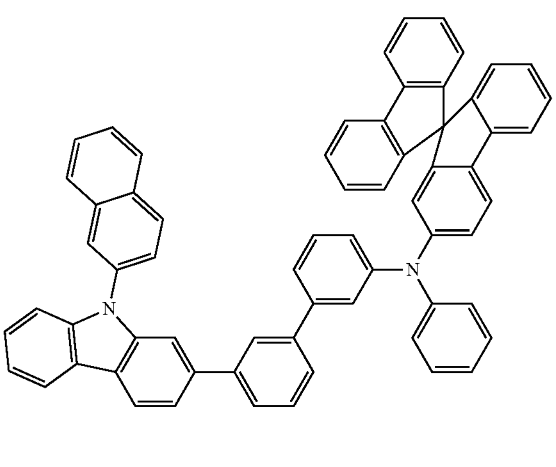
-continued
F-181
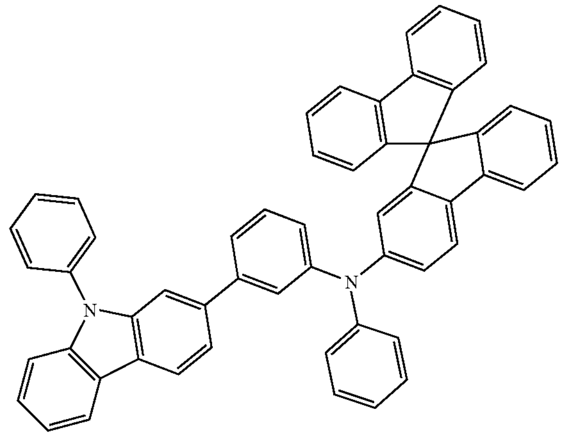
F-182
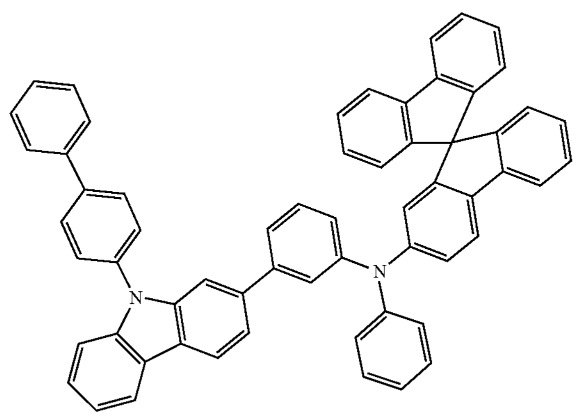
F-183
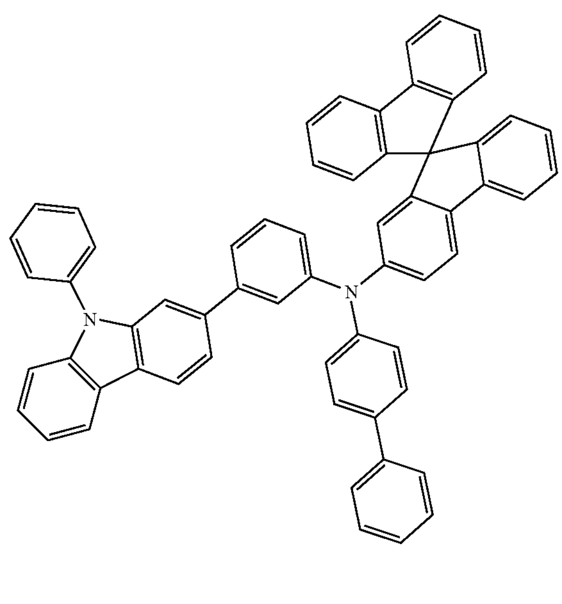

-continued
F-184
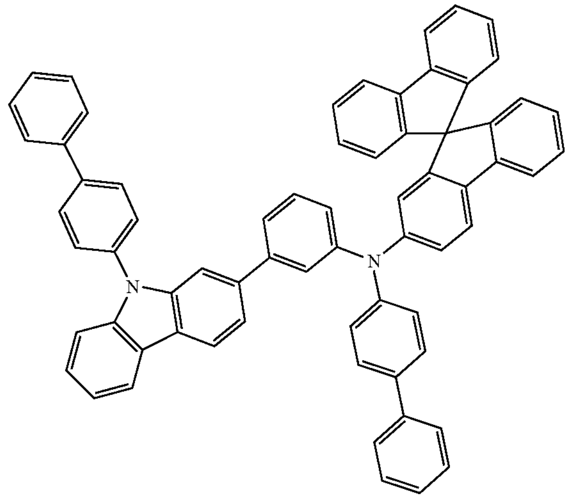
F-185
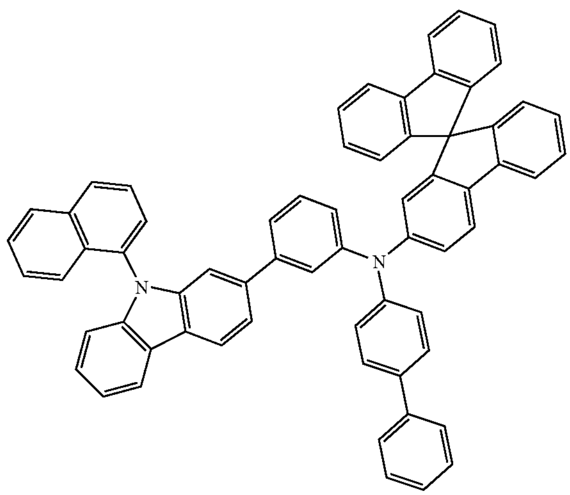
F-186
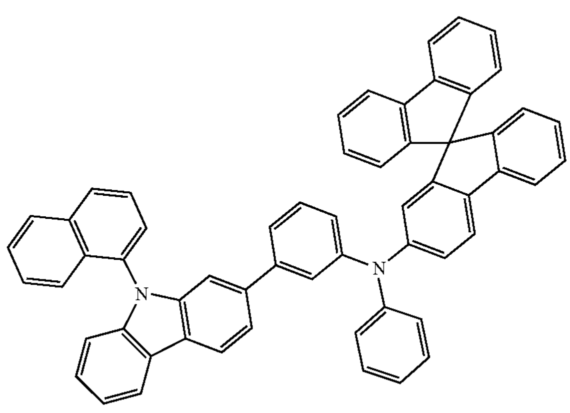
-continued
F-187
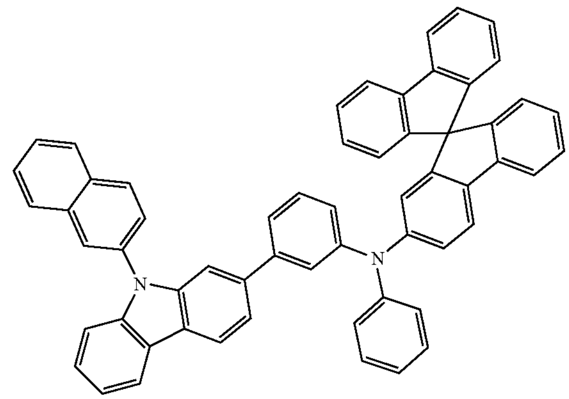
F-188
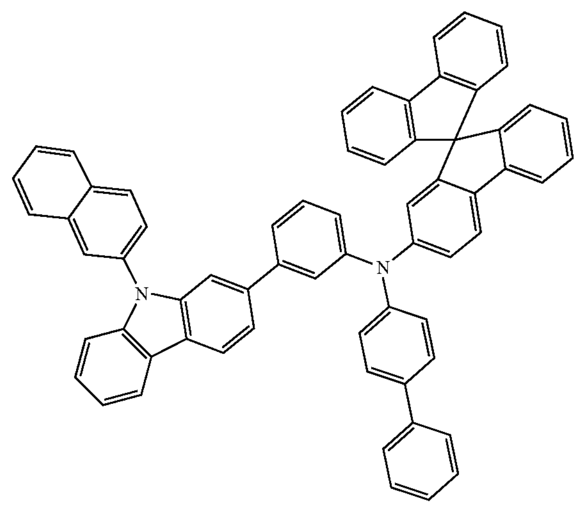
F-189
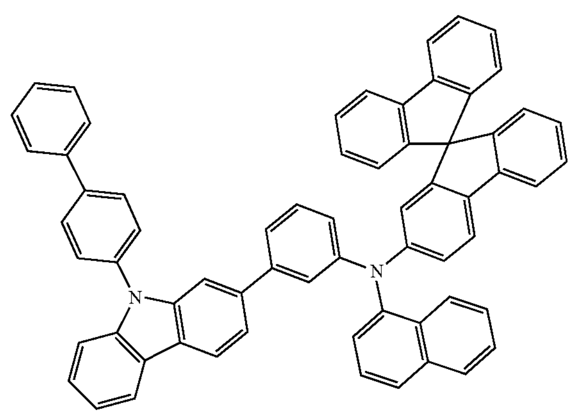

-continued
F-190
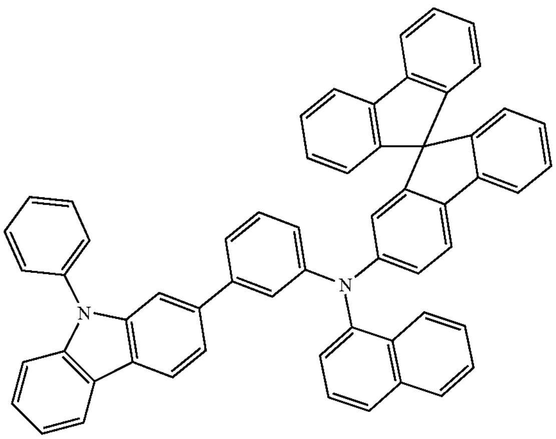
F-191
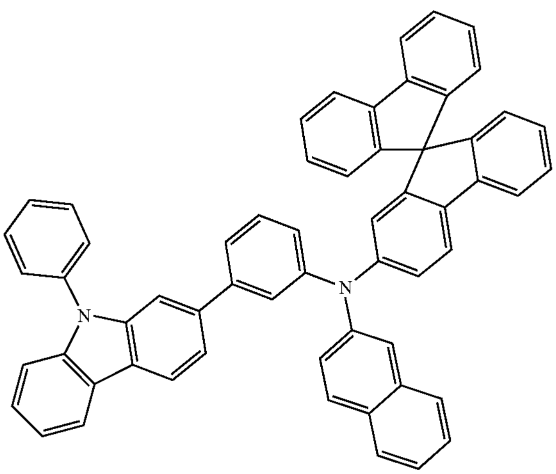
F-192
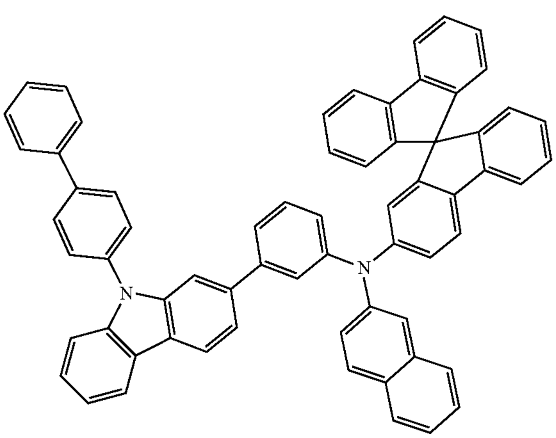
-continued
F-193
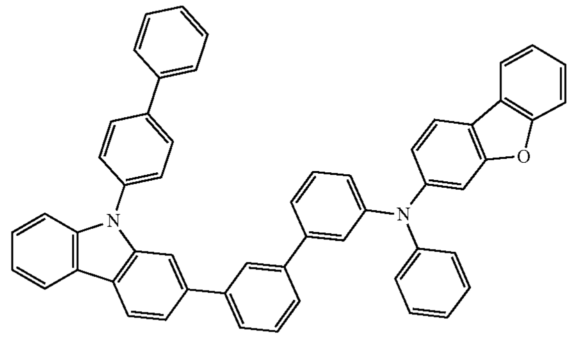
F-194
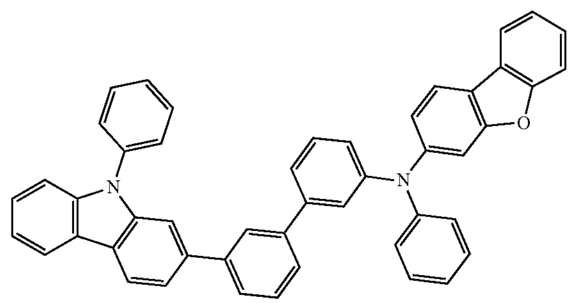
F-195
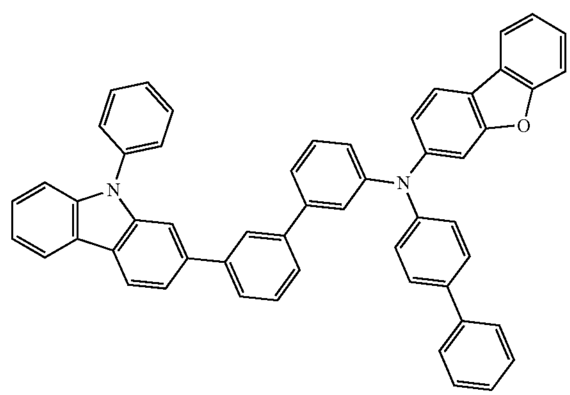
F-196
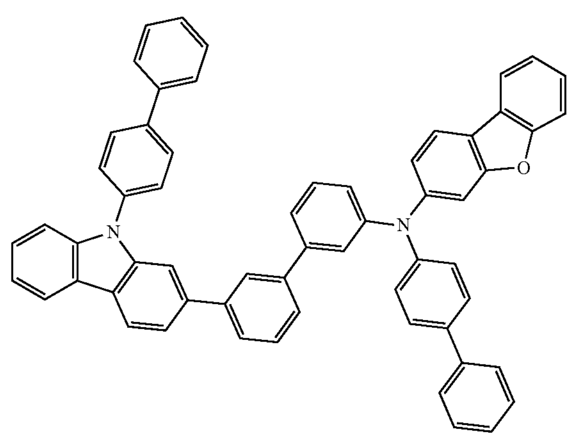

-continued
F-197
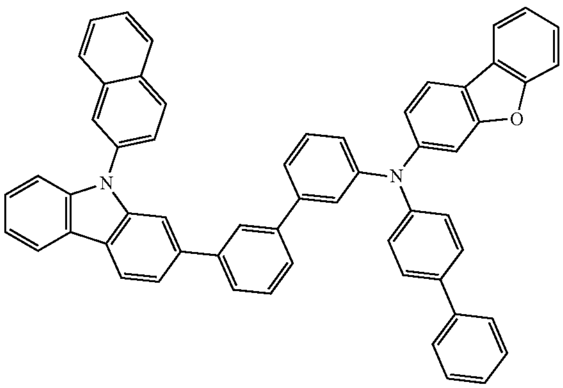
F-198
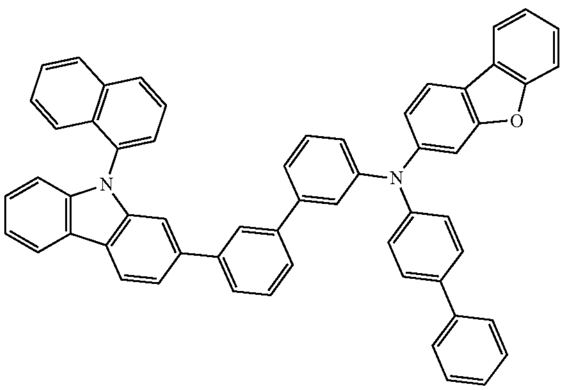
F-199
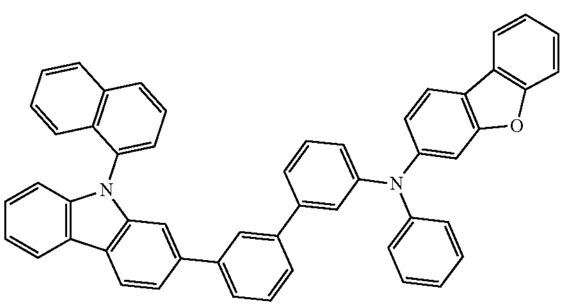
F-200
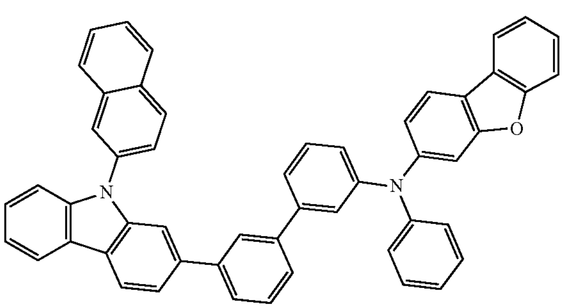
-continued
F-201
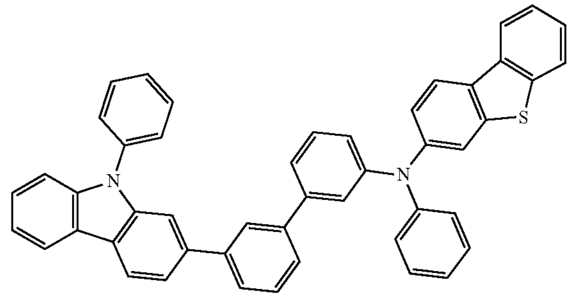
F-202
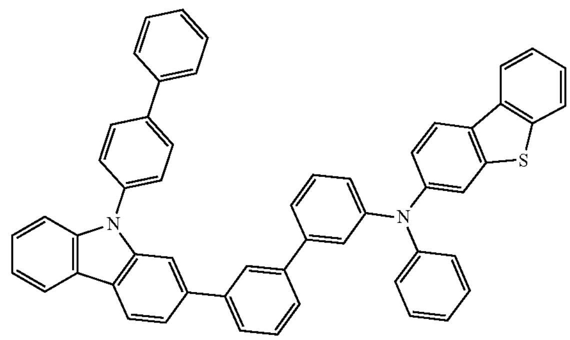
F-203
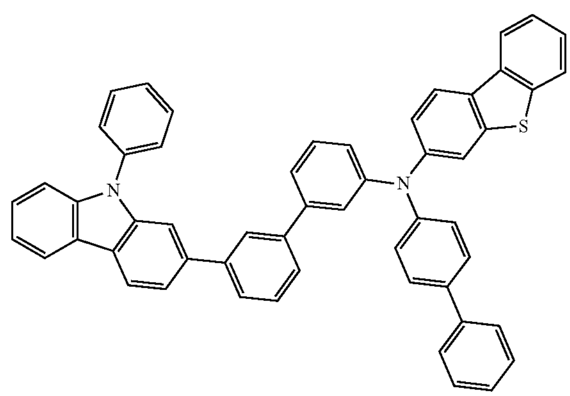
F-204
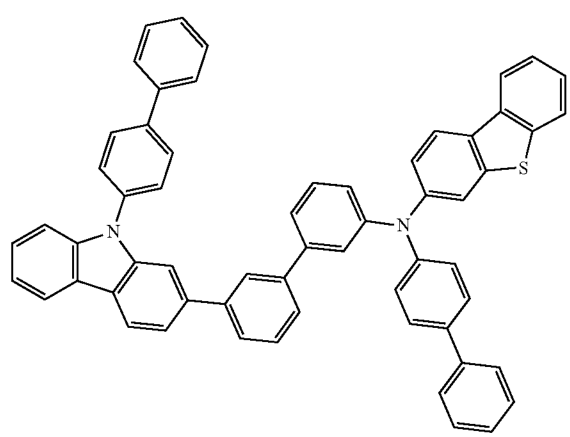

-continued
F-205
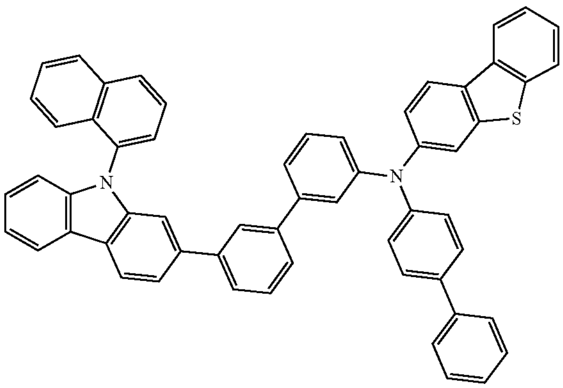
F-206
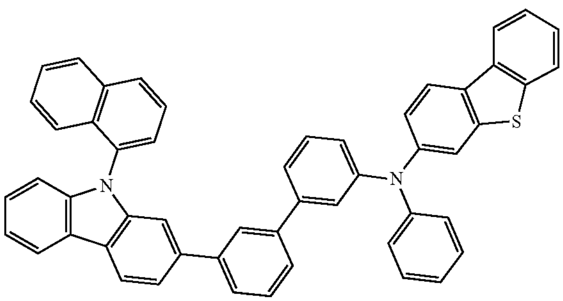
F-207
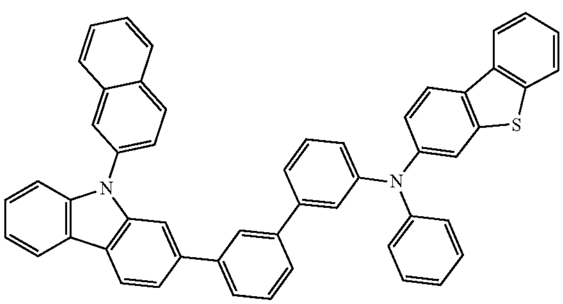
F-208
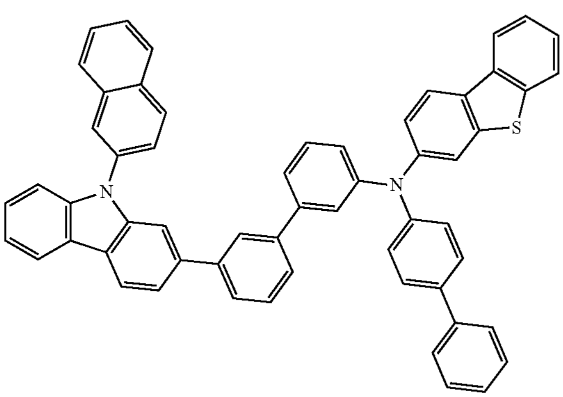
-continued
F-209
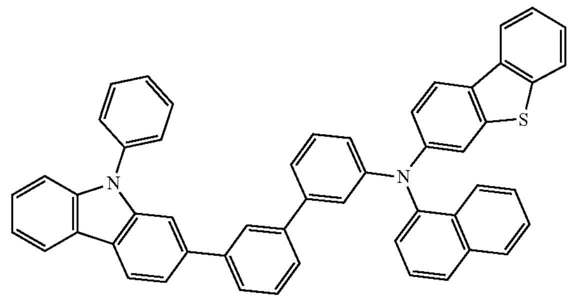
F-210
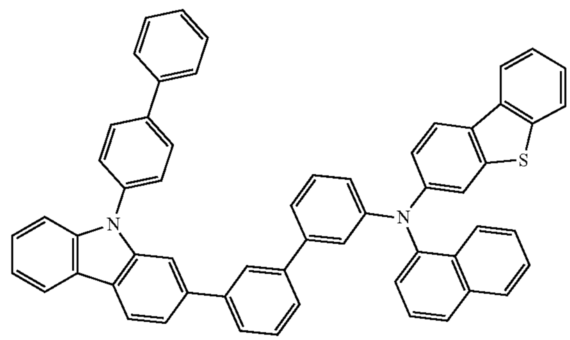
F-211
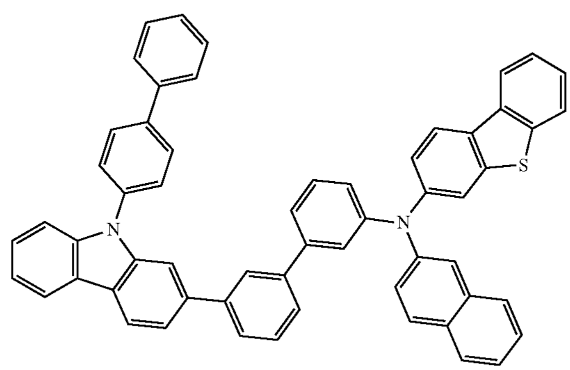
F-212
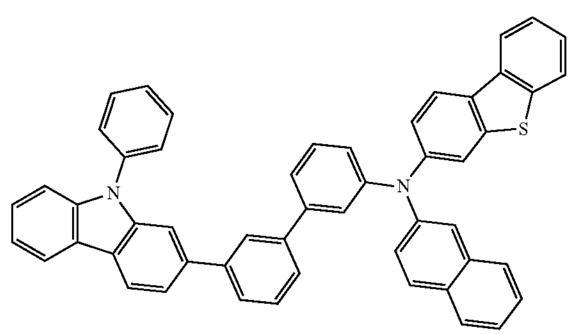

-continued
F-213
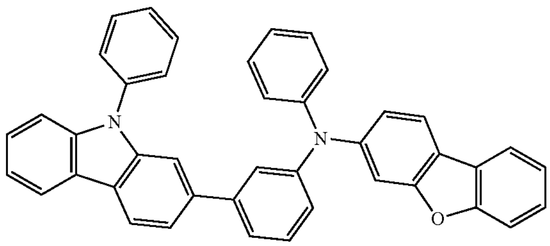
F-214
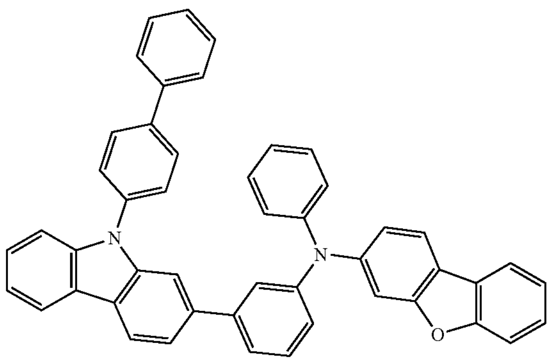
F-215
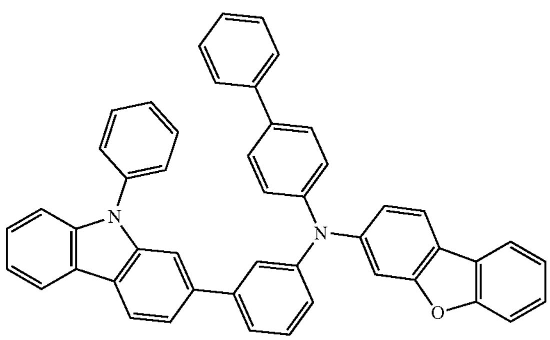
F-216
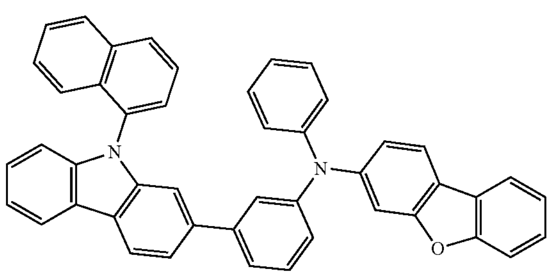
F-217
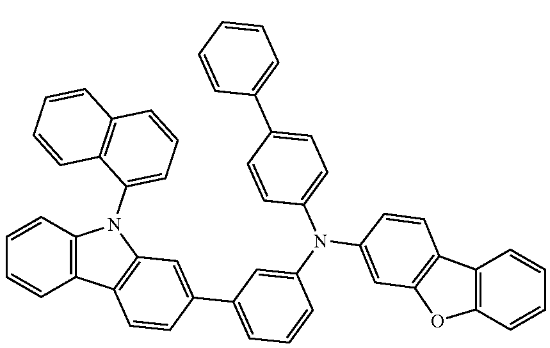
-continued
F-218
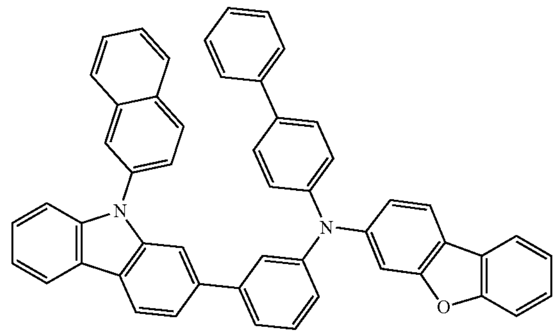
F-219
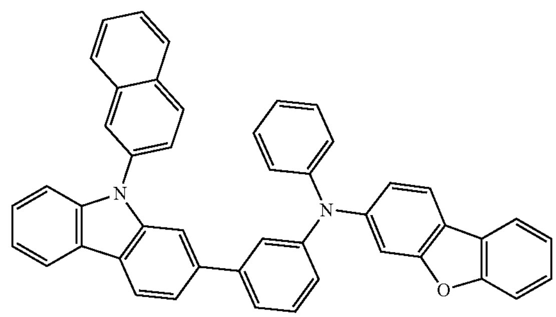
F-220
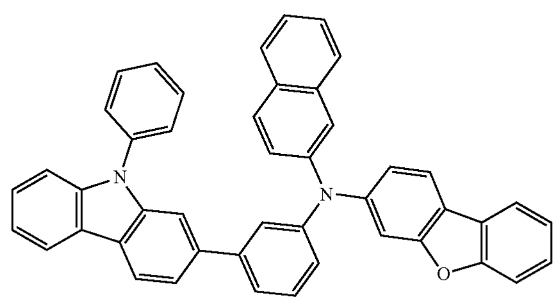
F-221
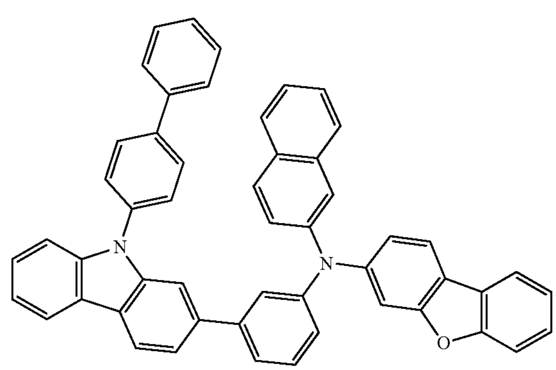

-continued
F-222
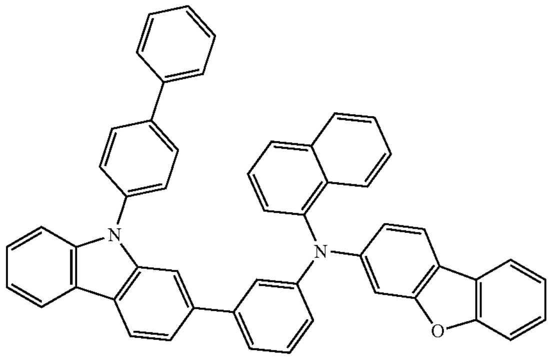
F-223
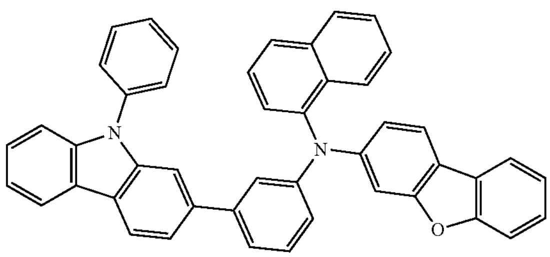
F-224
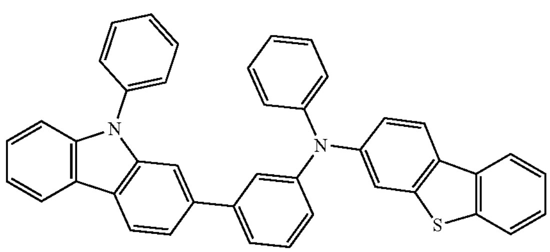
F-225
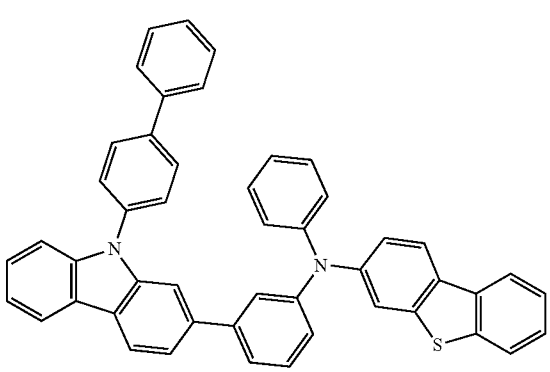
-continued
F-226
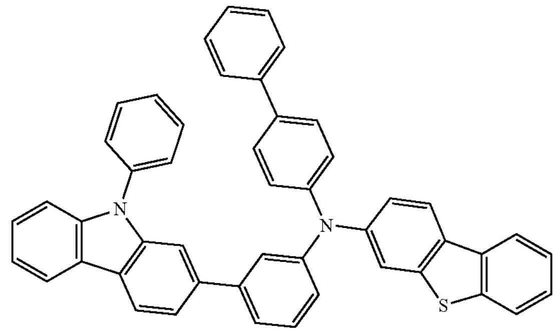
F-227
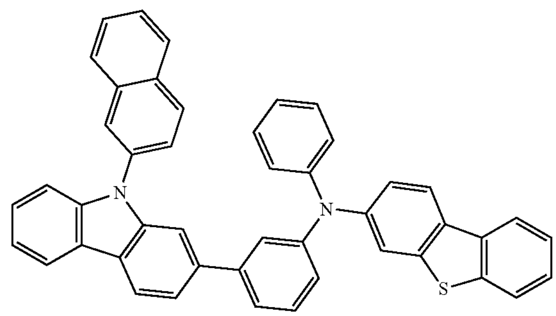
F-228
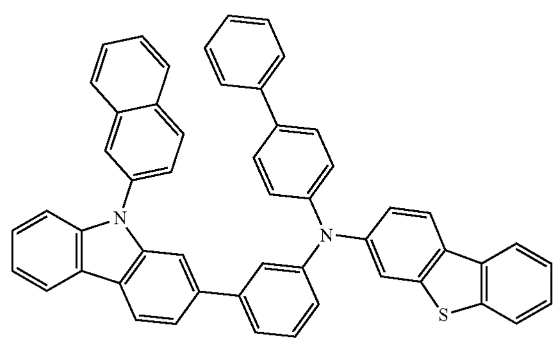
F-229
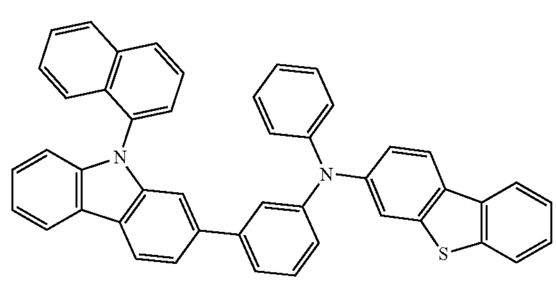

F-230
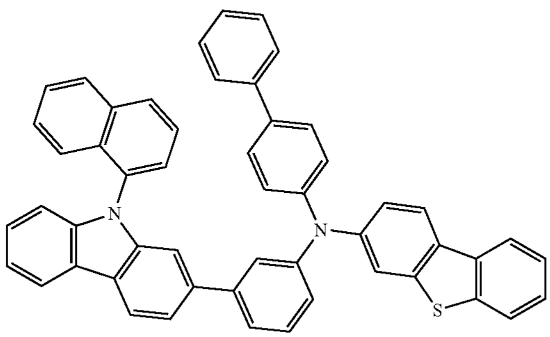
F-231
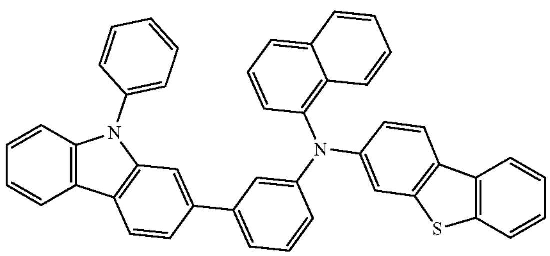
F-232
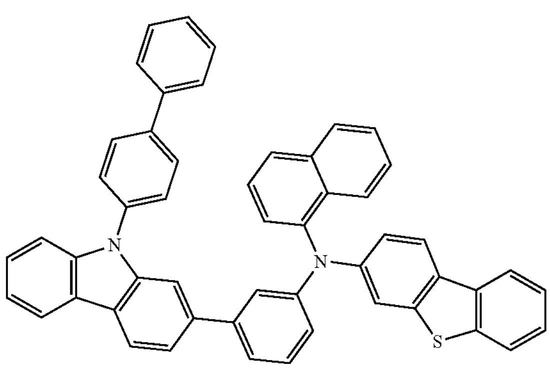
F-233
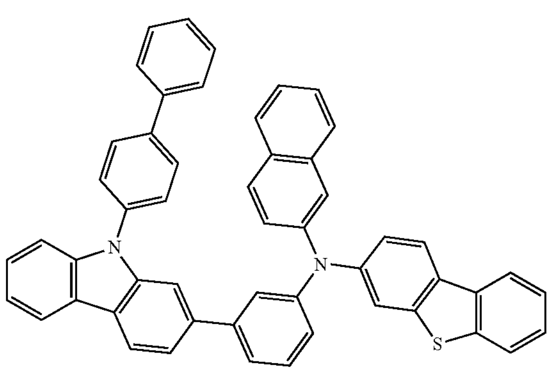
F-234
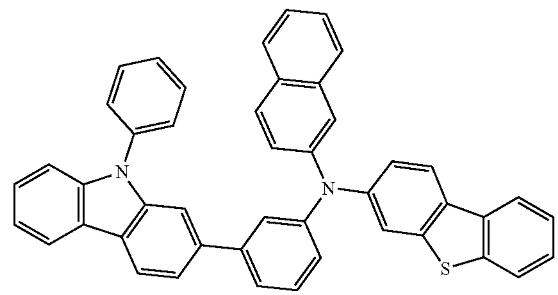
F-235
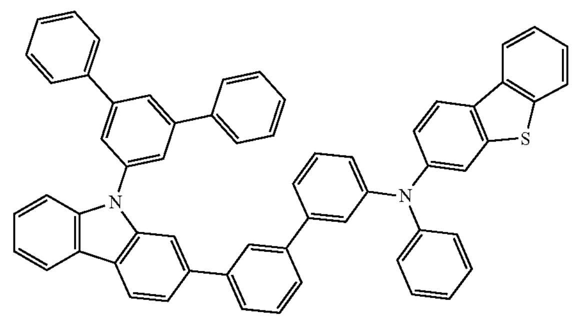
F-236
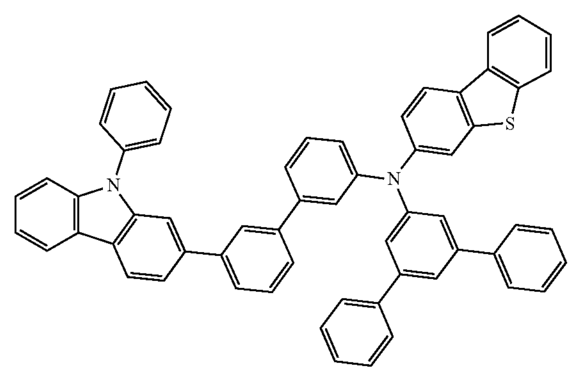
F-237
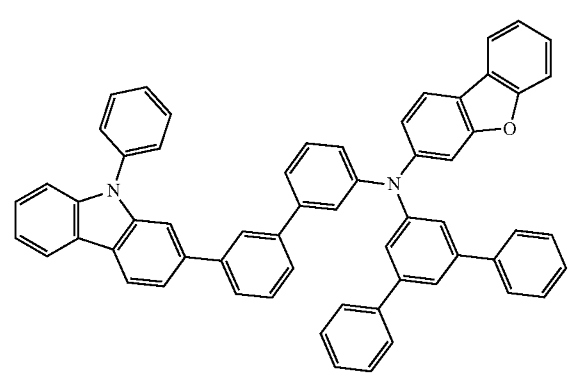

-continued
F-238
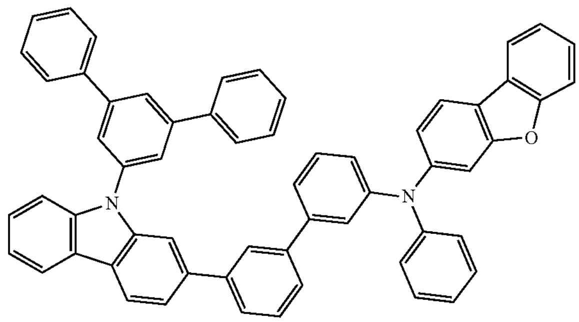
F-239
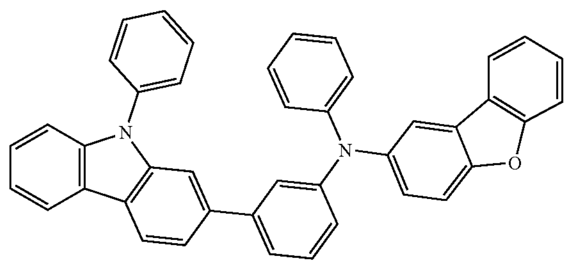
F-240
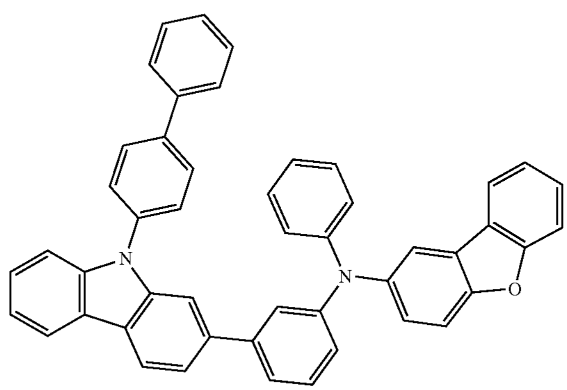
F-241
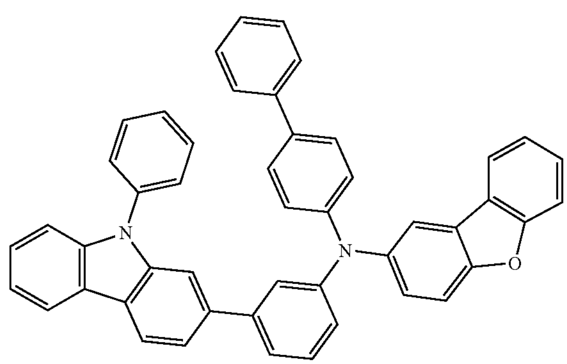
-continued
F-242
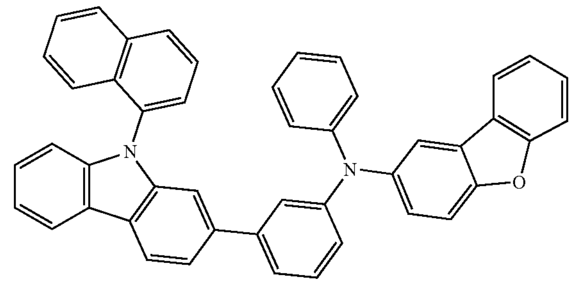
F-243
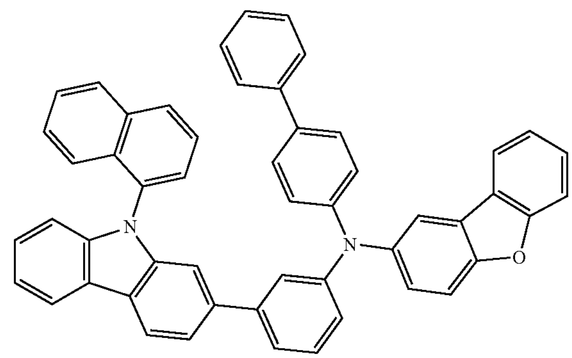
F-244
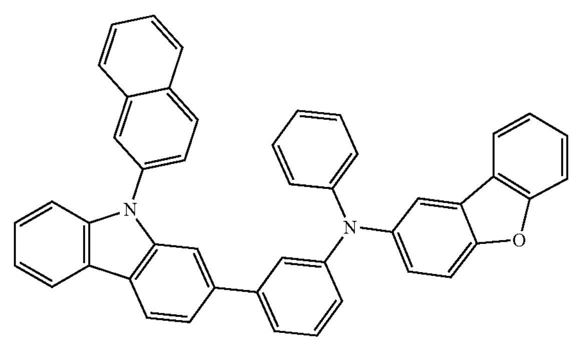
F-245
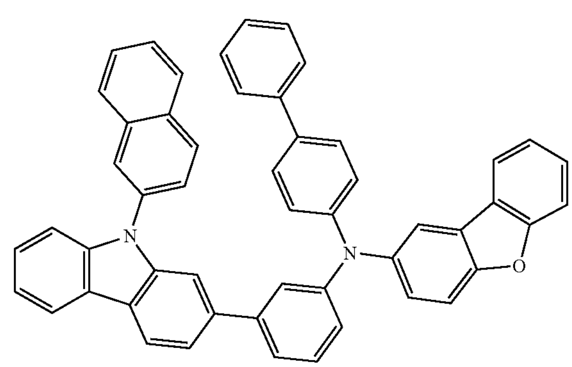

-continued
F-246
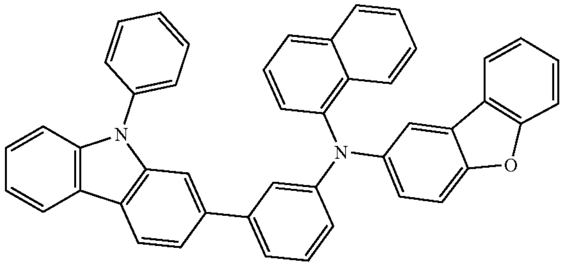
F-247
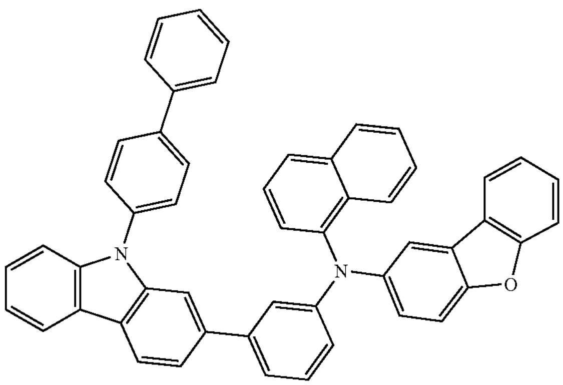
F-248
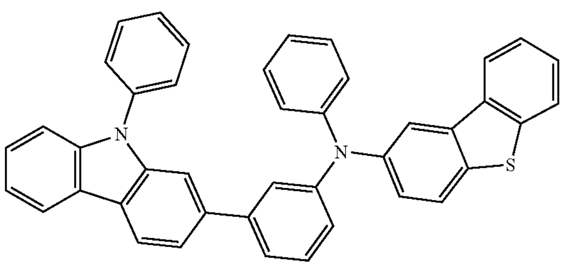
F-249
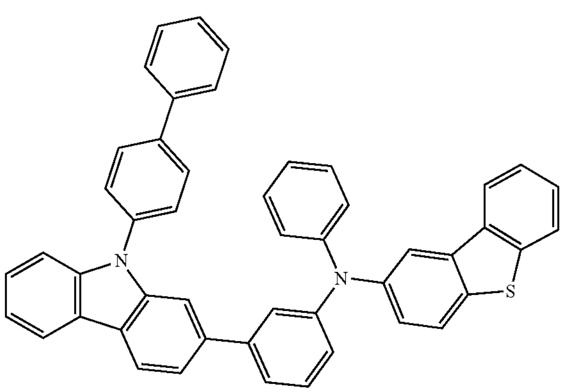
-continued
F-250
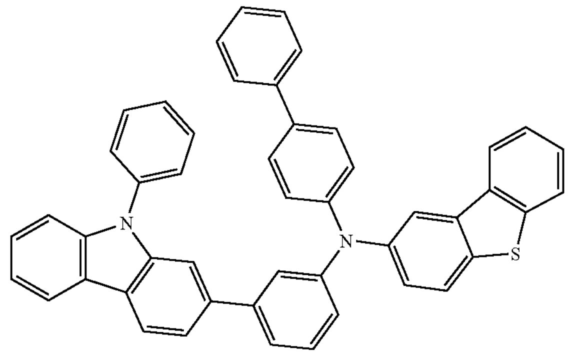
F-251
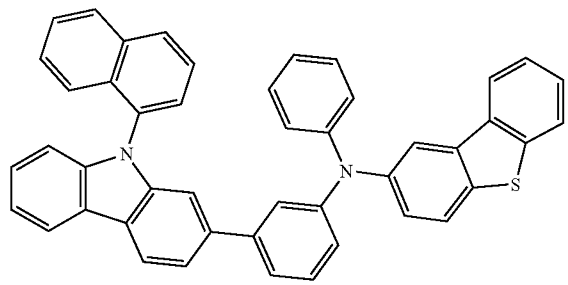
F-252
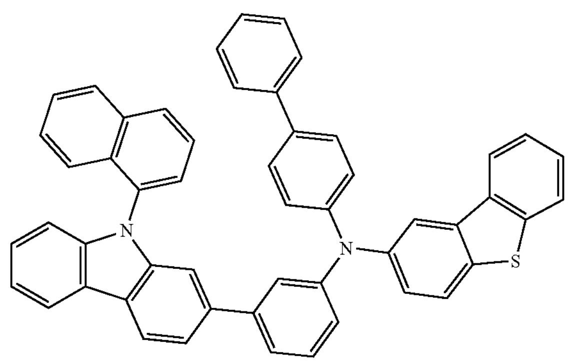
F-253
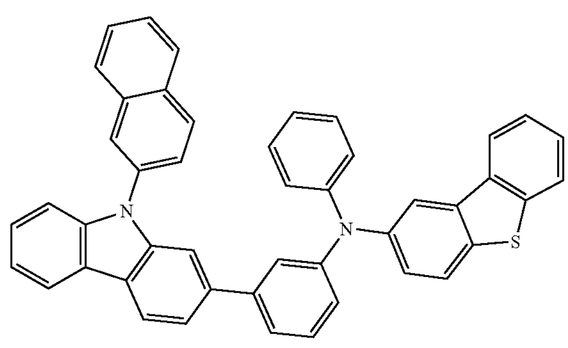

-continued
F-254
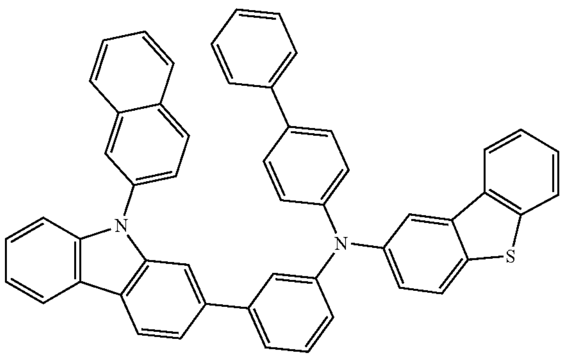
F-255
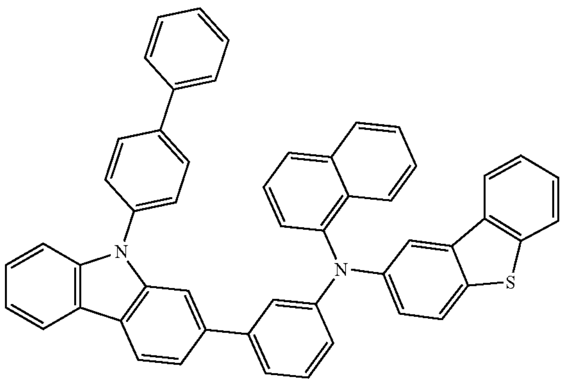
F-256
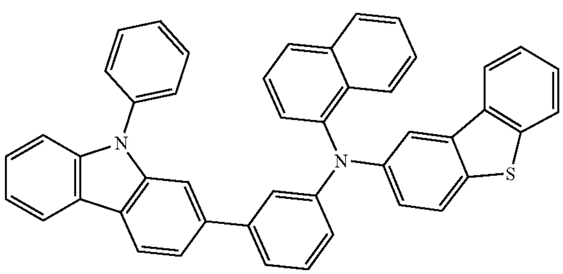
F-257
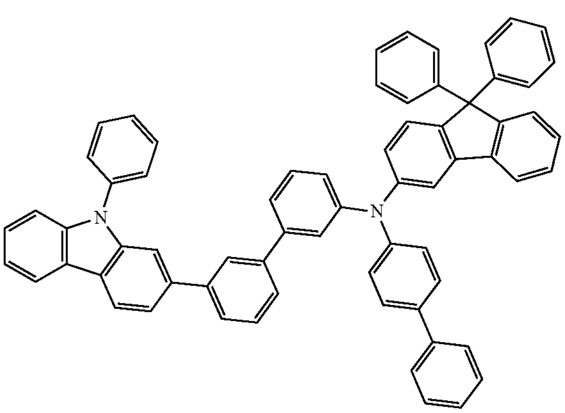
-continued
F-258
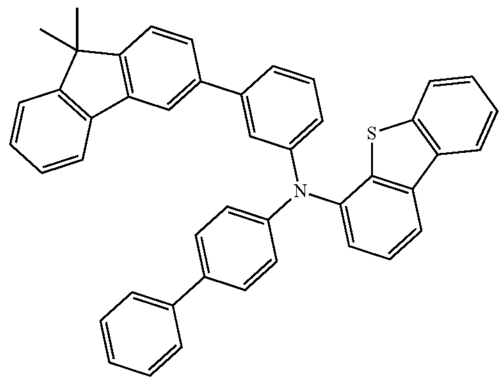
F-259
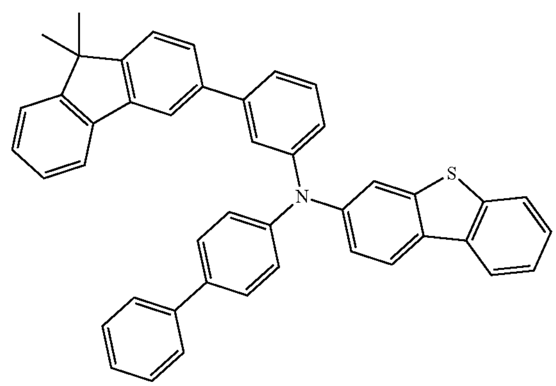
F-260
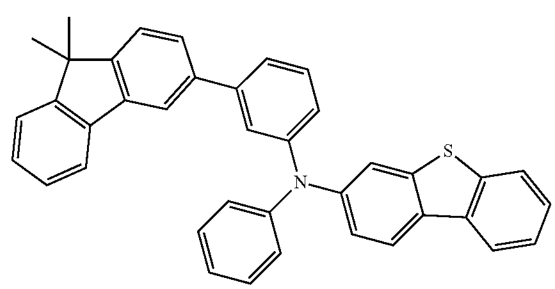
F-261
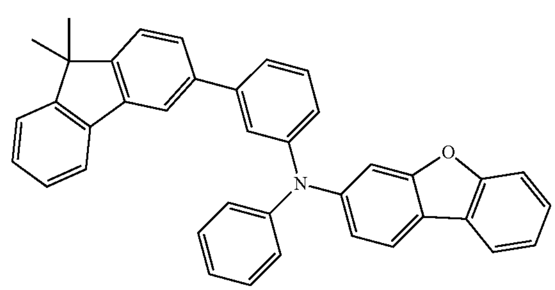

-continued
F-262
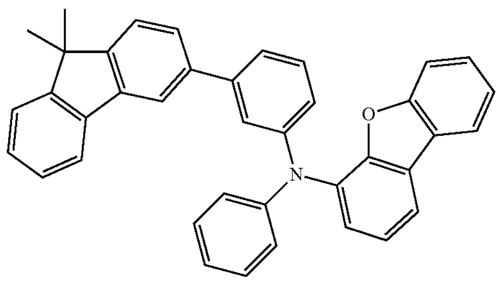
F-263
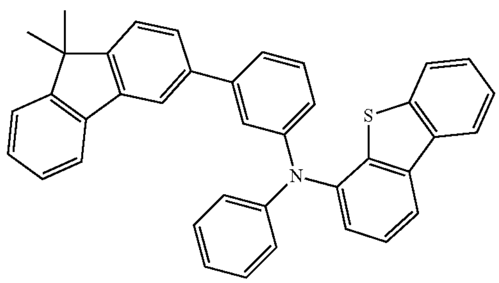
F-264
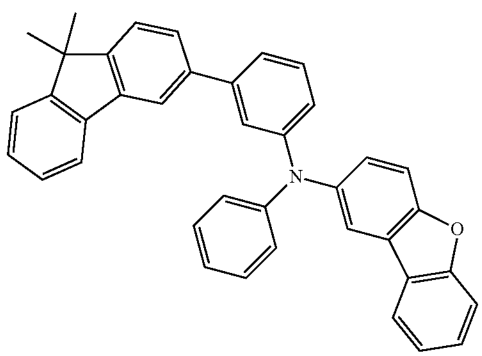
F-265
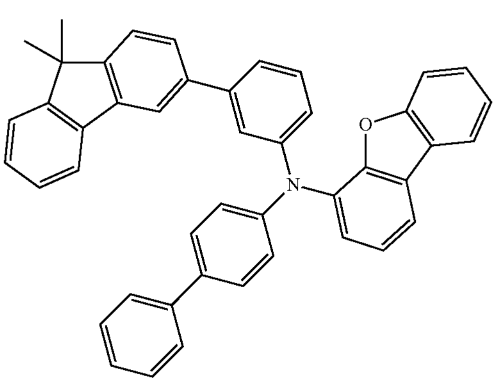
-continued
F-266
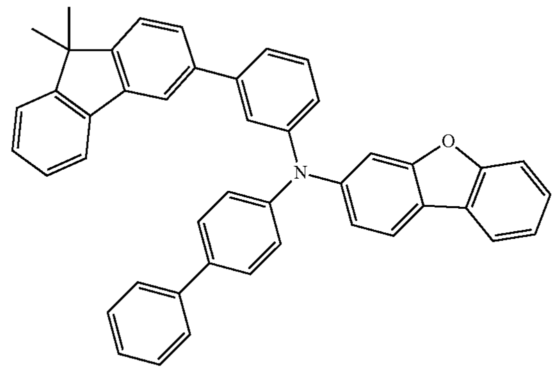
F-267
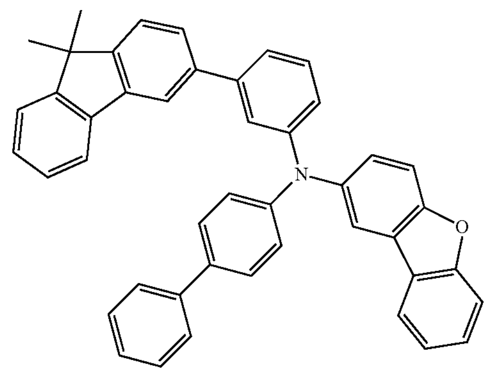
F-268
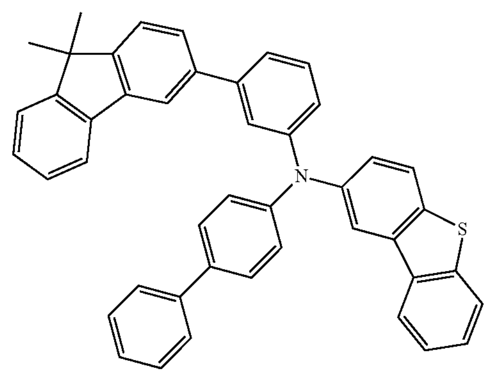
F-269
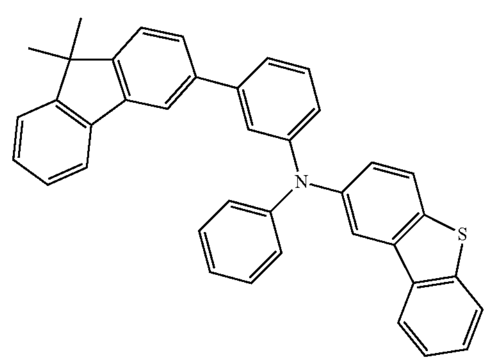

-continued
F-270
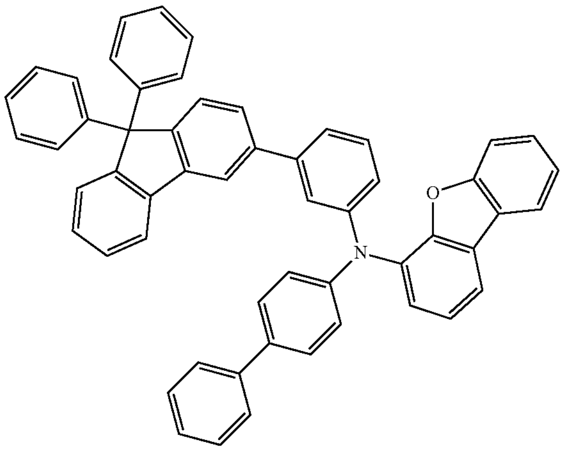
F-271
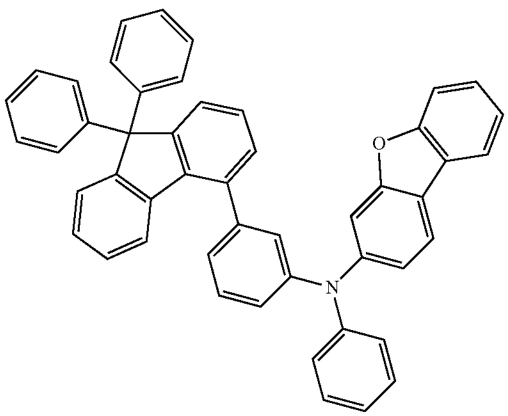
F-272
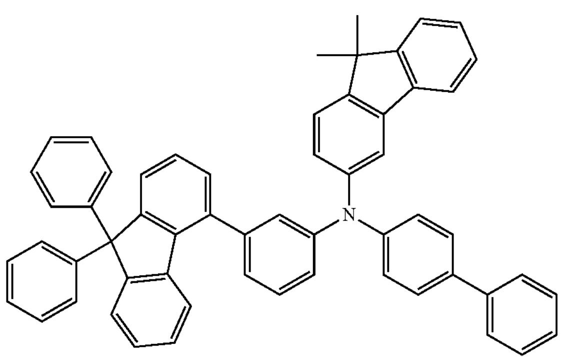
-continued
F-273
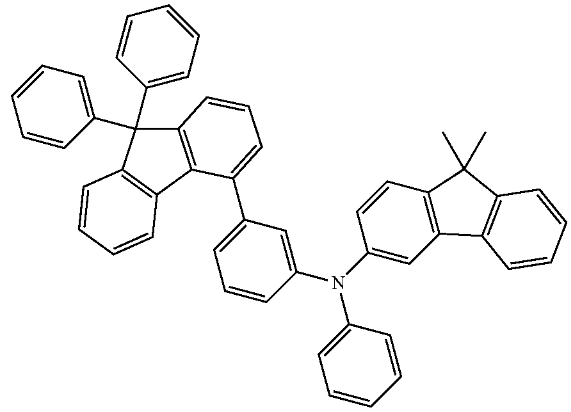
F-274
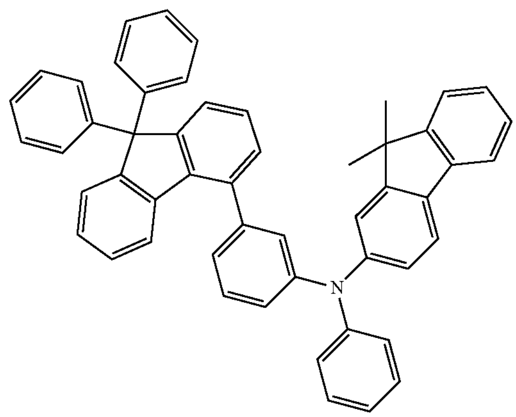
F-275
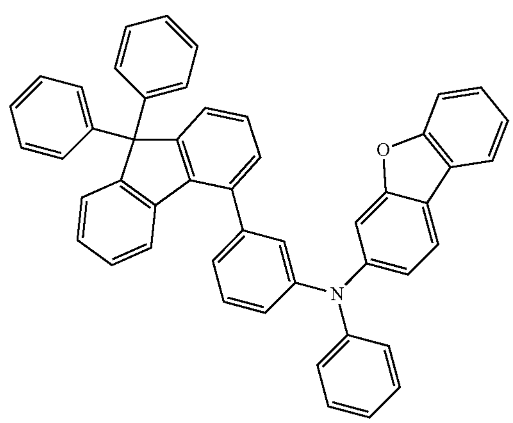

-continued
F-276
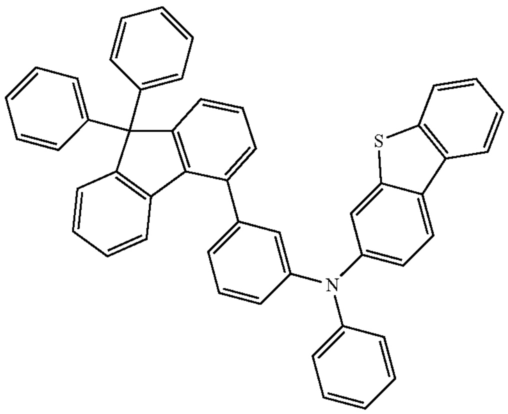
F-277
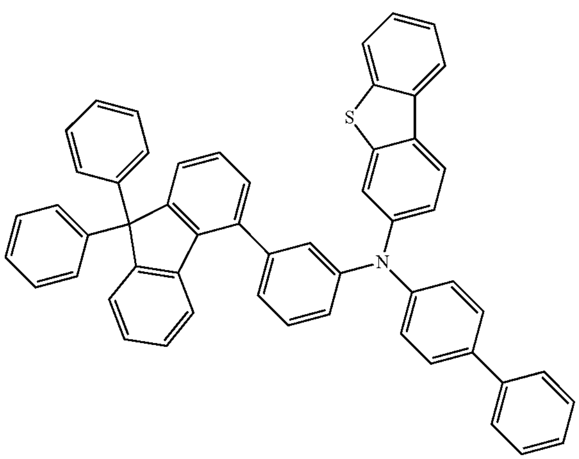
F-278
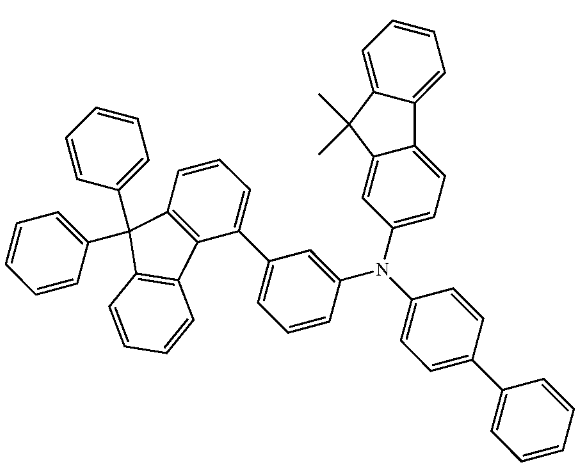
-continued
F-279
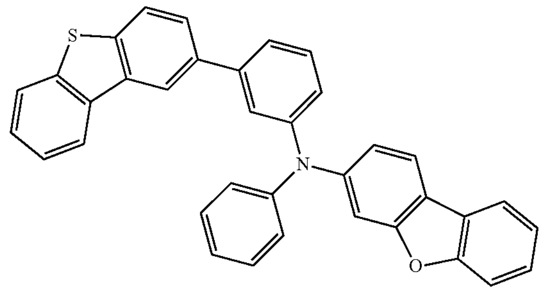
F-280
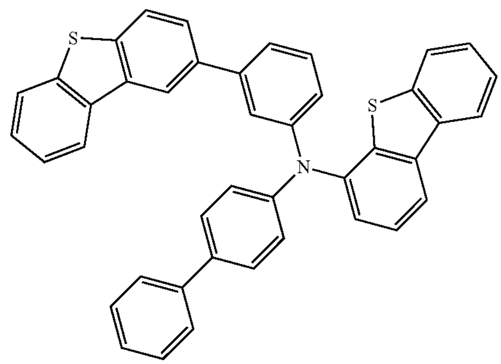
F-281
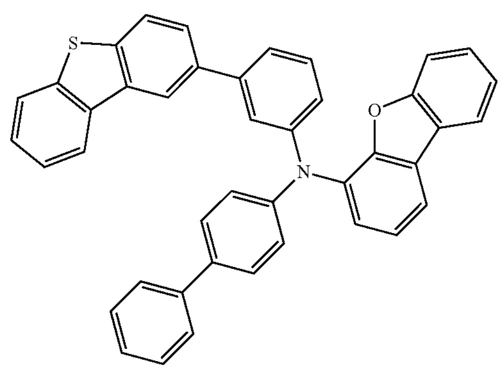
F-282
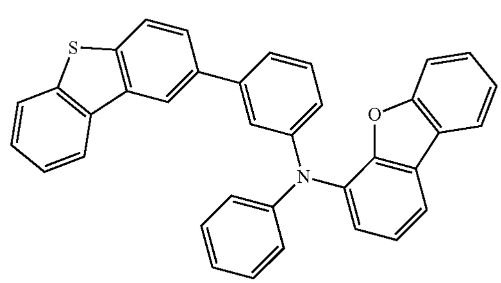

-continued
F-283
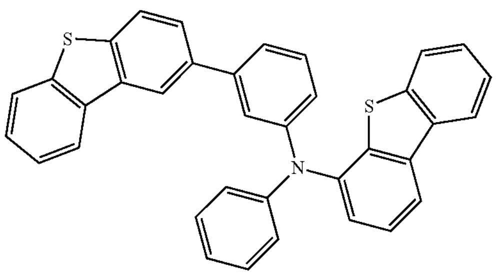
F-284
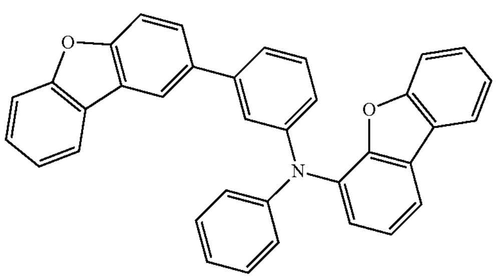
F-285
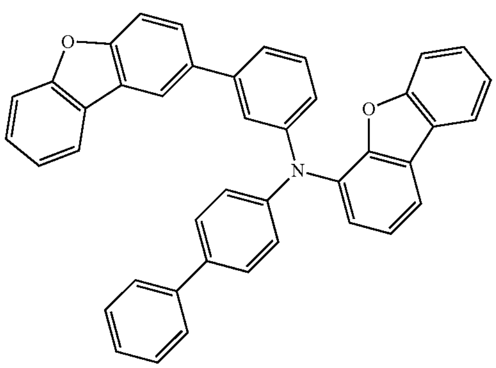
F-286
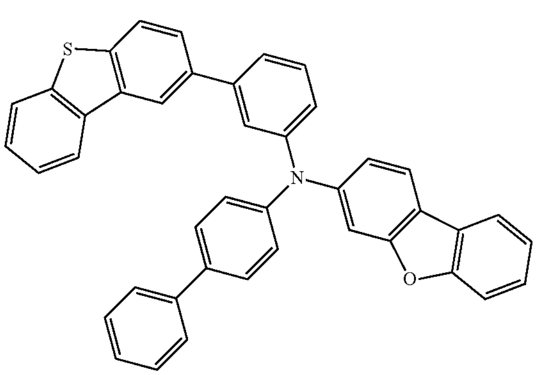
-continued
F-287
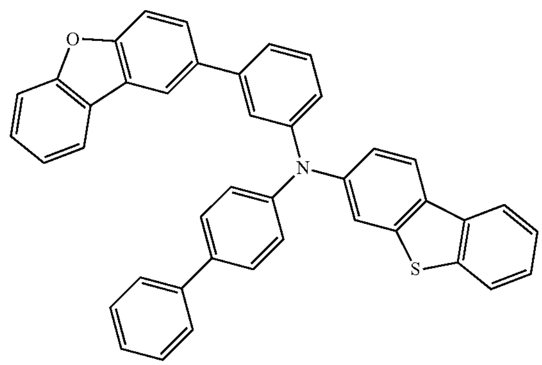
F-288
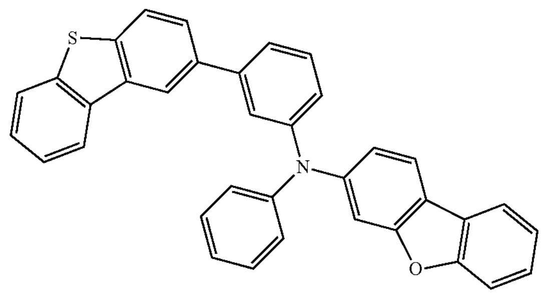
F-289
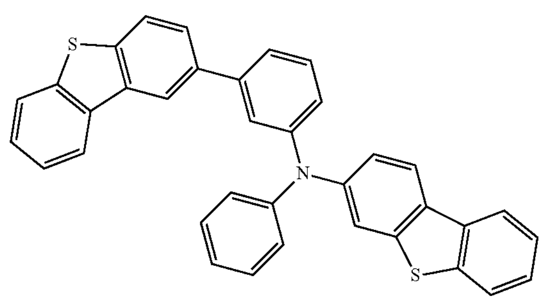
F-290
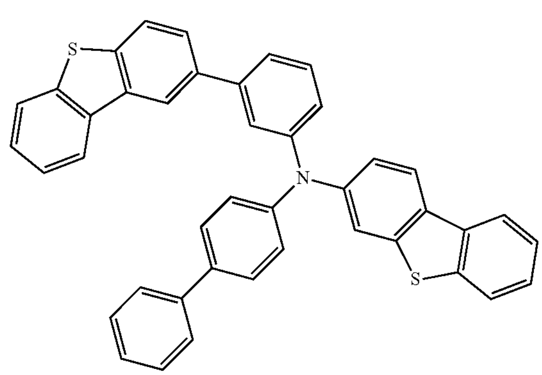

-continued
F-291
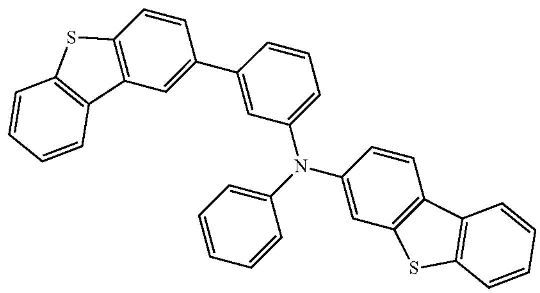
F-292
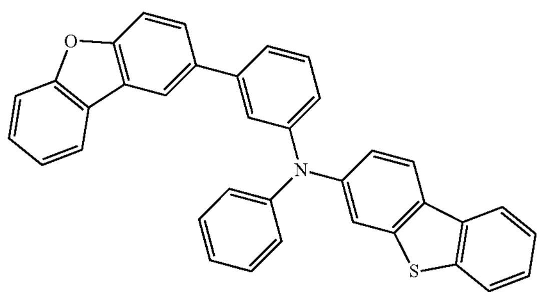
F-293
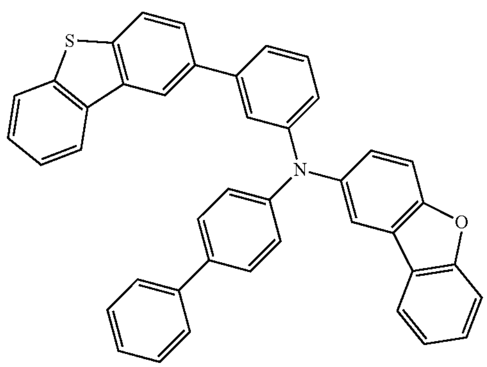
F-294
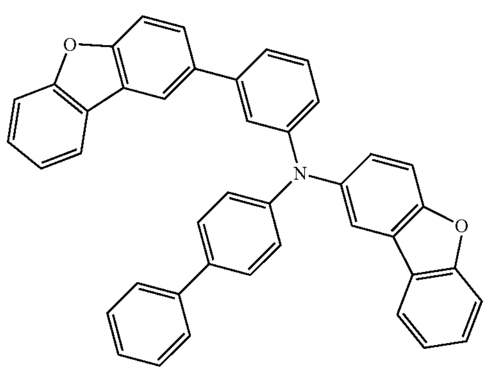
-continued
F-295
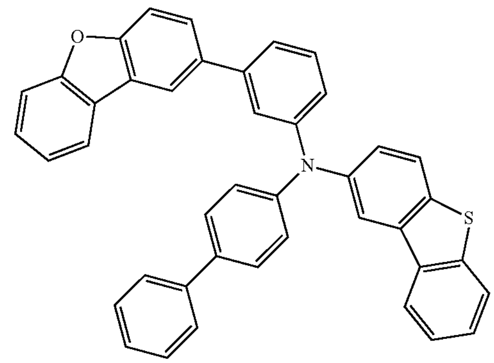
F-296
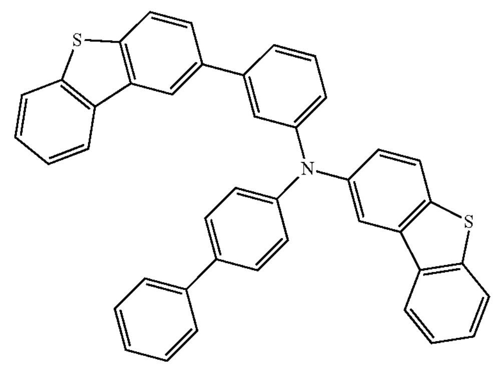
F-297
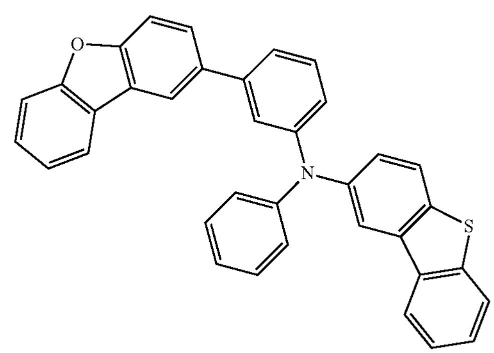
F-298
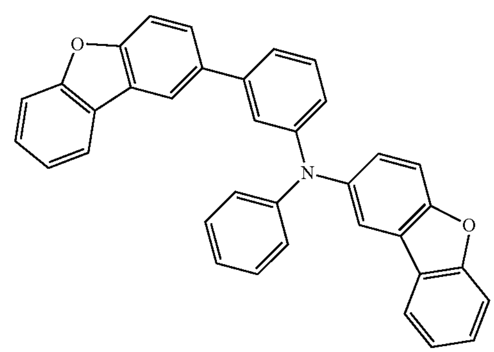

-continued
F-299
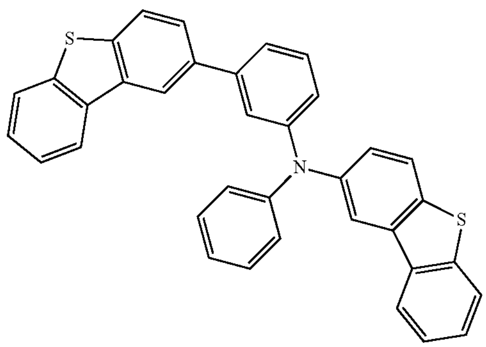
F-300
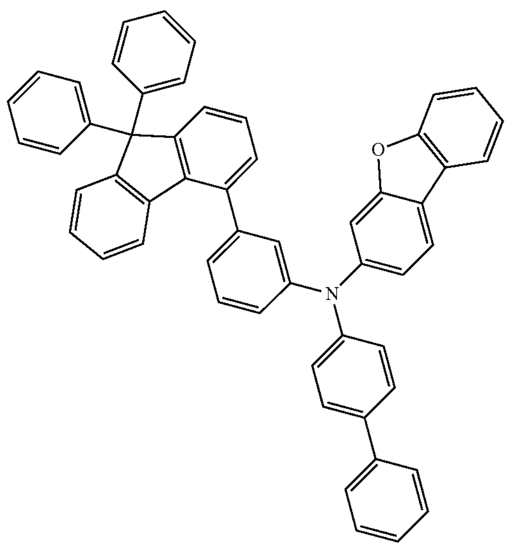
F-301
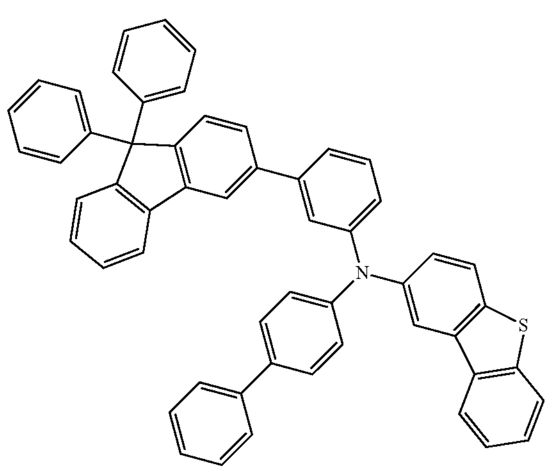
-continued
F-302
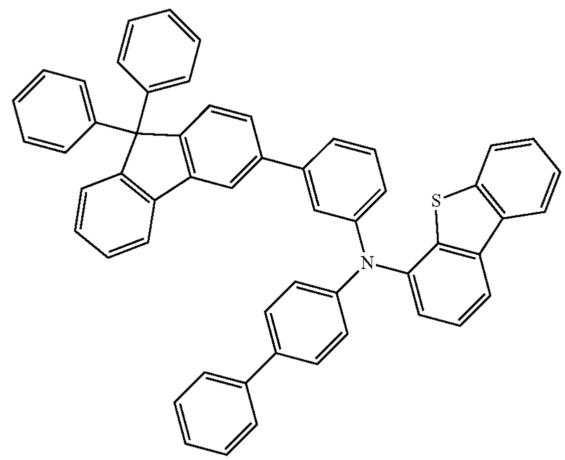
F-303
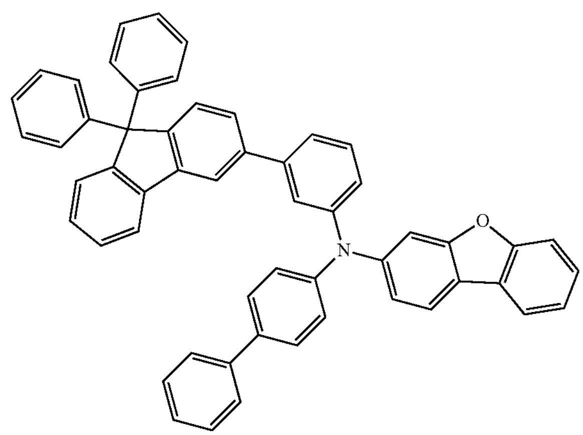
F-304
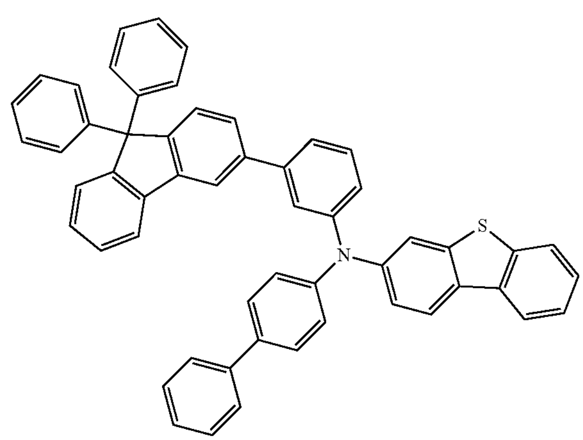

-continued
F-305
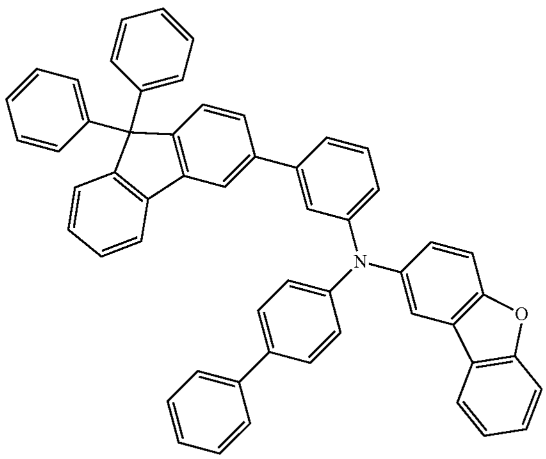
F-306
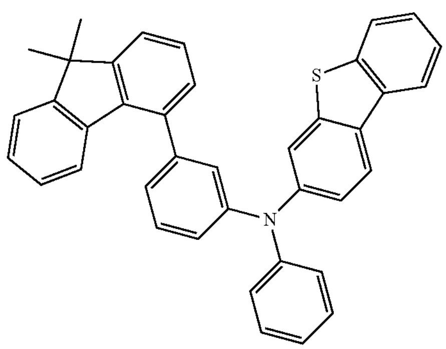
F-307
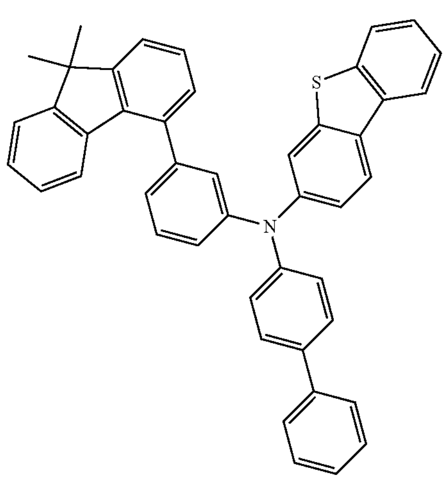
-continued
F-308
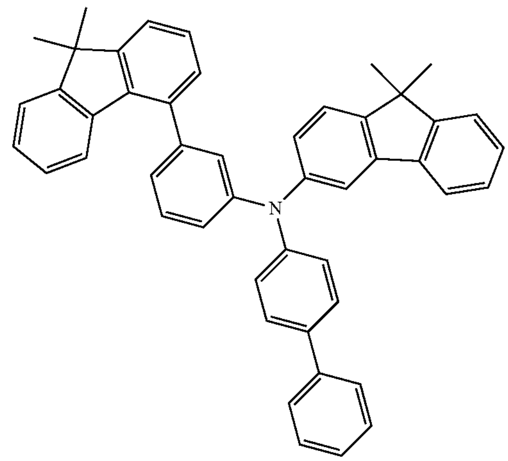
F-309
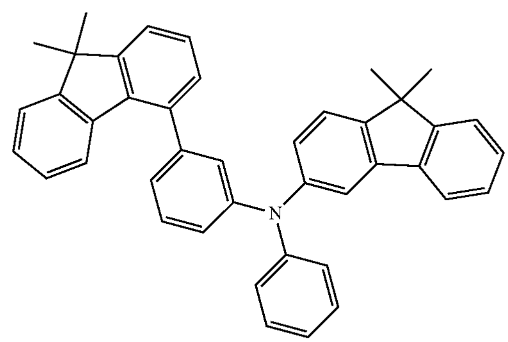
F-310
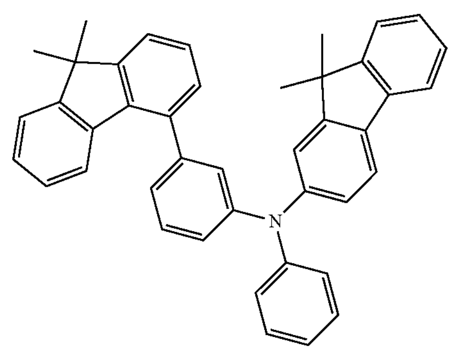
F-311
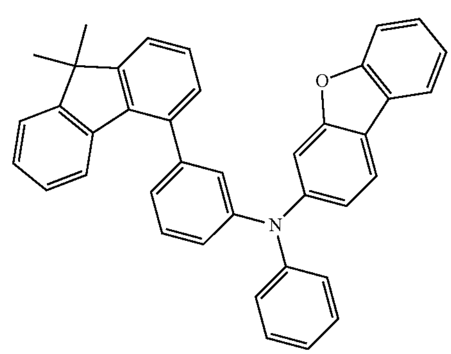

-continued

F-312

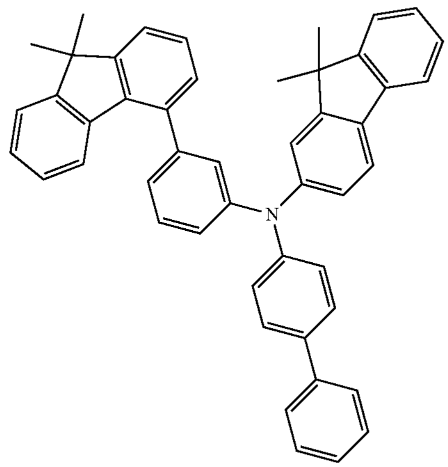

F-313

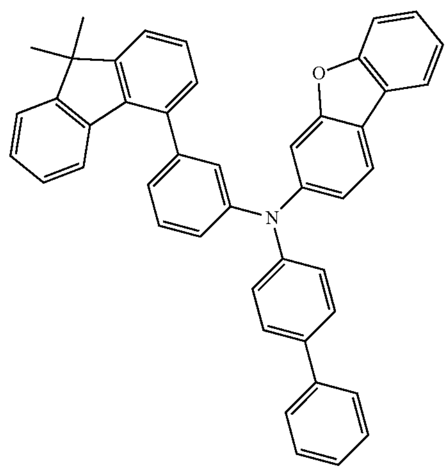

FIG. 1 is a schematic diagram illustrating the relative relationship between HOMO energy levels and LUMO energy levels of the first compound, the second compound, and the third compound that are included in an organic light-emitting device according to one or more embodiments.

Since the organic light-emitting device includes the first compound to the fourth compound that satisfy Equations 1 to 8, the balance of electrons and holes in an emission layer may improve, thus allowing for an effective (or suitable) formation of excitons in the emission layer and preventing (or reducting) the leakage of excitons toward a hole transport region, and consequentially, the formed excitons may effectively contribute to the light emission of the organic light-emitting device. Accordingly, the organic light-emitting device may have high efficiency and long lifespan in conjunction with high power efficiency.

For example, when Equation 7 is satisfied, i.e., when the HOMO energy level of the third compound is less than or equal to −5.6 eV, hole injection from the hole transport region to the emission layer may effectively (or suitably) occur, and thus, accumulation of holes at an interface between the emission layer and the hole transport region may be prevented or reduced. Accordingly, deterioration of the organic light-emitting device may be prevented or reduced and roll-off (e.g., efficiency roll-off) may be reduced, thus increasing the efficiency of the organic light-emitting device.

The substantial balance of electrons and holes and effective energy transfer from a host to a dopant in the emission layer of the organic light-emitting device may substantially improve the efficiency and lifespan of the organic light-emitting device. To this end, the first compound may include a hole transporting group, and the second compound may include at least one electron transporting group. When the emission layer includes both the first compound and the second compound, the balance of holes and electrons in the emission layer may improve, and thus, the organic light-emitting device may have both high efficiency and long lifespan.

However, even in the organic light-emitting device that includes both the first compound and the second compound according to the present embodiments, without a suitable hole transport region, the efficiency of the organic light-emitting device may nevertheless decrease because electrons may leak from the emission layer to a hole transport layer, which may result in an increase in current and voltage.

When the third compound according to the present embodiments is used in the hole transport region, the leakage of electrons from the emission layer to the hole transport region may be reduced. Thus, most excitons formed in the emission layer may contribute to emission, consequentially leading to improving the efficiency of the organic light-emitting device. Moreover, this may reduce the deterioration of organic layer materials caused by leakage of electrons, and may also reduce the amount of current necessary to sustain the same level of luminance. Therefore, the lifespan of the organic light-emitting device may improve.

Furthermore, in the third compound represented by Formula 4, at least one selected from $L_{41}$ to $L_{43}$ may be a group represented by Formula 5. In this case, the HOMO energy level of the third compound may be −5.6 eV or greater. Accordingly, compared to compounds including a para-phenylene group, the third compound (including a meta-substituted cyclic group) may have a relatively low HOMO energy level and slow hole mobility. Such HOMO energy level may contribute to balancing electrons and holes in the emission layer and preventing (or reducing) the leakage of excitons toward the hole transport region. Accordingly, the organic light-emitting device may have improved efficiency.

Figure 2:
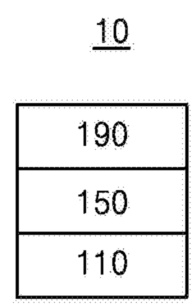
FIG. 2 is a schematic cross-sectional diagram of an organic light-emitting device according to one or more embodiments.

Description of FIG. 2

FIG. 2 is a schematic diagram of an organic light-emitting device 10 according to an embodiment. The organic light-emitting device 10 includes a first electrode 110, an organic layer 150, and a second electrode 190.

Hereinafter, the structure of the organic light-emitting device 10 according to an embodiment and a method of manufacturing the organic light-emitting device 10 will be described in connection with FIG. 2.

First Electrode 110

In FIG. 2, a substrate may be additionally disposed under the first electrode 110 or above the second electrode 190. The substrate may be a glass substrate or a plastic substrate, each having excellent mechanical strength, thermal stability, transparency, surface smoothness, ease of handling, and/or water-resistance.

The first electrode 110 may be formed by depositing or sputtering a material for the first electrode 110 on the substrate. When the first electrode 110 is an anode, the material for the first electrode 110 may be selected from materials with a high work function to facilitate hole injection.

The first electrode 110 may be a reflective electrode, a semi-transmissive electrode, or a transmissive electrode. When the first electrode 110 is a transmissive electrode, a material for the first electrode 110 may be selected from indium tin oxide (ITO), indium zinc oxide (IZO), tin oxide (SnO2), zinc oxide (ZnO), and any combinations thereof, but embodiments are not limited thereto. In one or more embodiments, when the first electrode 110 is a semi-transmissive electrode or a reflective electrode, the material for the first electrode 110 may be selected from magnesium (Mg), silver (Ag), aluminum (Al), aluminum-lithium (Al—Li), calcium (Ca), magnesium-indium (Mg—In), magnesium-silver (Mg—Ag), and any combinations thereof, but is not limited thereto.

The first electrode 110 may have a single-layered structure, or a multi-layered structure including two or more layers. For example, the first electrode 110 may have a three-layered structure of ITO/Ag/ITO, but embodiments of the structure of the first electrode 110 are not limited thereto.

Organic Layer 150

The organic layer 150 may be disposed on the first electrode 110. The organic layer 150 may include an emission layer.

The organic layer 150 may further include a hole transport region between the first electrode 110 and the emission layer, and an electron transport region between the emission layer and the second electrode 190.

Hole Transport Region in Organic Layer 150

The hole transport region may have i) a single-layered structure including a single layer including a single material, ii) a single-layered structure including a single layer including a plurality of different materials, or iii) a multi-layered structure having a plurality of layers including a plurality of different materials.

The hole transport region may include at least one layer selected from a hole injection layer, a hole transport layer, an emission auxiliary layer, and an electron blocking layer.

The hole transport region may include a first layer including the third compound, and the first layer may directly contact the emission layer.

In some embodiments, the first layer may be an emission auxiliary layer.

For example, the hole transport region may have a single-layered structure including a single layer including a plurality of different materials, or a multi-layered structure having a structure of hole injection layer/hole transport layer, hole injection layer/hole transport layer/emission auxiliary layer, hole injection layer/emission auxiliary layer, hole transport layer/emission auxiliary layer, or hole injection layer/hole transport layer/electron blocking layer, wherein the layers constituting each structure are sequentially stacked on the first electrode 110 in the stated order, but embodiments of the structure of the hole transport region are not limited thereto.

The hole transport region may include, in addition to the third compound, at least one selected from m-MTDATA, TDATA, 2-TNATA, NPB (NPD), β-NPB, TPD, a spiro-TPD, a spiro-NPB, methylated NPB, TAPC, HMTPD, 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), (polyaniline)/poly(4-styrenesulfonate) (Pani/PSS), a compound represented by Formula 201, and a compound represented by Formula 202:

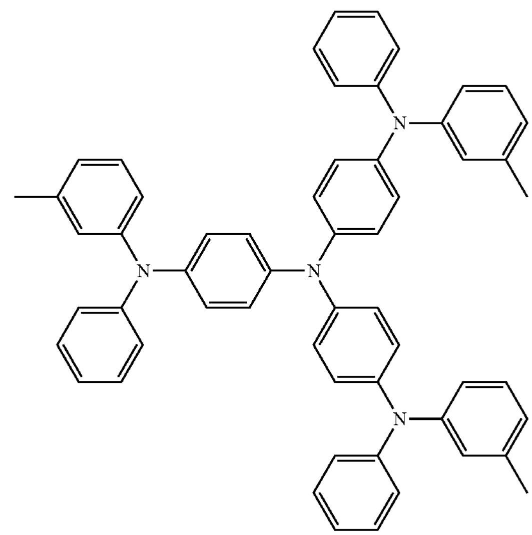

m-MTDATA

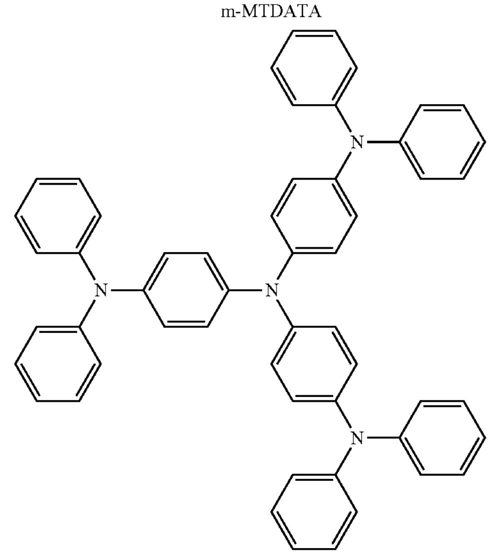

TDATA

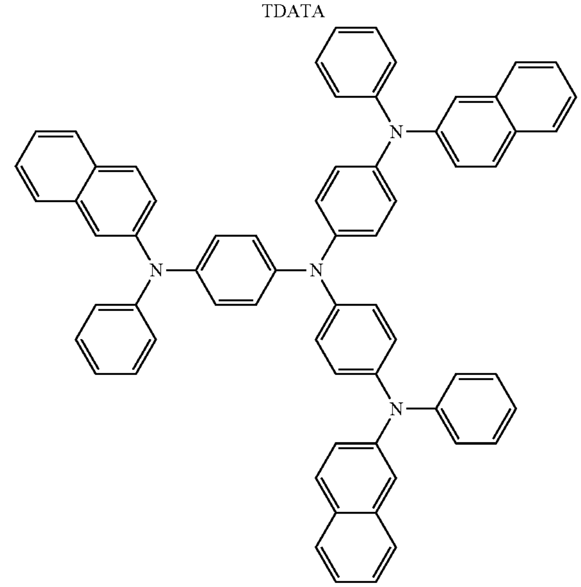

2-TNATA

-continued

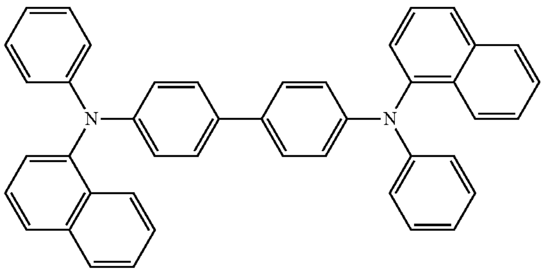

NPB

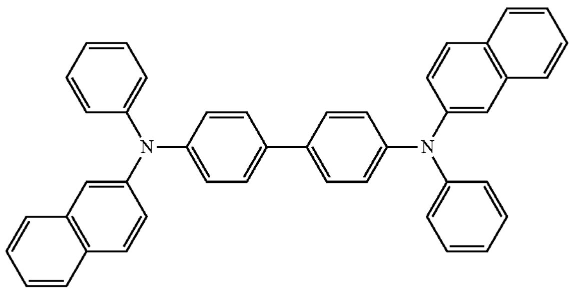

β-NPB

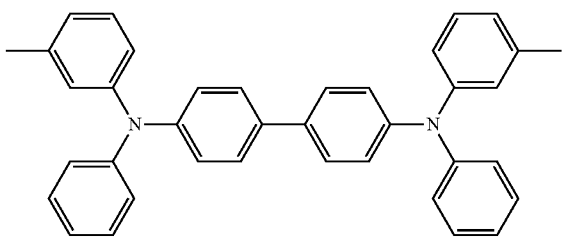

TPD

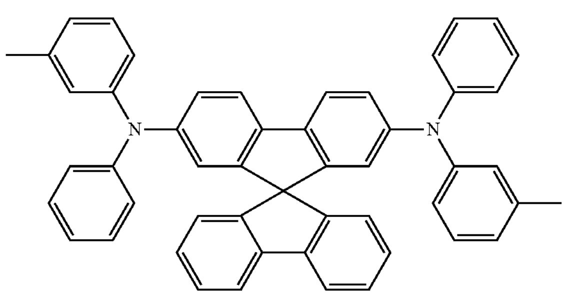

Spiro-TPD

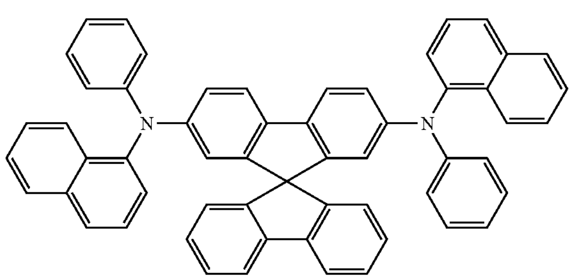

Spiro-NPB

-continued

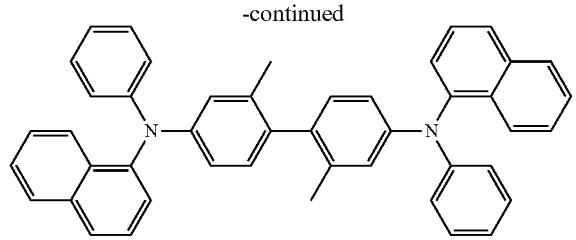

methylated NPB

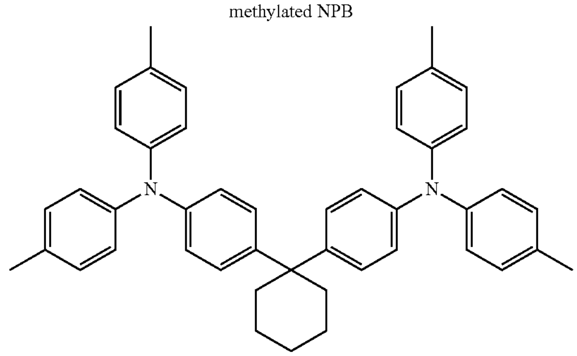

TAPC

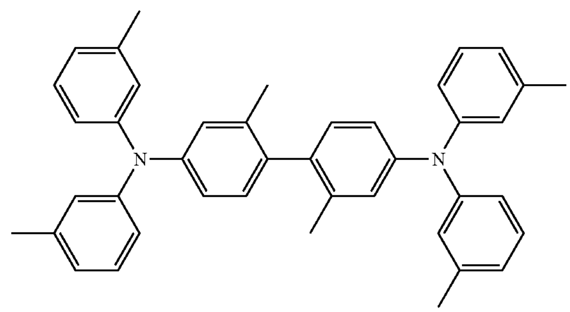

HMTPD

Formula 201

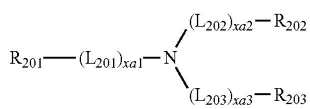

Formula 202

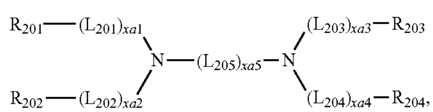

wherein, in Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer selected from 0 to 3, xa5 may be an integer selected from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, in Formula 202, $R_{201}$ and $R_{202}$ may optionally be bound via a single bond, a dimethyl-methylene group, or a diphenyl-methylene group, and $R_{203}$ and $R_{204}$ may optionally be bound via a single bond, a dimethyl-methylene group, or a diphenyl-methylene group.

In some embodiments, in Formulae 201 and 202, $L_{201}$ to $L_{205}$ may each independently be selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xa1 to xa4 may each independently be 0, 1, or 2.

According to an embodiment, xa5 may be 1, 2, 3, or 4.

According to some embodiments, $R_{201}$ to $R_{204}$ and $Q_{201}$ may each independently be selected from the group consisting of:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein description of $Q_{31}$ to $Q_{33}$ may be the same as above.

According to some embodiments, at least one selected from $R_{201}$ to $R_{203}$ in Formula 201 may each independently be selected from the group consisting of:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments are not limited thereto.

According to some embodiments, in Formula 202, i) $R_{201}$ and $R_{202}$ may be bound via a single bond, and/or ii) $R_{203}$ and $R_{204}$ may be bound via a single bond.

According to some embodiments, at least one selected from $R_{201}$ to $R_{204}$ in Formula 202 may be selected from the group consisting of:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments are not limited thereto.

The compound represented by Formula 201 may be represented by Formula 201A:

Formula 201A

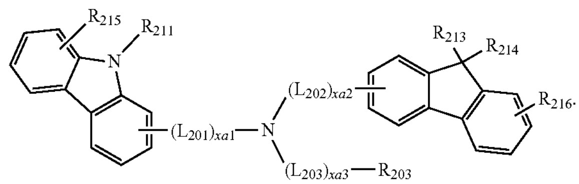

In some embodiments, the compound represented by Formula 201 may be represented by Formula 201A(1), but embodiments are not limited thereto:

Formula 201A(1)

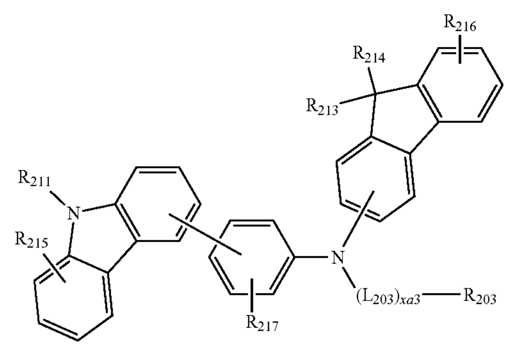

In some embodiments, the compound represented by Formula 201 may be represented by Formula 201A-1, but embodiments are not limited thereto:

Formula 201A-1

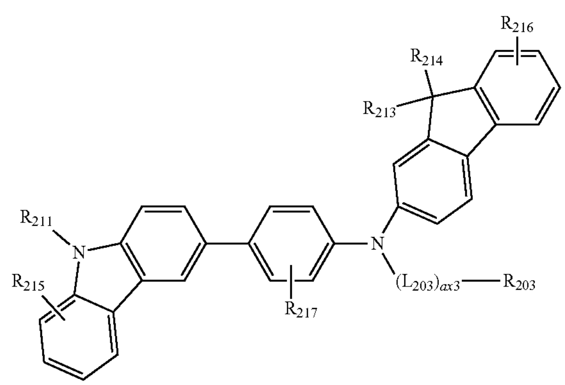

In some embodiments, the compound represented by Formula 202 may be represented by Formula 202A:

Formula 202A

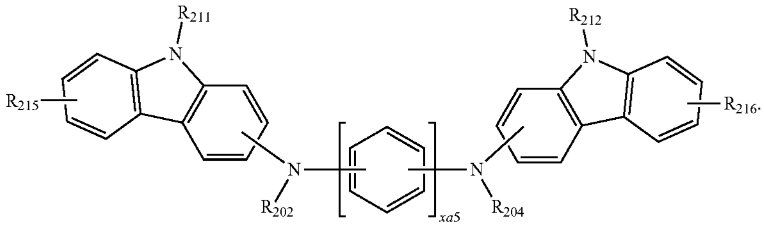

In some embodiments, the compound represented by Formula 202 may be represented by Formula 202A-1:

Formula 202A-1

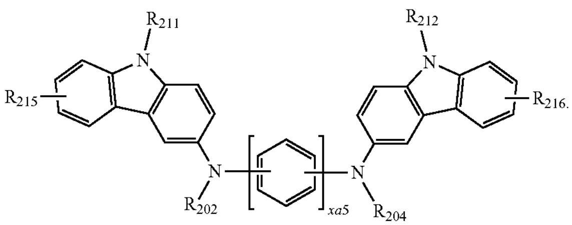

In Formulae 201A, 201A(1), 201A-1, 202A, and 202A-1, descriptions of $L_{201}$ to $L_{203}$, xa1 to xa3, xa5, and $R_{202}$ to $R_{204}$ may be respectively the same as those provided above, descriptions of $R_{211}$ and $R_{212}$ may each independently be the same as the description provided above in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT39, but embodiments are not limited thereto:

HT1

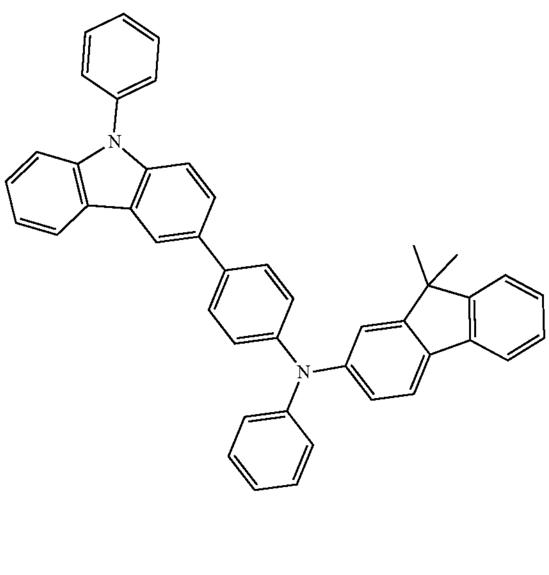

HT2

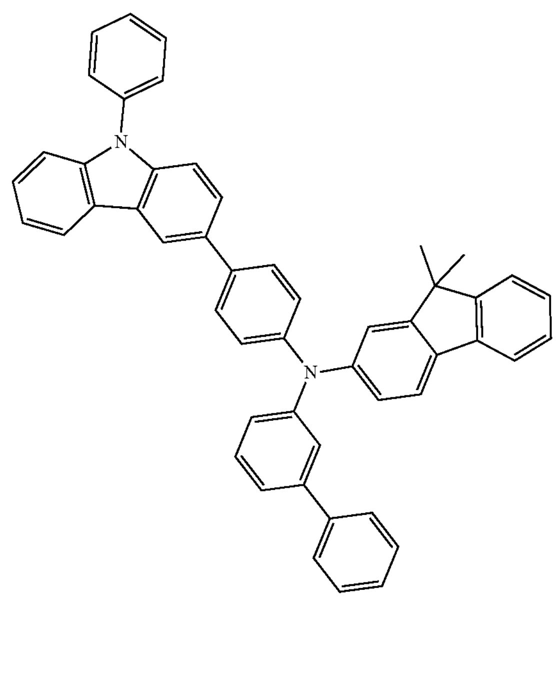

-continued
HT3
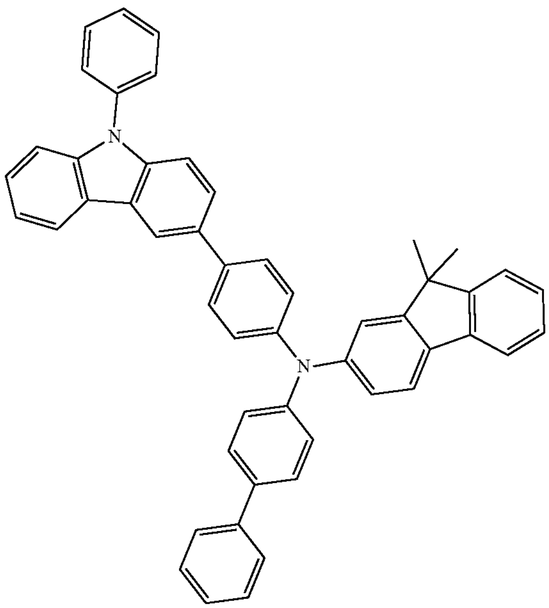
HT4
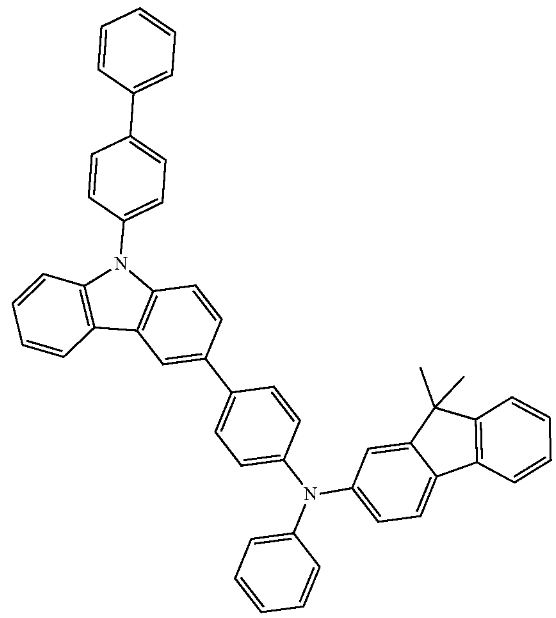
HT5
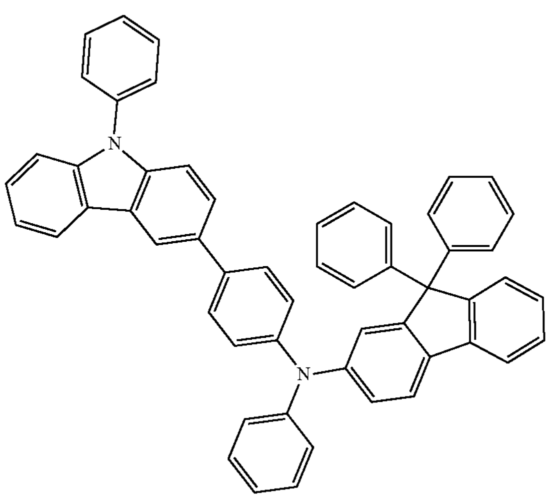
HT6
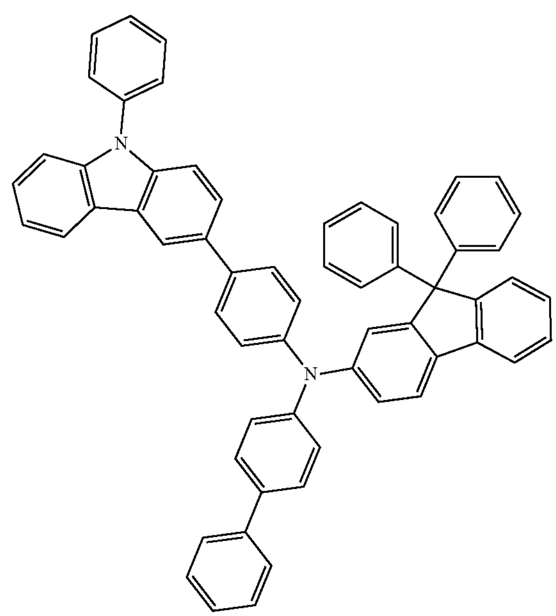

-continued
HT7
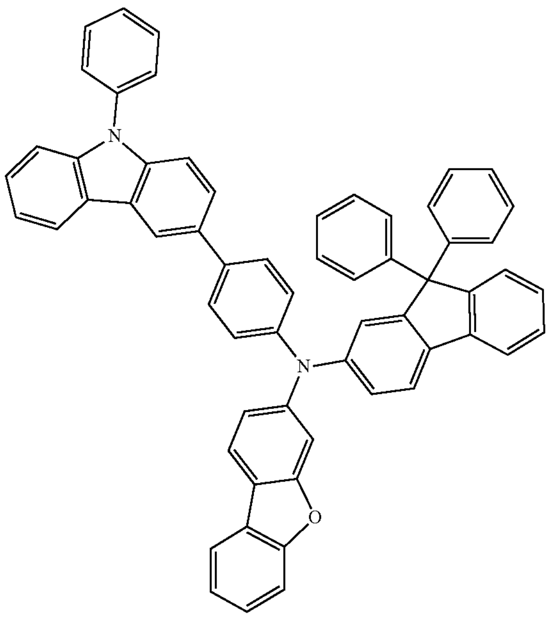
HT8
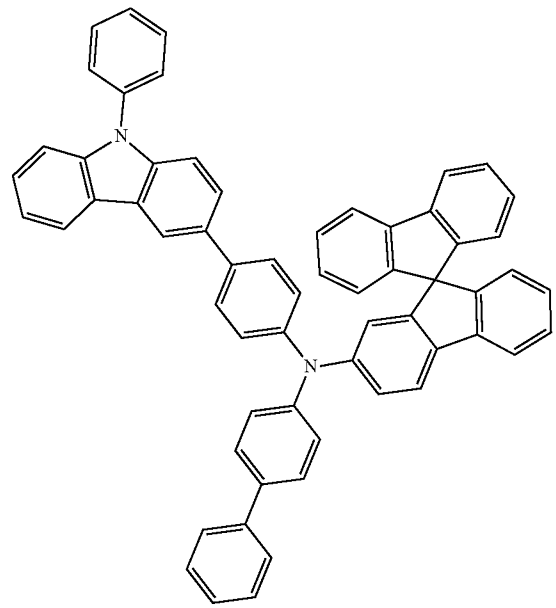
HT9
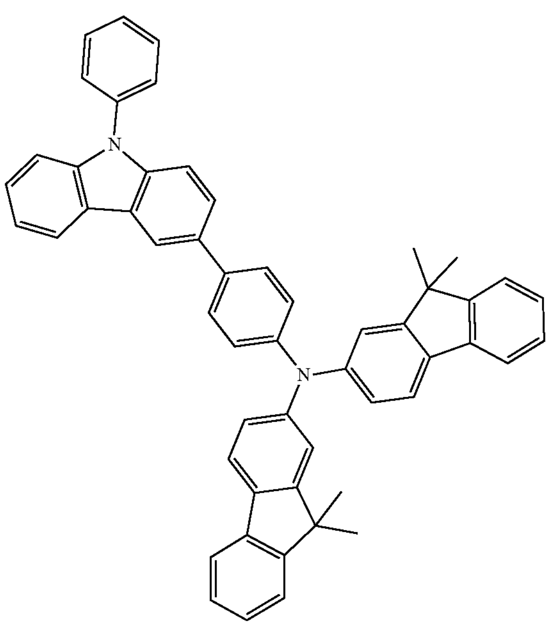
HT10
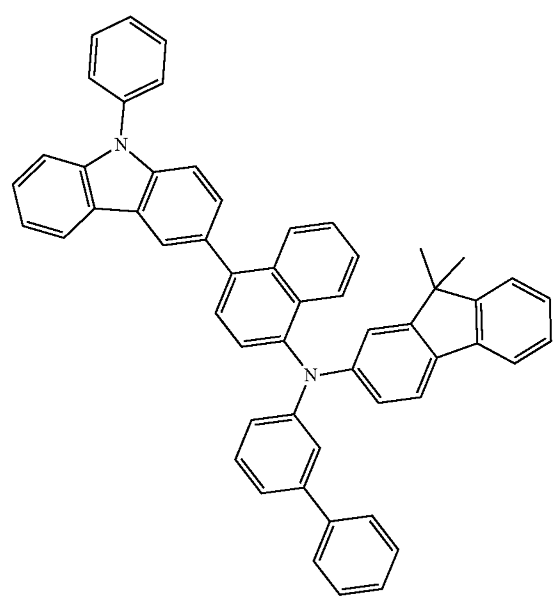

-continued
HT11
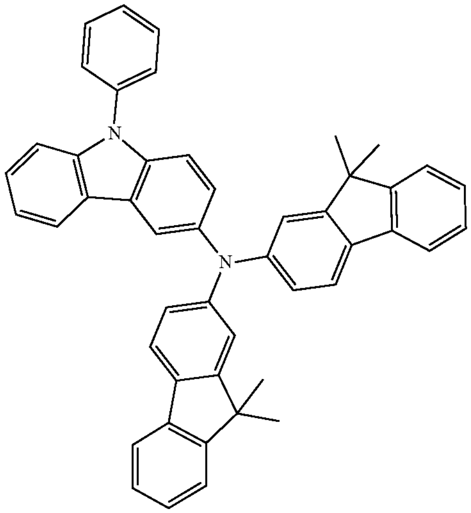
HT12
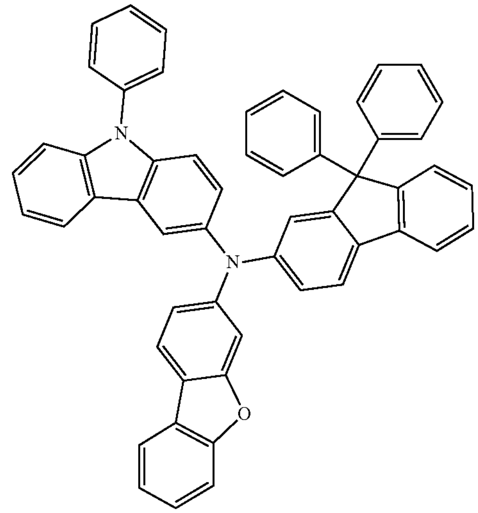
HT13
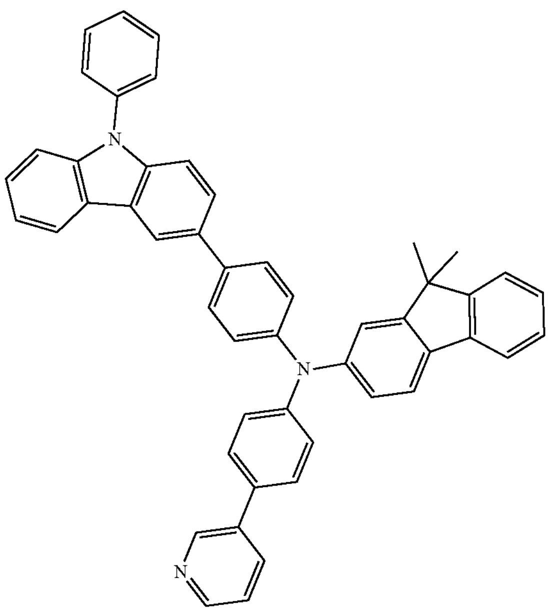
HT14
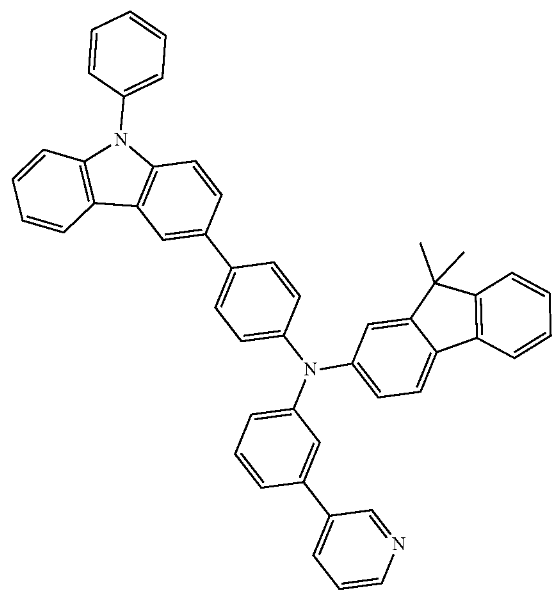
HT15
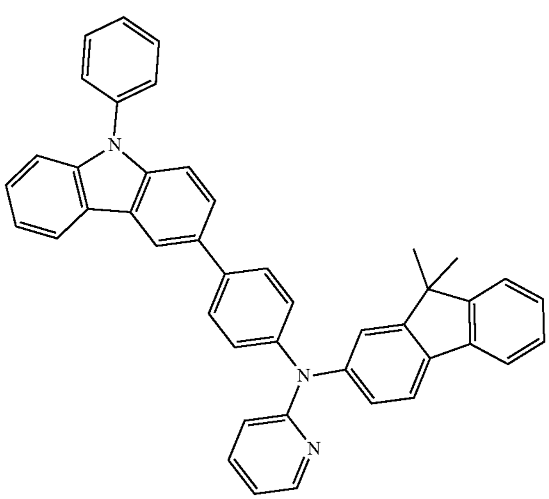
HT16
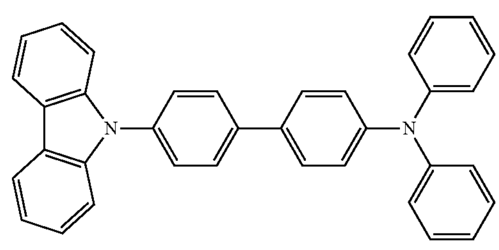

-continued
HT17
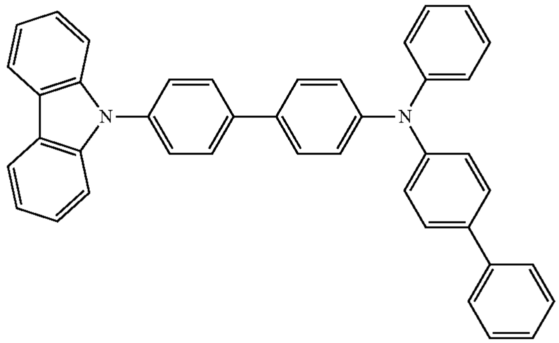
HT18
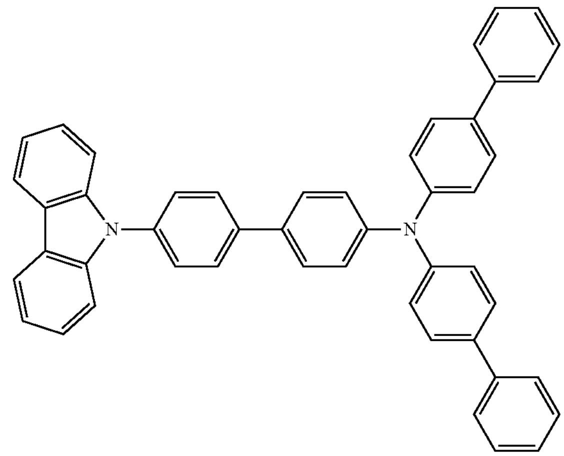
HT19
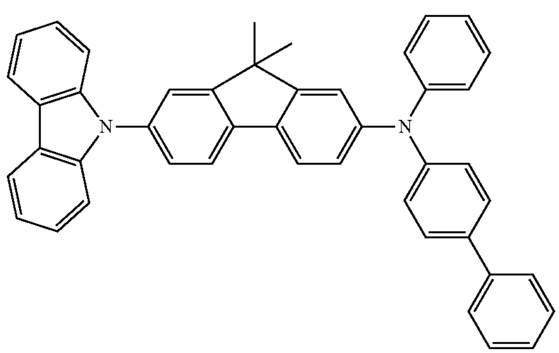
HT20
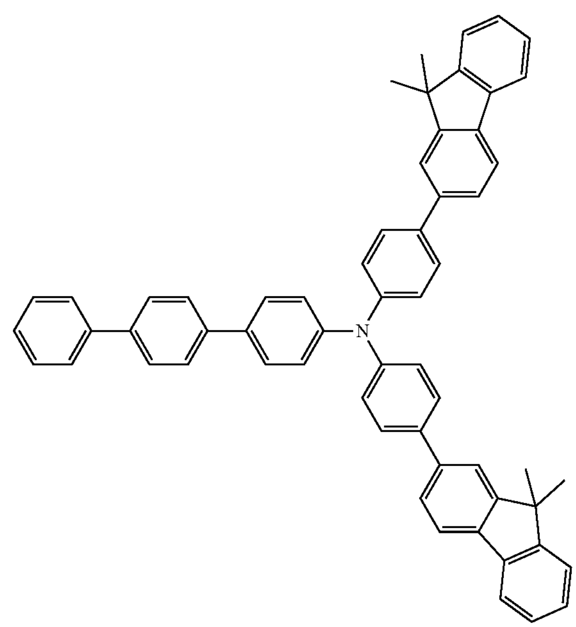

-continued
HT21
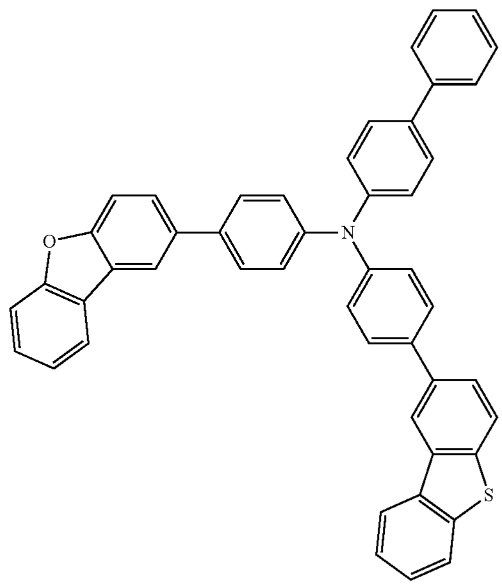
HT22
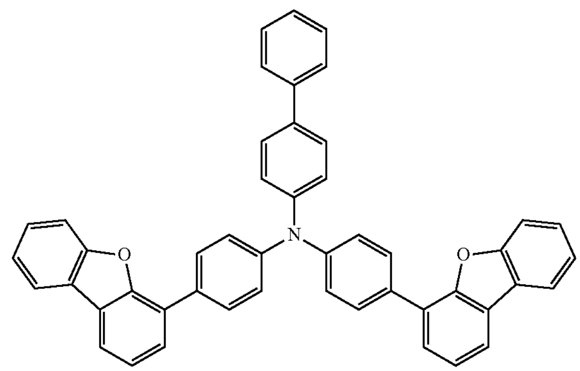
HT23
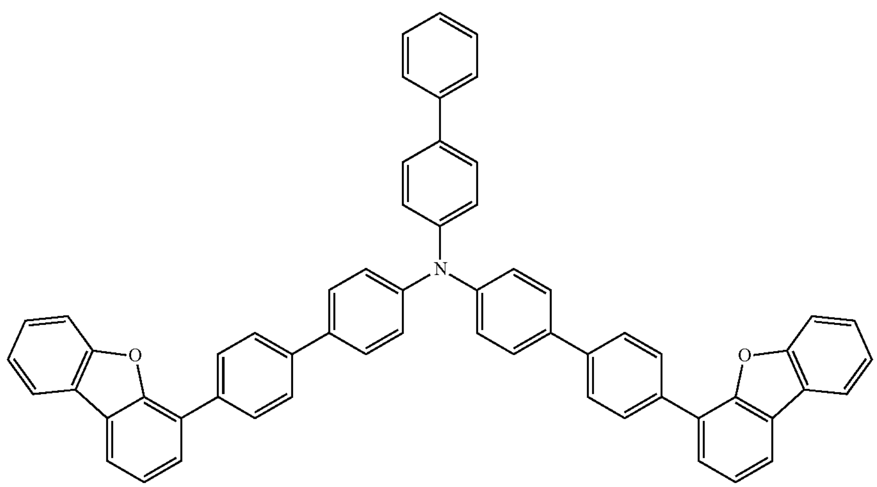
HT24
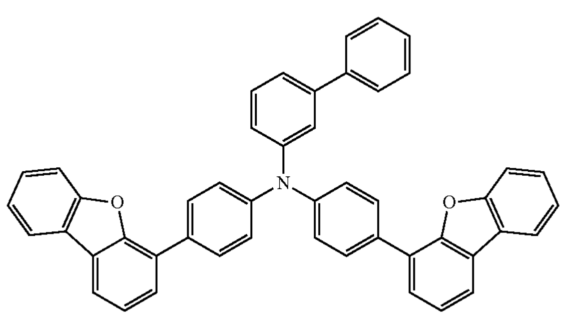
HT25
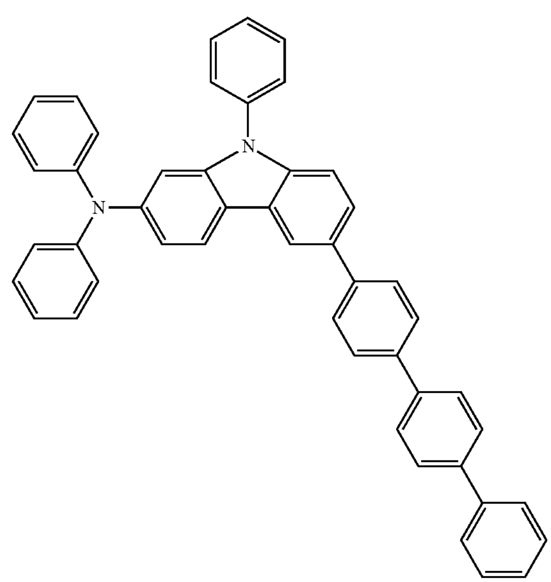

-continued
HT26
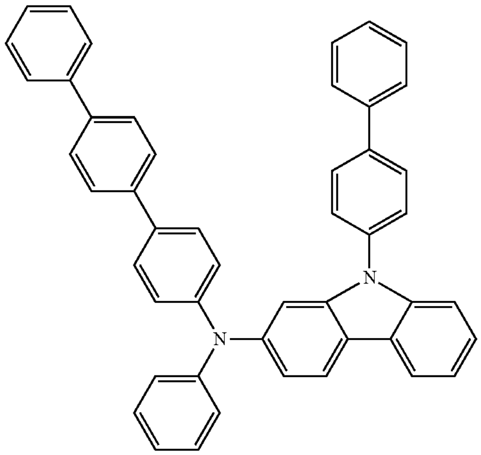
HT27
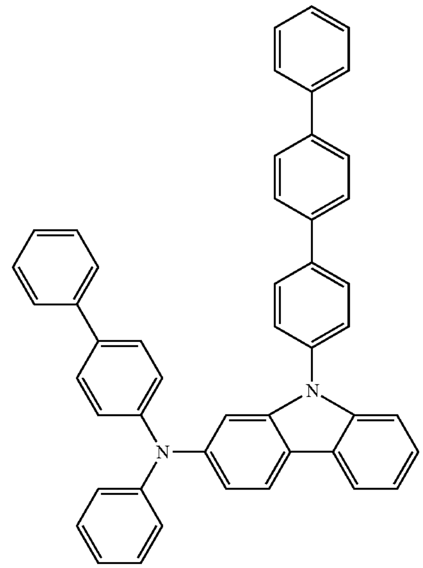
HT28
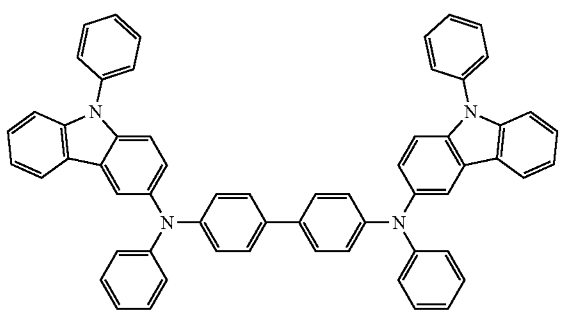
HT29
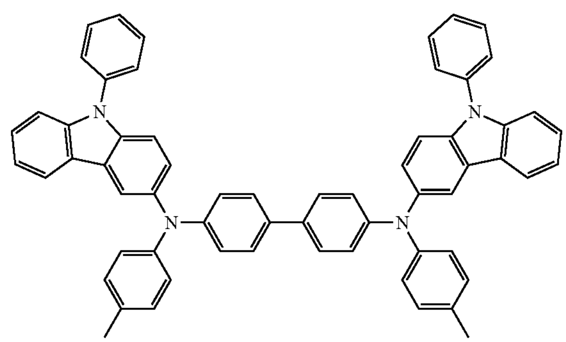
HT30
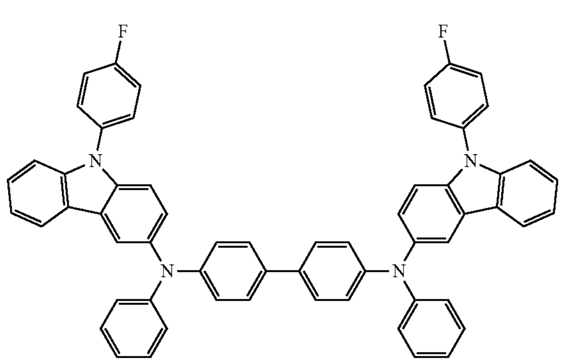
HT31
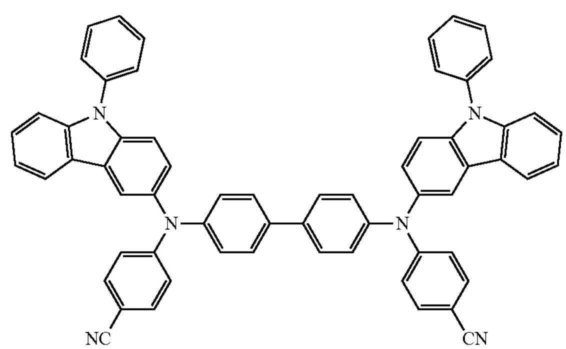

-continued
HT32
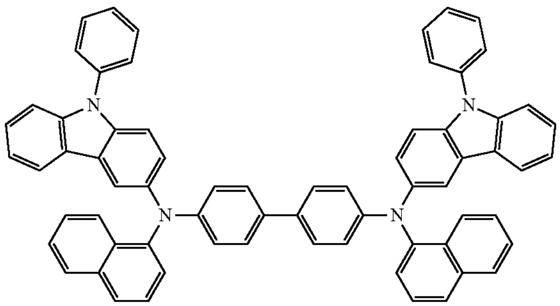
HT33
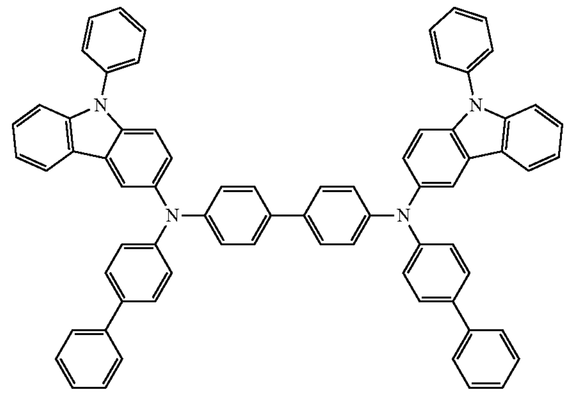
HT34
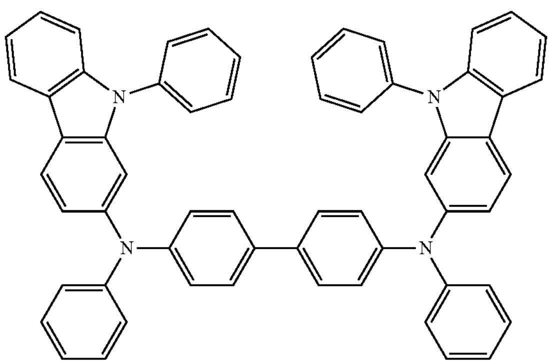
HT35
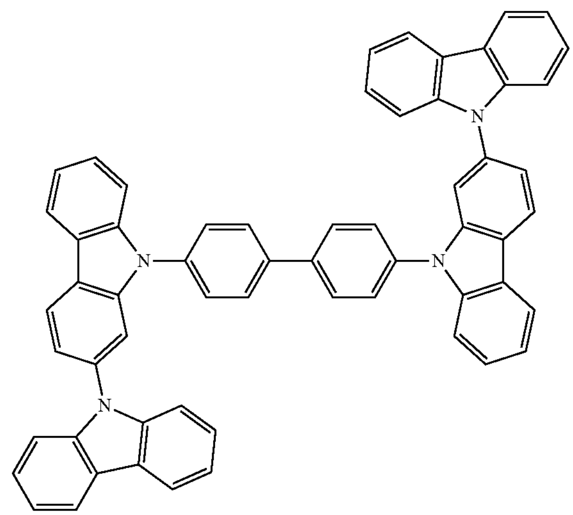
HT36
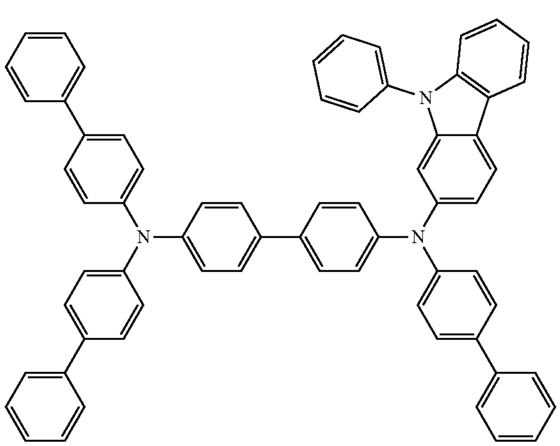
HT37
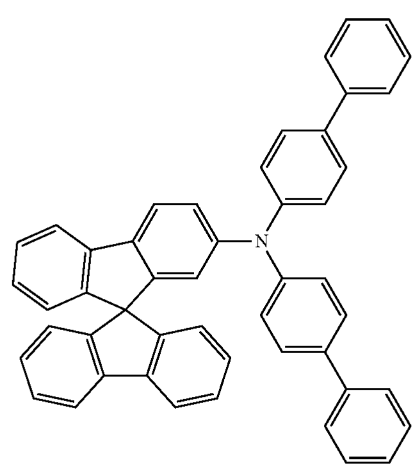

-continued

HT38

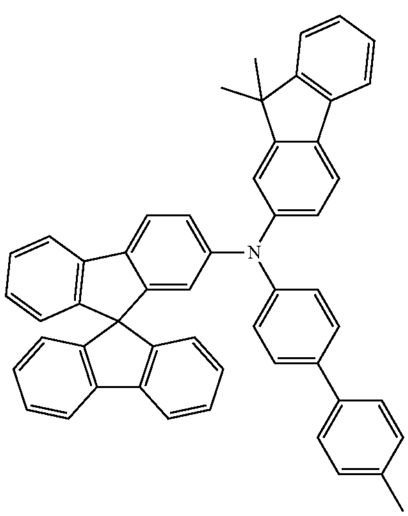

HT39

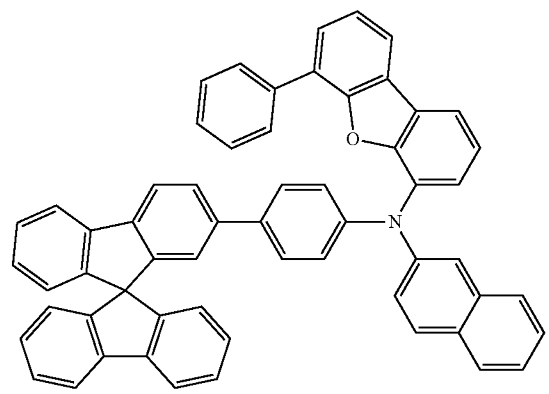

The thickness of the hole transport region may be in a range of about 100 Å to about 10,000 Å, for example, about 100 Å to about 2,000 Å. When the hole transport region includes at least one selected from a hole injection layer and a hole transport layer, a thickness of the hole injection layer may be in a range of about 50 Å to about 2,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within any of these ranges, satisfactory (or suitable) hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block or reduce the flow of electrons from an electron transport region. The emission auxiliary layer and the electron blocking layer may each independently include any of the materials described above. In some embodiments, the emission auxiliary layer may include the third compound.

The thickness of the emission auxiliary layer may be in a range of about 10 Å to about 2,000 Å, for example, about 50 Å to about 1,000 Å. When the thickness of the emission auxiliary layer is within any of these ranges, excellent (or suitable) hole transport characteristics may be obtained without a substantial increase in driving voltage.

p-Dopant

The hole transport region may further include, in addition to the materials described above, a charge-generation material for the improvement of conductive properties. The charge-generation material may be homogeneously or non-homogeneously dispersed in the hole transport region.

The charge-generation material may be, for example, a p-dopant.

In one embodiment, the p-dopant may have a LUMO level of about −3.5 eV or less.

The p-dopant may include at least one selected from a quinone derivative, a metal oxide, and a cyano group-containing compound, but embodiments are not limited thereto.

In some embodiments, the p-dopant may include at least one selected from the group consisting of:

a quinone derivative, such as tetracyanoquinodimethane (TCNQ) and/or 2,3,5,6-tetrafluoro-7,7,8,8-tetracyanoquinodimethane (F4-TCNQ);

a metal oxide, such as tungsten oxide and/or molybdenum oxide;

1,4,5,8,9,11-hexaazatriphenylene-hexacarbonitrile (HAT-CN); and a compound represented by Formula 221, but embodiments are not limited thereto:

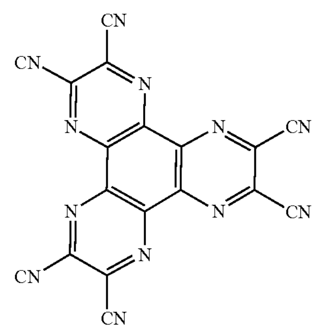

HAT-CN

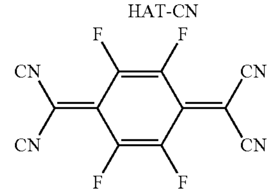

F4-TCNQ

Formula 221

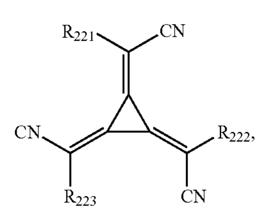

wherein, in Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may include at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Emission Layer in Organic Layer 150

When the organic light-emitting device 10 is a full color organic light-emitting device, the emission layer may be patterned into a red emission layer, a green emission layer, and/or a blue emission layer, according to a sub-pixel. In one or more embodiments, the emission layer may have a stacked structure of two or more layers selected from a red emission layer, a green emission layer, and a blue emission layer, wherein the two or more layers may contact each other or may be separated from each other. In one or more embodiments, the emission layer may include two or more materials selected from a red-light emission material, a green-light emission material, and a blue-light emission material, wherein the two or more materials are mixed together in a single layer to emit white light.

The emission layer may include a host and a dopant. The dopant may include at least one selected from a phosphorescent dopant and a fluorescent dopant.

The amount of the dopant in the emission layer may be in a range of about 0.01 parts by weight to about 15 parts by weight based on 100 parts by weight of the host, but embodiments are not limited thereto.

The thickness of the emission layer may be in a range of about 100 Å to about 1,000 Å, and in some embodiments, about 200 Å to about 600 Å. When the thickness of the emission layer is within any of these ranges, excellent (or suitable) light-emission characteristics may be obtained without a substantial increase in driving voltage.

Host in Emission Layer

The emission layer may include the first compound and the second compound as a host. The first compound and the second compound may be substantially the same as those described above.

For example, a weight ratio of the first compound to the second compound may be in a range of about 1:99 to about 99:1 or about 20:80 to about 80:20, but embodiments are not limited thereto.

Phosphorescent Dopant Included in Emission Layer in Organic Layer 150

The phosphorescent dopant may be the fourth compound.

The fourth compound may include a metal selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), but embodiments are not limited thereto.

In some embodiments, the fourth compound may be a compound represented by Formula 401, but embodiments are not limited thereto.

In some embodiments, the phosphorescent dopant may include an organometallic complex represented by Formula 401:

Formula 401

$$M(L_{401})_{xc1}(L_{402})_{xc2}$$

Formula 402

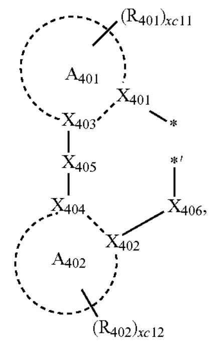

wherein, in Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be selected from ligands represented by Formula 402, and xc1 may be 1, 2, or 3; and when xc1 is 2 or greater, a plurality of $L_{401}$(s) may be identical to or different from each other, $L_{402}$ may be an organic ligand, and xc2 may be an integer selected from 0 to 4; and when xc2 is 2 or greater, a plurality of $L_{402}$(s) may be identical to or different from each other, $X_{401}$ to $X_{404}$ may each independently be a nitrogen (—N—) or a carbon (—C—), $X_{401}$ and $X_{403}$ may be bound to each other via a single bond or a double bond, $X_{402}$ and $X_{404}$ may be bound to each other via a single bond or a double bond, $A_{401}$ and $A_{402}$ may each independently be selected from a $C_5$-$C_{60}$ carbocyclic group and a $C_1$-$C_{60}$ heterocyclic group, $X_{405}$ may be selected from a single bond, *—O—*', *—S—*', *—C(═O)—*', *—N($Q_{411}$)-*', *—C($Q_{411}$)($Q_{412}$)-*', *—C($Q_{411}$)═C($Q_{412}$)-*', *—C($Q_{411}$)═*', and *═C($Q_{411}$)═*', wherein $Q_{411}$ and $Q_{412}$ may be selected from hydrogen, deuterium, a $C_1$-$C_{20}$ alkyl group, a $C_1$-$C_{20}$ alkoxy group, a phenyl group, a biphenyl group, a terphenyl group, and a naphthyl group, $X_{406}$ may be a single bond, O, or S, $R_{401}$ and $R_{402}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group and a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), and —P(═O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may each independently be an integer selected from 0 to 10, and

* and *' in Formula 402 may each independently indicate a binding site to M in Formula 401.

According to an embodiment, $A_{401}$ and $A_{402}$ in Formula 402 may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In one or more embodiments, in Formula 402, i) $X_{401}$ may be nitrogen, and $X_{402}$ may be carbon, or ii) $X_{401}$ and $X_{402}$ may both be nitrogen.

According to some embodiments, $R_{401}$ and $R_{402}$ in Formula 402 may each independently be selected from the group consisting of:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantyl group, a norbornanyl group, and a norbornenyl group;

a cyclopentyl group, a cyclohexyl group, an adamantyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantyl group, a norbornanyl group, a norbornenyl group a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a phenyl group, a biphenyl group, and a naphthyl group, but embodiments are not limited thereto.

In one or more embodiments, when xc1 in Formula 401 is 2 or greater, two $A_{401}$(s) of the plurality of $L_{401}$(s) may optionally be bound to each other via $X_{407}$ as a linking group, or two $A_{402}$(s) of the plurality of $L_{401}$(s) may optionally be bound to each other via $X_{408}$ as a linking group (see e.g., Compounds PD1 to PD4 and PD7). $X_{407}$ and $X_{408}$ may each independently be selected from a single bond, *—O—*', *—S—*', *—C(=O)—*', *—N($Q_{413}$)-*', *—C($Q_{413}$)($Q_{414}$)-*', and *—C($Q_{413}$)=C($Q_{414}$)-*', wherein $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, and/or a naphthyl group, but embodiments are not limited thereto.

$L_{402}$ in Formula 401 may be any suitable monovalent, divalent, or trivalent organic ligand. In some embodiments, $L_{402}$ may be selected from a halogen, a diketone (e.g., acetylacetonate), a carboxylic acid ligand (e.g., picolinate), —C(=O), isonitrile, —CN, and a phosphorus ligand (e.g., phosphine and/or phosphite), but embodiments are not limited thereto.

In some embodiments, the phosphorescent dopant may include, for example, at least one selected from Compounds PD1 to PD26, but embodiments are not limited thereto:

PD1

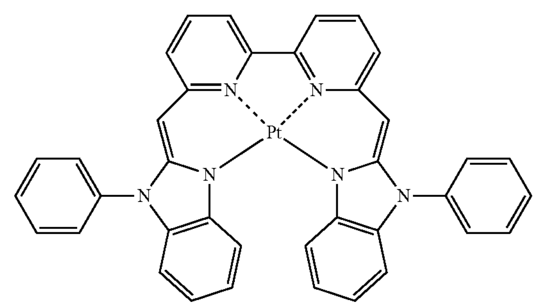

PD2

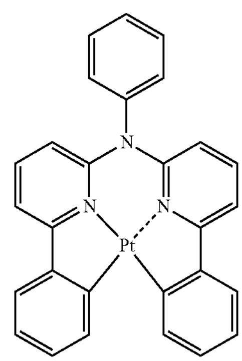

PD3

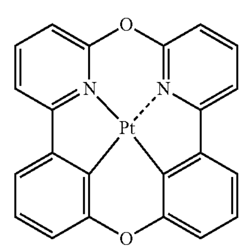

-continued
PD4
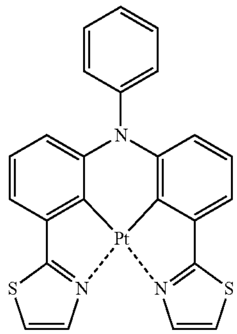
PD5
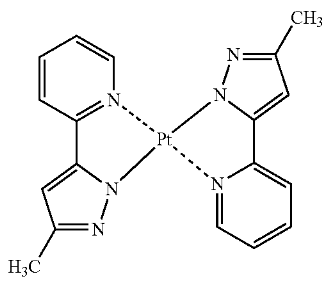
PD6
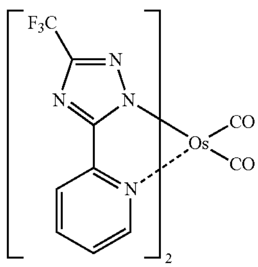
PD7
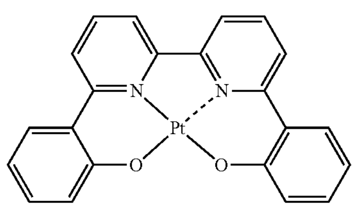
PD8
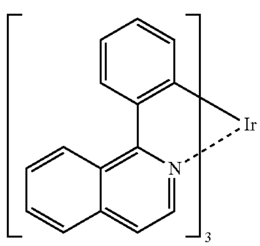
PD9
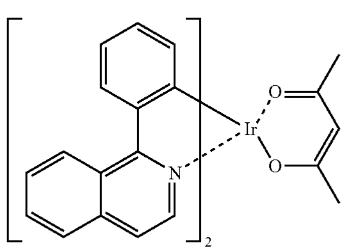
-continued
PD10
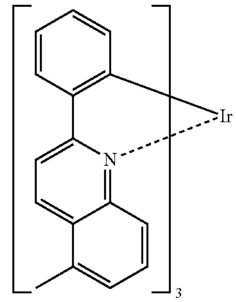
PD11
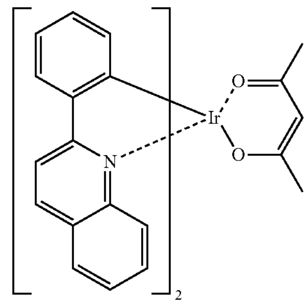
PD12
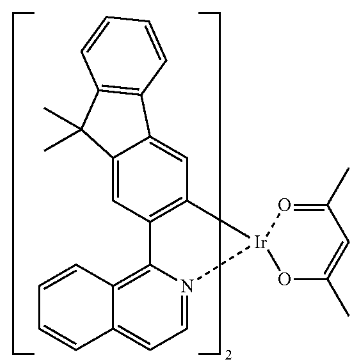
PD13
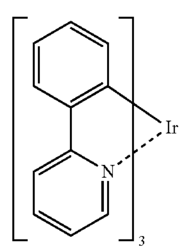
PD14
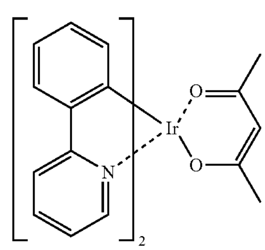

-continued
PD15
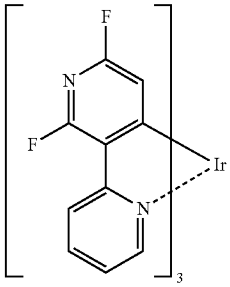
PD16
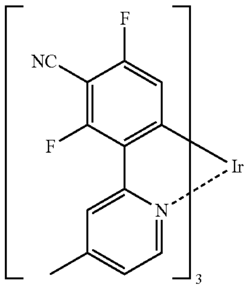
PD17
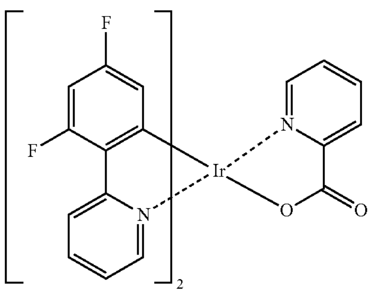
PD18
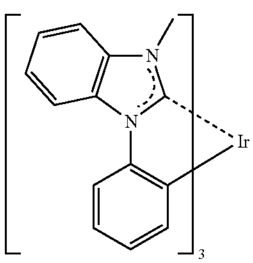
PD19
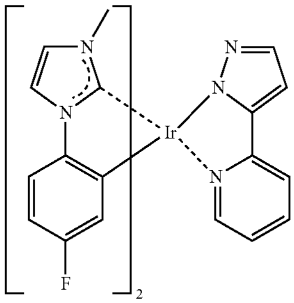
-continued
PD20
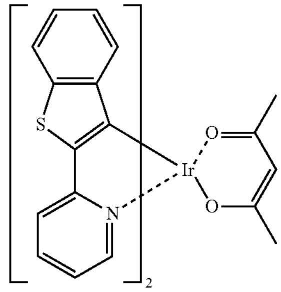
PD21
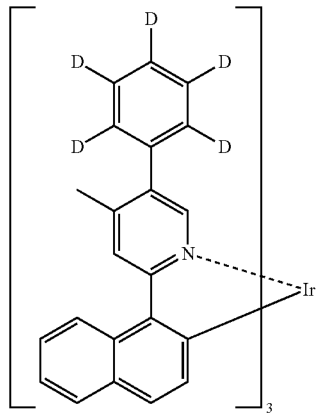
PD22
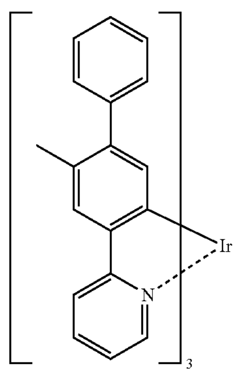
PD23
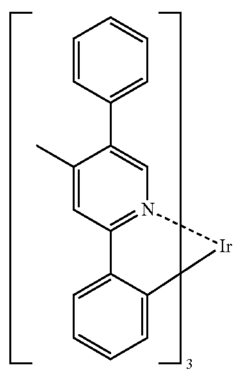

-continued

PD24

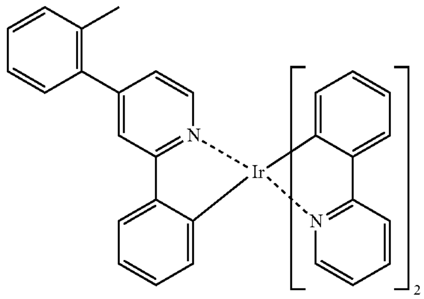

PD25

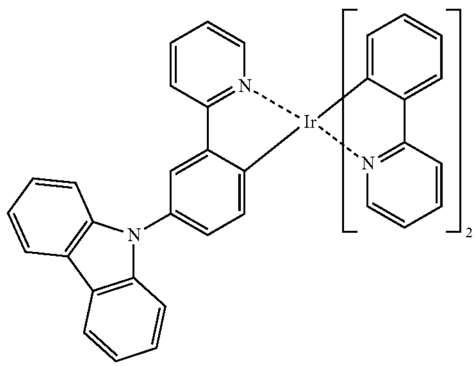

PD26

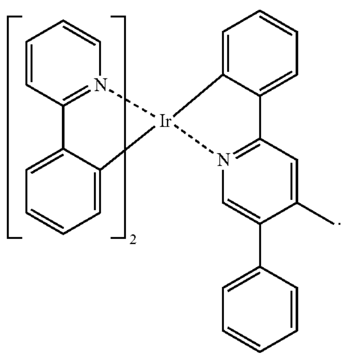

Electron Transport Region in Organic Layer 150

The electron transport region may have i) a single-layered structure including a single layer including a single material, ii) a single-layered structure including a single layer including a plurality of different materials, or iii) a multi-layered structure having a plurality of layers including a plurality of different materials.

The electron transport region may include at least one selected from a buffer layer, a hole blocking layer, an electron control layer, an electron transport layer, and an electron injection layer, but is not limited thereto.

In some embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein the layers constituting each structure are sequentially stacked on the emission layer in the stated order. However, embodiments of the structure of the electron transport region are not limited thereto.

The electron transport region (e.g., a buffer layer, a hole blocking layer, an electron control layer, and/or an electron transport layer in the electron transport region) may include a metal-free compound containing at least one π electron-depleted nitrogen-containing ring.

The "π electron-depleted nitrogen-containing ring" as used herein may refer to a $C_1$-$C_{60}$ heterocyclic group having at least one *—N=*' moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed (e.g., fused), or iii) a heteropolycyclic group in which at least one 5-membered to 7-membered heteromonocyclic group having at least one *—N=*' moiety, is condensed to at least one $C_5$-$C_{60}$ carbocyclic group.

Non-limiting examples of the π electron-depleted nitrogen-containing ring may include an imidazole, a pyrazole, a thiazole, an isothiazole, an oxazole, an isoxazole, a pyridine, a pyrazine, a pyrimidine, a pyridazine, an indazole, a purine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzimidazole, an isobenzothiazole, a benzoxazole, an isobenzoxazole, a triazole, a tetrazole, an oxadiazole, a triazine, thiadiazole, an imidazopyridine, an imidazopyrimidine, and an azacarbazole, but are not limited thereto.

In some embodiments, the electron transport region may include a compound represented by Formula 601:

$$[Ar_{601}]_{xe11}\text{-}[(L_{601})_{xe1}\text{-}R_{601}]_{xe21}, \qquad \text{Formula 601}$$

wherein, in Formula 601, $Ar_{601}$ may be selected from a substituted or unsubstituted $C_5$-$C_{60}$ carbocyclic group and a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer selected from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_{601})(Q_{602})(Q_{603})$, —$C(=O)(Q_{601})$, —$S(=O)_2(Q_{601})$, and —$P(=O)(Q_{601})(Q_{602})$, wherein $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, and/or a naphthyl group, and xe21 may be an integer selected from 1 to 5.

In some embodiments, at least one selected from the xe11 number of $Ar_{601}$(s) and the xe21 number of $R_{601}$ (S) may include a π electron-depleted nitrogen-containing ring.

In some embodiments, ring $Ar_{601}$ in Formula 601 may be selected from the group consisting of:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an iso-benzothiazole group, a benzoxazole group, an isobenzoxazole group, a triazole group, a tetrazole group, an oxadiazole group, a triazine group, a thiadiazole group, an imidazopyridine group, an imidazopyrimidine group, and an indenoquinoline group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, phenazine group, a benzimidazole group, an iso-benzothiazole group, a benzoxazole group, an isobenzoxazole group, a triazole group, a tetrazole group, an oxadiazole group, a triazine group, a thiadiazole group, an imidazopyridine group, an imidazopyrimidine group, and an indenoquinoline group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or greater, a plurality of $Ar_{601}$(s) may be bound to respective one another via a single bond.

In one or more embodiments, $Ar_{601}$ in Formula 601 may be an anthracene group.

In some embodiments, the compound represented by Formula 601 may be represented by Formula 601-1:

Formula 601-1

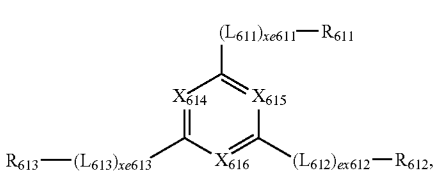

wherein, in Formula 601-1, $X_{614}$ may be N or C($R_{614}$), $X_{615}$ may be N or C($R_{615}$), $X_{616}$ may be N or C($R_{616}$), and at least one selected from $X_{614}$ to $X_{616}$ may be N, descriptions of $L_{611}$ to $L_{613}$ may each independently be the same as the description provided above in connection with $L_{601}$, descriptions of xe611 to xe613 may each independently be the same as the description provided above in connection with xe1, descriptions of $R_{611}$ to $R_{613}$ may each independently be the same as the description provided above in connection with $R_{601}$, $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one embodiment, $L_{601}$ and $L_{611}$ to $L_{613}$ in Formulae 601 and 601-1 may each independently be selected from the group consisting of:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments are not limited thereto.

In one or more embodiments, xe1 and xe611 to xe613 in Formulae 601 and 601-1 may each independently be selected from 0, 1, and 2.

According to some embodiments, $R_{601}$ and $R_{611}$ to $R_{613}$ in Formulae 601 and 601-1 may each independently be selected from the group consisting of:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and $—S(=O)_2(=O)_2(Q_{601})$ and $—P(=O)(Q_{601})(Q_{602})$, wherein $Q_{601}$ and $Q_{602}$ may each independently be as those described above.

The electron transport region may include at least one compound selected from Compounds ET1 to ET36, but embodiments are not limited thereto:
ET1
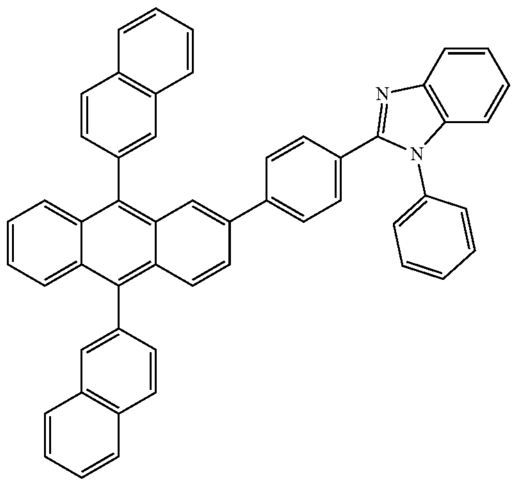
ET2
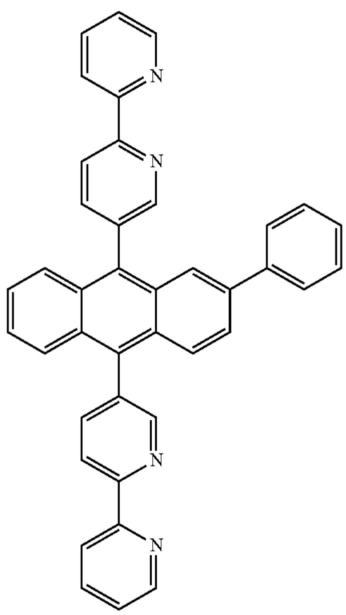
ET3
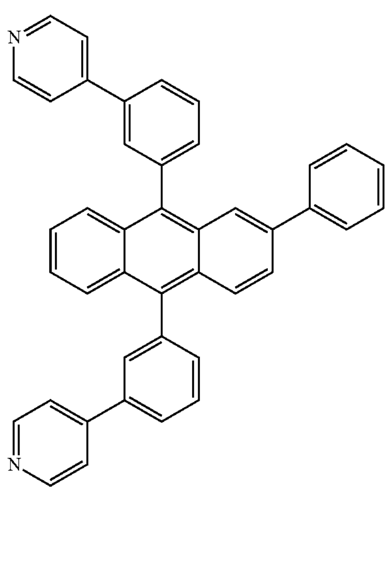
-continued
ET4
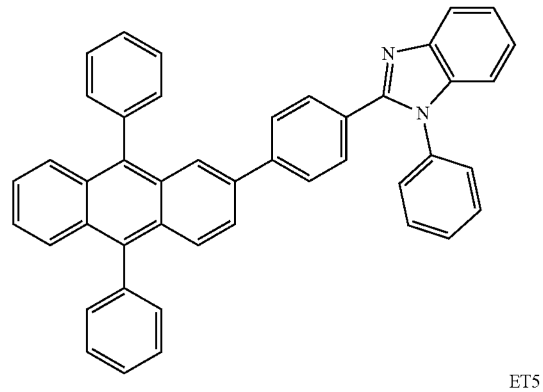
ET5
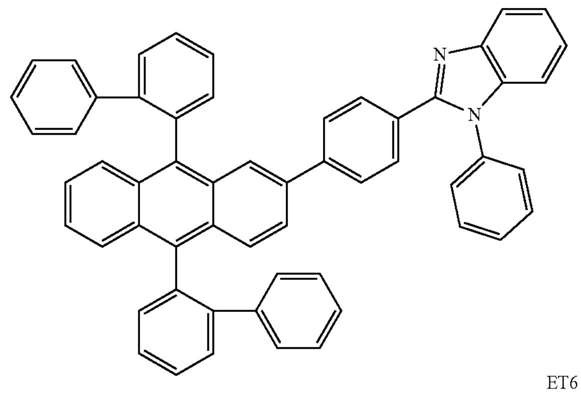
ET6
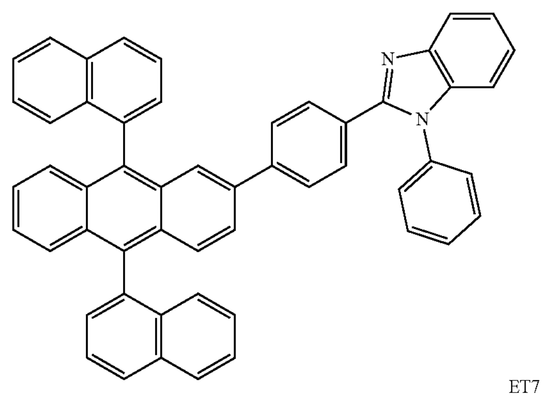
ET7
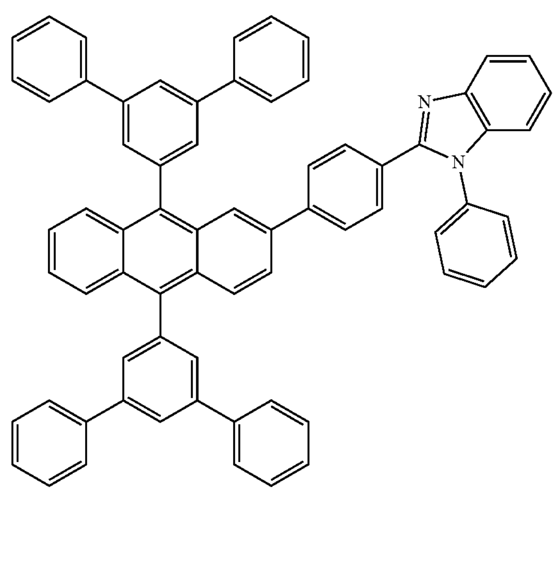

-continued
ET8
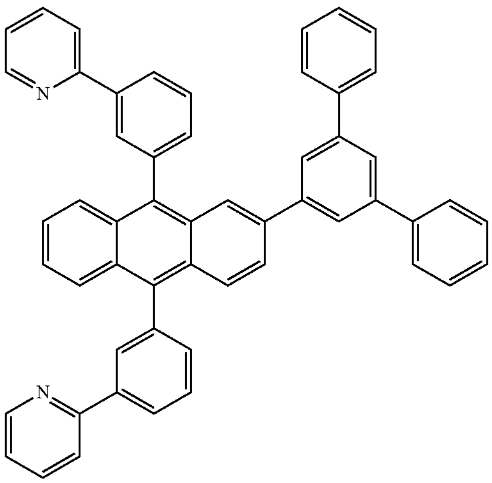
ET9
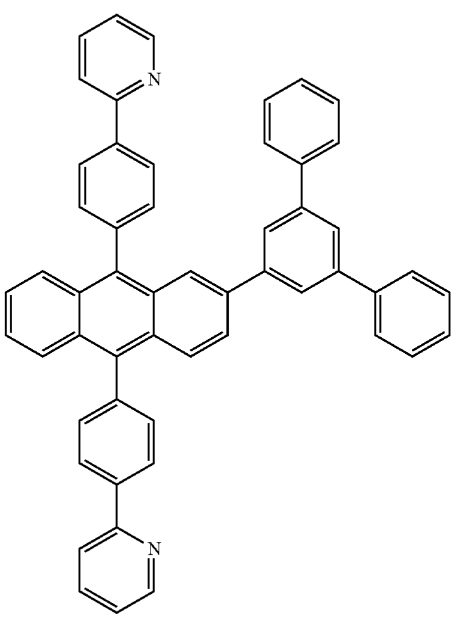
-continued
ET10
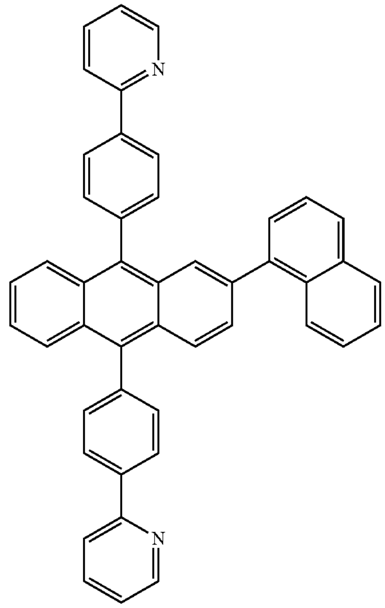
ET11
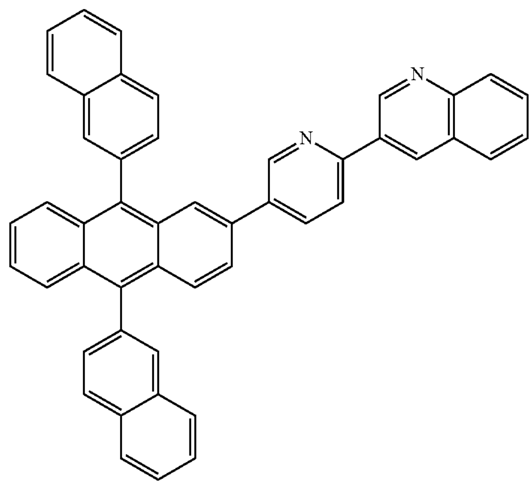
ET12
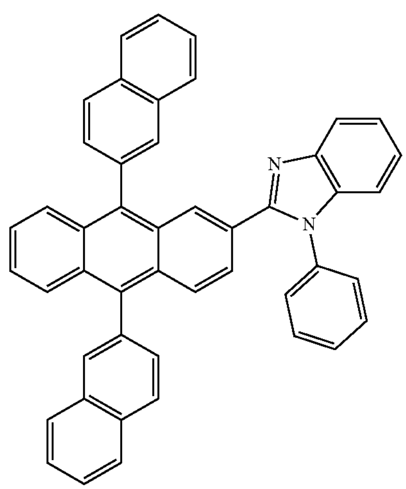

ET13
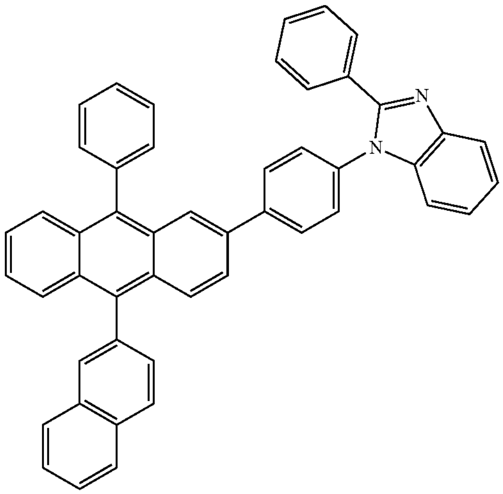
ET14
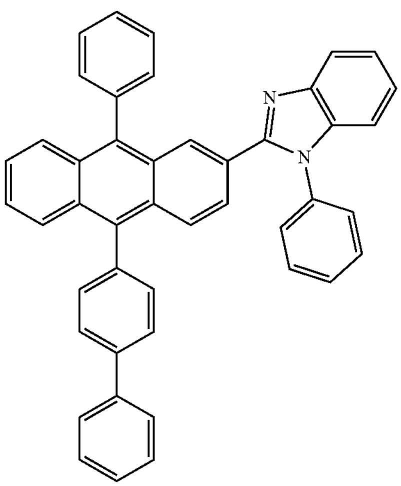
ET15
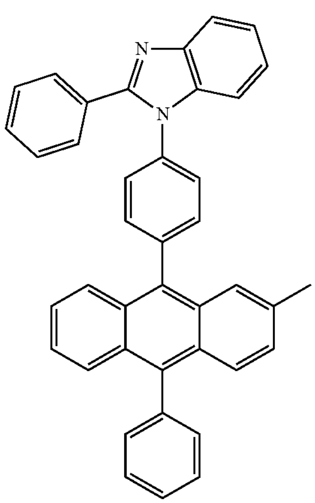
ET16
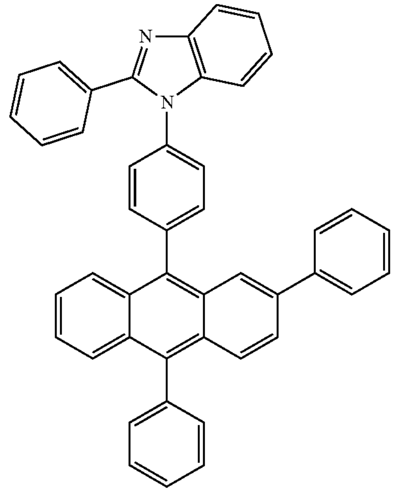
ET17
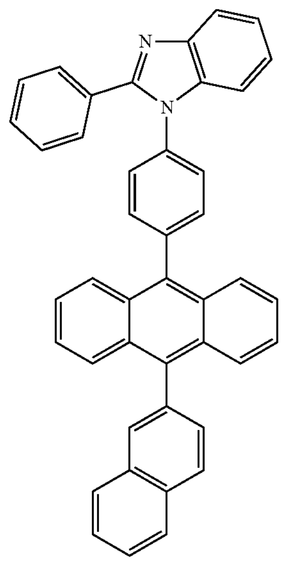
ET18
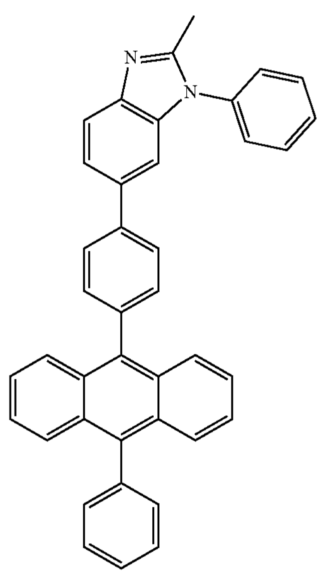

-continued
ET19
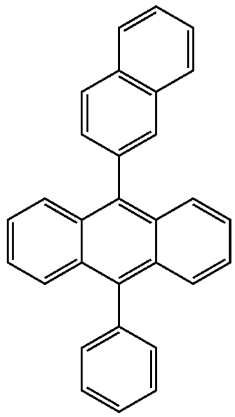
ET20
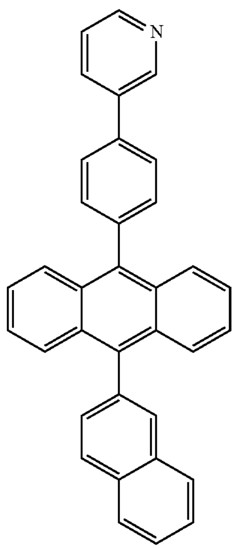
ET21
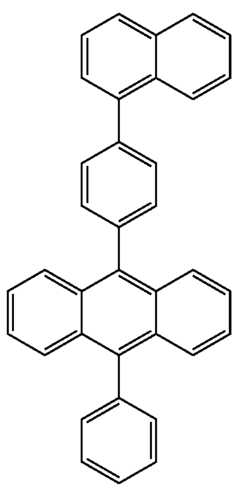
-continued
ET22
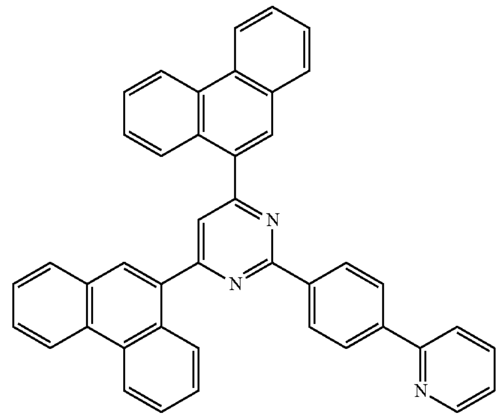
ET23
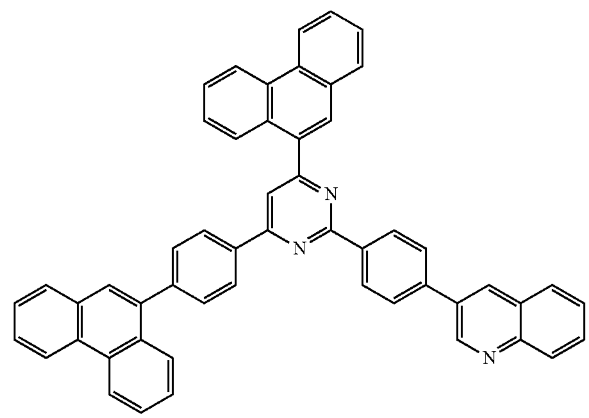
ET24
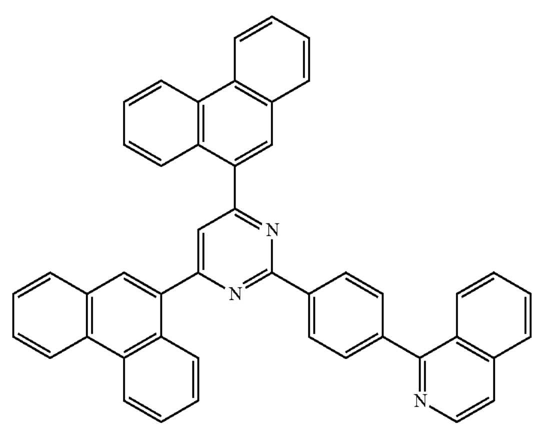

-continued
ET25
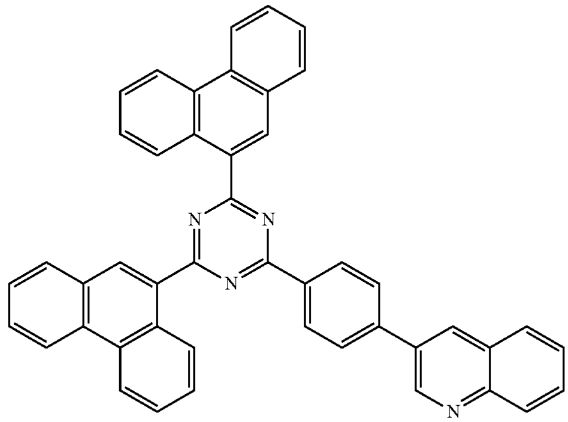
ET26
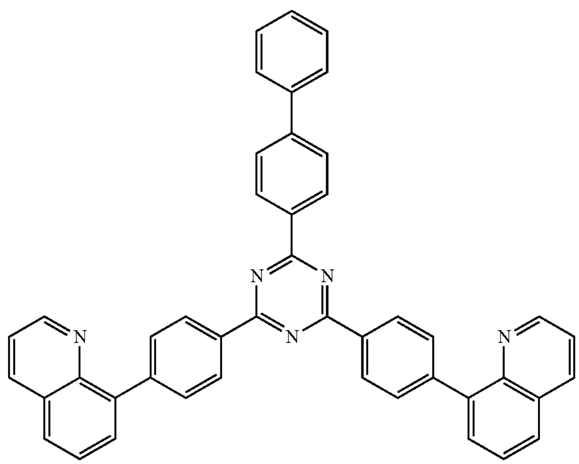
ET27
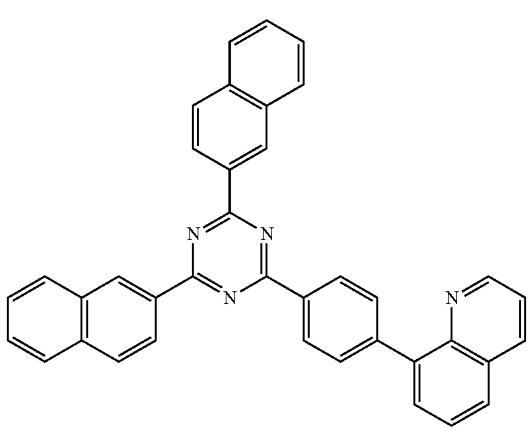
-continued
ET28
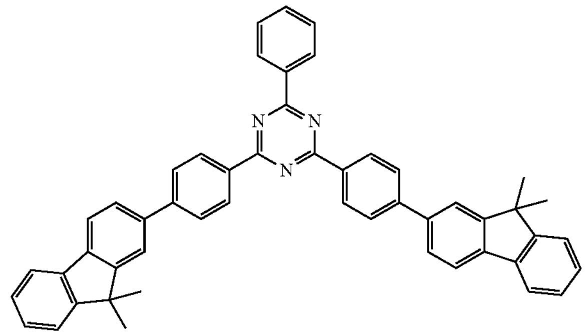
ET29
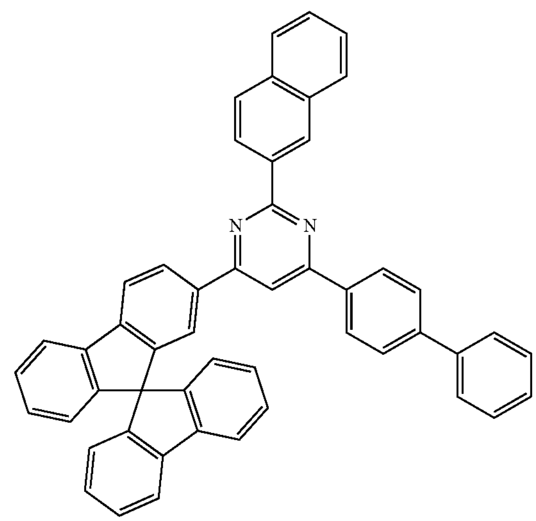
ET30
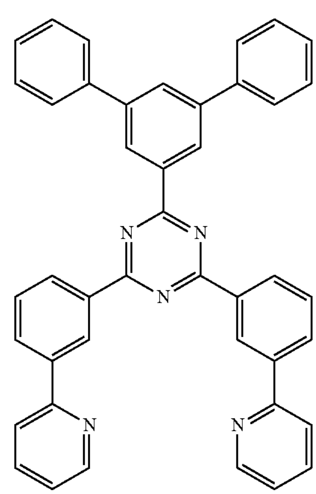

-continued
ET31
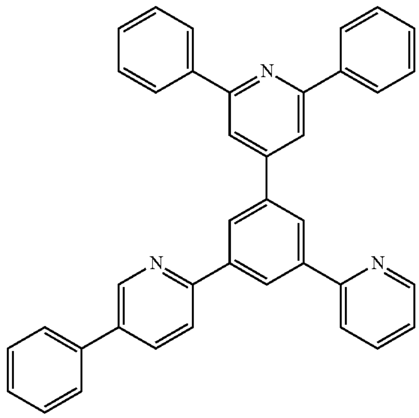
ET32
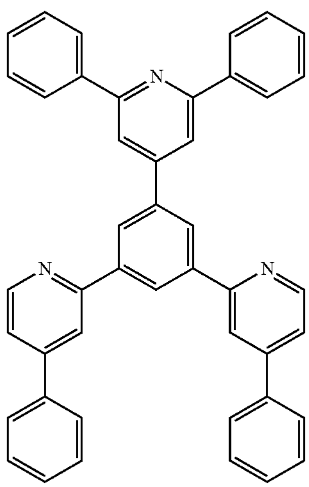
ET33
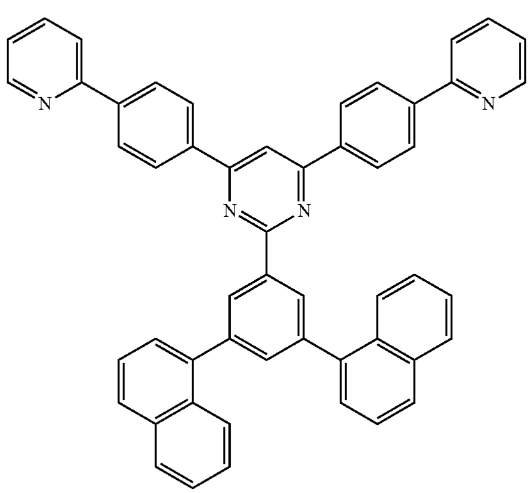
-continued
ET34
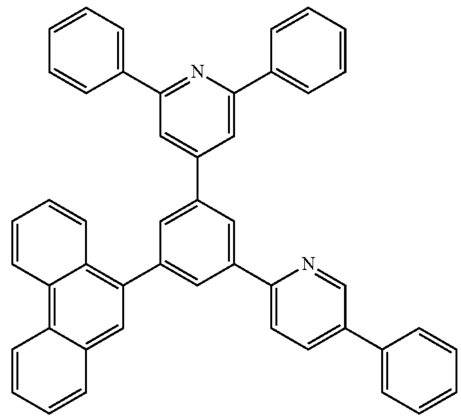
ET35
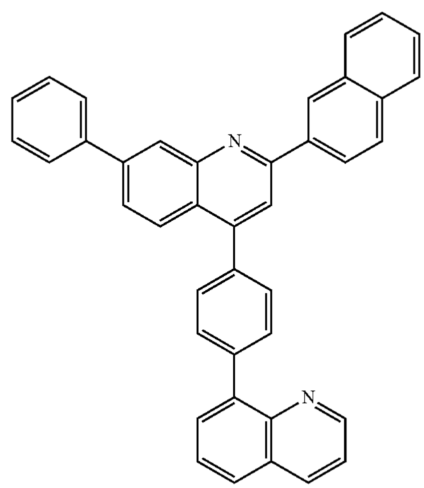
ET36
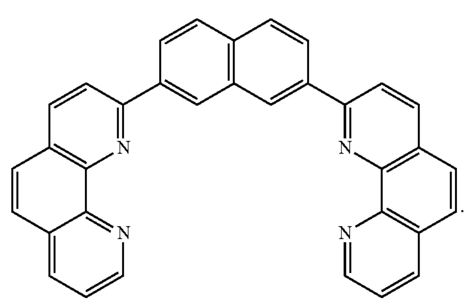
In one or more embodiments, the electron transport region may include at least one selected from 2,9-dimethyl-4,7-diphenyl-1,10-phenanthroline (BCP), 4,7-dphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), and NTAZ:

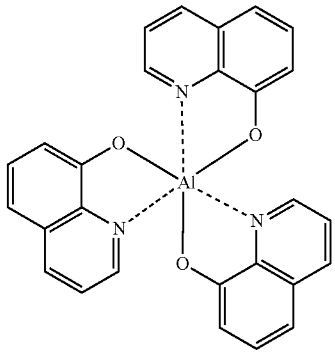

Alq3

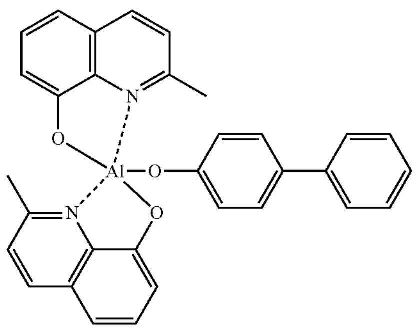

BAlq

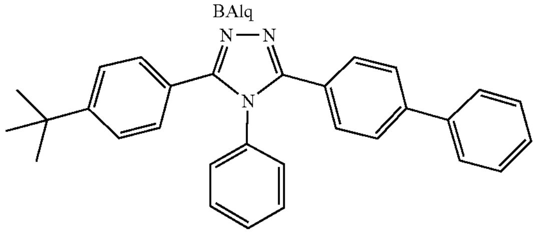

TAZ

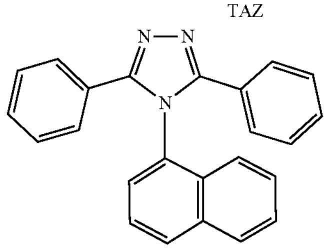

NTAZ

The thicknesses of the buffer layer, the hole blocking layer, and the electron control layer may each independently be in a range of about 20 Å to about 1,000 Å, and in some embodiments, about 30 Å to about 300 Å. When the thicknesses of the buffer layer, the hole blocking layer, and the electron control layer are each within any of these ranges, the electron transport region may have excellent (or suitable) electron blocking characteristics or electron control characteristics without a substantial increase in driving voltage.

The thickness of the electron transport layer may be in a range of about 100 Å to about 1,000 Å, and in some embodiments, about 150 Å to about 500 Å. When the thickness of the electron transport layer is within any of these ranges, the electron transport layer may have satisfactory (or suitable) electron transport characteristics without a substantial increase in driving voltage.

The electron transport region (e.g., the electron transport layer in the electron transport region) may further include, in addition to the materials described above, a metal-containing material.

The metal-containing material may include at least one selected from an alkali metal complex and an alkaline earth-metal complex. The alkali metal complex may include a metal ion selected from an Li ion, a Na ion, a K ion, a Rb ion, and a Cs ion. The alkaline earth-metal complex may include a metal ion selected from a Be ion, a Mg ion, a Ca ion, an Sr ion, and a Ba ion. Ligands respectively coordinated with the metal ion of the alkali metal complex and the alkaline earth-metal complex may each independently be selected from a hydroxyquinoline, a hydroxyisoquinoline, a hydroxybenzoquinoline, a hydroxyacridine, a hydroxyphenanthridine, a hydroxyphenyl oxazole, a hydroxyphenyl thiazole, a hydroxydiphenyl oxadiazole, a hydroxydiphenyl thiadiazole, a hydroxyphenyl pyridine, a hydroxyphenyl benzimidazole, a hydroxyphenyl benzothiazole, a bipyridine, a phenanthroline, and a cyclopentadiene, but embodiments are not limited thereto.

In some embodiments, the metal-containing material may include a Li complex. The Li complex may include, for example, Compound ET-D1 (lithium quinolate, LiQ) and/or Compound ET-D2:

ET-D1

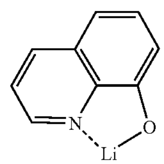

ET-D2

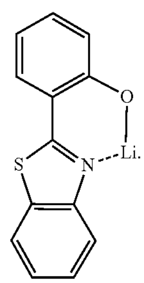

The electron transport region may include an electron injection layer that facilitates the injection of electrons from the second electrode 190. The electron injection layer may directly contact the second electrode 190.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth-metal, a rare-earth metal, an alkali metal compound, an alkaline earth-metal compound, a rare-earth metal compound, an alkali metal complex, an alkaline earth-metal complex, a rare-earth metal complex, or a combination thereof.

The alkali metal may be selected from Li, Na, K, Rb, and Cs. In one embodiment, the alkali metal may be selected from Li, Na, and Cs. In one or more embodiments, the alkali metal may be Li or Cs, but embodiments are not limited thereto.

The alkaline earth-metal may be selected from Mg, Ca, Sr, and Ba.

The rare-earth metal may be selected from Sc, Y, Ce, Tb, Yb, and Gd.

The alkali metal compound, the alkaline earth-metal compound, and the rare-earth metal compound may each independently be selected from oxides and halides (e.g., fluorides, chlorides, bromides, and/or iodines) of the alkali metal, the alkaline earth-metal, and the rare-earth metal, respectively.

For example, the alkali metal compound may be selected from alkali metal oxides (such as $Li_2O$, $Cs_2O$, and/or $K_2O$) and alkali metal halides (such as LiF, NaF, CsF, KF, LiI, NaI, CsI, KI, and/or RbI). In one embodiment, the alkali metal compound may be selected from LiF, $Li_2O$, NaF, LiI, NaI, CsI, KI, and RbI, but is not limited thereto.

The alkaline earth-metal compound may be selected from alkaline earth-metal compounds (such as $MgF_2$, BaO, SrO, CaO, $Ba_xSr_{1-x}O$ (wherein $0<x<1$), and/or $Ba_xCa_{1-x}O$ (wherein $0<x<1$)). In one embodiment, the alkaline earth-metal compound may be selected from BaO, SrO, and CaO, but embodiments are not limited thereto.

The rare-earth metal compound may be selected from $YbF_3$, $ScF_3$, $ScO_3$, $Y_2O_3$, $Ce_2O_3$, $GdF_3$, and $TbF_3$. In one embodiment, the rare-earth metal compound may be selected from $YbF_3$, $ScF_3$, $TbF_3$, $YbI_3$, $ScI_3$, and $TbI_3$, but embodiments are not limited thereto.

The alkali metal complex, the alkaline earth-metal complex, and the rare-earth metal complex may include an alkali metal ion, and alkaline earth-metal ion, and a rare-earth metal ion, respectively, as described above, and ligands respectively coordinated with the metal ion of the alkali metal complex, the alkaline earth-metal complex, and the rare-earth metal complex may each independently be selected from a hydroxyquinoline, a hydroxyisoquinoline, a hydroxybenzoquinoline, a hydroxyacridine, a hydroxyphenanthridine, a hydroxyphenyl oxazole, a hydroxyphenyl thiazole, a hydroxydiphenyl oxadiazole, a hydroxydiphenyl thiadiazole, a hydroxyphenyl pyridine, a hydroxyphenyl benzimidazole, a hydroxyphenyl benzothiazole, a bipyridine, a phenanthroline, and a cyclopentadiene, but embodiments are not limited thereto.

The electron injection layer may include an alkali metal, an alkaline earth-metal, a rare-earth metal, an alkali metal compound, an alkaline earth-metal compound, a rare-earth metal compound, an alkali metal complex, an alkaline earth-metal complex, a rare-earth metal complex, or a combination thereof, as described above. In one or more embodiments, the electron injection layer may further include an organic material. When the electron injection layer further includes an organic material; an alkali metal, an alkaline earth-metal, a rare-earth metal, an alkali metal compound, an alkaline earth-metal compound, a rare-earth metal compound, an alkali metal complex, an alkaline earth-metal complex, a rare-earth metal complex, or a combination thereof may be homogeneously or non-homogeneously dispersed in a matrix including the organic material.

The thickness of the electron injection layer may be in a range of about 1 Å to about 100 Å, and in some embodiments, about 3 Å to about 90 Å. When the thickness of the electron injection layer is within any of these ranges, the electron injection layer may have satisfactory (or suitable) electron injection characteristics without a substantial increase in driving voltage.

Second Electrode 190

The second electrode 190 may be disposed on the organic layer 150. The second electrode 190 may be a cathode, which is an electron injection electrode, and in this regard, the material for the second electrode 190 may be selected from a metal, an alloy, an electrically conductive compound, and a mixture thereof, which may have a relatively low work function.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments are not limited thereto. The second electrode 190 may be a transmissive electrode, a semi-transmissive electrode, or a reflective electrode.

The second electrode 190 may have a single-layered structure, or a multi-layered structure including two or more layers.

Figure 3:
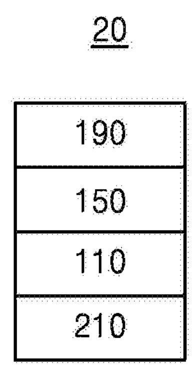
FIG. 3 is a schematic cross-sectional diagram of an organic light-emitting device according to one or more embodiments.
Figure 4:
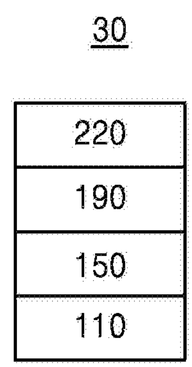
FIG. 4 is a schematic cross-sectional diagram of an organic light-emitting device according to one or more embodiments.
Figure 5:
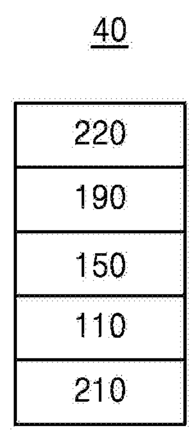
FIG. 5 is a schematic cross-sectional diagram of an organic light-emitting device according to one or more embodiments.

Description of FIGS. 3 to 5

An organic light-emitting device 20 illustrated in FIG. 3 includes a first capping layer 210, a first electrode 110, an organic layer 150, and a second electrode 190 which are sequentially stacked in this stated order. An organic light-emitting device 30 illustrated in FIG. 4 includes a first electrode 110, an organic layer 150, a second electrode 190, and a second capping layer 220 which are sequentially stacked in this stated order. An organic light-emitting device 40 illustrated in FIG. 5 includes a first capping layer 210, a first electrode 110, an organic layer 150, a second electrode 190, and a second capping layer 220 which are sequentially stacked in this stated order.

Regarding FIGS. 3 to 5, the first electrode 110, the organic layer 150, and the second electrode 190 may each independently be the same as those described above in connection with FIG. 2.

In the organic layer 150 of each of the organic light-emitting devices 20 and 40, light emitted from the emission layer may pass through the first electrode 110 (which may be a semi-transmissive electrode or a transmissive electrode), and through the first capping layer 210 toward the outside. In the organic layer 150 of each of the organic light-emitting devices 30 and 40, light emitted from the emission layer may pass through the second electrode 190 (which may be a semi-transmissive electrode or a transmissive electrode), and through the second capping layer 220 toward the outside.

The first capping layer 210 and the second capping layer 220 may increase external luminescent efficiency, based on the principle of constructive interference.

The first capping layer 210 and the second capping layer 220 may each independently be an organic capping layer including an organic material, an inorganic capping layer including an inorganic material, or a composite capping layer including an organic material and an inorganic material.

At least one selected from the first capping layer 210 and the second capping layer 220 may include at least one material selected from carbocyclic compounds, heterocyclic compounds, amine-based compounds, porphyrin derivatives, phthalocyanine derivatives, naphthalocyanine derivatives, alkali metal-based complexes, and alkaline earth-metal-based complexes. The carbocyclic compound, the heterocyclic compound, and the amine-based compound may each independently be optionally substituted with a substituent containing at least one element selected from O, N, S, Se, Si, F, Cl, Br, and I. In one embodiment, at least one selected from the first capping layer 210 and the second capping layer 220 may include an amine-based compound.

In one embodiment, at least one selected from the first capping layer 210 and the second capping layer 220 may include the compound represented by Formula 201 or the compound represented by Formula 202.

In one or more embodiments, at least one selected from the first capping layer 210 and the second capping layer 220 may include a compound selected from Compounds HT28 to HT33 and Compounds CP1 to CP5, but embodiments are not limited thereto:

CP1

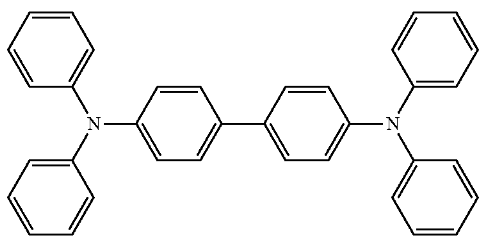

CP2

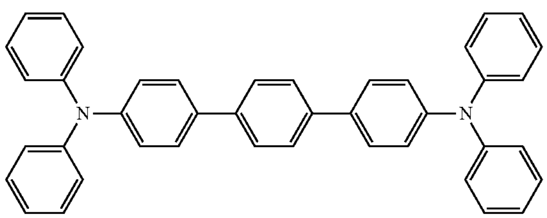

CP3

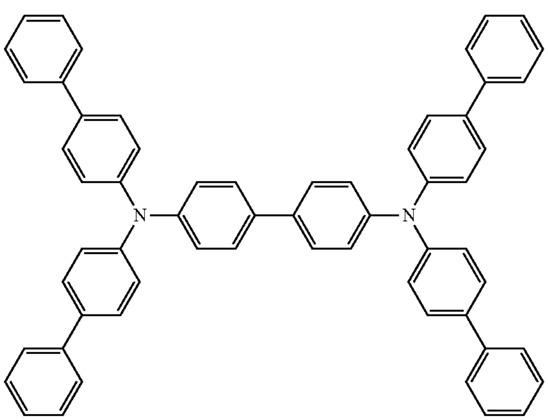

CP4

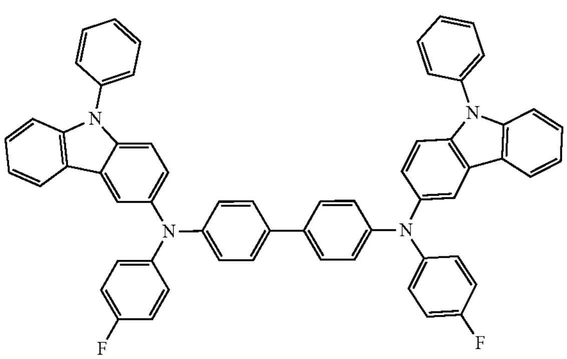

-continued

CP5

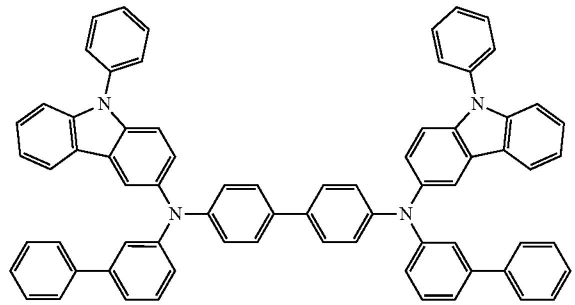

Hereinbefore, an organic light-emitting device according to one or more embodiment has been described in connection with FIGS. 2 to 5. However, embodiments are not limited thereto.

The layers constituting the hole transport region, the emission layer, and the layers constituting the electron transport region may each independently be formed in a respective region using one or more suitable methods such as vacuum deposition, spin coating, casting, Langmuir-Blodgett (LB) deposition, ink-jet printing, laser-printing, and/or laser-induced thermal imaging (LITI).

When the layers constituting the hole transport region, the emission layer, and the layers constituting the electron transport region are each independently formed by vacuum deposition, the vacuum deposition may be performed, for example, at a deposition temperature of about 100° C. to about 500° C., at a vacuum degree of about $10^{-8}$ torr to about $10^{-3}$ torr, and at a deposition rate of about 0.01 Angstroms per second (Å/sec) to about 100 Å/sec, depending on the compound to be included in each layer and the structure of each layer to be formed.

When the layers constituting the hole transport region, the emission layer, the and the layers constituting the electron transport region are each independently formed by spin coating, the spin coating may be performed, for example, at a coating rate of about 2,000 revolutions per minute (rpm) to about 5,000 rpm and at a heat treatment temperature of about 80° C. to 200° C., depending on the compound to be included in each layer and the structure of each layer to be formed.

General Definition of Substituents

The term "$C_1$-$C_{60}$ alkyl group" as used herein may refer to a linear or branched saturated aliphatic hydrocarbon monovalent group having 1 to 60 carbon atoms. Non-limiting examples thereof may include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group" as used herein may refer to a divalent group having the same structure as the $C_1$-$C_{60}$ alkyl group.

The term "$C_2$-$C_{60}$ alkenyl group" as used herein may refer to a hydrocarbon group having at least one carbon-carbon double bond at one or more positions along the hydrocarbon chain of the $C_2$-$C_{60}$ alkyl group (e.g., in the middle and/or at the terminus of the $C_2$-$C_{60}$ alkyl group). Non-limiting examples thereof may include an ethenyl group, a propenyl group, and a butenyl group. The term "$C_2$-$C_{60}$ alkenylene group" as used herein may refer to a divalent group having the same structure as the $C_2$-$C_{60}$ alkenyl group.

The term "$C_2$-$C_{60}$ alkynyl group" as used herein may refer to a hydrocarbon group having at least one carbon-carbon triple bond at one or more positions along the hydrocarbon chain of the $C_2$-$C_{60}$ alkyl group (e.g., in the middle and/or at the terminus of the $C_2$-$C_{60}$ alkyl group). Non-limiting examples thereof may include an ethynyl group and a propynyl group. The term "$C_2$-$C_{60}$ alkynylene group" as used herein may refer to a divalent group having the same structure as the $C_2$-$C_{60}$ alkynyl group.

The term "$C_1$-$C_{60}$ alkoxy group" as used herein may refer to a monovalent group represented by —$OA_{101}$ (wherein $A_{101}$ is the $C_1$-$C_{60}$ alkyl group). Non-limiting examples thereof may include a methoxy group, an ethoxy group, and an isopropoxy group.

The term "$C_3$-$C_{10}$ cycloalkyl group" as used herein may refer to a monovalent saturated hydrocarbon monocyclic group having 3 to 10 carbon atoms. Non-limiting examples thereof may include a cyclopropyl group, a cyclobutyl group, a cyclopentyl group, a cyclohexyl group, and a cycloheptyl group. The term "$C_3$-$C_{10}$ cycloalkylene group" as used herein may refer to a divalent group having the same structure as the $C_3$-$C_{10}$ cycloalkyl group.

The term "$C_1$-$C_{10}$ heterocycloalkyl group" as used herein may refer to a monovalent saturated monocyclic group having at least one heteroatom selected from N, O, Si, P, and S as a ring-forming atom and 1 to 10 carbon atoms. Non-limiting examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein may refer to a divalent group having the same structure as the $C_1$-$C_{10}$ heterocycloalkyl group.

The term "$C_3$-$C_{10}$ cycloalkenyl group" as used herein may refer to a monovalent monocyclic group that has 3 to 10 carbon atoms and at least one carbon-carbon double bond in its ring, and is not aromatic. Non-limiting examples thereof may include a cyclopentenyl group, a cyclohexenyl group, and a cycloheptenyl group. The term "$C_3$-$C_{10}$ cycloalkenylene group" as used herein may refer to a divalent group having the same structure as the $C_3$-$C_{10}$ cycloalkenyl group.

The term "$C_1$-$C_{10}$ heterocycloalkenyl group" as used herein may refer to a monovalent monocyclic group that has at least one heteroatom selected from N, O, Si, P, and S as a ring-forming atom, 1 to 10 carbon atoms, and at least one carbon-carbon double bond in its ring. Non-limiting examples of the $C_1$-$C_{10}$ heterocycloalkenyl group may include a 4,5-dihydro-1,2,3,4-oxatriazolylgroup, a 2,3-dihydrofuranyl group, and a 2,3-dihydrothiophenyl group. The term "$C_1$-$C_{10}$ heterocycloalkenylene group" as used herein may refer to a divalent group having the same structure as the $C_1$-$C_{10}$ heterocycloalkenyl group.

The term "$C_6$-$C_{60}$ aryl group" as used herein may refer to a monovalent group that has an aromatic system having 6 to 60 carbon atoms. The term "$C_6$-$C_{60}$ arylene group" as used herein may refer to a divalent group that has an aromatic system having 6 to 60 carbon atoms. Non-limiting examples of the $C_6$-$C_{60}$ aryl group may include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as used herein may refer to a monovalent group having an aromatic system that has at least one heteroatom selected from N, O, Si, P, and S as a ring-forming atom, in addition to 1 to 60 carbon atoms. The term "$C_1$-$C_{60}$ heteroarylene group" as used herein may refer to a divalent group having an aromatic system that has at least one heteroatom selected from N, O, Si, P, and S as a ring-forming atom, in addition to 1 to 60 carbon atoms. Non-limiting examples of the $C_1$-$C_{60}$ heteroaryl group may include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each independently include two or more rings, the respective rings may be fused.

The term "$C_6$-$C_{60}$ aryloxy group" as used herein may refer to a group represented by —$OA_{102}$ (wherein $A_{102}$ is the $C_6$-$C_{60}$ aryl group). The term "$C_6$-$C_{60}$ arylthio group" as used herein may refer to a group represented by —$SA_{103}$ (wherein $A_{103}$ is the $C_6$-$C_{60}$ aryl group).

The term "monovalent non-aromatic condensed polycyclic group" as used herein may refer to a monovalent group that has two or more rings condensed (e.g., fused) to each other and only carbon atoms (e.g., 8 to 60 carbon atoms) as ring-forming atoms, wherein the entire molecular structure is non-aromatic (e.g., the molecular structure does not have overall aromaticity). Non-limiting example of the monovalent non-aromatic condensed polycyclic group is a fluorenyl group. The term "divalent non-aromatic condensed polycyclic group" as used herein may refer to a divalent group having the same structure as the monovalent non-aromatic condensed polycyclic group.

The term "monovalent non-aromatic condensed heteropolycyclic group" as used herein may refer to a monovalent group that has two or more rings condensed (e.g., fused) to each other, at least one heteroatom selected from N, O, Si, P, and S, in addition to carbon atoms (e.g., 1 to 60 carbon atoms), as ring-forming atoms, wherein the entire molecular structure is non-aromatic (e.g., the molecular structure does not have overall aromaticity). Non-limiting example of the monovalent non-aromatic condensed heteropolycyclic group is a carbazolyl group. The term "divalent non-aromatic condensed heteropolycyclic group" as used herein may refer to a divalent group having the same structure as the monovalent non-aromatic condensed heteropolycyclic group.

The term "$C_5$-$C_{60}$ carbocyclic group" as used herein may refer to a monocyclic or polycyclic group having 5 to 60 carbon atoms only as ring-forming atoms. The $C_5$-$C_{60}$ carbocyclic group may be an aromatic carbocyclic group or a non-aromatic carbocyclic group. The term "$C_5$-$C_{60}$ carbocyclic group" as used herein may refer to a ring, such as a benzene group, a monovalent group (such as a phenyl group), or a divalent group (such as a phenylene group). In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein may refer to a group having substantially the same structure as a $C_5$-$C_{60}$ carbocyclic group, except that as a ring-forming atom, at least one heteroatom selected from N, O, Si, P, and S may be used in addition to carbon atoms (e.g., 1 to 60 carbon atoms).

In the present specification, at least one of substituent(s) of the substituted $C_5$-$C_{60}$ carbocyclic group, substituted $C_1$-$C_{60}$ heterocyclic group, substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from the group consisting of:

deuterium (~D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(C_{211})(C_{212})(Q_{13})$, —$N(Q_{11})(Q_{12})$, —$B(Q_{11})(Q_{12})$, —$C(=O)(Q_{11})$, —$S(=O)_2(Q_{11})$, and —$P(=O)(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —$C_1$, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, and —$P(=O)(Q_{21})(Q_{22})$; and —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, wherein $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

The term "Ph" as used herein may refer to a phenyl group. The term "Me" as used herein may refer to a methyl group. The term "Et" as used herein may refer to an ethyl group. The term "ter-Bu" or "But" as used herein may refer to a tert-butyl group. The term "OMe" as used herein may refer to a methoxy group. "D" as used herein may refer to deuterium.

The term "biphenyl group" as used herein may refer to a phenyl group substituted with a phenyl group. For example, the "biphenyl group" may be a substituted phenyl group having a $C_6$-$C_{60}$ aryl group as a substituent.

The term "terphenyl group" as used herein may refer to a phenyl group substituted with a biphenyl group. For example, the "terphenyl group" may be a substituted phenyl group having a $C_6$-$C_{60}$ aryl group substituted with a $C_6$-$C_{60}$ aryl group as a substituent.

The symbols * and *' used herein, unless defined otherwise, refer to a binding site to a neighboring atom in a corresponding formula.

Hereinafter a compound and an organic light-emitting device according to one or more embodiments will be described in more detail with reference to Synthesis Examples and Examples. The expression "B was used instead of A" used in describing Synthesis Examples may refer to a molar equivalent of A being identical to a molar equivalent of B.

EXAMPLES

Evaluation Example 1

The HOMO energy level, the LUMO energy level, and the lowest excited triplet energy level (T1) of the first compound, the second compound, the third compound, and the fourth compound that were used in the manufacture of organic light-emitting devices manufactured in Examples 1 to 9 and Comparative Examples 1 to 3 were measured according to the method described in Table 1. The measurement results are shown in Table 2.

TABLE 1

| | |
|---|---|
| HOMO energy level evaluation method | A potential (Volts, V) versus current (Amperes, A) graph of each compound was obtained by using cyclic voltammetry (CV) (electrolyte: 0.1 molar (M) $Bu_4NClO_4$/solvent: $CH_2Cl_2$/electrode: 3-electrode system (working electrode: GC, reference electrode: Ag/AgCl, auxiliary electrode: Pt)). Subsequently, from reduction onset of the graph, a HOMO energy level of the compound was calculated. |
| LUMO energy level evaluation method | Each compound was diluted with toluene at a concentration of $1 \times 10^{-4}$M, and a UV absorption spectrum thereof was measured at room temperature by using a Shimadzu UV-350 spectrometer. Then a LUMO energy level thereof was calculated by using an optical band gap (Eg) from an edge of the absorption spectrum. |
| T1 energy level evaluation method | A mixture of each compound, diluted with toluene at a concentration of about $1 \times 10^{-4}$M, was loaded into a quartz cell. Subsequently, the resultant quartz cell was loaded into liquid nitrogen (at T = 77K), a photoluminescence spectrum thereof was measured by using a device for measuring photoluminescence. The obtained spectrum was compared with a photoluminescence spectrum measured at room temperature, and peaks observed only at a low temperature were analyzed to calculate T1 energy levels. |

TABLE 2

| Energy level | LUMO (eV) | HOMO (eV) | T1 (eV) |
|---|---|---|---|
| B-125 | −2.28 | −5.65 | 2.68 |
| B-167 | −2.32 | −5.71 | 2.72 |
| E-165 | −2.25 | −5.72 | 2.76 |
| C-109 | −2.91 | −6.10 | 2.77 |
| C-124 | −2.75 | −6.02 | 2.79 |
| A-161 | −2.82 | −5.91 | 2.71 |
| F-101 | −2.35 | −5.64 | 2.58 |
| F-102 | −2.43 | −5.70 | 2.61 |
| F-103 | −2.41 | −5.72 | 2.62 |
| F-100 | −2.37 | −5.54 | 2.64 |
| PD26 | −2.69 | −5.09 | 2.39 |

Example 1

A glass substrate, on which an anode having a structure of ITO/Ag/ITO (70 Å/1,000 Å/70 Å) was deposited, was cut to a size of 50 mm×50 mm×0.4 mm, sonicated in isopropyl alcohol and water for 10 minutes, respectively, and cleaned by exposure to ultraviolet rays for 10 minutes, and then ozone. The glass substrate was then mounted on a vacuum-deposition device.

Compound HT28 was vacuum-deposited on the ITO glass substrate to form a hole injection layer having a thickness of about 700 Å. Subsequently, Compound NPB was vacuum-deposited on the hole injection layer to form a hole transport layer having a thickness of about 500 Å. Then, Compound F-101 (as a third compound) was vacuum-deposited on the hole transport layer to form a first layer (i.e., emission auxiliary layer) having a thickness of about 350 Å, thereby forming a hole transport region.

Compound B-125 (as a first compound and a host), C-109 (as a second compound and a host), and PD26 (as a fourth compound and a dopant) were co-deposited on the hole transport region at a weight ratio of about 50:50:10 to form an emission layer having a thickness of about 400 Å.

ET1 and LiQ were co-deposited at a weight ratio of about 1:1 on the emission layer to form an electron transport layer having a thickness of about 360 Å. Subsequently, MgAg (at a weight ratio of about 9:1) were vacuum-deposited on the electron transport layer to form a cathode having a thickness of about 120 Å, thereby completing the manufacture of an organic light-emitting device.

Examples 2 to 9 and Comparative Examples 1 to 3

Organic light-emitting devices were manufactured in the same (or substantially the same) manner as in Example 1, except that compounds listed in Table 3 were respectively used to form the emission layer and the emission auxiliary layer (i.e., the first layer).

Evaluation Example 2

The driving voltage, current density, efficiency, and lifespan of the organic light-emitting devices of Examples 1 to 9 and Comparative Examples 1 to 3 were evaluated using a Keithley 236 source-measure unit (SMU) and a PR650 luminance meter. The lifespan refers to the time that it took for the initial luminance of the organic light-emitting device to reduce to 97% of the initial luminance. The evaluation results are shown in Table 3.

TABLE 3

| | First compound | Second compound | First compound: Second compound (weight: weight) | Third compound | Driving voltage (V) | Current density (mA/cm$^2$) | Efficiency (cd/A) | Lifespan (hr) |
|---|---|---|---|---|---|---|---|---|
| Example 1 | B-125 | C-109 | 5:5 | F-101 | 4.2 | 10 | 96.4 | 151 |
| Example 2 | B-167 | D-124 | 5:5 | F-101 | 4.5 | 10 | 95.8 | 162 |
| Example 3 | E-165 | A-161 | 5:5 | F-101 | 4.3 | 10 | 97.1 | 157 |
| Example 4 | B-125 | C-109 | 5:5 | F-102 | 4.2 | 10 | 95.7 | 161 |
| Example 5 | B-167 | D-124 | 5:5 | F-102 | 4.4 | 10 | 94.9 | 158 |
| Example 6 | E-165 | A-161 | 5:5 | F-102 | 4.2 | 10 | 95.6 | 149 |
| Example 7 | B-125 | C-109 | 5:5 | F-103 | 4.1 | 10 | 96.3 | 148 |
| Example 8 | B-167 | D-124 | 5:5 | F-103 | 4.4 | 10 | 95.8 | 145 |
| Example 9 | E-165 | A-161 | 5:5 | F-103 | 4.2 | 10 | 95.2 | 153 |
| Comparative Example 1 | B-125 | C-109 | 5:5 | F-100 | 4.1 | 10 | 77.4 | 125 |
| Comparative Example 2 | B-167 | D-124 | 5:5 | F-100 | 4.4 | 10 | 79.2 | 118 |
| Comparative Example 3 | E-165 | A-161 | 5:5 | F-100 | 4.2 | 10 | 78.2 | 111 |

F-100

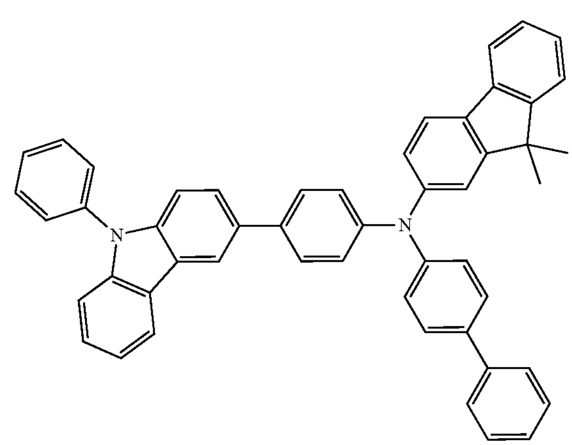

-continued

PD26

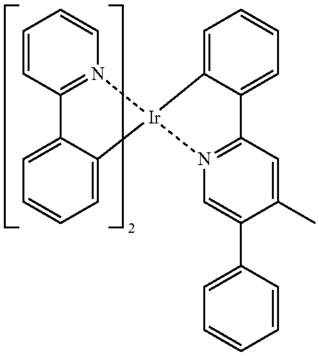

Referring to the results of Table 3, it was found that the organic light-emitting devices of Examples 1 to 9 exhibited excellent efficiency and lifespan, as compared with the organic light-emitting devices of Comparative Examples 1 to 3.

As described above, according to the one or more of the above embodiments, an organic light-emitting device may have high efficiency and long lifespan.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

It will be understood that when an element such as a layer, film, region, or substrate is referred to as being "on" another element, it can be directly on the other element or intervening elements may also be present. In contrast, when an element is referred to as being "directly on" or "directly contacting" another element, there are no intervening elements present.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments.

While one or more embodiments of the present disclosure have been described with reference to the figures, it will be understood by those of ordinary skill in the art that various changes in form and details may be made therein without departing from the spirit and scope of the present disclosure as defined by the following claims and equivalents thereof.

What is claimed is:

1. An organic light-emitting device comprising:

a first electrode;

a second electrode facing the first electrode; and an organic layer between the first electrode and the second electrode, the organic layer comprising an emission layer, wherein the organic layer comprises a first compound, a second compound, a third compound, and a fourth compound, and the first compound to the fourth compound satisfy Equations 1 to 8:

$$E_{1,LUMO} \geq E_{2,LUMO} + 0.15 \text{ electron volts (eV)} \quad \text{Equation 1}$$

$$E_{1,HOMO} \geq E_{2,HOMO} + 0.15 \text{ eV} \quad \text{Equation 2}$$

$$E_{1,T1} \geq E_{4,T1} \quad \text{Equation 3}$$

$$E_{2,T1} \geq E_{4,T1} \quad \text{Equation 4}$$

$$E_{3,T1} \geq E_{4,T1} \quad \text{Equation 5}$$

$$E_{3,LUMO} \geq E_{2,LUMO} + 0.1 \text{ eV} \quad \text{Equation 6}$$

$$-5.6 \text{ eV} \geq E_{3,HOMO} \quad \text{Equation 7}$$

$$E_{gap1} \geq E_{gap3}, \quad \text{Equation 8}$$

wherein, in Equations 1 to 8, $E_{1,LUMO}$ indicates a lowest unoccupied molecular orbital (LUMO) energy level of the first compound, $E_{2,LUMO}$ indicates a LUMO energy level of the second compound, $E_{3,LUMO}$ indicates a LUMO energy level of the third compound, $E_{1,HOMO}$ indicates a highest occupied molecular orbital (HOMO) energy level of the first compound, $E_{2,HOMO}$ indicates a HOMO energy level of the second compound, $E_{3,HOMO}$ indicates a HOMO energy level of the third compound, $E_{1,T1}$ indicates a lowest excited triplet energy level of the first compound, $E_{2,T1}$ indicates a lowest excited triplet energy level of the second compound, $E_{3,T1}$ indicates a lowest excited triplet energy level of the third compound, $E_{4,T1}$ indicates a lowest excited triplet energy level of the fourth compound, $E_{gap1}$ indicates a gap between the LUMO energy level of the first compound and the HOMO energy level of the first compound, and $E_{gap3}$ indicates a gap between the LUMO energy level of the third compound and the HOMO energy level of the third compound, wherein the third compound is represented by Formula 4:

Formula 4

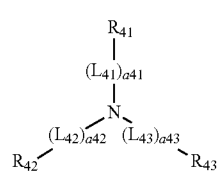

-continued

Formula 5

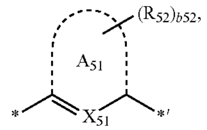

wherein, in Formulae 4 and 5, $A_{51}$ is selected from a benzene group, a naphthalene group, a fluorene group, a phenanthrene group, an anthracene group, a triphenylene group, a pyrene group, a chrysene group, a furan group, a thiophene group, a pyrrole group, a pyridine group, a pyrazine group, a pyrimidine group, a pyridazine group, a triazine group, a quinoline group, an isoquinoline group, a 2,6-naphthyridine group, a 1,8-naphthyridine group, a 1,5-naphthyridine group, a 1,6-naphthyridine group, a 1,7-naphthyridine group, a 2,7-naphthyridine group, a quinoxaline group, a quinazoline group, a benzofuran group, a benzothiophene group, a dibenzofuran group, a dibenzothiophene group, and a carbazole group $X_{51}$ is selected from N and $CR_{51}$, $L_{41}$ to $L_{43}$ are each independently selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a benzocarbazolylene group, and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, dibenzosilolylene group, a benzocarbazolylene group, and a dibenzocarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$, wherein $Q_{31}$ to $Q_{33}$ are each independently selected from hydrogen, a methyl group, an ethyl group, an n-propyl group, an iso-propyl group, a tert-butyl group, a phenyl group, a biphenyl group, and a terphenyl group, a41 to a43 are each independently selected from 0, 1, 2, 3, 4, and 5, at least one selected from $L_{41}$ to $L_{43}$ is a group represented by Formula 5, provided that $L_{41}$ to $L_{43}$ are not a carbazolylene group and are not a benzofluorenylene group, wherein when $L_{41}$ is a group represented by Formula 5, a41 is selected from 1, 2, 3, 4, and 5; when $L_{42}$ is a group represented by Formula 5, a42 is selected from 1, 2, 3, 4, and 5; and when $L_{43}$ is a group represented by Formula 5, a43 is selected from 1, 2, 3, 4, and 5, $R_{41}$ to $R_{43}$ are each independently a hole transporting group or an electron transporting group, provided that $R_{41}$ to $R_{43}$ are not a carbazolyl group and are not a benzofluorenyl group, $R_{51}$ and $R_{52}$ are each independently a hole transporting group, at least one selected from $R_{41}$ to $R_{43}$ is represented by one selected from Formula 4a and 4b:

4a

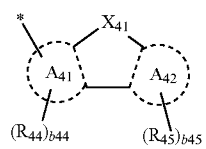

4b

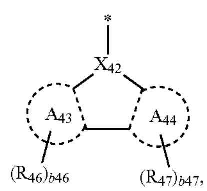

wherein, in Formulae 4a and 4b, $X_{41}$ is selected from $N(R_{401})$, $C(R_{401})(R_{402})$, $Si(R_{401})(R_{402})$, O, and S, $X_{42}$ is selected from N, $C(R_{403})$, and $Si(R_{403})$, $A_{41}$ to $A_{44}$ are each independently selected from a benzene group, a naphthalene group, a pyridine group, a pyrazine group, a pyrimidine group, a pyridazine group, a triazine group, a quinoline group, an isoquinoline group, a 2,6-naphthyridine group, a 1,8-naphthyridine group, a 1,5-naphthyridine group, a 1,6-naphthyridine group, a 1,7-naphthyridine group, a 2,7-naphthyridine group, a quinoxaline group, and a quinazoline group, descriptions of $R_{44}$ to $R_{47}$ and $R_{401}$ to $R_{403}$ are each independently the same as the descriptions provided below in connection with $Z_{11}$ to $Z_{14}$, $Z_{31}$ to $Z_{34}$, $Z_{41}$ to $Z_{44}$, and $Z_{51}$ to $Z_{56}$, b44 to b47 are each independently selected from 1, 2, 3, and 4, and $R_{401}$ and $R_{402}$ are optionally bound to form a saturated or unsaturated ring, wherein when $A_{41}$ and $A_{42}$ are both a benzene group, $X_{41}$ is selected from $C(R_{401})(R_{402})$, $Si(R_{401})(R_{402})$, O, and S, and when $A_{43}$ and $A_{44}$ are both a benzene group, $X_{42}$ is selected from $C(R_{403})$ and $Si(R_{403})$, and wherein when one of $A_{41}$ and $A_{42}$ is a benzene group, the other is not a naphthalene group, and when one of $A_{43}$ and $A_{44}$ is a benzene group, the other is not a naphthalene group, b52 is selected from 1, 2, 3, and 4, and

* indicates a binding site to an adjacent atom, and the first compound is represented by one of Formulae 1-1, 2-1, 2-2, and 3-1, and the second compound is represented by one of Formulae 1-2, 2-3, 2-4, and 3-2:

Formula 1-1

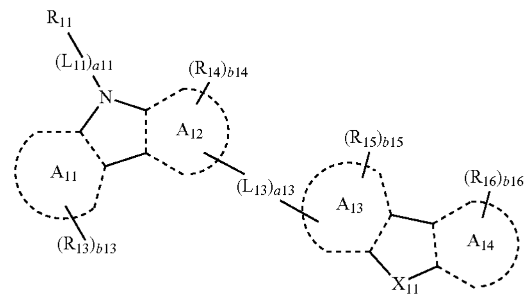

Formula 1-2

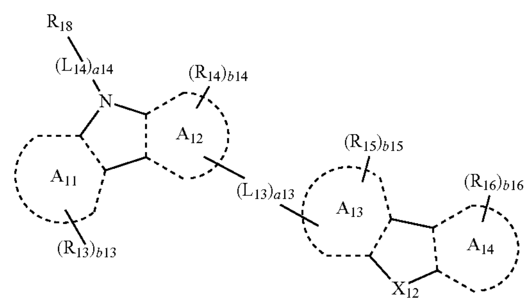

Formula 2-1

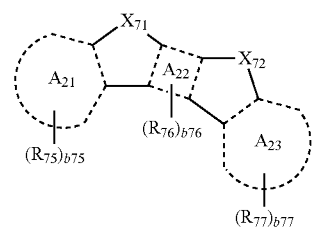

Formula 2-2

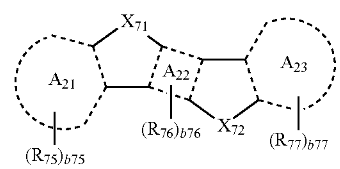

Formula 2-3

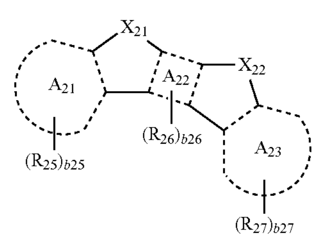

-continued

Formula 2-4

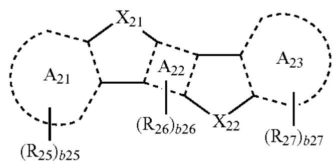

Formula 3-1

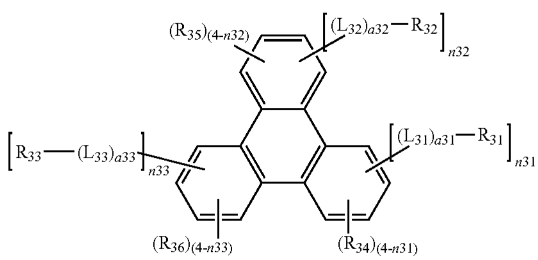

Formula 3-2

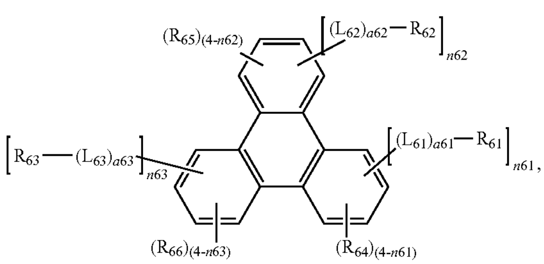

wherein, in Formulae 1-1, 1-2, 2-1 to 2-4, 3-1, and 3-2, $A_{11}$ to $A_{14}$ and $A_{21}$ to $A_{23}$, are each independently selected from a benzene group, a naphthalene group, a fluorene group, a phenanthrene group, an anthracene group, a triphenylene group, a pyrene group, a chrysene group, a furan group, a thiophene group, a pyrrole group, a pyridine group, a pyrazine group, a pyrimidine group, a pyridazine group, a triazine group, a quinoline group, an isoquinoline group, a 2,6-naphthyridine group, a 1,8-naphthyridine group, a 1,5-naphthyridine group, a 1,6-naphthyridine group, a 1,7-naphthyridine group, a 2,7-naphthyridine group, a quinoxaline group, a quinazoline group, a benzofuran group, a benzothiophene group, a dibenzofuran group, a dibenzothiophene group, and a carbazole group, $X_{11}$ is selected from O, S, $N[(L_{12})_{a12}\text{-}R_{12}]$, $C[(L_{12})_{a12}\text{-}R_{12}](R_{17})$, $Si[(L_{12})_{a12}\text{-}R_{12}](R_{17})$, $P[(L_{12})_{a12}\text{-}R_{12}]$, $B[(L_{12})_{a12}\text{-}R_{12}]$, and $P(=O)[(L_{12})_{a12}\text{-}R_{12}]$, $X_{12}$ is selected from O, S, $N[(L_{15})_{a15}\text{-}R_{19}]$, $C[(L_{15})_{a15}\text{-}R_{19}](R_{20})$, $Si[(L_{15})_{a15}\text{-}R_{19}](R_{20})$, $P[(L_{15})_{a15}\text{-}R_{19}]$, $B[(L_{15})_{a15}\text{-}R_{19}]$, and $P(=O)[(L_{15})_{a15}\text{-}R_{19}]$, $X_{21}$ is selected from $N[(L_{21})_{a21}\text{-}R_{21}]$, $C[(L_{21})_{a21}\text{-}R_{21}](R_{23})$, O, and S, $X_{22}$ is selected from $N[(L_{22})_{a22}\text{-}R_{22}]$, $C[(L_{22})_{a22}\text{-}R_{22}](R_{24})$, O, and S, $X_{71}$ is selected from $N[(L_{71})_{a71}\text{-}R_{71}]$, $C[(L_{71})_{a71}\text{-}R_{71}](R_{73})$, O, and S, $X_{72}$ is selected from $N[(L_{72})_{a72}\text{-}R_{72}]$, $C[(L_{72})_{a72}\text{-}R_{72}](R_{74})$, O, and S, $R_{12}$ and $R_{17}$ are optionally bound to form a saturated or unsaturated ring, $R_{19}$ and $R_{20}$ are optionally bound to form a saturated or unsaturated ring, $L_{11}$ to $L_{13}$, $L_{31}$ to $L_{33}$, $L_{71}$, and $L_{72}$ are each independently selected from the group consisting of:

a phenylene group, a naphthylene group, a fluorenylene group, a spiro-bifluorenylene group, a benzofluorenylene group, a dibenzofluorenylene group, a phenanthrenylene group, an anthracenylene group, a triphenylenylene group, a thiophenylene group, a furanylene group, a carbazolylene group, a benzofuranylene group, a benzothiophenylene group, a dibenzofuranylene group, a dibenzothiophenylene group, a dibenzosilolylene group, a benzocarbazolylene group, and a dibenzocarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a triphenylenylene group, a thiophenylene group, a furanylene group, a carbazolylene group, a benzofuranylene group, a benzothiophenylene group, a dibenzofuranylene group, a dibenzothiophenylene group, a dibenzosilolylene group, a benzocarbazolylene group, and a dibenzocarbazolylene group, each substituted with at least one selected from deuterium, —F, a cyano group, a methyl group, an ethyl group, an n-propyl group, an iso-propyl group, an n-butyl group, a sec-butyl group, an iso-butyl group, a tert-butyl group, a methoxy group, an ethoxy group, an n-propoxy group, an iso-propoxy group, an n-butoxy group, a sec-butoxy group, an iso-butoxy group, a tert-butoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a thiophenyl group, a furanyl group, a carbazolyl group, a benzofuranyl group, a benzothiophenyl group, a dibenzofuranyl group, a dibenzothiophenyl group, a dibenzosilolyl group, a benzocarbazolyl group, a dibenzocarbazolyl group, $—N(Q_{31})(Q_{32})$, $—Si(Q_{31})(Q_{32})(Q_{33})$, and $—B(Q_{31})(Q_{32})$, and $L_{14}$, $L_{15}$, $L_{21}$, $L_{22}$, and $L_{61}$ to $L_{63}$ are each independently selected from the group consisting of:

a phenylene group, a naphthylene group, a fluorenylene group, a spiro-bifluorenylene group, a benzofluorenylene group, a dibenzofluorenylene group, a phenanthrenylene group, an anthracenylene group, a triphenylenylene group, a thiophenylene group, a furanylene group, a pyridinylene group, a pyrazinylene group, a pyrimidinylene group, a pyridazinylene group, a triazinylene group, a carbazolylene group, a benzofuranylene group, a benzothiophenylene group, a dibenzofuranylene group, a dibenzothiophenylene group, a dibenzosilolylene group, a benzocarbazolylene group, and a dibenzocarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a triphenylenylene group, a thiophenylene group, a furanylene group, a pyridinylene group, a pyrazinylene group, a pyrimidinylene group, a pyridazinylene group, a triazinylene group, a carbazolylene group, a benzofuranylene group, a benzothiophenylene group, a dibenzofuranylene group, a dibenzothiophenylene group, a dibenzosilolylene group, a benzocarbazolylene group, and a dibenzocarbazolylene group, each substituted with at least one selected from deuterium, —F, a cyano group, a methyl group, an ethyl group, an n-propyl group, an iso-propyl group, an n-butyl group, a sec-butyl group, an iso-butyl group, a tert-butyl group, a methoxy group, an ethoxy group, an n-propoxy group, an iso-propoxy group, an n-butoxy group, a sec-butoxy group, an iso-butoxy group, a tert-butoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a thiophenyl group, a furanyl group, a pyridinyl group, a pyrazinyl group, a pyrimidinyl group, a pyridazinyl group, a triazinyl group, a carbazolyl group, a benzofuranyl group, a benzothiophenyl group, a dibenzofuranyl group, a dibenzothiophenyl group, a dibenzosilolyl group, a benzocarbazolyl group, a dibenzocarbazolyl group, $—N(Q_{31})(Q_{32})$, $—Si(Q_{31})(Q_{32})(Q_{33})$, and $—B(Q_{31})(Q_{32})$, wherein $Q_{31}$ to $Q_{33}$ are each independently selected from a methyl group, an ethyl group, an n-propyl group, an iso-propyl group, an n-butyl group, a sec-butyl group, an iso-butyl group, a tert-butyl group, a phenyl group, a biphenyl group, a terphenyl group, and a naphthyl group, a11 to a15, a21, a22, a31 to a33, a61 to a63, a71, and a72 are each independently selected from 0, 1, 2, 3, 4, and 5, $R_{11}$ to $R_{17}$, $R_{31}$ to $R_{36}$, and $R_{71}$ to $R_{77}$ are each independently a hole transporting group, $R_{18}$ to $R_{27}$ and $R_{61}$ to $R_{66}$ are each independently a hole transporting group or an electron transporting group, b13 to b16, b25 to b27, b43 to b48, and b75 to b77 are each independently selected from 1, 2, 3, and 4, n31 to n33 and n61 to n63 are each independently selected from 0, 1, 2, 3, and 4,

* indicates a binding site to an adjacent atom, wherein the hole transporting group is selected from a $C_1$-$C_{20}$ alkyl group, $—Si(Q_1)(Q_2)(Q_3)$, $—N(Q_1)(Q_2)$, and a group represented by any of Formulae 5-1 to 5-19:

5-1

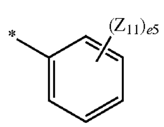

5-2

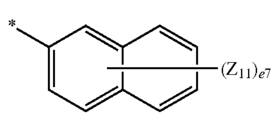

5-3

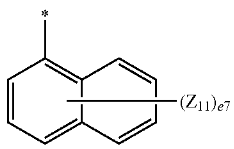

5-4

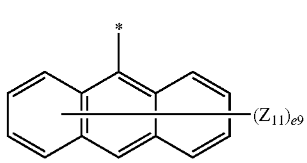

-continued 5-5

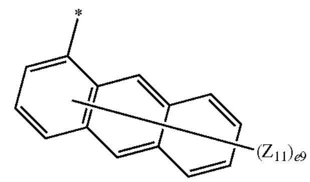

5-6

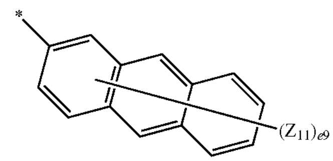

5-7

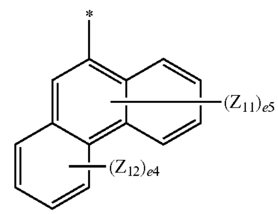

5-8

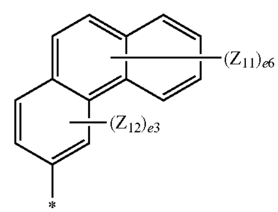

5-9

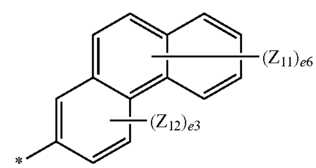

5-10

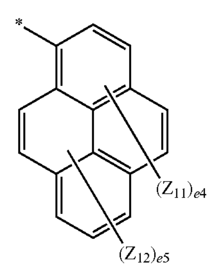

5-11

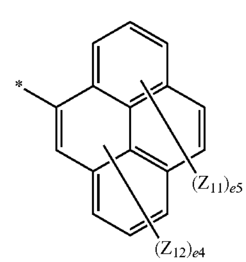

-continued 5-12

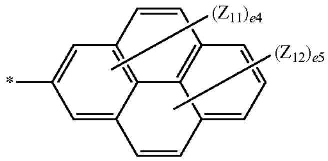

5-13

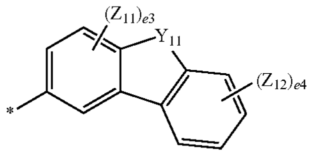

5-14

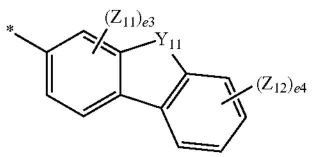

5-15

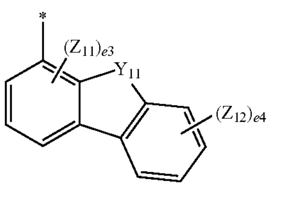

5-16

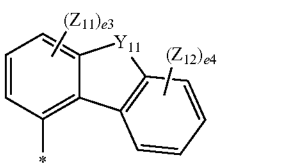

5-17

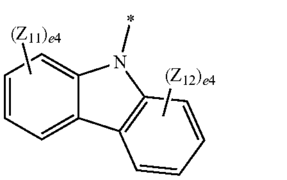

5-18

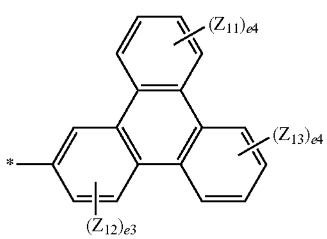

5-19

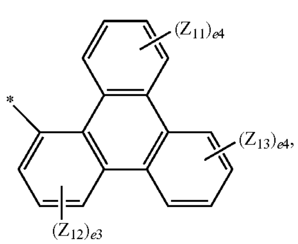

wherein, in Formulae 5-1 to 5-19, $Y_{11}$ is selected from O, S, $C(Z_{13})(Z_{14})$, $N(Z_{13})$, and $Si(Z_{13})(Z_{14})$, $Z_{11}$ to $Z_{14}$ are each independently selected from the group consisting of:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a benzofuranyl group, a benzothiophenyl group, a benzosilolyl group, an isobenzothiazolyl group, a dibenzofuranyl group, a dibenzothiophenyl group, a dibenzosilolyl group, a carbazolyl group, a benzocarbazolyl group, a dibenzocarbazolyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$; and a phenyl group, a biphenyl group, a terphenyl group, a naphthyl group, a dibenzofuranyl group, a dibenzothiophenyl group, a dibenzosilolyl group, a carbazolyl group, a benzocarbazolyl group, and a dibenzocarbazolyl group, each substituted with at least one selected from a $C_1$-$C_{20}$ alkyl group, a $C_1$-$C_{20}$ alkoxy group, a phenyl group, a biphenyl group, a terphenyl group, a naphthyl group, a carbazolyl group, a fluorenyl group, $—Si(Q_{21})(Q_{22})(Q_{23})$, and $—N(Q_{21})(Q_{22})$, wherein $Q_1$ to $Q_3$, $Q_{21}$ to $Q_{23}$, and $Q_{31}$ to $Q_{33}$ are each independently selected from a $C_1$-$C_{10}$ alkyl group, a $C_1$-$C_{10}$ alkoxy group, a phenyl group, a biphenyl group, a terphenyl group, and a naphthyl group, e2 is an integer selected from 1 and 2, e3 is an integer selected from 1 to 3, e4 is an integer selected from 1 to 4, e5 is an integer selected from 1 to 5, e6 is an integer selected from 1 to 6, e7 is an integer selected from 1 to 7, e9 is an integer selected from 1 to 9, and

* indicates a binding site to an adjacent atom, and the electron transporting group is selected from —CN, $—CF_3$, and a group represented by any of Formulae 6-1 to 6-128:

6-1

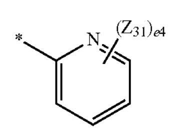

6-2

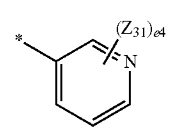

6-3

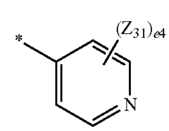

-continued
6-4
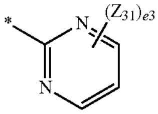
6-5
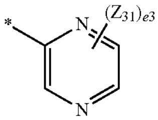
6-6
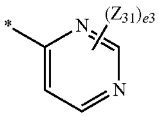
6-7
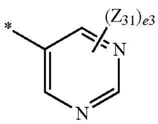
6-8
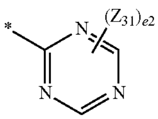
6-9
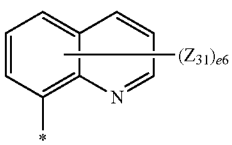
6-10
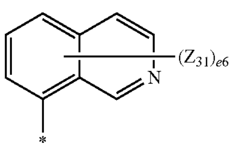
6-11
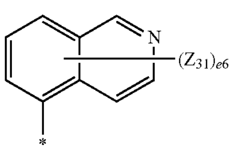
6-12
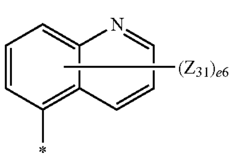
6-13
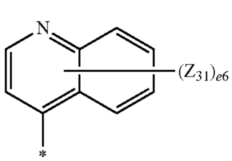
6-14
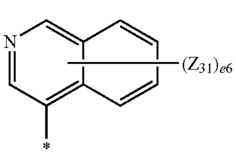
-continued
6-15
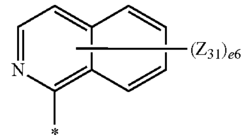
6-16
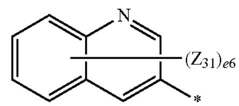
6-17
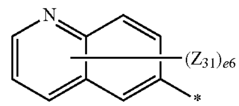
6-18
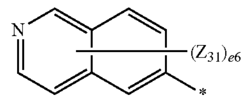
6-19
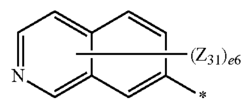
6-20
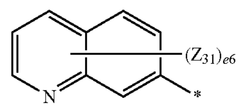
6-21
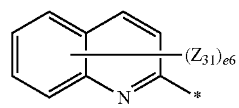
6-22
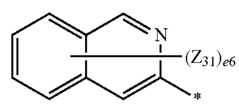
6-23
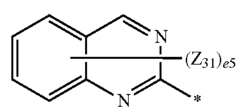
6-24
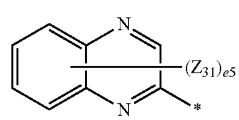
6-25
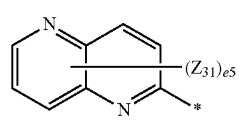
6-26
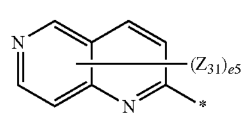
6-27
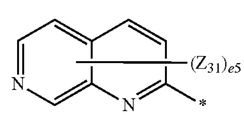

-continued
6-28
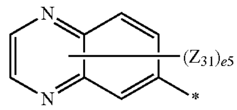
6-29
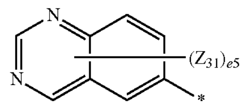
6-30
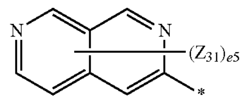
6-31
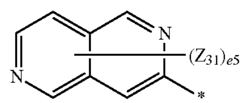
6-32
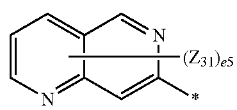
6-33
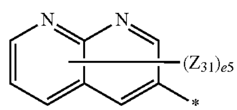
6-34
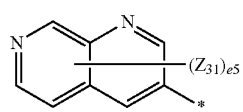
6-35
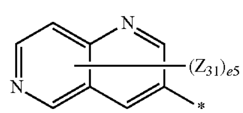
6-36
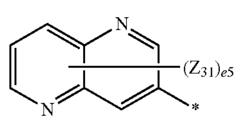
6-37
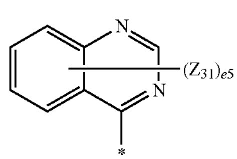
6-38
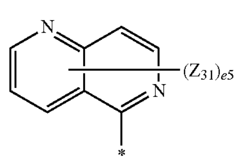
6-39
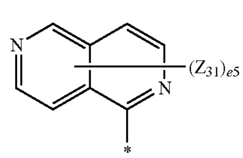
-continued
6-40
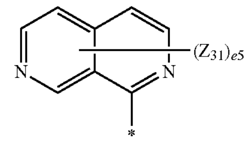
6-41
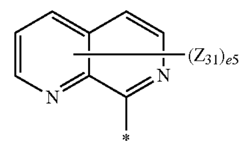
6-42
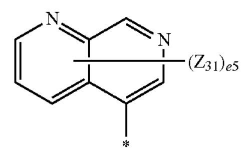
6-43
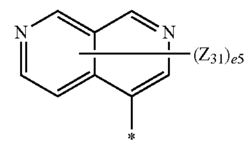
6-44
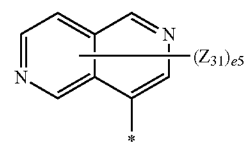
6-45
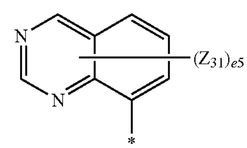
6-46
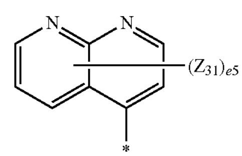
6-47
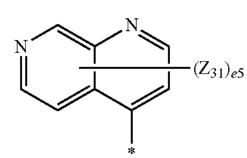
6-48
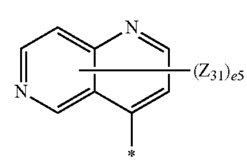
6-49
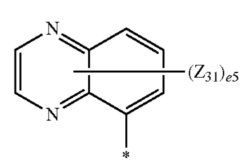

6-50
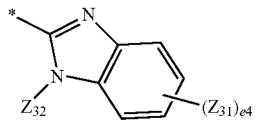
6-51
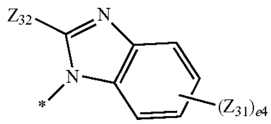
6-52
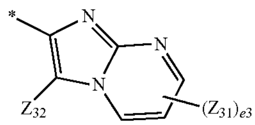
6-53
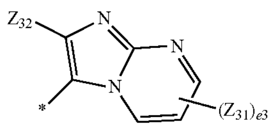
6-54
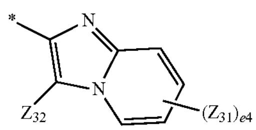
6-55
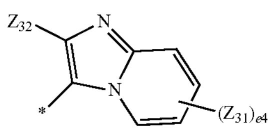
6-56
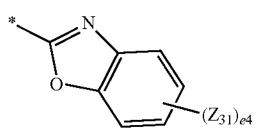
6-57
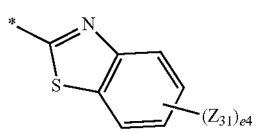
6-58
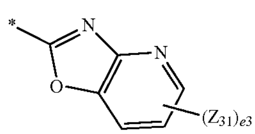
6-59
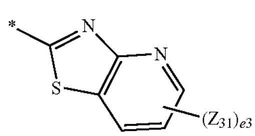
6-60
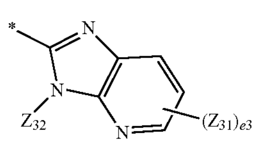
6-61
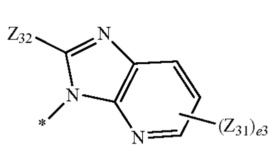
6-62
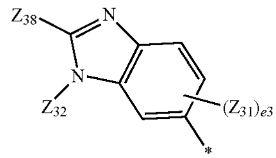
6-63
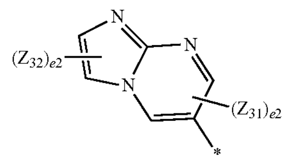
6-64
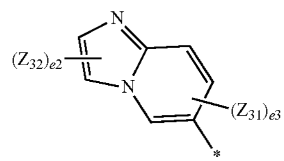
6-65
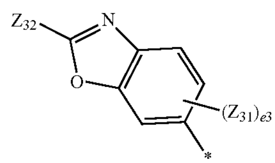
6-66
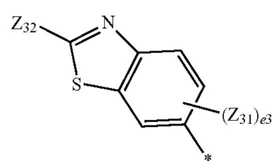
6-67
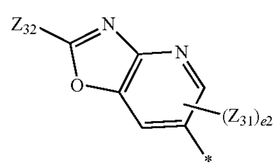
6-68
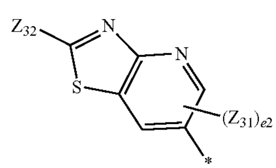
6-69
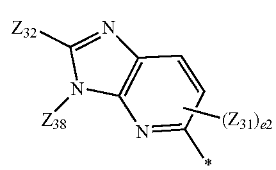
6-70
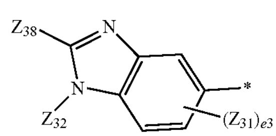
6-71
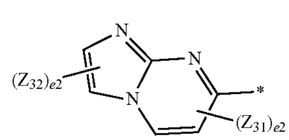

-continued
6-72
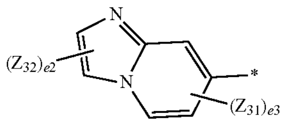
6-73
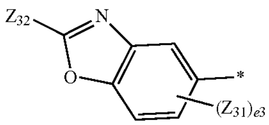
6-74
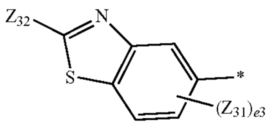
6-75
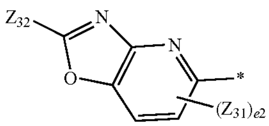
6-76
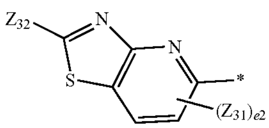
6-77
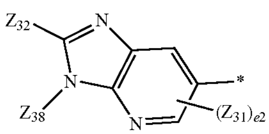
6-78
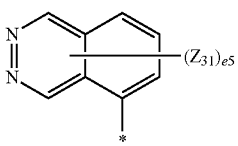
6-79
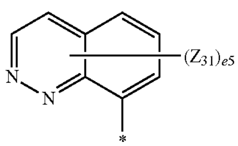
6-80
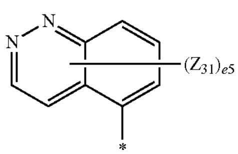
6-81
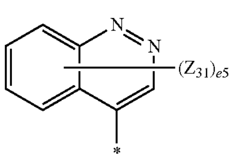
6-82
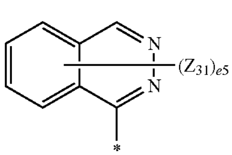
-continued
6-83
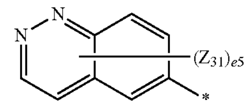
6-84
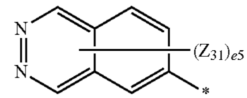
6-85
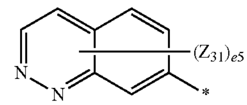
6-86
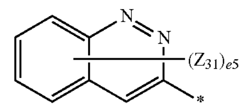
6-87
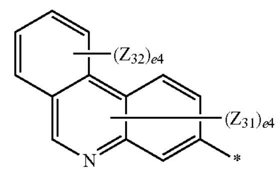
6-88
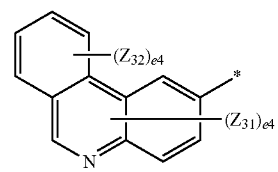
6-89
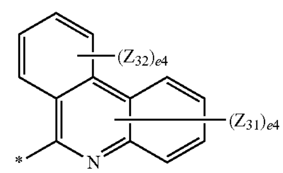
6-90
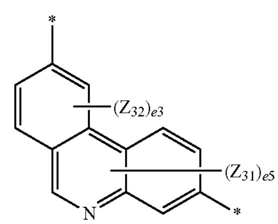
6-91
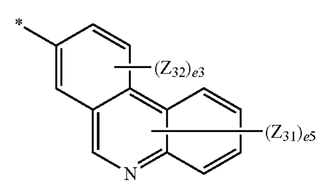
6-92
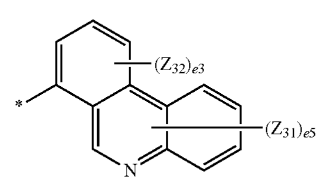

-continued
6-93
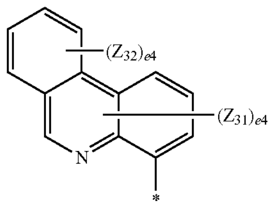
6-94
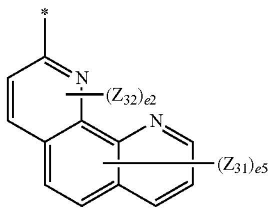
6-95
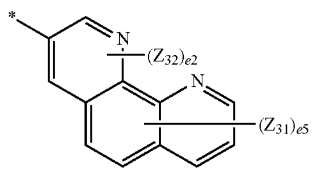
6-96
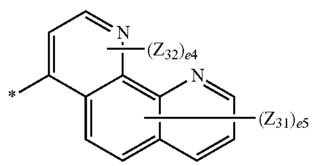
6-97
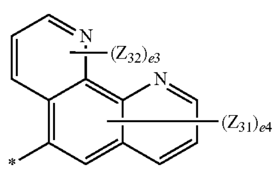
6-98
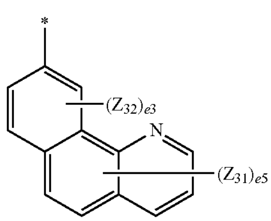
6-99
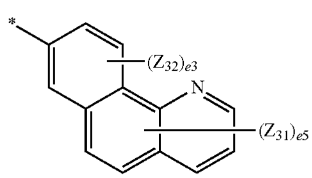
6-100
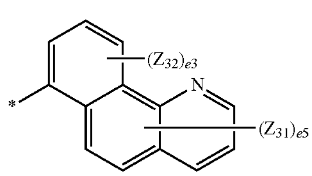
-continued
6-101
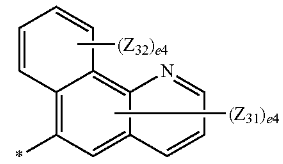
6-102
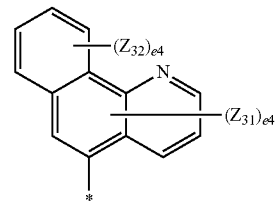
6-103
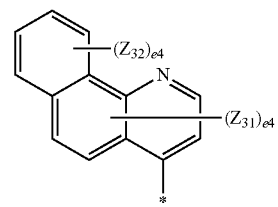
6-104
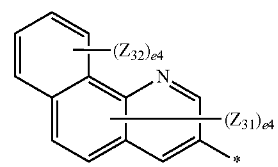
6-105
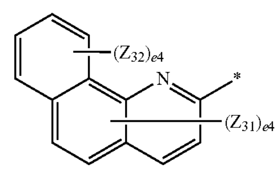
6-106
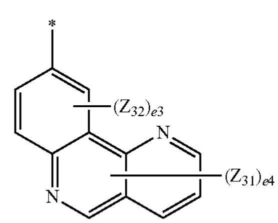
6-107
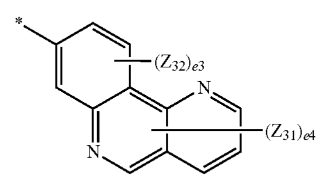
6-108
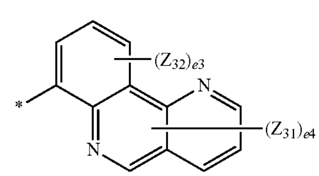

-continued
6-109
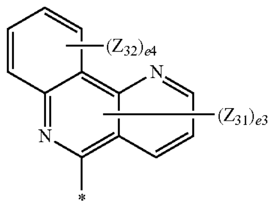
6-110
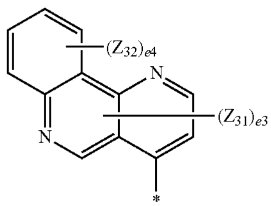
6-111
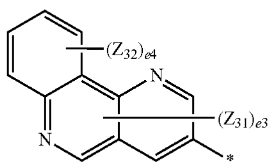
6-112
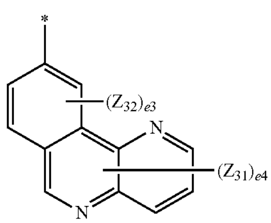
6-113
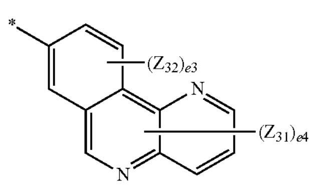
6-114
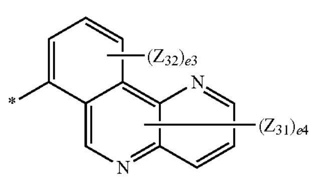
6-115
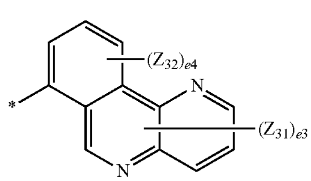
6-116
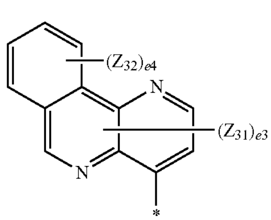
-continued
6-117
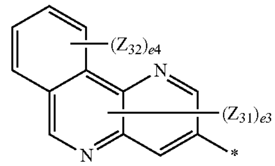
6-118
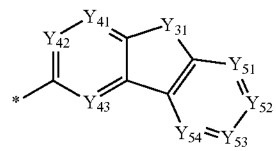
6-119
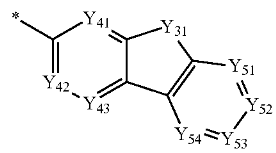
6-120
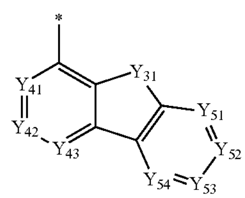
6-121
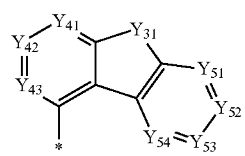
6-122
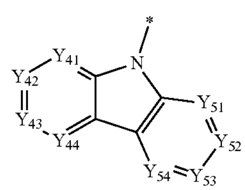
6-123
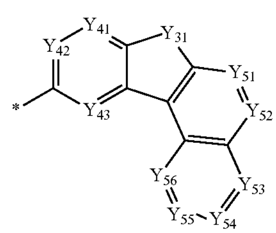
6-124
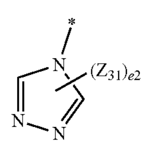
6-125
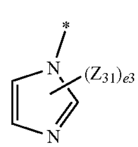

-continued 6-126

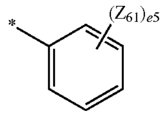

6-127

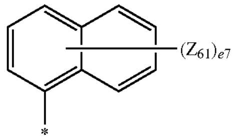

6-128

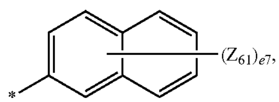

wherein, in Formulae 6-1 to 6-128, $Y_{31}$ is selected from O, S, $C(Z_{33})(Z_{34})$, $N(Z_{33})$, and $Si(Z_{33})(Z_{34})$, $Y_{41}$ is N or $C(Z_{41})$, $Y_{42}$ is N or $C(Z_{42})$, $Y_{43}$ is N or $C(Z_{43})$, $Y_{44}$ is N or $C(Z_{44})$, $Y_{51}$ is N or $C(Z_{51})$, $Y_{52}$ is N or $C(Z_{52})$, $Y_{53}$ is N or $C(Z_{53})$, $Y_{54}$ is N or $C(Z_{54})$, $Y_{55}$ is N or $C(Z_{55})$, $Y_{56}$ is N or $C(Z_{56})$, at least one selected from $Y_{41}$ to $Y_{43}$ and $Y_{51}$ to $Y_{54}$ in Formulae 6-118 to 6-121 is N, at least one selected from $Y_{41}$ to $Y_{44}$ and $Y_{51}$ to $Y_{54}$ in Formula 6-122 is N, at least one selected from $Y_{41}$ to $Y_{43}$ and $Y_{51}$ to $Y_{56}$ in Formula 6-123 is N, $Z_{31}$ to $Z_{34}$, $Z_{41}$ to $Z_{44}$, and $Z_{51}$ to $Z_{56}$ are each independently selected from the group consisting of:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$; and a phenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{20}$ alkyl group, a $C_1$-$C_{20}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, a quinazolinyl group, a carbazolyl group, a fluorenyl group, $—Si(Q_{21})(Q_{22})(Q_{23})$, and $—N(Q_{21})(Q_{22})$, $Z_{61}$ is selected from hydrogen, a cyano group, —F, and $—CF_3$, and at least one $Z_{61}$ is selected from a cyano group, —F, and $—CF_3$, wherein $Q_{21}$ to $Q_{23}$ and $Q_{31}$ to $Q_{33}$ are each independently selected from a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, e2 is an integer selected from 1 and 2, e3 is an integer selected from 1 to 3, e4 is an integer selected from 1 to 4, e5 is an integer selected from 1 to 5, e6 is an integer selected from 1 to 6, e7 is an integer selected from 1 to 7, and

* indicates a binding site to an adjacent atom.

2. The organic light-emitting device of claim 1, wherein the first compound to the fourth compound satisfy Equations 1a to 6a:

$$E_{1,LUMO} \geq E_{2,LUMO} + 0.2\ \text{eV} \quad \text{Equation 1a}$$

$$E_{1,HOMO} \geq E_{2,HOMO} + 0.2\ \text{eV} \quad \text{Equation 2a}$$

$$E_{1,T1} \geq E_{4,T1} + 0.1\ \text{eV} \quad \text{Equation 3a}$$

$$E_{2,T1} \geq E_{4,T1} + 0.1\ \text{eV} \quad \text{Equation 4a}$$

$$E_{3,T1} \geq E_{4,T1} + 0.1\ \text{eV} \quad \text{Equation 5a}$$

$$E_{3,LUMO} \geq E_{2,LUMO} + 0.2\ \text{eV}. \quad \text{Equation 6a}$$

3. The organic light-emitting device of claim 1, further comprising a hole transport region between the first electrode and the emission layer, wherein the emission layer comprises the first compound, the second compound, and the fourth compound, and the hole transport region comprises the third compound.

4. The organic light-emitting device of claim 3, wherein the hole transport region comprises a first layer, wherein the first layer comprises the third compound, and the first layer directly contacts the emission layer.

5. The organic light-emitting device of claim 1, wherein $L_{41}$ to $L_{43}$ are each independently selected from groups represented by Formulae 4-1 to 4-31:

4-1

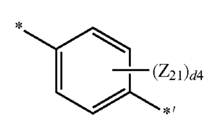

-continued
4-2
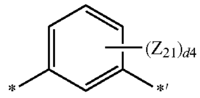
4-3
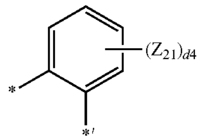
4-4
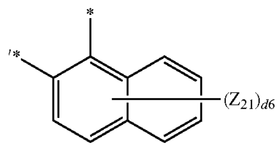
4-5
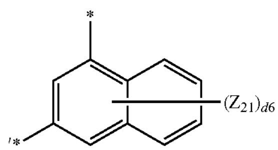
4-6
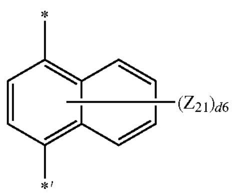
4-7
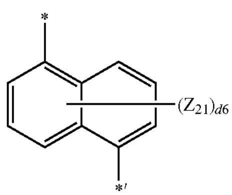
4-8
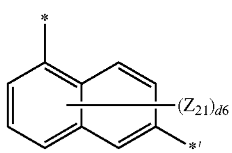
4-9
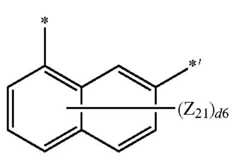
4-10
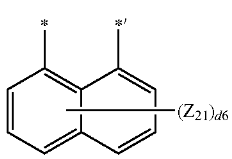
4-11
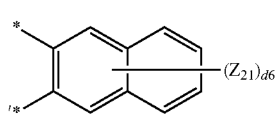
-continued
4-12
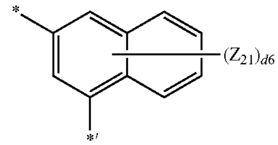
4-13
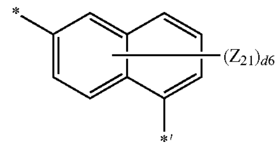
4-14
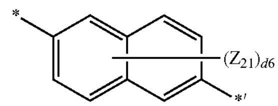
4-15
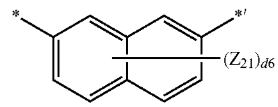
4-16
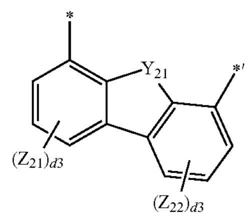
4-17
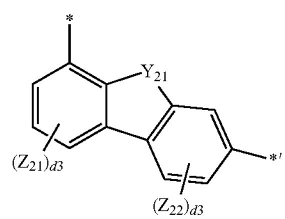
4-18
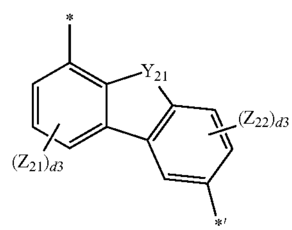
4-19
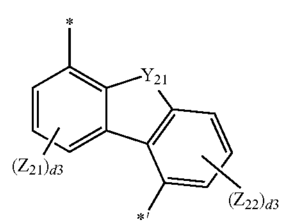
4-20
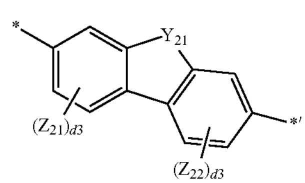

-continued 4-21

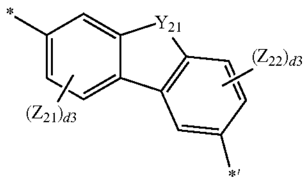

4-22

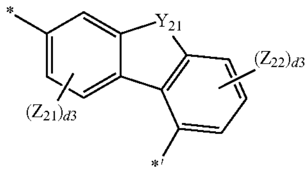

4-23

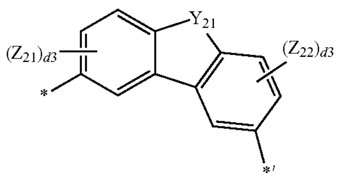

4-24

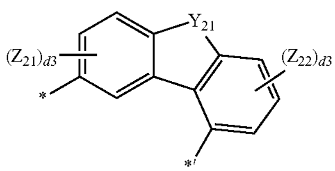

4-25

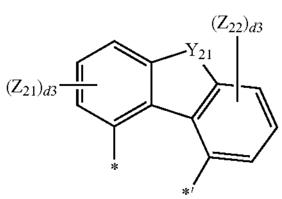

4-26

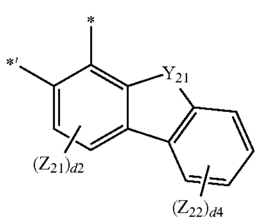

4-27

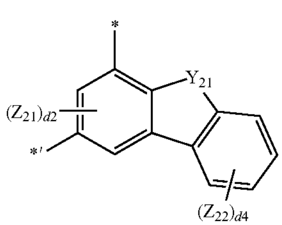

4-28

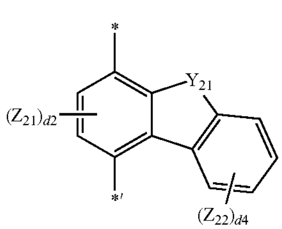

-continued 4-29

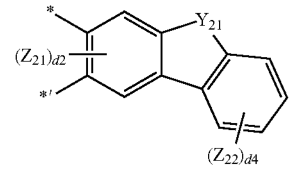

4-30

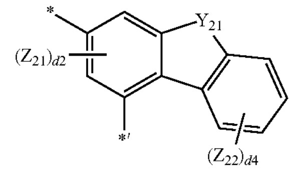

4-31

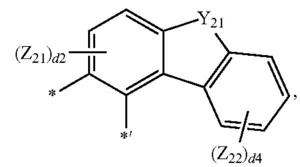

wherein, in Formulae 4-1 to 4-31, $Y_{21}$ is selected from O, S, $C(R_{43})(R_{44})$, and $Si(R_{43})(R_{44})$, $Z_{21}$ and $Z_{22}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a naphthyl group, a fluorenyl group, a spiro-bifluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a triazinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$, wherein $Q_{31}$ to $Q_{33}$ are each independently selected from hydrogen, a methyl group, an ethyl group, an n-propyl group, an iso-propyl group, a tert-butyl group, a phenyl group, a biphenyl group, and a terphenyl group, d2 is an integer selected from 1 and 2, d3 is an integer selected from 1 to 3, d4 is an integer selected from 1 to 4, d6 is an integer selected from 1 to 6, and

* and *' each independently indicate a binding site to an adjacent atom.

6. The organic light-emitting device of claim 1, wherein Formula 5 is represented by one selected from Formulae 4-2, 4-5, 4-27, and 4-30:

4-2

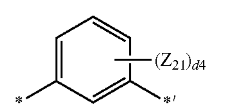

4-5

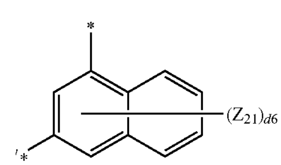

-continued 4-27

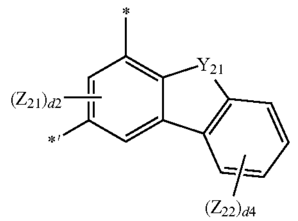

4-30

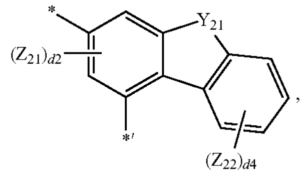

wherein, in Formulae 4-2, 4-5, 4-27, and 4-30, $Y_{21}$ is selected from O, S, $C(R_{43})(R_{44})$, and $Si(R_{43})(R_{44})$, $Z_{21}$ and $Z_{22}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a naphthyl group, a fluorenyl group, a spiro-bifluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a triazinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$, wherein $Q_{31}$ to $Q_{33}$ are each independently selected from hydrogen, a methyl group, an ethyl group, an n-propyl group, an iso-propyl group, a tert-butyl group, a phenyl group, a biphenyl group, and a terphenyl group, d2 is an integer selected from 1 and 2, d4 is an integer selected from 1 to 4, d6 is an integer selected from 1 to 6, and

* and *' each independently indicate a binding site to an adjacent atom.

7. The organic light-emitting device of claim 1, wherein the first compound represented by Formula 1-1 is represented by Formula 1-11, and the second compound represented by Formula 1-2 is represented by Formula 1-21:

1-11

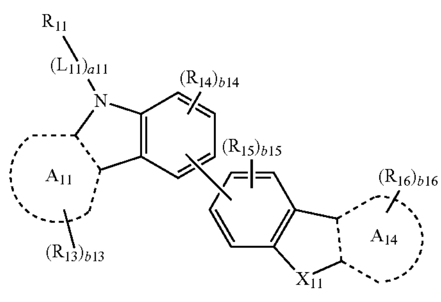

-continued 1-21

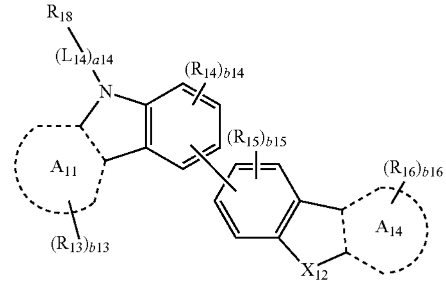

wherein, in Formulae 1-11 and 1-21, descriptions of $A_{11}$, $A_{14}$, $X_{11}$, $X_{12}$, $L_{11}$, $L_{14}$, a11, a14, $R_{11}$, $R_{13}$ to $R_{16}$, $R_{18}$, and b13 to b16 are respectively the same as those provided in connection with Formulae 1-1 and 1-2.

8. The organic light-emitting device of claim 1, wherein the first compound represented by Formula 2-1 or 2-2 is represented by one of Formulae 2-11 to 2-15 and 2-21 to 2-23, and the second compound represented by Formula 2-3 or 2-4 is represented by one of Formulae 2-31 to 2-35 and 2-41 to 2-43:

2-11

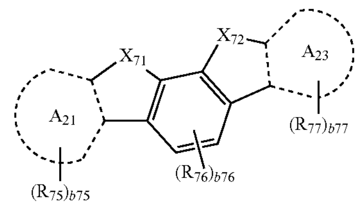

2-12

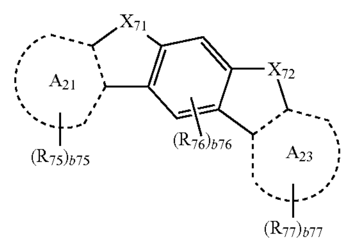

2-13

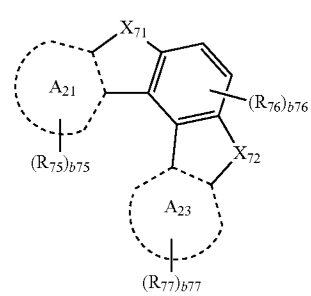

2-14

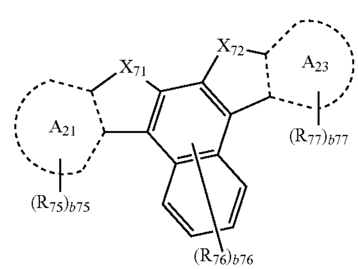

-continued
2-15
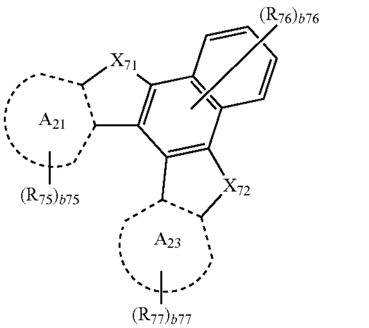
2-21
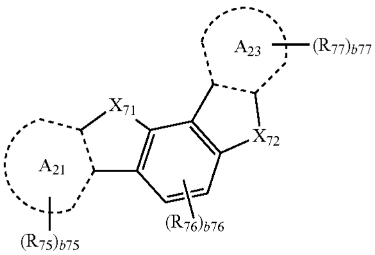
2-22
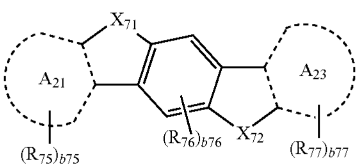
2-23
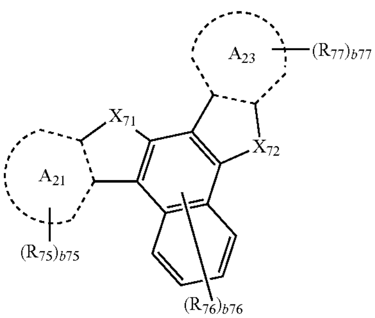
2-31
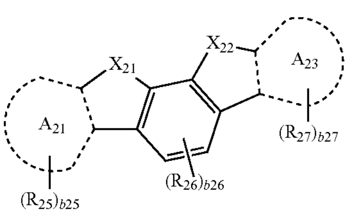
2-32
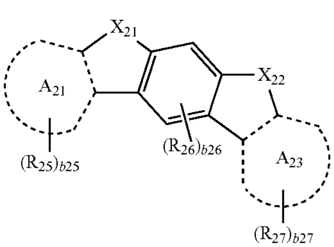
-continued
2-33
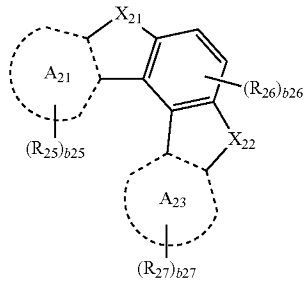
2-34
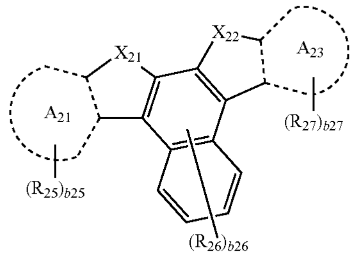
2-35
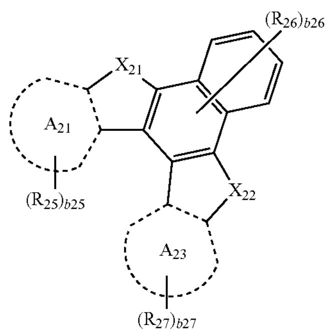
2-41
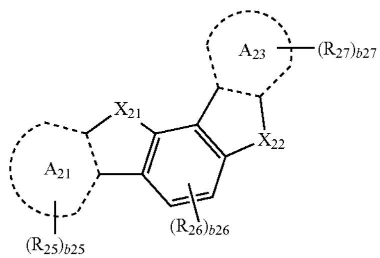
2-42
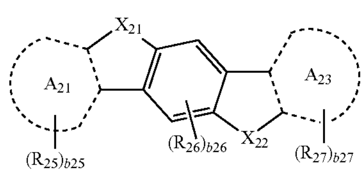
2-43
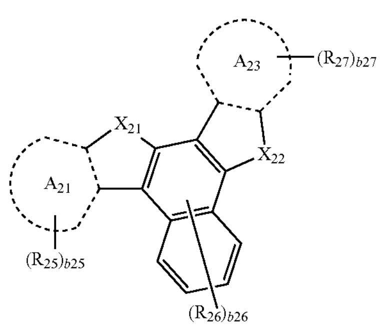

wherein, in Formulae 2-11 to 2-15, 2-21 to 2-23, 2-31 to 2-35, and 2-41 to 2-43, descriptions of $A_{21}$, $A_{23}$, $X_{21}$, $X_{22}$, $X_{71}$, $X_{72}$, $R_{25}$ to $R_{27}$, $R_{75}$ to $R_{77}$, b25 to b27, and b75 to b77 are respectively the same as those provided in connection with Formulae 2-1 to 2-4.

9. The organic light-emitting device of claim 1, wherein a weight ratio of the first compound to the second compound is in a range of about 1:99 to about 99:1.

10. The organic light-emitting device of claim 1, wherein the emission layer comprises the fourth compound, and the fourth compound comprises a phosphorescent dopant.

11. The organic light-emitting device of claim 1, wherein the fourth compound comprises a metal selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm).

12. The organic light-emitting device of claim 1, wherein a weight ratio of the first compound to the second compound is in a range of about 20:80 to about 80:20.

13. The organic light-emitting device of claim 4, wherein the hole transport region comprises at least one layer selected from a hole injection layer, a hole transport layer, an emission auxiliary layer, and an electron blocking layer, and wherein the first layer is the emission auxiliary layer.

14. The organic light-emitting device of claim 3, wherein in the emission layer, the first compound is a host, the second compound is a host, and the fourth compound is a dopant.

15. The organic light-emitting device of claim 1, wherein the first compound comprises at least one selected from the group consisting of Compound B-125, Compound B-167, and Compound E-165, the second compound comprises at least one selected from the group consisting of Compound C-109, Compound D-124, and Compound A-161, and the third compound is Compound F103:

B-125

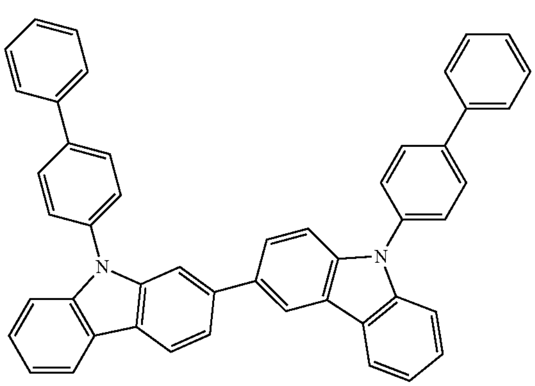

-continued

B-167

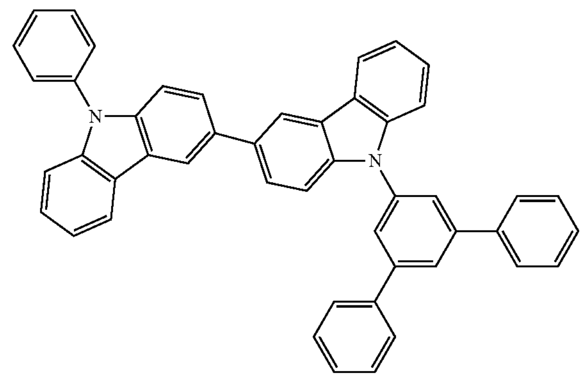

E-165

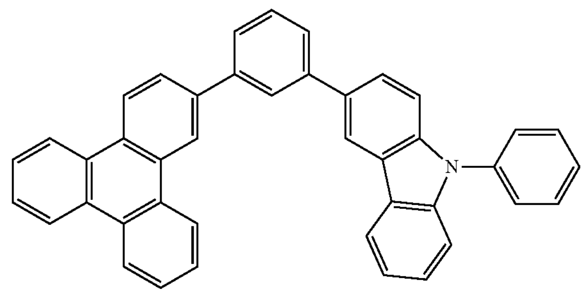

C-109

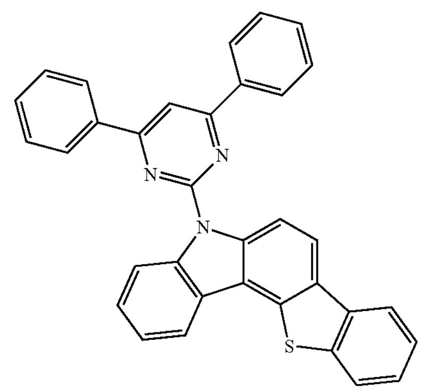

D-124

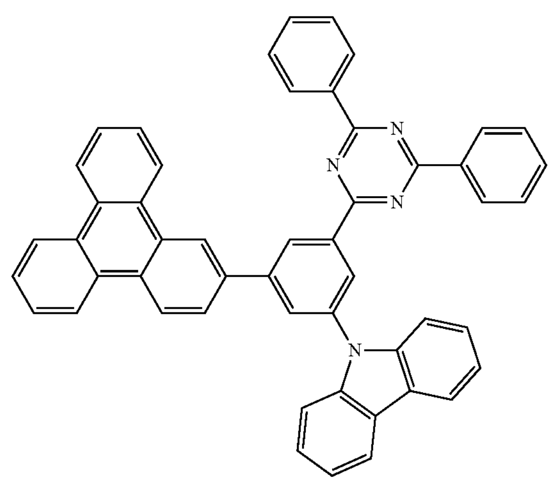

-continued
A-161
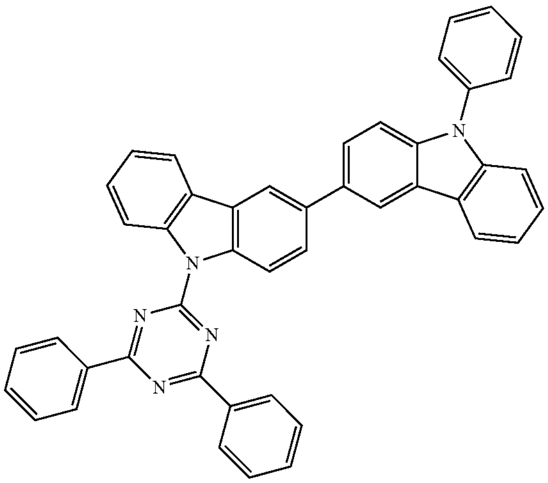
-continued
F-103
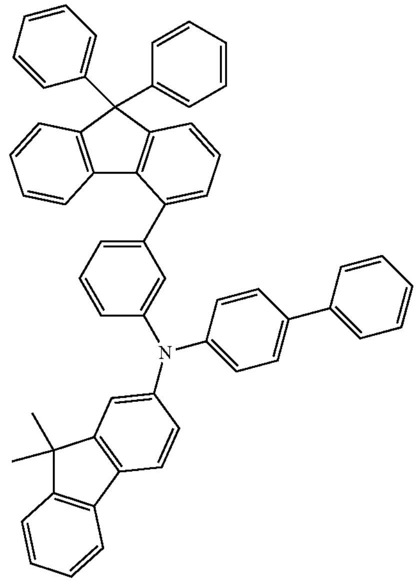
16. The organic light-emitting device of claim 3, wherein the hole transport region further comprises a p-dopant having a LUMO level of about −3.5 eV or less, the p-dopant comprising at least one selected from a quinone derivative, a metal oxide, and a cyano group-containing compound.
* * * * *